(12) United States Patent
Iwata et al.

(10) Patent No.: US 7,312,499 B2
(45) Date of Patent: Dec. 25, 2007

(54) SEMICONDUCTOR STORAGE DEVICE AND MANUFACTURING METHOD THEREFOR, SEMICONDUCTOR DEVICE, PORTABLE ELECTRONIC EQUIPMENT AND IC CARD

(75) Inventors: Hiroshi Iwata, Nara (JP); Takayuki Ogura, Nara (JP); Akihide Shibata, Nara (JP); Kouichirou Adachi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 40 days.

(21) Appl. No.: 11/414,226

(22) Filed: May 1, 2006

(65) Prior Publication Data

US 2006/0208312 A1    Sep. 21, 2006

Related U.S. Application Data

(62) Division of application No. 10/844,474, filed on May 13, 2004, now Pat. No. 7,129,539.

(30) Foreign Application Priority Data

May 15, 2003 (JP) ............................. 2003-137817
May 16, 2003 (JP) ............................. 2003-138540

(51) Int. Cl.
*H01L 29/792* (2006.01)
(52) U.S. Cl. ............... 257/324; 257/411; 257/E29.309; 438/596; 438/216; 438/261
(58) Field of Classification Search ................. 257/324
See application file for complete search history.

(56) References Cited

U.S. PATENT DOCUMENTS 5,838,041 A    11/1998   Sakagami et al.

6,335,554 B1    1/2002   Yoshikawa (Continued)

FOREIGN PATENT DOCUMENTS

JP    5-81072 B2    11/1993

(Continued)

OTHER PUBLICATIONS

Fujio Masuoka, "A handbook for flash memory techniques," K.K. Science Forum, Aug. 15, 1993, pp. 55-58.

*Primary Examiner*—Tu-Tu V. Ho
(74) *Attorney, Agent, or Firm*—Birch, Stewart, Kolasch & Birch, LLP

(57) ABSTRACT

A semiconductor storage device includes a field effect transistor which has a gate insulator, a gate electrode and a pair of source/drain diffusion regions on a semiconductor substrate. The device also includes a coating film made of a dielectric having a function of storing electric charge and formed on the substrate in such a manner as to cover an upper surface and side surfaces of the gate electrode. The device further includes an interlayer insulator formed on and in contact with the coating film. The device still further includes contact members which extend vertically through the interlayer insulator and the coating film on the source/drain diffusion regions and which are electrically connected to the source/drain diffusion regions, respectively. The coating film and the interlayer insulator are made of materials which are selectively etchable to each other. Thus, the issues of overerase and read failures due to the overerase can be solved, and the device reliability can be enhanced.

28 Claims, 45 Drawing Sheets

U.S. PATENT DOCUMENTS 6,885,060 B2 * 4/2005 Nomoto et al. ............. 257/324
6,906,390 B2 * 6/2005 Nomoto et al. ............. 257/406

FOREIGN PATENT DOCUMENTS

| JP | 09-116119 A | 5/1997 |
| JP | 2000-077618 A | 3/2000 |
| JP | 2001-156188 A | 6/2001 |
| JP | 2001-230332 A | 8/2001 |
| JP | 2002-190535 A | 7/2002 |

* cited by examiner

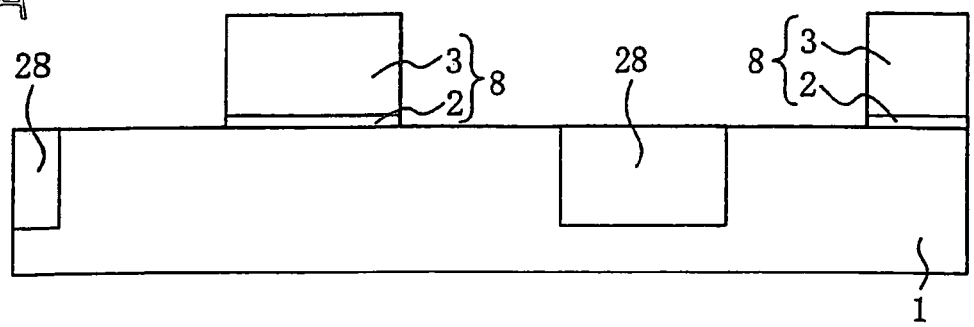
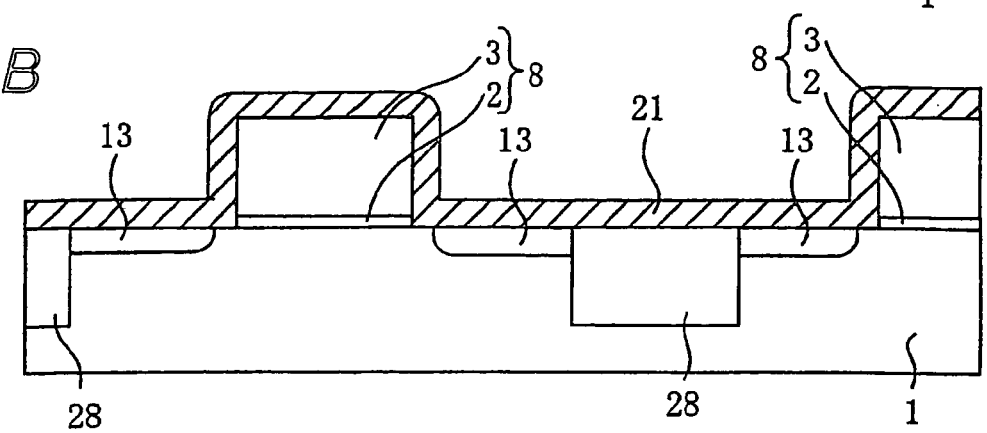
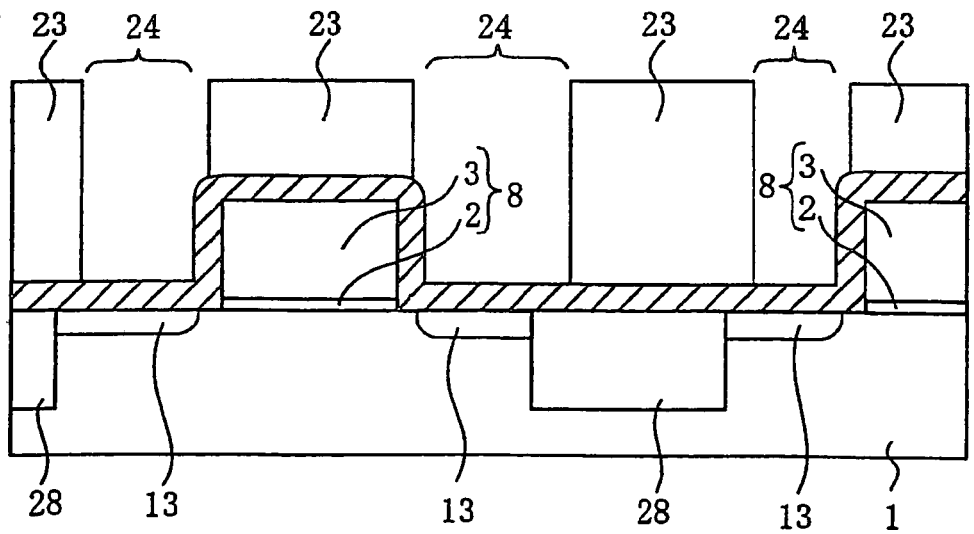

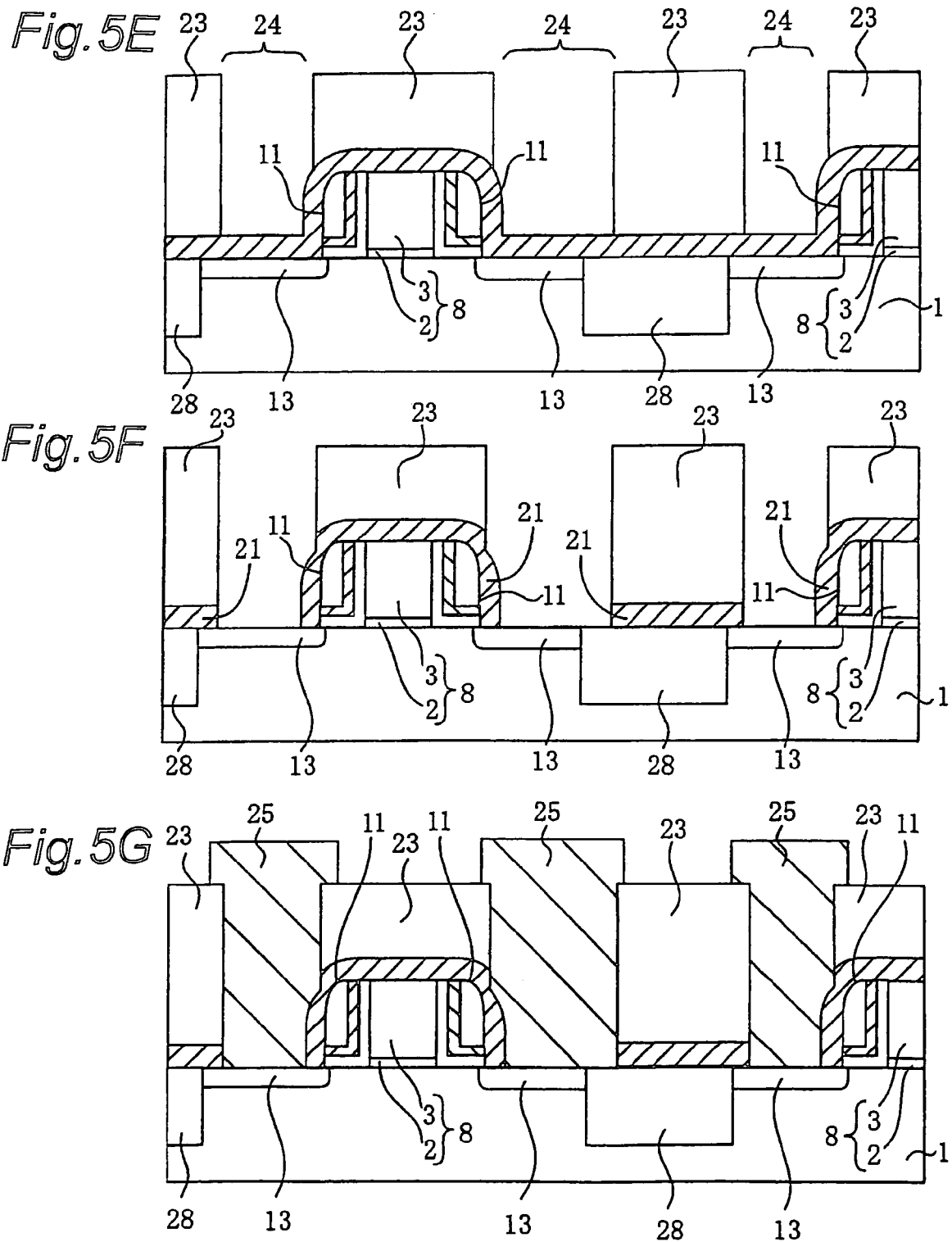

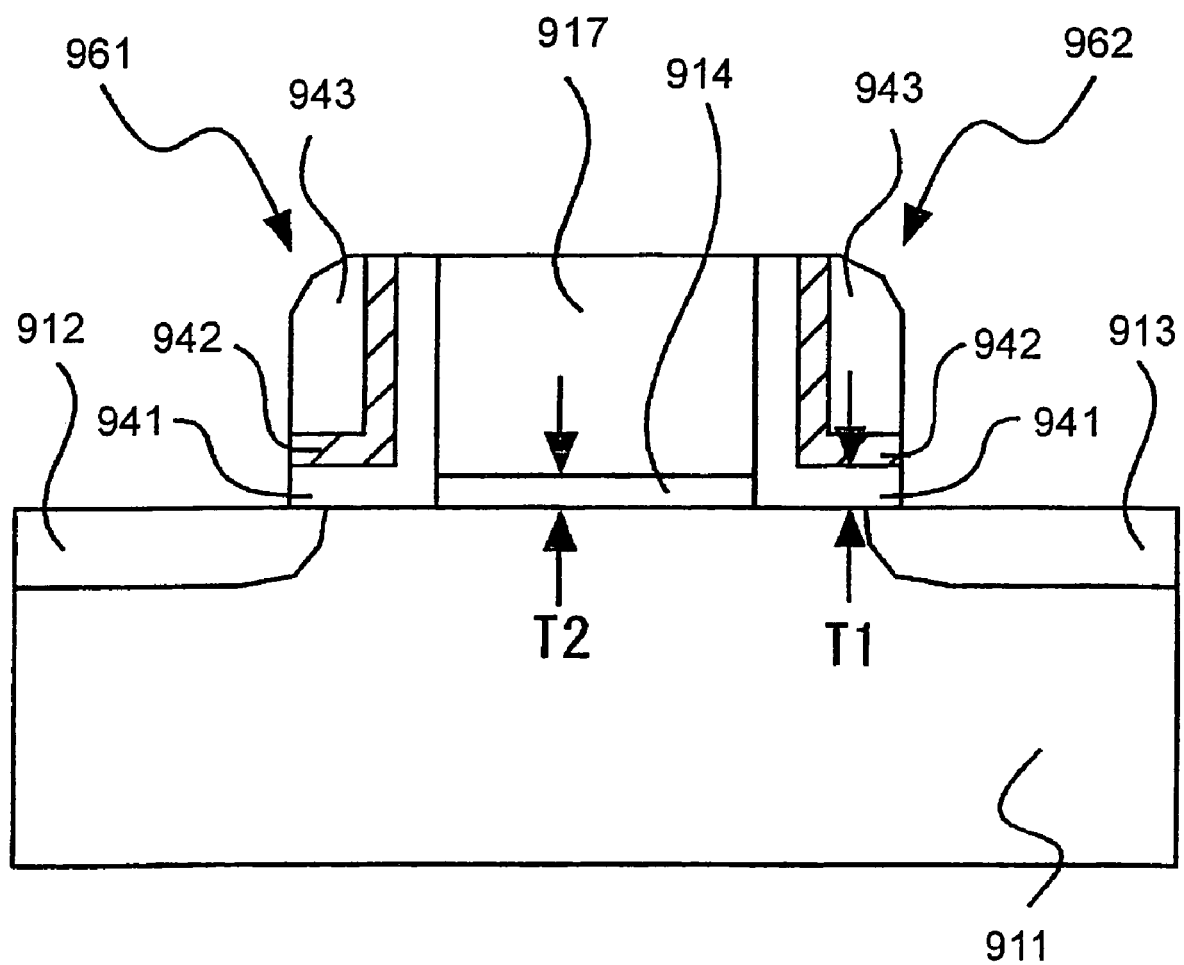

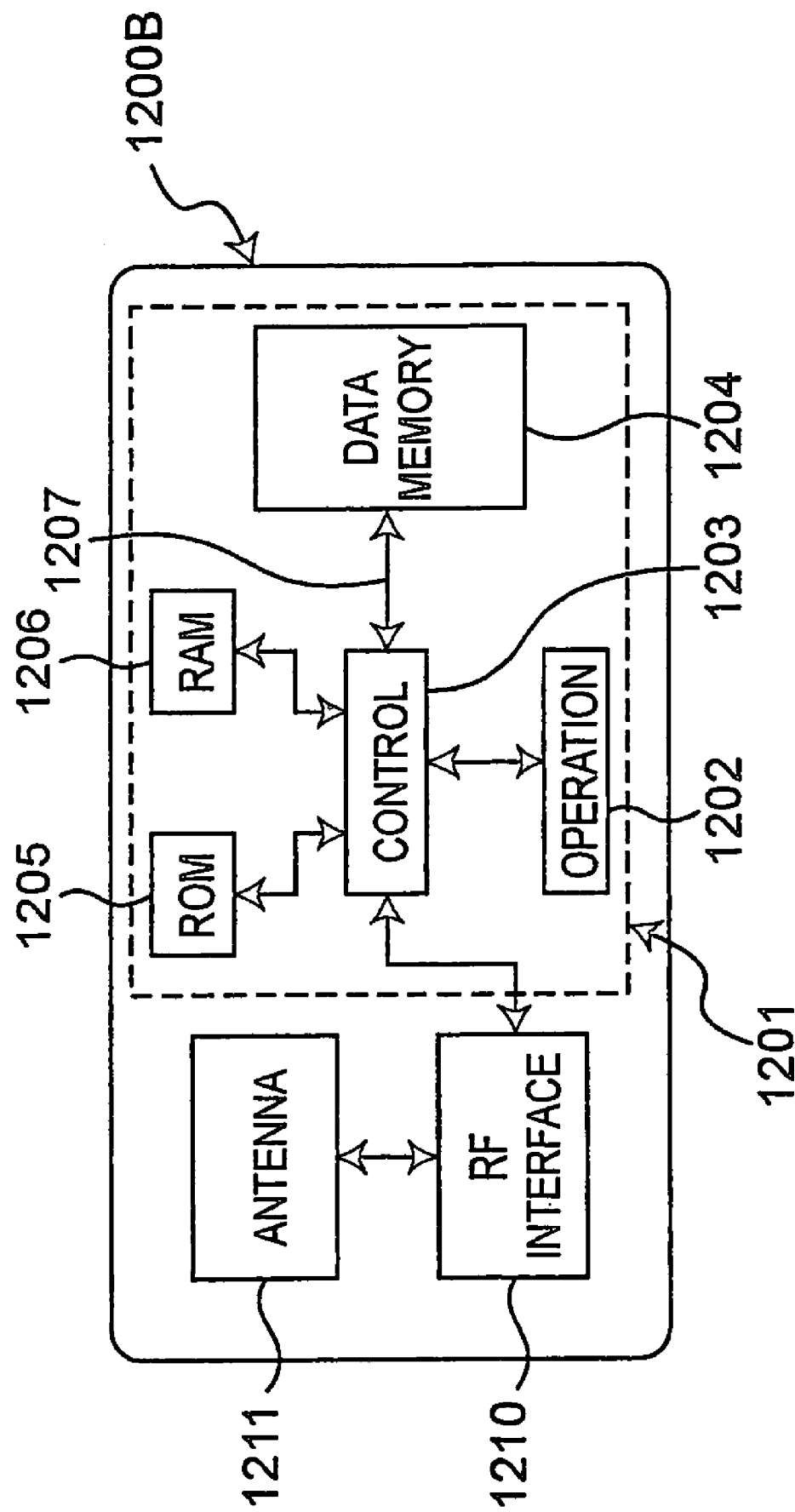

SEMICONDUCTOR STORAGE DEVICE AND MANUFACTURING METHOD THEREFOR, SEMICONDUCTOR DEVICE, PORTABLE ELECTRONIC EQUIPMENT AND IC CARD

The present application is a divisional of application Ser. No. 10/844,474, filed May 13, 2004, now U.S. Pat. No. 7,129,539 which application claims priority under 35 U.S.C. § 119(a) on Patent Application No. 2003-137817 filed in Japan on May 15, 2003 and Patent Application No. 2003-138540 filed in Japan on May 16, 2003. The entire contents of all are hereby incorporated by reference.

BACKGROUND OF THE INVENTION

The present invention relates to a semiconductor storage device and its manufacturing method, particularly, an electrically erasable programmable nonvolatile semiconductor storage device and its manufacturing method.

Also, the invention relates to a semiconductor storage device, as well as its manufacturing method, in which semiconductor storage elements and semiconductor switching elements are mounted compositely on one identical substrate.

Also, the invention relates to portable electronic equipment and IC cards equipped with such a semiconductor storage device or semiconductor device.

As a semiconductor storage device, there has conventionally been a flash memory that is a memory element that allows electrical writing and erasing (e.g., see "A handbook for flash memory techniques," edited by Fujio Masuoka, K. K. Science Forum, Aug. 15, 1993, pp. 55-58). A structural cross sectional view of the flash memory element is shown in FIG. 34. As shown in FIG. 34, the flash memory element is composed of a floating gate 1506 made of polysilicon placed on a semiconductor substrate 1501 via a first oxide 1504, and a control gate 1507 made of polysilicon placed on the floating gate 1506 via a second oxide 1505. On the surface of the semiconductor substrate 1501, a pair of source/drain diffusion regions 1502, 1503 are disposed. The end portions of the gate electrodes 1506, 1507 are respectively laid above the end portions of the source/drain diffusion regions 1502, 1503. The control gate 1507 plays the role of a gate electrode of an Field Effect Transistor (FET) in the flash memory. Moreover, between the control gate 1507 and the semiconductor substrate 1501, the first oxide 1504, the floating gate 1506 and the second oxide 1505 are disposed. Therefore, the flash memory is a memory element which is provided with a memory film (floating gate) serving as a charge retention section disposed in a gate insulator portion of the FET so as to implement the function of changing a threshold voltage of the FET depending on a charge amount stored in the memory film.

SUMMARY OF THE INVENTION

The flash memory of this structure has a problem of so-called overerase as described below. That is, an erase operation in flash memory is, normally, to lower the threshold voltage of a FET in the flash memory by pulling off the electrons accumulated at the floating gate or injecting holes thereinto. If this erase is done excessively, the FET would be turned ON due to an effect of the charge retained at the floating gate under the gate electrode (i.e., control gate), causing a current to flow between the source/drain diffusion regions. This phenomenon occurs due to the FET being turned ON only by the retained charge of the floating gate as a result of a structural characteristic that the control gate, which is the gate electrode as a FET, and a floating gate, which is the memory film as a memory, are stacked together.

Upon occurrence of such an overerase, there would arise leakage currents derived from non-selected memory cells in a read operation of the memory cell array, which might cause read failures such as an incidence that currents of selected memory cells could no longer be extracted.

Moreover, in the case of a nonvolatile memory manufactured by a method disclosed in the Nonpatent Document (e.g., see "A handbook for flash memory techniques," edited by Fujio Masuoka, K. K. Science Forum, Aug. 15, 1993, pp. 55-58), a contact to the source/drain diffusion layer is to be formed, and so in the step of etching an $SiO_2$ film into a contact form, the surface of the source/drain diffusion layer would be damaged or over-etched due to excessive etching, causing contact failure and short-circuit between the source/drain diffusion layer and an Si substrate.

Further, in the case of using a so-called diffusion-layer interconnection for establishing connection between the source/drain diffusion layers of different cells with use of an existing source/drain diffusion layer, there arises a problem that parasitic capacitance and resistance of interconnection lines between cells is increased and an operation speed is reduced. Because of this, in reality, a contact to an upper interconnection line that extends in parallel with the diffusion-layer interconnection line is made on the basis of every several cells. Therefore, the contact for connecting the source/drain diffusion regions and an upper layer thereof is indispensable, which poses the same problem as stated before.

The present invention provides a semiconductor storage device, as well as its manufacturing method, which is capable of solving the overerase and the problem of read failures due to the overerase.

The present invention provides a highly-reliable semiconductor storage device and a manufacturing method therefor capable of preventing read failure due to excessive erasing and miniaturizing the semiconductor storage device by approximating a contact and a gate electrode with simple structure so as to increase the operation speed.

The present invention provides a semiconductor device, as well as its manufacturing method, in which such semiconductor storage elements and semiconductor switching elements forming logic circuits are mounted compositely on one identical substrate.

The present invention provides portable electronic equipment and IC cards equipped with such a semiconductor storage device or semiconductor device.

In general, a semiconductor storage device of the present invention comprises:
 a field effect transistor which has a gate electrode formed on a semiconductor substrate via a gate insulator and a pair of source/drain diffusion regions formed on portions of a semiconductor substrate surface corresponding to opposite sides of the gate electrode;
 a coating film which is made of a dielectric having a function of storing electric charge and formed on the semiconductor substrate in such a manner as to cover an upper surface and side surfaces of the gate electrode;
 an interlayer insulator formed on and in contact with the coating film; and
 contact members which extend vertically through the interlayer insulator and coating film on the source/drain diffusion regions and which are electrically connected to the source/drain diffusion regions, respectively, wherein the coating film and the interlayer insulator are made of materials which are selectively etchable to each other.

In the semiconductor storage device of the present invention, a portion of the aforementioned coating film that extends along the side surfaces of the gate electrode play the role of a charge retention section that has a function to store charges. More specifically, the charge retention section is formed not on the portion that functions as a gate insulator of the field effect transistor in the semiconductor storage device but on the lateral side of the gate electrode. This solves the problems of excessive erasing and read failure relevant thereto, the problems having been found in the prior art.

Further, since the gate electrode and the contact member can be isolated by the coating film, it is possible to freely choose a material from those different from the materials used for regular interlayer insulators, allowing increase in an insulating capability and reduction in a leak current amount, or reduction in a parasitic capacitance by the use of low dielectric constant materials. Therefore, further approximation between the contact and the gate electrode becomes possible, thereby achieving miniaturization of the element.

Further, etching of the interlayer insulator can be stopped by the coating film. More specifically, stopping the etching by the coating film makes it possible to prevent the semiconductor substrate from being etched. As a result, it becomes possible to restrain contact failure and short-circuit between the source/drain diffusion regions and the semiconductor substrate. Therefore, a highly-reliable semiconductor storage device can be provided.

Further, with use of only the coating film, the charge retention function as well as a number of the above-stated functions can be fulfilled. More precisely, this semiconductor storage device can be manufactured from a regularly-structured MOSFET (Metal Oxide Semiconductor FET) only with addition of the coating film, which allows simplification of the manufacturing steps, making it possible to provide a semiconductor storage device with a low manufacturing cost.

In one embodiment of the semiconductor storage device, spaces are provided between the gate electrode and the source/drain diffusion regions with respect to a channel direction, and the spaces are covered with portions of the coating film that extend along the side surfaces of the gate electrode.

In the semiconductor storage device in this one embodiment, spaces (offset regions) are disposed between the gate electrode and the source/drain diffusion regions with respect to a channel direction, each of the offset regions being covered with a portion of the aforementioned coating film that extends along the side surfaces of the gate electrode (charge retention section). Therefore, an inversion layer is deleted or formed by the presence or absence of excessive electrons in the charge retention section in the coating film, as a result of which large hysteresis (threshold change) is obtained, making it possible to provide a semiconductor storage device with good write/erase characteristics.

In another aspect of the present invention, the semiconductor storage device comprises:
  a field effect transistor which has a gate electrode formed on a semiconductor substrate via a gate insulator and a pair of source/drain diffusion regions formed on portions of a semiconductor substrate surface corresponding to opposite sides of the gate electrode;
  memory function bodies which are provided on opposite sides of the gate electrode, respectively, and each of which comprises a charge retention part made of a material having a function of storing electric charge, and an anti-dissipation dielectric having a function of preventing dissipation of stored charge;
  a coating film which is made of a dielectric formed on the semiconductor substrate in such a manner as to cover an upper surface and side surfaces of the gate electrode and the memory function bodies that are integrated together;
  an interlayer insulator which is formed on and in contact with the coating film; and
  contact members which extend vertically through the interlayer insulator and the coating film on the source/drain diffusion regions so as to be electrically connected to the source/drain diffusion regions, respectively, wherein
  the coating film and the interlayer insulator are made of materials which are selectively etchable to each other.

In the semiconductor storage device of this invention, a memory function body having a charge retention section with a function to store charges is formed not on a gate insulator section in the field effect transistor but on the lateral side of the gate electrode. This solves the problems of excessive erasing and read failure relevant thereto, the problems having been found in the prior art.

Further, since the gate electrode, the memory function body and the contact member can be isolated by the coating film, it is possible to freely choose a material from those different from the materials used for regular interlayer insulators, allowing increase in an insulating capability and reduction in a leak current amount, or reduction in a parasitic capacitance by the use of low dielectric constant materials. Therefore, further approximation between the contact and the gate electrode becomes possible, thereby achieving miniaturization of the element.

Further, etching of the interlayer insulator can be stopped by the coating film. More specifically, stopping the etching by the coating film makes it possible to prevent the semiconductor substrate from being etched. This allows restraint of contact failure and short-circuit between the source/drain diffusion regions and the semiconductor substrate. Therefore, a highly-reliable semiconductor storage device can be provided.

Further, the charges retained in the charge retention section having a function to store charges are restrained from dissipating by an anti-dissipation dielectric. Therefore, a semiconductor storage device with a good retention characteristic can be provided. Furthermore, the coating film also helps to restrain retained charges in the memory function body from dissipating, making it possible to provide a semiconductor storage device with a further better retention characteristic and high reliability.

In the one embodiment of the semiconductor storage device, spaces are provided between the gate electrode and the source/drain diffusion regions with respect to a channel direction, and the spaces are covered with the memory function bodies.

In the semiconductor storage device in this one embodiment, spaces (offset regions) are disposed between the gate electrode and the source/drain diffusion regions with respect to a channel direction, each of the offset regions being covered with the memory function body. Therefore, an inversion layer is deleted or formed by the presence or absence of excessive electrons in the charge retention section in the memory function body, as a result of which large hysteresis (threshold change) is obtained, making it possible to provide a semiconductor storage device with good write/erase characteristics. Furthermore, write/erase operations by hot carriers generated in the offset region are executable, allowing provision of a semiconductor storage device supporting 2-bit operation.

In one embodiment of the semiconductor storage device,
a material of the semiconductor substrate and a material of the gate electrode principally contain silicon,
a material of the gate insulator and a material of the interlayer insulator principally contain silicon oxide, and
a material of the coating film principally contain silicon nitride.

According to the semiconductor storage device in this one embodiment, materials of the semiconductor substrate, the gate electrode, the gate insulator, the coating film and the interlayer insulator primarily contain silicon or silicon compounds that are widely used as materials of semiconductor devices today, and therefore a semiconductor process having an extremely high compatibility with the conventional semiconductor manufacturing process can be developed. This makes it possible to provide a semiconductor storage device with a low manufacturing cost.

Moreover, the material of the interlayer insulator primarily contains a silicon oxide and the material of the coating film primarily contains silicon nitride, so that a large etching selectivity can be gained between the coating film and the interlayer insulator. This makes it possible to develop a process which has an extremely high compatibility with the conventional semiconductor manufacturing process and allows constraint of contact failure and short-circuit between the source/drain diffusion regions and the semiconductor substrate. Therefore, a semiconductor storage device with a further lower manufacturing cost can be provided. Moreover, in the conventional semiconductor manufacturing process, a device isolation region is primarily made of a silicon oxide, which makes it possible to gain a large etching selectivity between the coating film and the device isolation region. This makes it possible to develop a process which has an extremely high compatibility with the conventional semiconductor manufacturing process and allows constraint of contact failure and short-circuit between the source/drain diffusion regions and the semiconductor substrate.

Further, in the case where a portion of the coating film that extends along the side surfaces of the gate electrode functions as a charge retention section having a function to store charges, the charge retention section can hold a number of charge traps if the material of the coating film primarily contains a silicon nitride.

It is to be noted that in this specification, a phrase "the material of A primarily contains a" means that "A" can contain materials (e.g., impurities) "b" other than the primary material "a". Any material is applicable as long as the effects gained by the primary material "a" contained in "A" would not be damaged.

In one embodiment of the semiconductor storage device,
a plurality of the field effect transistors are arranged on the semiconductor substrate, and
the semiconductor storage device has a device isolation region for electrically isolating the source/drain diffusion regions of mutually neighboring ones of the field effect transistors from each other;
a material of the device isolation region principally contains silicon oxide.

Conventionally, the devices have been manufactured based on the design allowing for a sufficient margin of alignment between a contact hole and a device isolation region so that the device isolation region would not be etched away in the etching process for forming the contact holes. However, if a silicon nitride is used as a coating film, in addition to which the device isolation region is made from a material primarily containing a silicon oxide like the semiconductor storage device in this one embodiment, then the etching process for forming contact holes is stopped at the coating film and moreover the coating film can be selectively etched depending on the material of the device isolation region, thereby enabling the margin of alignment between the device isolation region and the contact hole to be reduced in a view point design. Therefore, it becomes possible to provide a semiconductor storage device with a smaller space occupancy and a reduced manufacturing cost.

Further in the semiconductor storage device in one embodiment, the memory function body is composed of a plurality of particulates having a function to store charges and a side-wall insulator containing these particulates formed on a side wall section of an L-shaped insulator having a function to suppress dissipation of charges.

According to the semiconductor storage device in this one embodiment, the structure for retaining charges by means of a plurality of particulates, i.e., the structure in which a region having a function to store charges is segmentalized into minute regions like particulates is adopted. Accordingly, even if the insulator leaks to deteriorate a retention characteristic of the memory, not all the charges retained in a plurality of the particulates are leaked but only partial charges which are retained in the particulates in the vicinity of a leaking portion in the insulator are leaked. Therefore, a semiconductor storage device with a good retention characteristic and extremely high long-term reliability is provided. Further, as one example, the particulates made from a material having a function to store charges may be formed into, for example, a nanodot-like structure like a silicon dot structure. Therefore, due to the Coulomb blockage effect, the memory effect is significantly enhanced.

Further in the semiconductor storage device in one embodiment, the memory function body is composed of a side-wall insulator and a charge retention section having a function to retain charges formed on a side wall section of an L-shaped insulator having a function to suppress dissipation of charges, and
the charge retention section is smaller in width than the memory function body, and disposed in between the L-shaped insulator and the side-wall insulator.

According to the semiconductor storage device in this one embodiment, the region into which electrons are injected in the write process is limited to the vicinity of a channel, which facilitates removal of electrons in the erase process, enabling accidental erasing to be prevented. Further, a volume of the memory function body for retaining charges is decreased while an amount of charges to be injected is unchanged, enabling an amount of charges per unit volume to be increased. This allows effective write/erase operations with use of electrons, making it possible to provide a semiconductor storage device with a high write/erase speed. Furthermore, since the side wall of the charge retention section is covered with the side-wall insulator, the charge retention section and the contact member are prevented from being short-circuited during the step for forming a contact to the source/drain diffusion regions. Therefore, a required margin of alignment between the contact hole and the memory function body in design is reduced, by which the device is miniaturized. This makes it possible to provide a semiconductor storage device with a reduced cost.

Further in the semiconductor storage device in one embodiment, the memory function body is composed of a side-wall insulator and a charge retention section having a function to retain charges formed on a side wall section of an L-shaped insulator having a function to suppress dissipation of charges, the charge retention section being smaller in width than the memory function body, smaller in height than the memory function body and being in contact with the L-shaped insulator.

According to the semiconductor storage device in this one embodiment, the charge retention section is scaled down more than the charge retention section in the aforementioned one embodiment, so that the region into which electrons are injected in the write process is limited to a small region in the vicinity of a channel. This facilitates removal of electrons in the erase process, enabling accidental erasing to be prevented. Further, a volume of the memory function body for retaining charges is decreased while an amount of charges to be injected is unchanged, enabling an amount of charges per unit volume to be increased. This allows effective write/erase operations with use of electrons, making it possible to provide a semiconductor storage device with a high write/erase speed.

Further, since the charge retention section is completely covered with the side-wall insulator, the charge retention section and the contact member are prevented from being short-circuited during the step for forming a contact to the source/drain diffusion regions. Therefore, a required design contact margin is further reduced, by which a space occupancy is miniaturized. This makes it possible to provide a semiconductor storage device with a reduced manufacturing cost.

Further in the semiconductor storage device in one embodiment, the memory function body is composed of a side-wall insulator containing therein a plurality of particulates having a function to store charges, a film made of a conductor or a semiconductor disposed between the side-wall insulator and the gate electrode and between the side-wall insulator and the semiconductor substrate, and an L-shaped insulator disposed between the film made of a conductor or semiconductor and the gate electrode and between the film made of a conductor or semiconductor and the semiconductor substrate.

According to the semiconductor storage device in this one embodiment, it becomes possible to control dispersion in threshold voltages and driving current values of the field effect transistor caused by dispersion in the position and the size of particulates. This makes it possible to provide a semiconductor storage device of high reliability with accidental read operations being suppressed.

Further in the semiconductor storage device in one embodiment, the L-shaped insulating film and the side-wall insulating film are made of a silicon oxide or a silicon nitride, the charge retention section is made of polysilicon, and the particulates are made of silicon.

According to the semiconductor storage device in this one embodiment, the charge retention section is made of polysilicon, so that a charge-injection amount can be controlled. This allows multilevel control over the charge-injection amount, resulting in reduction in a manufacturing cost per bit. Further, since the particulates are also made of silicon, which is an essentially standard material for use in the LSI process, the manufacturing cost thereof can be reduced.

Further in the semiconductor storage device in one embodiment, the charge retention section is made of a silicon nitride.

According to the semiconductor storage device in this one embodiment, the charge retention section is made of a silicon nitride and the second side-wall insulating film is made of a silicon oxide or a silicon nitride, which brings about levels of about $1\times10^{12}$ cm$^{-2}$ for trapping charges, making it possible to obtain a large hysteresis characteristic. Moreover, since charge retention time is long, a problem of leakage of charges caused by generation of a leakage path is suppressed, which improves the retention characteristic. Further, since these materials are essentially standard materials for use in the LSI process, the manufacturing cost thereof can be reduced.

In one embodiment of the semiconductor storage device, at least part of the charge retention part overlaps with part of the source/drain diffusion regions.

According to the semiconductor storage device in this one embodiment, current values during read operation in the semiconductor storage device are drastically improved from those in the case where no overlapping is arranged. Eventually, a read speed is drastically increased either, making it possible to provide a semiconductor storage device with a high read speed. In one embodiment of the semiconductor storage device, the charge retention part has a portion extending generally parallel to a surface of the gate insulator.

It is to be noted that a phrase "almost parallel" in this specification refers to substantially parallel in the range of production tolerances.

According to the semiconductor storage device in this one embodiment, susceptibility to formation of an inversion layer in the offset region can be effectively controlled depending on the size of an amount of charges retained in the charge retention section, thereby allowing enhancement of the memory effect. Moreover, even if an offset amount is dispersed, changes in the memory effect can be kept relatively small, which enables the dispersion in the memory effect to be suppressed.

In the one embodiment of the semiconductor storage device, the charge retention part has a portion generally parallel to a side surface of the gate electrode.

According to the semiconductor storage device in this one embodiment, charges to be injected into a charge-storage region during reprogramming operation are increased, resulting in increase in a reprogramming speed.

In one embodiment of the semiconductor storage device, a portion of the anti-dissipation dielectric that isolates the charge retention part and the semiconductor substrate from each other has a thickness thinner than a film thickness of the gate insulator and not less than 0.8 nm.

According to the semiconductor storage device in this one embodiment, it becomes possible to facilitate injection of charges into the charge-storage region, decreases voltages in write operation and erase operation, and increases the speed in the write operation and the erase operation. Moreover, an amount of charges induced to the channel formation region or the well region when charges are retained in the charge retention section is increased, which enables the memory effect to be enhanced. Moreover, a portion of the anti-dissipation dielectric, that separates the charge retention section and the semiconductor substrate, is not less than 0.8 nm in thickness, which enables excessive deterioration of the retention characteristic to be restrained.

In one embodiment of the semiconductor storage device, a plurality of the field effect transistors are arranged on the semiconductor substrate, the semiconductor storage device has a device isolation region for electrically isolating the source/drain diffusion regions of mutually neighboring ones of the field effect transistors from each other, the contact members stretch to the source/drain diffusion regions located on opposite sides of the device isolation region, and the coating film and the device isolation region are made of materials which are selectively etchable to each other.

For manufacturing the semiconductor storage device in this one embodiment, a single large contact hole that can connect two adjacent source/drain diffusion regions should be formed. This makes it possible to form a large contact hole, and facilitate embedment of the contact member.

Further, as for the device isolation region disposed below the contact member, it is not necessary to allow for a margin of alignment with the contact hole. Therefore, the required margin of alignment between the contact hole and the device isolation region is considerably diminished, which allows significant reduction in space occupancy of memory cell arrays.

Further in the semiconductor storage device in one embodiment, a device isolation region and an active region on which the device isolation region is not formed are defined on the surface of a semiconductor substrate, a plurality of the active regions extending in a first direction are formed in parallel, a plurality of source/drain diffusion regions serving as source regions or drain regions are formed on the active regions, and a channel formation region is defined in between each of the adjacent source/drain diffusion regions in an identical active region, a plurality of word lines extending across the first direction on the semiconductor substrate is provided on the channel formation region via an insulator, a plurality of bit lines respectively extending in the first direction is provided on the semiconductor substrate, when two adjacent bit lines (a first bit line and a second bit line) are selected, a specified portion of the active region between these two bit lines is defined, the first bit line is connected to one out of every two source/drain diffusion regions that belong to the specified active region, the second bit line is connected to source/drain diffusion regions other than those one out of every two source/drain diffusion regions that belong to the specified active region, these two bit lines are further connected to source/drain diffusion regions adjacent to the connected source/drain diffusion regions via the bit lines, the word line functions as a gate electrode on the channel formation region, a memory function body having a function to retain charges is formed on a side wall of the word line, depending on volumes of an amount of charges retained in the charge retention section defined by selecting a specified word line and a pair of bit lines adjacent to each other, an amount of charges flowing through the channel formation region defined by the specified word line and the first and second bit lines is structured to be changed, and two source/drain diffusion regions that are adjacent to each other via bit lines connected to the selected bit lines are provided.

According to the semiconductor storage device in this one embodiment, a space occupancy of the device isolation region is decreased, and the number of bit lines is also decreased. This allows further integration of the device, allowing the cost to be reduced.

A semiconductor device of the present invention comprises:

a memory area having semiconductor storage elements and a logic circuit area having semiconductor switching elements, both the memory area and the logic circuit area being arranged on a semiconductor substrate, wherein each of the semiconductor storage element and the semiconductor switching element comprises a field effect transistor which has a gate electrode formed on the semiconductor substrate via a gate insulator and which has a pair of source/drain diffusion regions formed on portions of a semiconductor substrate surface corresponding to opposite sides of the gate electrode, a coating film which is made of a dielectric having a function of storing electric charge and formed on the semiconductor substrate in such a manner as to cover an upper surface and side surfaces of the gate electrode;

an interlayer insulator formed on and in contact with the coating film; and contact members which extend vertically through the interlayer insulator and the coating film on the source/drain diffusion regions so as to be electrically connected to the source/drain diffusion regions, respectively, wherein the coating film and the interlayer insulator are made of materials which are selectively etchable to each other, in the semiconductor storage element, spaces are provided between the gate electrode and the source/drain diffusion regions with respect to a channel direction, and the spaces are covered with portions of the coating film that extend along the side surfaces of the gate electrode, and in the semiconductor switching element, the source/drain diffusion regions extend under an end portion of the gate electrode with respect to the channel direction so as to overlap therewith.

In the semiconductor device of the present invention, a memory region having a semiconductor storage element and a logic circuit region having a semiconductor switching device are disposed on the semiconductor substrate, and the semiconductor storage device and the semiconductor switching device have no considerable difference in structure. Particularly, the semiconductor switching device is structured such that the source/drain diffusion regions extend below and overlap with an end portion of the gate electrode with respect to the channel direction. Accordingly, if spaces are disposed between the gate electrode and the source/drain diffusion regions with respect to the channel direction so that the spaces are covered with a portion of the coating film that extends along the side surface of the gate electrode, the function of the semiconductor switching device is still intact. In the semiconductor device, therefore, the memory region having a semiconductor storage element and the logic circuit region having a semiconductor switching device can be manufactured almost collaterally with great ease. Moreover, no limitation is attached to the thickness of the gate insulator, which makes it possible to provide a semiconductor device to which an advanced MOSFET manufacturing process can be easily applied.

In another aspect, a semiconductor device of the present invention comprises:

a memory area having semiconductor storage elements and a logic circuit area having semiconductor switching elements, both the memory area and the logic circuit area being arranged on a semiconductor substrate, wherein each of the semiconductor storage element and the semiconductor switching element comprises a field effect transistor which has a gate electrode formed on the semiconductor substrate via a gate insulator and which has a pair of source/drain diffusion regions formed on portions of a semiconductor substrate surface corresponding to opposite sides of the gate electrode, the semiconductor device further comprising:

memory function bodies which are provided on opposite sides of the gate electrode, respectively, and each of which comprises a charge retention part made of a material having a function of storing electric charge, and an anti-dissipation dielectric having a function of preventing dissipation of stored charge;

a coating film which is made of a dielectric formed on the semiconductor substrate in such a manner as to cover an upper surface and side surfaces of the gate electrode and the memory function bodies that are integrated together;

an interlayer insulator formed on and in contact with the coating film; and contact members which extend vertically through the interlayer insulator and the coating film on the source/drain diffusion regions so as to be electrically connected to the source/drain diffusion regions, respectively, wherein the coating film and the interlayer insulator are made of materials which are selectively etchable to each other, in the semiconductor storage element, spaces are provided between the gate electrode and the source/drain diffusion regions with respect to a channel direction, and the spaces are covered with the memory function bodies, and in the semiconductor switching element, the source/drain diffusion regions extend under an end portion of the gate electrode with respect to the channel direction so as to overlap therewith.

In the semiconductor device of the present invention, a memory region having a semiconductor storage element and a logic circuit region having a semiconductor switching device are disposed on the semiconductor substrate, and the semiconductor storage device and the semiconductor switching device have no considerable difference in structure. Particularly, the semiconductor switching device is structured such that the source/drain diffusion regions extend below and overlap with an end portion of the gate electrode with respect to the channel direction. Accordingly, if spaces (offset regions) are disposed between the gate electrode and the source/drain diffusion regions with respect to the channel direction so that each of the spaces is covered with a portion of the coating film that extends along the side surface of the gate electrode, the function of the semiconductor switching device is still intact. Further, the semiconductor switching device is structured such that the source/drain diffusion regions extend below and overlap with an end portion of the gate electrode with respect to the channel direction. Accordingly, if the memory function body is formed into a semiconductor switching device, the function of the semiconductor switching device is still intact. In the semiconductor device, therefore, the memory region having a semiconductor storage element and the logic circuit region having a semiconductor switching device can be manufactured almost collaterally with great ease. Moreover, no limitation is attached to the thickness of the gate insulator, which makes it possible to provide a semiconductor device to which an advanced MOSFET manufacturing process can be easily applied.

Further in the semiconductor storage element in one embodiment, the semiconductor storage element constitutes a nonvolatile memory region.

In the semiconductor storage element in this one embodiment, the nonvolatile memory region and the logic circuit region having a semiconductor switching device can be integrally mounted on the same semiconductor substrate.

Further in the semiconductor storage element in one embodiment, power supply voltages supplied to the semiconductor storage element in the nonvolatile memory region and to the semiconductor switching device in the logic circuit region are set independently of each other.

In the semiconductor device of this one embodiment, a relatively high power supply voltage can be supplied to the semiconductor storage element in the nonvolatile memory region, which allows the write/erase speed to be relatively increased. Further, a relatively low power supply voltage can be supplied to the semiconductor switching device in the logic circuit section, which makes it possible to suppress deterioration of transistor characteristics caused by destruction of the gate insulator or the like, thereby achieving further lower power consumption. Moreover, these devices are integrally mounted on the same substrate. Therefore, it becomes possible to fulfill a semiconductor device having a logic circuit section with high reliability and a nonvolatile memory section with a considerably high write/erase speed, which are easily mounted integrally on the same substrate.

Further in the semiconductor device in one embodiment, the semiconductor switching device further constitutes a static random access memory.

In the semiconductor device in this one embodiment, the semiconductor switching device constitutes a static random access memory. In this case, the semiconductor switching device constitutes a logic circuit section and a static random access memory, while the semiconductor storage element constitutes a nonvolatile memory section. This makes it possible to easily fulfill a semiconductor device having a logic circuit section, a static random access memory and a nonvolatile memory section, all of which are integrally mounted on the same substrate. Furthermore, integrally mounting the static random access memory as a high-speed temporary storage memory makes it possible to achieve further enhancement of the function.

Further, an IC card of the present invention is composed of any one of the semiconductor storage devices or the semiconductor devices of the present invention.

The IC card of the present invention can obtain the same effects as any one of the semiconductor storage devices or the semiconductor devices of the present invention. For example, the IC card is composed of a semiconductor device in which a nonvolatile memory, its peripheral circuit section, a logic circuit section, an SRAM (Static Random Access Memory) section or the like are easily mounted integrally to achieve cost reduction. This makes it possible to provide an IC card with a reduced cost.

Further, portable electronic equipment of the present invention is composed of any one of the semiconductor storage devices or the semiconductor device of the present invention.

The portable electronic equipment of the present invention can obtain the same effects as any one of the semiconductor storage devices or the semiconductor devices of the present invention. For example, a cell phone is composed of a semiconductor device in which a nonvolatile memory, its peripheral circuit section, a logic circuit section, an SRAM (Static Random Access Memory) section or the like are easily mounted integrally to achieve cost reduction. This makes it possible to provide a cell phone with a reduced cost.

A method for manufacturing a semiconductor storage device, comprises, in forming a semiconductor storage element constituted of a field effect transistor on a semiconductor substrate, the steps of:

forming a gate electrode on a semiconductor substrate via a gate insulator;

forming, on the semiconductor substrate, a coating film which is made of a dielectric having a function of storing electric charge formed on the semiconductor substrate in such a manner as to cover an upper surface and side surfaces of the gate electrode;

performing impurity implantation for forming a pair of source/drain diffusion regions on portions of the semiconductor substrate surface corresponding to opposite sides of the gate electrode and the coating film that are integrated together;

forming an interlayer insulator on the coating film;

with photoresist used as a mask, performing on the interlayer insulator an etching that is selective against the coating film to form, in regions including the source/drain diffusion regions, respectively, contact holes that extend vertically through the interlayer insulator; and with the interlayer insulator after the formation of the contact holes used as a mask, etching the coating film to make surfaces of the source/drain diffusion regions exposed into the contact holes, respectively.

According to the manufacturing method for semiconductor storage devices in this embodiment, the semiconductor storage device described first can be manufactured.

Further, since the coating film is formed so as to cover the upper surface and the side surface of the gate electrode, it is not necessary to allow for a large margin of alignment in designing the position to form the contact hole as required in an example described in the prior art, which makes it possible to decrease a space occupancy of the device and reduce the manufacturing cost. More specifically, in designing the position of the contact with use of the manufacturing method disclosed in the prior art, a capacity between the gate electrode and the contact member should be reduced, which necessitates designing the contact hole so as to be formed with a sufficient margin of alignment. However, according to the manufacturing method in the present embodiment, it is acceptable if the position of the contact hole is out of alignment and overlaps with the coating film (i.e., equivalent to a floating gate in the prior art). Therefore, unlike the prior art, it is not necessary to allow for a sufficient margin of alignment and form the contact hole away from the gate electrode and the floating gate in the consideration of the sufficient margin. Consequently, it becomes possible to form the contact and the coating film substantially with an overlap portion, by which a space occupancy per element can be significantly decreased and a semiconductor storage device with a low manufacturing cost can be provided.

Further, etching of the interlayer insulator can be stopped by the coating film. More specifically, stopping the etching by the coating film makes it possible to prevent the semiconductor substrate from being etched. As a result, it becomes possible to restrain contact failure and short-circuit between the source/drain diffusion regions and the semiconductor substrate. Therefore, a highly-reliable semiconductor storage device can be provided.

Further, with use of only the coating film, the charge retention function as well as a number of the above-stated functions can be fulfilled. More precisely, this semiconductor storage device can be manufactured from a regularly-structured MOSFET (Metal Oxide Semiconductor FET) only with addition of the coating film, which allows simplification of the manufacturing steps, making it possible to provide a semiconductor storage device with a low manufacturing cost.

In one embodiment of the method for manufacturing a semiconductor storage device, in the step of performing the impurity implantation for forming the source/drain diffusion regions, the gate electrode and portions of the coating film extending along side surfaces of the gate electrode are used integrally as an implantation mask.

In the manufacturing method for semiconductor storage devices in this one embodiment, each of spaces (offset regions) disposed between the gate electrode and the source/drain diffusion regions with respect to a channel direction is disposed below a portion of the coating film which extends along the side surface of the gate electrode. As a result, an inversion layer in the offset region is deleted or formed by depending on volumes of an amount of charges in the charge retention section in the coating film, which makes it possible to provide a semiconductor storage device with good write/erase characteristics. Moreover, since the source/drain diffusion regions can be formed under the coating film, a semiconductor storage element with large driving current can be provided. Further, since the above-structured source/drain diffusion regions can be formed so as to be self-aligned, it becomes possible to form a semiconductor storage device having the above effects with great ease.

In one embodiment of the method for manufacturing a semiconductor storage device, in the step of making the surfaces of the source/drain diffusion regions exposed into the contact holes, respectively, performing an anisotropic selective etchback on the coating film exposed into the contact holes.

According to the manufacturing method for semiconductor devices in this one embodiment, each of the contact holes can be easily formed on the surface of the source/drain diffusion regions.

In another aspect, a method for manufacturing a semiconductor storage device, comprising, in forming a semiconductor storage element constituted of a field effect transistor on a semiconductor substrate, the steps of:

forming a gate electrode on a semiconductor substrate surface via a gate insulator;

forming, on opposite sides of the gate electrode, respectively, memory function bodies each of which comprises a charge retention part made of a material having a function of storing electric charge, and an anti-dissipation dielectric having a function of preventing dissipation of stored charge;

forming, on the semiconductor substrate, a coating film made of a dielectric in such a manner as to cover an upper surface and side surfaces of the gate electrode and the memory function bodies that are integrated together;

performing impurity implantation for forming a pair of source/drain diffusion regions on portions of the semiconductor substrate surface corresponding to opposite sides of the gate electrode, the memory function bodies and the coating film that are integrated together;

forming an interlayer insulator on the coating film;

with photoresist used as a mask, performing on the interlayer insulator an etching that is selective against the coating film to form, in regions including the source/drain diffusion regions, respectively, contact holes that extend vertically through the interlayer insulator; and with the interlayer insulator after the formation of the contact holes used as a mask, etching the coating film to make surfaces of the source/drain diffusion regions exposed into the contact holes, respectively.

According to the manufacturing method for semiconductor devices of the present invention, the semiconductor storage device described second can be manufactured.

Like the aforementioned manufacturing method for semiconductor devices, it becomes possible to restrain contact failure and short-circuit between the source/drain diffusion regions and the semiconductor substrate, thereby allowing provision of a highly-reliable semiconductor storage device.

Further, the charges stored in the charge retention section in the memory function body are restrained from dissipating by the anti-dissipation dielectric. Therefore, a semiconductor storage device with a good retention characteristic can be provided. Also, the charges injected during reprogramming operation are also restrained from dissipating to the gate electrode and other nodes, which increases the charge injection efficiency, allowing higher-speed operation. Further, the memory function body and the gate electrode are covered with the coating film, which restrains outward diffusion of impurities that would cause depletion of impurities in the gate electrode, thereby boosting yield. Furthermore, the coating film can restrain retained charges in the memory function body from dissipating, making it possible to provide a semiconductor storage device with a further better retention characteristic and high reliability.

In one embodiment of the method for manufacturing a semiconductor storage device, in the step of performing the impurity implantation for forming the source/drain diffusion regions, the gate electrode and the memory function bodies and portions of the coating film extending along side surfaces of the gate electrode are used integrally as an implantation mask so as to provide a space between the gate electrode and each of the source/drain diffusion regions.

In the manufacturing method for semiconductor storage devices in this one embodiment, spaces (offset regions) are disposed between the gate electrode and the source/drain diffusion regions with respect to a channel direction. As a result, an inversion layer in each of the offset region is deleted or formed by the presence or absence of excessive electrons in the memory function body, as a result of which large hysteresis (threshold change) is obtained, making it possible to provide a semiconductor storage device with good write/erase characteristics. Furthermore, write/erase operations by hot carriers generated in the offset region are executable, allowing provision of a semiconductor storage device supporting 2-bit operation.

In another aspect, a semiconductor storage device in a first aspect of the present invention comprises:

a gate electrode formed on a semiconductor substrate via a gate insulator;

a channel formation region placed at least in a region under the gate electrode on the semiconductor substrate;

a pair of source/drain diffusion regions which are arranged on opposite sides of the channel formation region of the semiconductor substrate and which have a conductive type opposite to that of the channel formation region, an interlayer insulator formed at least above the gate electrode;

a coating film which is formed so as to cover an upper surface and side surfaces of the gate electrode and which is made of a dielectric having a function of retaining electric charge formed beside the interlayer insulator; and contact members which are formed beside the gate electrode via the coating film and which are electrically connected to the source/drain diffusion regions respectively, wherein the coating film is made of a material having such a selection ratio to the interlayer insulator that the material functions as an etching stopper material in etching of the interlayer insulator.

According to the semiconductor storage device in the first aspect of the invention, the charge retention section is formed not on the portion that functions as a gate insulator of the field effect transistor but on the lateral side of the gate electrode. This solves the problems of excessive erasing and read failure relevant thereto, the problems having been found in the prior art.

Further, the gate electrode and the contact member can be isolated by the coating film, in addition to which, a material of the coating film can be freely chosen from those different from the materials used for regular interlayer insulators. This allows increase in an insulating capability and reduction in a leak current amount, or reduction in a parasitic capacitance by the use of low dielectric constant materials. Therefore, further approximation between the contact and the gate electrode becomes possible, thereby achieving miniaturization of the element.

Further, etching of the interlayer insulator can be stopped by the coating film. More specifically, stopping the etching by the coating film makes it possible to restrain contact failure and short-circuit between the source/drain diffusion regions and the semiconductor substrate which are attributed to the semiconductor substrate being etched. Therefore, a highly-reliable semiconductor storage device can be provided.

Further, with use of only the coating film, the charge retention function as well as a number of the above-stated functions can be fulfilled, which allows simplification of the manufacturing steps, making it possible to provide a semiconductor storage device with a low manufacturing cost.

Further, since the coating film composed of an insulating film is formed on the upper side and the lateral side of the gate electrode, it is not necessary to allow for a large margin of alignment in designing the position to form the contact as required in the prior art, which makes it possible to decrease a space occupancy of the device and reduce the manufacturing cost.

A semiconductor storage device in a second aspect of the present invention comprises:

a gate electrode formed on a semiconductor substrate via a gate insulator;

a channel formation region placed at least in a region under the gate electrode on the semiconductor substrate;

a pair of source/drain diffusion regions which are arranged on opposite sides of the channel formation region of the semiconductor substrate and which have a conductive type opposite to that of the channel formation region, a third coating film made of a dielectric formed on an upper portion of the gate electrode;

a first coating film which is formed at least beside the gate electrode and beside the third coating film and which is made of a dielectric having a function of retaining electric charge;

an interlayer insulator formed at least above the third coating film; and contact members which are formed beside the gate electrode via the first coating film and which are electrically connected to the source/drain diffusion regions respectively, wherein the first coating film is made of a material having such a selection ratio to the interlayer insulator that the material functions as an etching stopper material in etching of the interlayer insulator.

According to the semiconductor storage device in the second aspect of the present invention, the charge retention section is formed not on the portion that functions as a gate insulator of the field effect transistor but on the lateral side of the gate electrode. This solves the problems of excessive erasing and read failure relevant thereto, the problems having been found in the prior art.

Further, the gate electrode and the contact member can be isolated by the coating film, in addition to which, a material of the first coating film can be freely chosen from those different from the materials used for regular interlayer insulators. This allows increase in an insulating capability and reduction in a leak current amount, or reduction in a parasitic capacitance by the use of low dielectric constant materials. Therefore, further approximation between the contact and the gate electrode becomes possible, thereby achieving miniaturization of the element.

Further, etching of the interlayer insulator can be stopped by the first coating film. More specifically, stopping the etching by the first coating film makes it possible to restrain contact failure and short-circuit between the source/drain diffusion regions and the semiconductor substrate which are attributed to the semiconductor substrate being etched. Therefore, a highly-reliable semiconductor storage device can be provided.

Further, with use of only the first coating film, two functions, which are the charge retention function and the function to stop the etching can be obtained, which allows simplification of the manufacturing steps, making it possible to provide a semiconductor storage device with a low manufacturing cost.

Further, since the first and third coating films composed of insulating films are formed on the upper side and the lateral side of the gate electrode, it is not necessary to allow for a large margin of alignment in designing the position to form the contact as required in the prior art, which makes it possible to decrease a space occupancy of the device and reduce the manufacturing cost.

A semiconductor storage device in a third aspect of the present invention comprises:

a gate electrode formed on a semiconductor substrate via a gate insulator;

a channel formation region placed at least in a region under the gate electrode on the semiconductor substrate;

a pair of source/drain diffusion regions which are arranged on opposite sides of the channel formation region of the semiconductor substrate and which have a conductive type opposite to that of the channel formation region, memory function bodies which are formed on opposite sides of the gate electrode and each of which comprises a charge retention part made of a material having a function of retaining electric charge, and an anti-dissipation dielectric having a function of preventing dissipation of electric charge retained in the charge retention part;

an interlayer insulator formed at least above the gate electrode;

a coating film which is formed so as to cover the gate electrode and the memory function bodies and which is made of a dielectric formed beside the interlayer insulator; and contact members which are formed beside the gate electrode via the coating film and which are electrically connected to the source/drain diffusion regions respectively, wherein the coating film is made of a material having such a selection ratio to the interlayer insulator that the material functions as an etching stopper material in etching of the interlayer insulator.

According to the semiconductor storage device in the third aspect of the present invention, the memory function body is formed not on the gate insulator section of the field effect transistor but on the lateral side of the gate electrode. This solves the problems of excessive erasing and read failure relevant thereto, the problems having been found in the prior art.

Further, the gate electrode and the contact member, as well as the memory function body and the contact member can be isolated by the coating film, in addition to which, a material of the coating film can be freely chosen from those different from the materials used for regular interlayer insulators. This allows increase in an insulating capability and reduction in a leak current amount, or reduction in a parasitic capacitance by the use of low dielectric constant materials. Therefore, further approximation between the contact and the gate electrode becomes possible, thereby achieving miniaturization of the element.

Further, the charges retained in the charge retention section having a function to retain charges are restrained from dissipating by the anti-dissipation dielectric having a function to prevent charges from dissipating. Therefore, a semiconductor storage device with a good retention characteristic can be provided.

Furthermore, the coating film can restrain retained charges in the memory function body from dissipating, making it possible to provide a semiconductor storage device with a further better retention characteristic and high reliability.

Further, since the coating film composed of an insulating film is formed on the upper side and the lateral side of the gate electrode, it is not necessary to allow for a large margin of alignment in designing the position to form the contact as required in the prior art, which makes it possible to decrease a space occupancy of the device and reduce the manufacturing cost.

In one embodiment of the semiconductor storage device in any one of the first to the third aspects of the present invention, the source/drain diffusion regions are so disposed as to be spaced from the gate electrode with respect to a channel direction.

According to the semiconductor storage device in the above embodiment, not only the effects of the semiconductor storage devices in the first and second aspects of the invention are implemented, but also the source/drain diffusion regions are not disposed below the gate electrode, i.e., the offset region remains below the coating film. Consequently, an inversion layer is deleted or formed by the presence or absence of excessive electrons in the charge retention section in the coating film, as a result of which large hysteresis (threshold change) can be gained, making it possible to provide a semiconductor storage device with good write/erase characteristics.

Furthermore, write/erase operations by hot carriers generated in the offset region are executable, allowing provision of a semiconductor storage device supporting 2-bit operation.

According to the semiconductor storage device in the above embodiment, not only the effects of the semiconductor storage device in the third aspect of the invention are implemented, but also the source/drain diffusion regions are not disposed below the gate electrode, i.e., the offset region remains below the coating film. Consequently, an inversion layer is deleted or formed by the presence or absence of excessive electrons in the charge retention section in the memory function body, as a result of which large hysteresis (threshold change) can be gained, making it possible to provide a semiconductor storage device with good write/erase characteristics.

Furthermore, write/erase operations by hot carriers generated in the offset region are executable, allowing provision of a semiconductor storage device supporting 2-bit operation.

In one embodiment of the semiconductor storage device in any one of the first to the third aspects of the present invention,
the semiconductor substrate and the gate electrode is made of silicon,
the gate insulator, the coating film and the interlayer insulator are made of silicon compound, and
the silicon compound of the coating film is silicon nitride.

According to the semiconductor storage device in above embodiment, the semiconductor substrate, the gate electrode, the gate insulator, the coating film and the interlayer insulator are made of silicon or silicon compounds that are widely used as materials of semiconductor devices today, and therefore a semiconductor process having an extremely high compatibility with the conventional semiconductor manufacturing process can be developed. This makes it possible to provide a semiconductor storage device with a low manufacturing cost.

Moreover, the coating film is made of a silicon nitride while the interlayer insulating and the device isolation region in the conventional semiconductor manufacturing process are made of a silicon oxide. Therefore, a large etching selectivity can be gained between the coating film and the interlayer insulator or the device isolation region. This makes it possible to develop a process which has an extremely high compatibility with the conventional semiconductor manufacturing process and allows constraint of contact failure and short-circuit between the source/drain diffusion regions and the semiconductor substrate. Therefore, a semiconductor storage device with a further lower manufacturing cost can be provided. Moreover, the nitride can hold a charge trap of about $1 \times 10^{12}$ cm$^{-2}$, making it possible to provide a semiconductor storage device having good write/erase characteristics.

In one embodiment of the semiconductor storage device of the third aspect of the present invention, each of the memory function bodies comprises:
a first dielectric as the anti-dissipation dielectric formed on opposite sides of the gate electrode;
nitride as the charge retention part formed at a side wall portion of the first dielectric; and
a side-wall dielectric as the anti-dissipation dielectric formed at a side wall portion of the nitride.

According to the semiconductor storage device in the above embodiment, the nitride can retain charges in a good condition, and the nitride interposed in between the first insulator and the side-wall insulator can effectively suppress dissipation of charges. Even if the insulating film leaks to deteriorate a retention characteristic of the memory, not all the charges retained in the first insulating film are leaked but only partial charges which are retained in the nitride in the vicinity of a leaking portion in the insulating film are leaked. Therefore, a semiconductor storage device with a good retention characteristic and extremely high long-term reliability is provided. Furthermore, the nitride can hold a charge trap of about $1 \times 10^{12}$ cm$^{-2}$, making it possible to provide a semiconductor storage device having good write/erase characteristics.

In one embodiment of the semiconductor storage device of the third aspect of the present invention, each of the memory function bodies comprises:
a first dielectric as the anti-dissipation dielectric formed on opposite sides of the gate electrode; and
a side-wall dielectric which is formed at a side wall portion of the first dielectric and which contains a plurality of fine particles as the charge retention part.

According to the semiconductor storage device in the above embodiment, the structure for retaining charges by means of a plurality of particulates, i.e., the structure in which a region having a function to retain charges is segmentalized into minute regions like particulates is adopted. Accordingly, even if the insulating film leaks to deteriorate a retention characteristic of the memory, not all the charges retained in a plurality of the particulates are leaked but only partial charges which are retained in the particulates (silicon dots) in the vicinity of a leaking portion in the insulating film are leaked. Therefore, a semiconductor storage device with a good retention characteristic and extremely high long-term reliability is provided. Further, as one example, the regions made from a material having a function to retain charges may be formed into, for example, a nanodot-like structure which is large enough to produce the Coulomb blockade effect. Therefore, due to the Coulomb blockade effect, the memory effect is significantly enhanced.

In one embodiment of the semiconductor storage device of the third aspect of the present invention, each of the memory function bodies comprises:
a first dielectric as the anti-dissipation dielectric formed on opposite sides of the gate electrode;
the charge retention part formed at a side wall portion of the first dielectric; and
a side-wall dielectric as the anti-dissipation dielectric which is formed so as to sandwich the charge retention part in cooperation with the first dielectric, wherein
the charge retention part is narrower in width than the memory function bodies.

According to the semiconductor storage device in the above embodiment, the region into which electrons are injected in the write process is limited to the vicinity of a channel, which facilitates removal of electrons in the erase process, enabling accidental erasing to be prevented.

Further, a volume of the charge retention section for retaining charges is decreased while an amount of charges to be injected is unchanged, enabling an amount of charges per unit volume to be increased. This allows effective write/erase operations with use of electrons, making it possible to provide a semiconductor storage device with a high write/erase speed.

Furthermore, since the side wall of the charge retention section is covered with the side-wall insulator, the charge retention section and the contact are prevented from being short-circuited during the step for forming a contact to the source/drain diffusion regions. Therefore, a required margin of alignment between the contact and the memory function body in design is reduced, by which the device is miniaturized. Therefore, a semiconductor storage device with a reduced cost can be provided.

In one embodiment of the semiconductor storage device of the third aspect of the present invention, each of the memory function bodies comprises:
a first dielectric as the anti-dissipation dielectric formed on opposite sides of the gate electrode;
the charge retention part formed at a side wall portion of the first dielectric; and
a side-wall dielectric as the anti-dissipation dielectric which is formed so as to cover the charge retention part, wherein
the charge retention part is narrower in width than the memory function bodies, lower in height than the memory function bodies, and covered with the side-wall dielectric in contact with the first dielectric.

According to the semiconductor storage device in the above embodiment, there is provided a charge retention section which is scaled down so as to be smaller in width than the memory function body and smaller in height than the memory function body. Consequently, the region into which electrons are injected in the write process is limited to a small region in the vicinity of a channel, which facilitates removal of electrons in the erase process, enabling accidental erasing to be prevented.

Further, a volume of the charge retention section for retaining charges is decreased while an amount of charges to be injected is unchanged, enabling an amount of charges per unit volume to be increased. This allows effective write/erase operations with use of electrons, making it possible to provide a semiconductor storage device with a high write/erase speed.

Further, since the charge retention section is completely covered with the side-wall insulator, the charge retention section and the contact are prevented from being short-circuited during the step for forming a contact to the gate electrode. Therefore, a required design contact margin is further reduced, by which a space occupancy is miniaturized. This makes it possible to provide a semiconductor storage device with a reduced manufacturing cost.

In one embodiment of the semiconductor storage device of the third aspect of the present invention, each of the memory function bodies comprises:
a side-wall dielectric which serves as the anti-dissipation dielectric formed on opposite sides of the gate electrode and which internally contains a plurality of fine particles as the charge retention part;
a film which is made of a conductor or semiconductor and which is placed between the side-wall dielectric and the gate electrode and between the side-wall dielectric and the semiconductor substrate; and
a first dielectric as the anti-dissipation dielectric which is placed between the film made of a conductor or semiconductor and the gate electrode and between the film made of a conductor or semiconductor and the semiconductor substrate.

According to the semiconductor storage device in the above embodiment, a film made of a conductor or semiconductor is disposed between the semiconductor substrate and a plurality of the particulates, which makes it possible to control dispersion in threshold voltages and driving current values of the field effect transistor caused by dispersion in the position and the size of the particulates serving as the charge retention section formed on the opposite sides of the gate electrode. This allows provision of a semiconductor storage device of high reliability with accidental read operations being suppressed.

Further, in one embodiment of the semiconductor storage device, the first insulator and the side-wall insulator are made of a silicon oxide or a silicon nitride, the charge retention section is made of polysilicon, and the particulates are made of silicon.

According to the semiconductor storage device in the above embodiment, the charge retention section is made of polysilicon, so that a charge-injection amount can be controlled. This allows multilevel control over the charge-injection amount, resulting in reduction in a manufacturing cost per bit. Further, since the particulates are also made of silicon, which is an essentially standard material for use in the LSI (Large Scale Integrated Circuit) process, the manufacturing cost thereof can be reduced.

Further in one embodiment of the semiconductor storage device, the charge retention section is made of a silicon nitride.

According to the semiconductor storage device in the above embodiment, the charge retention section is made of a silicon nitride and the side-wall insulator is made of a silicon oxide or a silicon nitride, which brings about levels of about $1\times10^{12}$ cm$^{-2}$ for trapping charges, making it possible to obtain a large hysteresis characteristic. Moreover, since charge retention time is long, a problem of leakage of charges caused by generation of a leakage path is suppressed, which improves the retention characteristic. Further, since these materials are essentially standard materials for use in the LSI process, the manufacturing cost thereof can be reduced.

A semiconductor storage device in a fourth aspect of the present invention according to any one of the first to the third aspects of the present invention, further comprises a device isolation region which is so placed as to electrically isolate source/drain diffusion regions of mutually neighboring semiconductor storage elements from each other.

Conventionally, the devices have been manufactured based on the design allowing for a sufficient margin of alignment between a contact and a device isolation region so that the device isolation region would not be etched away in the etching process for forming contact holes. However, according to the present invention, for example, a nitride can be used as a material of the coating film. Accordingly, if an oxide is primarily used as the material of the device isolation region, it is possible to design the device without allowing for a sufficient margin of alignment between the device isolation region and the contact, allowing provision of a semiconductor storage device with a smaller space occupancy and a reduced manufacturing cost.

Further in one embodiment of the semiconductor storage device, in the semiconductor storage device as defined in any one of the first to the third aspects of the present invention, the semiconductor substrate and the gate electrode are made of silicon, the gate insulator, the coating film and the interlayer insulator are made of silicon compounds, the coating film is made of a silicon nitride, and the device isolation region is primarily made of an oxide.

Conventionally, the devices have been manufactured based on the design allowing for a sufficient margin of alignment between a contact and a device isolation region so that the device isolation region would not be etched away in the etching process for forming contact holes. However, according to the semiconductor storage device in the above embodiment, it is possible to design the device without allowing for a sufficient margin of alignment between the device isolation region and the contact, allowing provision of a semiconductor storage device with a smaller space occupancy and a reduced manufacturing cost.

A semiconductor device in a fifth aspect of the present invention in which a memory area having the semiconductor storage device according to any one of the first to the third aspects of the present invention and a logic circuit area having the semiconductor switching element are disposed on a semiconductor substrate, wherein each of the semiconductor storage device and the semiconductor switching element is a field effect transistor having a gate electrode, and a pair of source/drain diffusion regions formed on portions of a semiconductor substrate surface corresponding to opposite sides of the gate electrode; and the semiconductor switching element not only has the structure of the semiconductor storage device but also extends so that at least part of the source/drain diffusion regions is placed under the gate electrode on the semiconductor substrate surface.

According to the above-structured semiconductor device, the semiconductor switching device with displacement (offset) of the source/drain diffusion regions from the end portions of the gate electrode and the semiconductor storage device without displacement (offset) can be integrally mounted on the same substrate, allowing integral mounting of a nonvolatile semiconductor storage device having a good memory effect and a semiconductor switching device with a high current driving capability.

Moreover, in the case where the memory function body is formed on both the semiconductor storage device and the semiconductor switching device, their manufacturing process has no significant difference, making it possible to provide a semiconductor storage device which easily implements integral mounting of a logic circuit or the like composed of the semiconductor switching device and a nonvolatile semiconductor memory circuit composed of the semiconductor storage device.

Further, in the conventional flash memories, the charge retention section was positioned below the gate electrode and therefore their capability was limited to that of a field effect transistor with a thick gate insulator. However, in the nonvolatile semiconductor storage device in this invention, the charge retention section can be formed independently of the gate insulator as it is positioned on the lateral side of the gate electrode, making it possible to provide a semiconductor storage device to which an advanced MOSFET manufacturing process can be easily applied and a semiconductor device on which the semiconductor storage device is integrally mounted.

Further, a plurality of the semiconductor switching devices constitute a logic circuit region, and a plurality of the semiconductor storage devices constitute a memory region, which makes it possible to fulfill a semiconductor device having the above effects and including the logic circuit region and the memory region which are easily mounted integrally on the same substrate.

Further in one embodiment of the semiconductor device, in the fifth aspect of the present invention, the semiconductor storage device constitutes a nonvolatile memory section.

According to the semiconductor storage device in the above embodiment, the semiconductor switching device constitutes the logic circuit section while the semiconductor storage device constitutes the nonvolatile memory section, making it possible to fulfill a semiconductor device in which a logic circuit section having the effects of the semiconductor device in the fifth aspect of the invention and a nonvolatile memory section having the effects of the semiconductor storage device in the first to third aspects of the invention are easily mounted integrally on the same semiconductor substrate.

Further in one embodiment of the semiconductor device, the semiconductor device in the fifth aspect of the present invention has the logic circuit region which is driven by a power supply voltage lower than a power supply voltage supplied to the memory region.

In the semiconductor device in the above embodiment, a high power supply voltage can be supplied to the nonvolatile memory section, which achieves considerable increase in write/erase speed. Further, a low power supply voltage can be supplied to the logic circuit section, which makes it possible to suppress deterioration of transistor characteristics caused by destruction of the gate insulator or the like, thereby achieving further lower power consumption. Therefore, it becomes possible to fulfill a semiconductor device having a logic circuit section with high reliability and a nonvolatile memory section with a considerably high write/erase speed, which are easily mounted integrally on the same substrate.

Further in one embodiment of the semiconductor device, in the semiconductor device in the fifth aspect of the present invention, the semiconductor storage device further constitutes a static random access memory.

In the semiconductor device in the above embodiment, the semiconductor storage device constitutes a logic circuit section and a static random access memory, while the semiconductor storage element constitutes a nonvolatile memory section. This makes it possible to fulfill a semiconductor device having any one of the effects of the first to third aspects of the invention and including a logic circuit section, a static random access memory and a nonvolatile memory section, all of which are easily mounted integrally on the same substrate. Furthermore, integral mounting the static random access memory as a high-speed temporary storage memory makes it possible to achieve further enhancement of the function of the semiconductor device.

Further, an IC card of a sixth aspect of the present invention is composed of any one of the semiconductor storage devices in the first to third aspects of the invention or the semiconductor device of the fifth aspect of the invention.

According to the IC card of the sixth aspect of the present invention, an IC card having the same effects as those of the first to third aspects of the invention or the fifth aspect of the invention can be provided. For example, the IC card is composed of a semiconductor device in which a nonvolatile memory, its peripheral circuit section, a logic circuit section, an SRAM section or the like are easily mounted integrally to achieve cost reduction. This makes it possible to provide an IC card with a reduced cost.

Further, portable electronic equipment of the seventh aspect of the present invention is composed of any one of the semiconductor storage devices in the first to third aspects of the invention or the semiconductor device of the fifth aspect of the invention.

According to the portable electronic equipment of the seventh aspect of the present invention, portable electronic equipment having the same effects as those of the first to third aspects of the invention or the fifth aspect of the invention can be provided. For example, a cell phone is composed of a semiconductor device in which a nonvolatile memory, its peripheral circuit section, a logic circuit section, an SRAM section or the like are easily mounted integrally to achieve cost reduction. This makes it possible to provide portable electronic equipment with a reduced cost.

A method for manufacturing a semiconductor storage device in an eighth aspect of the present invention, comprises the steps of:

forming a gate electrode on a semiconductor substrate via a gate insulator;

after the formation of the gate electrode, forming a first coating film made of a dielectric having a function of retaining electric charge so as to cover the semiconductor substrate and the gate electrode;

forming an interlayer insulator above the first coating film;

with the first coating film used as an etching stopper material, performing an anisotropic selective etching on the interlayer insulator to form contact holes;

removing the first coating film exposed into the contact holes to make part of the side wall and upper surface of the gate electrode exposed; and after the removal of the first coating film, forming a second coating film made of a dielectric having a function of retaining electric charge, at least on the side wall and upper surface of the gate electrode newly exposed into the contact holes.

According to the manufacturing method for semiconductor storage devices in the eighth aspect of the present invention, etching of the interlayer insulator is performed under an etching condition of high selectivity against the coating film, and therefore stopping the etching by the coating film makes it possible to restrain contact failure and short-circuit between the source/drain diffusion regions and the semiconductor substrate which are attributed to the semiconductor substrate being etched. Therefore, a highly-reliable semiconductor storage device can be provided. Moreover, with use of only the coating film, two functions, which are a memory function and a function to stop the etching can be obtained, which allows simplification of the manufacturing steps, making it possible to provide a semiconductor storage device with a low manufacturing cost.

A method for manufacturing a semiconductor storage device in a ninth aspect of the present invention, comprises the steps of:

forming a gate electrode on a semiconductor substrate via a gate insulator;

after the formation of the gate electrode, forming a first coating film made of a dielectric having a function of retaining electric charge so as to cover the semiconductor substrate and the gate electrode;

forming an interlayer insulator above the first coating film;

with the first coating film used as an etching stopper material, performing an anisotropic selective etching on the interlayer insulator to form contact holes;

performing an anisotropic selective etchback on the first coating film exposed into the contact holes so that part of the upper surface of the gate electrode and the semiconductor substrate are exposed with a side-wall configuration still left in the side surfaces of the gate electrode; and after the exposure of the semiconductor substrate, forming a second coating film at least on an upper surface of the gate electrode newly exposed into the contact holes.

According to the manufacturing method for semiconductor storage devices in the ninth aspect of the present invention, etching of the interlayer insulator is performed under an etching condition of high selectivity against the coating film, and therefore stopping the etching by the coating film makes it possible to restrain contact failure and short-circuit between the source/drain diffusion regions and the semiconductor substrate which are attributed to the semiconductor substrate being etched. Therefore, a highly-reliable semiconductor storage device can be provided. Moreover, with use of only the coating film, two functions, which are a memory function and a function to stop the etching can be obtained, which allows simplification of the manufacturing steps, making it possible to provide a semiconductor storage device with a low manufacturing cost.

A method for manufacturing a semiconductor storage device in a tenth aspect of the present invention, comprises the steps of:

forming a gate electrode on a semiconductor substrate via a gate insulator;

forming a third coating film above the gate electrode;

after the formation of the third coating film, forming a first coating film made of a dielectric having a function of retaining electric charge so as to cover the semiconductor substrate, the gate electrode and the third coating film;

forming an interlayer insulator above the first coating film;

with the first coating film used as an etching stopper material, performing an anisotropic selective etching on the interlayer insulator to form contact holes;

performing an anisotropic selective etchback on the first coating film exposed into the contact holes so that the semiconductor substrate is exposed with a side-wall configuration still left in the side surfaces of the gate electrode.

According to the manufacturing method for semiconductor storage devices in the tenth aspect of the present invention, etching of the interlayer insulator is performed under an etching condition of high selectivity against the first coating film, and therefore stopping the etching by the first coating film makes it possible to restrain contact failure and short-circuit between the source/drain diffusion regions and the semiconductor substrate which are attributed to the semiconductor substrate being etched. Therefore, a highly-reliable semiconductor storage device can be provided. Moreover, with use of only the first coating film, two functions, which are a memory function and a function to stop the etching can be obtained, which allows simplification of the manufacturing steps, making it possible to provide a semiconductor storage device with a low manufacturing cost.

One embodiment of the method for manufacturing a semiconductor storage device, further comprises the step of, after the formation of the first coating film, performing impurity implantation to form source/drain diffusion regions in a self-alignment fashion so as to be spaced from the gate electrode in a channel direction.

According to the manufacturing method for semiconductor storage devices in the above embodiment, the source/drain diffusion regions are not disposed below the gate electrode, i.e., the offset region remains below the coating film. Consequently, an inversion layer is deleted or formed by the presence or absence of excessive electrons in the charge retention section in the coating film, as a result of which large hysteresis (threshold change) can be gained, making it possible to provide a semiconductor storage device with good write/erase characteristics.

Furthermore, write/erase operations by hot carriers generated in the offset region are executable, allowing provision of a semiconductor storage device supporting 2-bit operation.

A method for manufacturing a semiconductor storage device in an eleventh aspect of the present invention, comprises the steps of:

forming a gate electrode on a semiconductor substrate via a gate insulator;

after the formation of the gate electrode, forming, on side walls of the gate electrode, memory function bodies each of which comprises a charge retention part made of a material having a function of retaining electric charge, and an anti-dissipation dielectric having a function of preventing dissipation of electric charge retained in the charge retention part;

after the formation of the memory function bodies, forming a first coating film so as to cover the semiconductor substrate, the gate electrode and the memory function bodies;

forming an interlayer insulator above the first coating film;

with the first coating film used as an etching stopper material, performing an anisotropic selective etching on the interlayer insulator to form contact holes;

removing the first coating film exposed into the contact holes to make part of the side wall and upper surface of the memory function bodies exposed; and after the step of removing the first coating film, forming a second coating film on the side wall and upper surface of the memory function bodies newly exposed into the contact holes.

According to the manufacturing method for semiconductor storage devices in the eleventh aspect of the present invention, contact failure as well as short-circuit between the source/drain diffusion regions and the semiconductor substrate may be suppressed as with the eighth aspect of the invention, allowing provision of a semiconductor storage device with high reliability.

Further, the charges retained in the charge retention section having a function to retain charges are restrained from dissipating by the anti-dissipation dielectric having a function to prevent charges from dissipating. Therefore, a semiconductor storage device with a good retention characteristic can be provided. Also, the charges injected during reprogramming operation are also restrained from dissipating to the gate electrode and other nodes, which increases the charge injection efficiency, allowing higher-speed operation. Further, the memory function bodies and the gate electrode are covered with the first and second coating films, which restrains outward diffusion of impurities that would cause depletion of impurities in the gate electrode, thereby boosting yield. Furthermore, the first and second coating films can restrain retained charges in the memory function body from dissipating, making it possible to provide a semiconductor storage device with a further better retention characteristic and high reliability.

A method for manufacturing a semiconductor storage device in a twelfth aspect of the present invention, comprises the steps of:

forming a gate electrode on a semiconductor substrate surface via a gate insulator;

after the formation of the gate electrode, forming, on side walls of the gate electrode, memory function bodies each of which comprises a charge retention part made of a material having a function of retaining electric charge, and an anti-dissipation dielectric having a function of preventing dissipation of electric charge retained in the charge retention part;

after the formation of the memory function bodies, forming a first coating film so as to cover the semiconductor substrate, the gate electrode and the memory function bodies;

forming an interlayer insulator above the first coating film;

with the first coating film used as an etching stopper material, performing an anisotropic selective etching on the interlayer insulator to form contact holes;

performing an anisotropic selective etchback on the first coating film exposed into the contact holes so that part of the upper surface of the gate electrode and the semiconductor substrate are exposed with a side-wall configuration still left in the side surfaces of the gate electrode; and after making the semiconductor substrate exposed, forming a second coating film at least on the upper surface of the gate electrode newly exposed into the contact holes.

According to the manufacturing method for semiconductor storage devices in the twelfth aspect of the present invention, contact failure as well as short-circuit between the source/drain diffusion regions and the semiconductor substrate may be suppressed as with the ninth aspect of the invention, allowing provision of a semiconductor storage device with high reliability.

Further, the charges retained in the charge retention section having a function to retain charges are restrained from dissipating by the anti-dissipation dielectric having a function to prevent charges from dissipating. Therefore, a semiconductor storage device with a good retention characteristic can be provided. Also, the charges injected during reprogramming operation are also restrained from dissipating to the gate electrode and other nodes, which increases the charge injection efficiency, allowing higher-speed operation. Further, the memory function bodies and the gate electrode are covered with the first and second coating films, which restrains outward diffusion of impurities that would cause depletion of impurities in the gate electrode, thereby boosting yield. Furthermore, the first and second coating films can restrain retained charges in the memory function body from dissipating, making it possible to provide a semiconductor storage device with a further better retention characteristic and high reliability.

A method for manufacturing a semiconductor storage device in a thirteenth aspect of the present invention, comprises the steps of:

forming a gate electrode on a semiconductor substrate via a gate insulator;

after the formation of the gate electrode, forming, on side walls of the gate electrode, memory function bodies each of which comprises a charge retention part made of a material having a function of retaining electric charge, and an anti-dissipation dielectric having a function of preventing dissipation of electric charge retained in the charge retention part;

after the formation of the memory function bodies, forming a third coating film above the gate electrode;

forming a first coating film so as to cover the semiconductor substrate, the gate electrode, the third coating film and the memory function bodies;

forming an interlayer insulator above the first coating film;

with the first coating film used as an etching stopper material, performing an anisotropic selective etching on the interlayer insulator to form contact holes;

performing an anisotropic selective etchback on the first coating film exposed into the contact holes so that the semiconductor substrate is exposed with a side-wall configuration still left in the side surfaces of the gate electrode.

According to the manufacturing method for semiconductor storage devices in the thirteenth aspect of the present invention, contact failure as well as short-circuit between the source/drain diffusion regions and the semiconductor substrate may be suppressed as with the tenth aspect of the invention, allowing provision of a semiconductor storage device with high reliability.

Further, the charges retained in the charge retention section having a function to retain charges are restrained from dissipating by the anti-dissipation dielectric having a function to prevent charges from dissipating. Therefore, a semiconductor storage device with a good retention characteristic can be provided. Also, the charges injected during reprogramming operation are also restrained from dissipating to the gate electrode and other nodes, which increases the charge injection efficiency, allowing higher-speed operation. Further, the memory function bodies and the gate electrode are covered with the first and third coating films, which restrains outward diffusion of impurities that would cause depletion of impurities in the gate electrode, thereby boosting yield. Furthermore, the first and third coating films can restrain retained charges in the memory function body from dissipating, making it possible to provide a semiconductor storage device with a further better retention characteristic and high reliability.

Further, a manufacturing method for semiconductor storage devices in one embodiment is composed of the step of:

forming a gate electrode on a semiconductor substrate via a gate insulator, forming a memory function body composed of an insulator, a semiconductor or a conductor having a function to retain charges and an anti-dissipation dielectric having a function to prevent charges from dissipating on a side wall of the gate electrode, injecting impurities to form source/drain diffusion regions in a self-aligning way in a channel direction with respect to the gate electrode with a space interposed therebetween;

forming a coating film above the semiconductor substrate, above the gate electrode and on a lateral side of the gate electrode via the memory function body;

forming an interlayer insulator above the coating film;

forming a contact hole on the interlayer insulator by anisotropic selective etching, and removing the coating film under the contact hole.

According to the manufacturing method for semiconductor devices in the above embodiment, contact failure as well as short-circuit between the source/drain diffusion regions and the semiconductor substrate may be suppressed, allowing provision of a semiconductor storage device with high reliability.

Further, the charges retained in the insulator, the semiconductor or the conductor having a function to retain charges are restrained from dissipating by the anti-dissipation dielectric having a function to prevent charges from dissipating. Therefore, a semiconductor storage device with a good retention characteristic can be provided. Also, the charges injected during reprogramming operation are also restrained from dissipating to the gate electrode and other nodes, which increases the charge injection efficiency, allowing higher-speed operation. Further, the memory function body and the gate electrode are covered with the coating film, which restrains outward diffusion of impurities that would cause depletion of impurities in the gate electrode, thereby boosting yield. Furthermore, the coating film can restrain retained charges in the memory function body from dissipating, making it possible to provide a semiconductor storage device with a further better retention characteristic and high reliability. Further, the source/drain diffusion regions are not disposed below the gate electrode, i.e., the offset region remains below the memory function body. Consequently, an inversion layer is deleted or formed by the presence or absence of excessive electrons in the memory function body, as a result of which large hysteresis (threshold change) can be gained, making it possible to provide a semiconductor storage device with good write/erase characteristics. Furthermore, write/erase operations by hot carriers generated in the offset region are executable, allowing provision of a semiconductor storage device supporting 2-bit operation.

In the method for manufacturing a semiconductor storage device in any one of the eighth to the tenth aspects of the present invention, the coating film is a nitride film.

According to the manufacturing method for semiconductor storage devices in the above embodiment, a first coating film made of a nitride, that is an insulating film having a function to retain charges, is formed above and on the lateral side of the gate electrode. Consequently, it is not necessary to allow for a large margin of alignment in designing the position to form the contact as required in the prior art, which makes it possible to decrease a space occupancy of the device and reduce the manufacturing cost.

Further, etching to form contact holes on the interlayer insulator in the relevant step is performed under an etching condition of high selectivity against the coating film, and therefore stopping the etching by the coating film makes it possible to restrain contact failure and short-circuit between the source/drain diffusion regions and the semiconductor substrate which are attributed to the semiconductor substrate being etched. Moreover, with use of only the coating film, two functions, which are a memory function and a function to stop the etching can be obtained, which allows simplification of the manufacturing steps, making it possible to provide a semiconductor storage device with a low manufacturing cost.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A to 4E are schematic cross sectional views showing manufacturing steps of a semiconductor storage device in a fourth embodiment of the present invention;

FIGS. 5A to 5G are schematic cross sectional views showing manufacturing steps of a semiconductor storage device in a fifth embodiment of the present invention;

FIG. 26 is a schematic cross sectional view showing a semiconductor storage device in a twentieth embodiment of the present invention;

FIGS. 30A and 30B are schematic block diagrams each showing an IC card in a twenty second embodiment of the present invention, respectively;

FIG. 32A is a circuit diagram showing a memory cell array in a semiconductor storage device in a twenty fourth embodiment of the present invention, while

FIG. 33A is a schematic cross sectional view showing a first memory cell array taken along the cross sectional line C-C of FIG. 32B, while

DETAILED DESCRIPTION OF THE PREFERRED EMBODIMENTS

Hereinbelow, the present invention will be described in detail in conjunction with the embodiments with reference to accompanying drawings.

First Embodiment

Figure 1A:
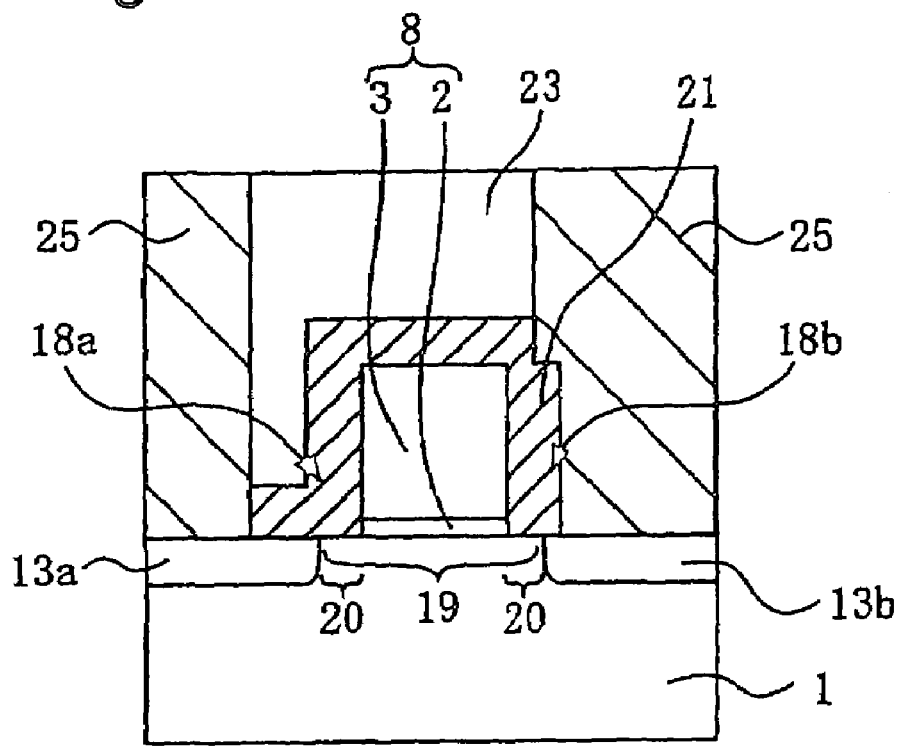
FIGS. 1A and 1B are schematic cross sectional views each showing a structure of a semiconductor storage device in a first embodiment of the present invention, respectively.

FIG. 1A shows a cross sectional structure of a semiconductor storage element of a first embodiment embodying a semiconductor storage device in the present invention.

The semiconductor storage element is formed on a semiconductor substrate 1, on which a gate electrode 3 is formed via a gate insulator 2, the gate insulator 2 and the gate electrode 3 forming a gate stack 8. On the semiconductor substrate under the gate electrode 3, there is formed a channel formation region 19, on the opposite sides of which source/drain diffusion regions having a conductivity type opposite to that of the channel formation region 19 are formed. Further, the upper surface and the side surfaces of the gate electrode 3 and a part of the semiconductor substrate are covered with a coating film 21. In this case, the coating film 21 is a silicon nitride having trap levels to hold charges. Opposite side-wall portions of the gate stack 8 in the coating film 21 respectively serve as charge retention sections 18a, 18b for substantially storing charges. Further, a structure that characterizes the present invention is the structure of the coating film 21 and an interlayer insulator 23 formed thereon. By etching the coating film 21 covering the gate electrode 3 with use of the interlayer insulator 23 as a mask, the structure of the coating film 21 is formed as shown in the drawing. It means that the relation between the coating film 21 and the interlayer insulator 23 corresponds to the relation between an etching film and an etching mask. On the side surface portion of the coating film 21 and the interlayer insulator 23, there are formed contacts 25 composed of a contact member filled in contact holes. The contact 25 extends through the interlayer insulator 23 and the coating film 21 in vertical direction on both the source/drain diffusion regions 13a, 13b and is electrically connected to the source/drain diffusion regions. Further, the gate electrode 3 is covered with the coating film 21, which restrains outward diffusion of impurities that would cause depletion of impurities in the gate electrode 3, thereby boosting yield.

The source/drain diffusion regions 13a, 13b function respectively as a source region or a drain region of a field effect transistor. The semiconductor storage element has an offset structure. That is, with respect to a channel direction, spaces (referred to as "offset region") 20, 20 are provided between the gate electrode 3 and the source/drain diffusion regions 13a, 13b, each of the offset region 20 being covered with a portion of the coating film 21 that extends along the side surface of the gate stack 8.

According to the above-structured semiconductor storage element, unlike the prior art, a charge retention section is formed not on the portion that functions as a gate insulator of the field effect transistor in the semiconductor storage device but on the lateral side of the gate electrode. This solves the problems of excessive erasing attributed to a structural defect and read failure relevant thereto, the problems having been found in the prior art.

Further, since the gate electrode and the contact member can be isolated by the coating film, it is possible to freely choose a material from those different from the materials used for regular interlayer insulators, allowing increase in an insulating capability and reduction in a leak current amount, or reduction in a parasitic capacitance by the use of low dielectric constant materials. Therefore, further approximation between the contact and the gate electrode becomes possible, thereby achieving miniaturization of the element.

Further, etching of the interlayer insulator can be stopped by the coating film. More specifically, stopping the etching by the coating film makes it possible to prevent the semiconductor substrate from being etched. As a result, it becomes possible to restrain contact failure and short-circuit between the source/drain diffusion regions and the semiconductor substrate. Therefore, a highly-reliable semiconductor storage device can be provided.

Further, since the coating film composed of an insulator is formed above and on the lateral side of the gate electrode, it is not necessary to allow for a large margin of alignment in designing the position to form the contact member, which makes it possible to decrease a space occupancy of the device and reduce the manufacturing cost. More specifically, in designing the position of the contact member with use of the manufacturing method disclosed in the prior art, a capacity between the gate electrode and the contact member should be reduced, which necessitates designing the contact hole so as to be formed with a sufficient margin of alignment. However, according to the manufacturing method in the present invention, even if the position of the contact hole is out of alignment and overlaps with the coating film (i.e., equivalent to a floating gate in the prior art), the coating film in the final state remains on the side-wall portion of the gate electrode, so that a capacity between the gate electrode and the contact member is sufficiently diminished. According to the present invention, therefore, compared to the prior art, it is not necessary to allow for a sufficient margin of alignment and form the contact hole away from the gate electrode (control gate) and the charge retention section (floating gate) in consideration of the sufficient margin, and therefore it becomes possible to form the contact hole and the charge retention section (floating gate in the prior art) substantially with an overlap portion. Therefore, a space occupancy per element can be significantly decreased and a semiconductor storage device with a low manufacturing cost can be provided.

Further, with use of only the coating film, the charge retention function as well as a number of the above-stated functions can be fulfilled, which allows simplification of the manufacturing steps, making it possible to provide a semiconductor storage device with a low manufacturing cost.

Further in the manufacturing steps of the semiconductor storage element, the coating film 21 has several functions to reduce a space occupancy of a device concerning the contact in the manufacturing steps described below, restrains contact failure, and further has a function as a charge retention section for storing charges. A plurality of these functions are achieved by simply forming the coating film 21, which allows simplification of the manufacturing steps, making it possible to provide a semiconductor storage device with a low manufacturing cost.

In the semiconductor storage device of the present invention, the coating film 21 is formed so as to cover a part of the gate electrode 3 and the semiconductor substrate. As the coating film, an insulating film should preferably be used so that interconnection lines and an electrode can be electrically isolated. Further, as the coating film, a material which is other than a material of a device isolation region or a device isolation region embedding material and which allows selective etching should preferably be used in order to prevent the device isolation region from being etched during etching to form contact holes. Since a silicon oxide is widely used as the material of the device isolation region or the device isolation region embedding material, a silicon nitride should be used as the coating film.

Moreover, the offset region 20 is covered with a portion (charge retention section) of the coating film 21 extending along the side surface of gate stack 8. Therefore, an inversion layer is deleted or formed by the presence or absence of excessive electrons in the charge retention section in the coating film, as a result of which large hysteresis (threshold change) is obtained, making it possible to provide a semiconductor storage device with good write/erase characteristics. Furthermore, since the semiconductor storage element of the present invention has an offset structure, it can store 2-bit information.

Figure 1B:
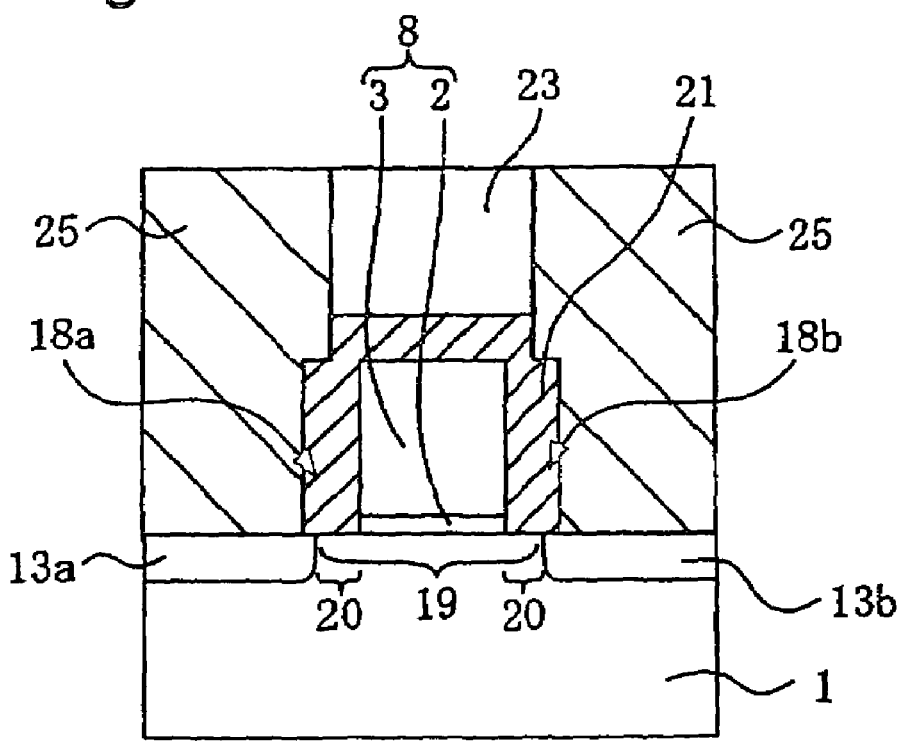

FIG. 1B shows a structure which brings about the same effects as those in FIG. 1A and allows further miniaturization of the deice. In FIG. 1A, only one side of the contact 25 overlaps with the gate electrode side-wall portion of the coating film 21, and the other contact does not overlap with the gate electrode side-wall portion of the coating film 21. According to this structure, only one side of the contact is close to the gate electrode, and therefore a space occupancy of the device is increased by the other side of the contact. However, according to the structure of FIG. 1B, the both contacts overlap with the gate electrode side-wall portion of the coating film 21, which miniaturizes the device more than the structure shown in FIG. 1A.

In the following embodiments, description will be given by presenting not the structure in which only one side of the contact 25 overlaps with the gate electrode side-wall portion of the coating film 21 as shown in FIG. 1A but the structure in which the both of the contacts overlap with the gate electrode side-wall portion of the coating film 21 as shown in FIG. 1B. It should be understood, however, that the aforementioned effects are still fulfilled with use of the structure in which only one side of the contact 25 overlaps with the gate electrode side-wall portion of the coating film 21 as shown in FIG. 1A.

It is to be noted that in FIGS. 1A and 1B, the charge retention sections 18a, 18b (collectively designated by reference numeral 18 as appropriate) may have a structure in which quantum dots of nanometer sizes (nanodot) are found scattering in the insulating film. In this case, the aforementioned same effects can also be fulfilled. For example, in the semiconductor storage element stated in FIGS. 1A and 1B, the coating film 21 covers the side surfaces and the upper surface of the gate stack 8, though the charge retention section 18 for substantially retaining charges locates at the opposite side-wall portions of the gate electrode. This means that a function to retain charges or a material to retain polarization should be disposed on these regions. Therefore, forming nanodots in these regions further improves the retention characteristic.

Description is now given of the write operation principle of the semiconductor storage element.

The term "write" herein refers to injecting electrons in the charge retention section 18 if the semiconductor storage element is of an N-channel type. Hereinbelow, description will be given on the assumption that the semiconductor storage element should be of the N-channel type.

In order to inject electrons (write) in the second charge retention section 18b, the first source/drain diffusion region 13a (having N-type conductivity) is set to be a source electrode, while the second source/drain diffusion region 13b (having N-type conductivity) is set to be a drain electrode. For example, a voltage of 0V should be applied to the first source/drain diffusion region 13a and the semiconductor substrate 1, a voltage of +5V should be applied to the second source/drain diffusion region 13b, and a voltage of +2V should be applied to the gate electrode 3. In such voltage conditions, an inversion layer extends from the first source/drain diffusion region 13a (source electrode) but stops short of reaching the second source/drain diffusion region 13b (drain electrode), resulting in generation of a pinch-off point. Electrons are accelerated from the pinch-off point to the second source/drain diffusion region 13b (drain electrode) by high electric fields and turn to be so-called hot electrons (high energy conduction electrons). Write operation is effectuated when these hot electros are injected in the second charge retention section 18b. It is to be noted that in the vicinity of the first charge retention section 18a, hot electrons are not generated so write operation is not executed.

Thus, write operation is executable by injecting electrons in the second charge retention section 18b.

In order to inject electrons (write) in the first charge retention section 18a, the second source/drain diffusion region 13b is set to be a source electrode, while the first source/drain diffusion region 13a is set to be a drain electrode. For example, a voltage of 0V should be applied to the second source/drain diffusion region 13b and the semiconductor substrate 1, a voltage of +5V should be applied to the first source/drain diffusion region 13a, and a voltage of +2V should be applied to the gate electrode 3. Thus, by reversing the source and drain regions employed in the case of injecting electrons in the second charge retention section 18b, electrons are injected in the first charge retention section 18a so that write operation is executable.

Description is now given of the erase operation principle of the semiconductor storage element.

In a first method for erasing information stored in the first charge retention section 18a, a positive voltage (e.g., +6V) should be applied to the first source/drain diffusion region 13a, a positive voltage of 0V should be applied to the semiconductor substrate 1, a reverse bias should be applied to the pn junction between the first source/drain diffusion region 13a and the semiconductor substrate 1, and further a negative voltage (e.g., −5V) should be applied to the gate electrode 3. In this case, in a portion of the pn junction that is in the vicinity of the gate electrode 3, potential gradient grows steep in particular due to the influence of the gate electrode to which the negative voltage was applied. As a consequence, hot holes (high energy holes) are generated in the pn junction on the side of the semiconductor substrate 1 by interband tunneling. The hot holes are pulled toward the side of the gate electrode 3 that has negative potentials, as a result of which holes are injected in the first charge retention section 18a. Thus, erase operation of the first charge retention section 18a is performed. At this time, a voltage of 0V should be applied to the second source/drain diffusion region 13b.

For erasing information stored in the second charge retention section 18b, the potentials of the first source/drain diffusion region 13a and the second source/drain diffusion region 13b should be switched.

In a second method for erasing information stored in the first charge retention section 18a, a positive voltage (e.g., +5V) should be applied to the first source/drain diffusion region 13a, a voltage of 0V should be applied to the second source/drain diffusion region 13b, a negative voltage (e.g., −4V) should be applied to the gate electrode 3, and a positive voltage (e.g., +0.8V) should be applied to the semiconductor substrate 1. In this case, a forward voltage is applied to between the semiconductor substrate 1 and the second source/drain diffusion region 13b, so that electrons are injected in the semiconductor substrate 1. The injected electrons diffuse to the pn junction between the semiconductor substrate 1 and the first source/drain diffusion region 13a, where the electrons are accelerated by strong electric fields to be hot electrons. The hot electrons generate electron-hole pairs in the pn junction. More specifically, by applying a forward voltage to between the semiconductor substrate 1 and the second source/drain diffusion region 13b, hot holes are generated in the pn junction positioned on the opposite side with the electrons injected in the semiconductor substrate 1 working as triggers. The hot holes generated in the pn junction are pulled toward the side of the gate electrode 3 that has negative potentials, as a result of which holes are injected in the first charge retention section 18a.

According to the second method, even in the case where a voltage applied to the pn junction between a P-type well region and the first source/drain diffusion region 13a is not large enough for generating hot holes through interband tunneling, the electrons injected from the second source/drain diffusion region 13b still work as triggers to generate electron-hole pairs in the pn junction, thereby achieving generation of hot holes. This makes it possible to reduce voltages required for erase operation. Particularly, with the presence of the offset region 20, the effect of gaining steep potential gradient in the pn junction by the gate electrode to which the negative voltage was applied is diminished, making it difficult to generate hot holes through interband tunneling. However, the second method remedies this drawback, allowing erase operation to be executed at low voltages.

It is to be noted that in the case of erasing information stored in the first charge retention section 18a, the first method required application of +6V to the first source/drain diffusion region 13a, whereas the second erase method required only +5V. Thus, according to the second method, voltages required for erase operation can be decreased, making it possible to reduce power consumption and restrain the semiconductor storage element from being deteriorated by hot carriers.

Description is now given of the read operation principle of the semiconductor storage element.

In order to read information stored in the first charge retention section 18a, the first source/drain diffusion region 13a is set to be a source electrode, the second source/drain diffusion region 13b is set to be a drain electrode, and the transistor is operated in the saturation region. For example, a voltage of 0V should be applied to the first source/drain diffusion region 13a and the semiconductor substrate 1, a voltage of +2V should be applied to the second source/drain diffusion region 13b, and a voltage of +1V should be applied to the gate electrode 3. In this case, if electrons are not stored in the first charge retention section 18a, drain current tends to flow. If, however, electrons are stored in the first charge retention section 18a, an inversion layer is not easily formed in the vicinity of the first charge retention section 18a so that drain current does not tend to flow. Therefore, by detecting the drain current, the information stored in the first charge retention section 18a can be read out. In this case, the presence or absence of the electrons stored in the second charge retention section 18b would not affect drain current since pinch-off is effected in the vicinity of the drain region.

In order to read information stored in the second charge retention section 18b, the second source/drain diffusion region 13b is set to be a source electrode, the first source/drain diffusion region 13a is set to be a drain electrode, and the transistor is operated in the saturation region. For example, a voltage of 0V should be applied to the second source/drain diffusion region 13b and the semiconductor substrate 1, a voltage of +2V should be applied to the first source/drain diffusion region 13a, and a voltage of +1V should be applied to the gate electrode 3. Thus, by reversing the source and drain regions employed in the case of reading information stored in the first charge retention section 18a, information stored in the second charge retention section 18b can be read out.

It is to be noted that in the case where a channel formation region (offset region 20) not covered with the gate electrode 3 remains, an inversion layer is deleted or formed by the presence or absence of excessive electrons in the charge retention sections 18b, 18b in the offset region 20, as a result of which large hysteresis (threshold change) is obtained. However, if the width of the offset region 20 is too large, then drain current significantly drops, resulting in considerable decrease in the read speed. Therefore, the width of the offset region 20 should preferably be determined so as to obtain sufficient hysteresis and read speed.

In the case where the source/drain diffusion regions 13a, 13b reach the end of the gate electrode 3, i.e., the source/drain diffusion regions 13a, 13b overlap with the gate electrode 3, the threshold value of the transistor was hardly changed by write operation, though parasitic resistance at the end portions of the source/drain regions was largely changed and drain current showed drastic reduction (of not less than 1 digit). Therefore, read operation is executable by detecting the drain current, and a function as a memory can be obtained. However, if the larger memory hysteresis effect is necessary, then it is preferable that the source/drain diffusion regions 13a, 13b do not overlap with the gate electrode 3 (i.e., the offset region 20 is present).

The above operation methods allow selective write and erase operations of two bit data per transistor.

Further in the above operation methods, although the source electrode and the drain electrode are switched so that 2-bit data is written or erased per transistor, the source electrode and the drain electrode can be fixed so as to allow operation as a 1-bit memory. In this case, it becomes possible to allot a fixed common voltage to one of the source/drain diffusion regions, thereby making it possible to reduce the number of bit lines connected to the source/drain diffusion regions by half.

As is clear from the above description, according to the semiconductor storage element, the charge retention section is formed independently of the gate insulator, and is formed on the opposite sides of the gate electrode, allowing 2-bit operation. Moreover, each of the charge retention sections is isolated by the gate electrode, and therefore interference during reprogramming can effectively be restrained. Further, a memory function implemented by the charge retention section and a transistor operation function implemented by the gate insulator are separated, which makes it possible to reduce the thickness of the gate insulator and control the short channel effect. This facilitates miniaturization of the semiconductor storage element.

Second Embodiment

Figure 2:
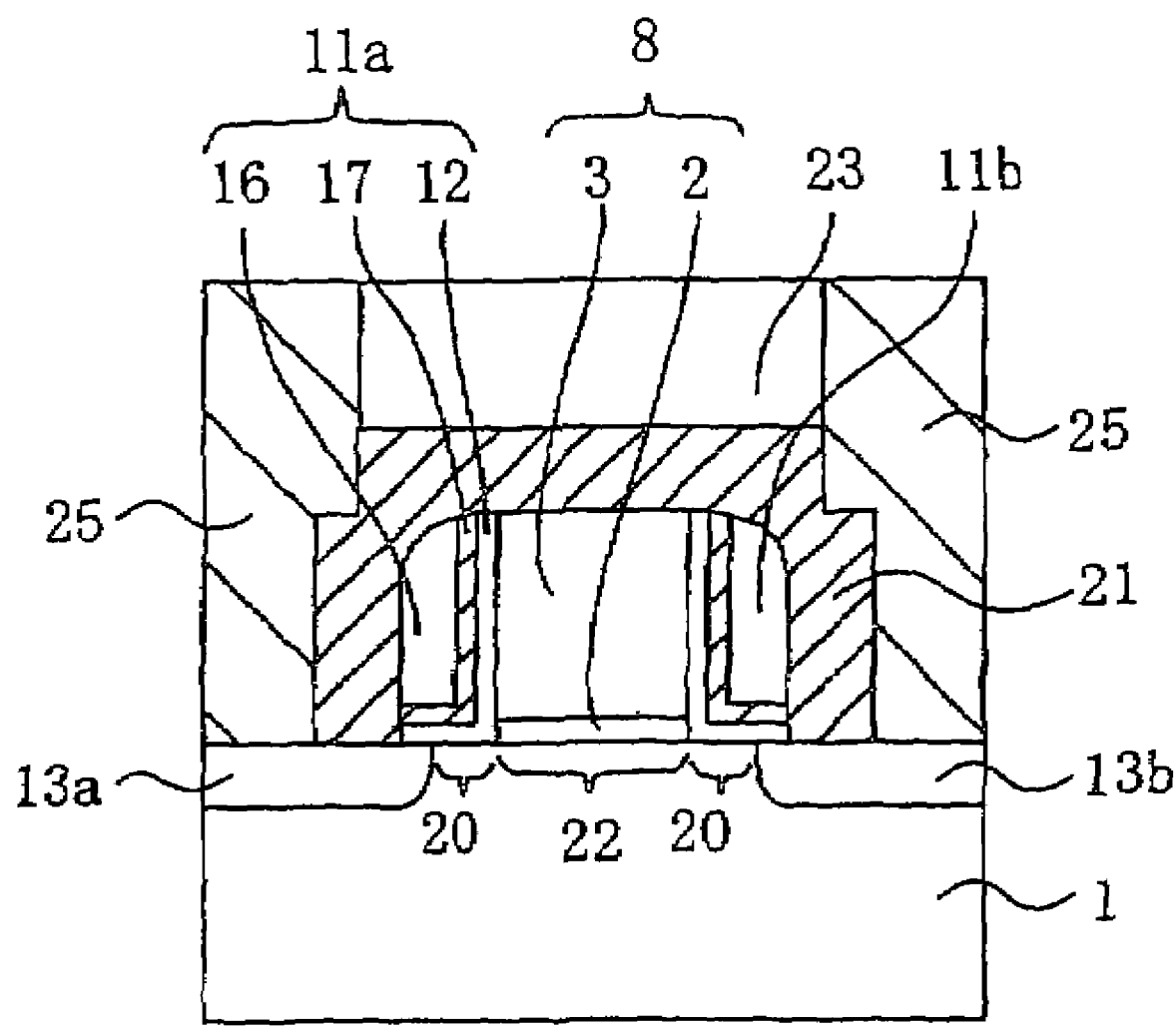
FIG. 2 is a schematic cross sectional view showing a structure of a semiconductor storage device in a second embodiment of the present invention.

FIG. 2 shows a cross sectional structure of a semiconductor storage element of a second embodiment embodying a semiconductor storage device in the present invention. The semiconductor storage element is different from the semiconductor storage element shown in FIGS. 1A and 1B in the point that memory function bodies 11 are formed. The memory function body 11 is composed of a silicon nitride 17 having trap levels that retain charges, and an L-shaped insulator 12 and a side-wall insulator 16 that are made of a silicon oxide and are disposed so as to sandwich the silicon nitride 17 therebetween. The L-shaped insulator 12 and the side-wall insulator 16 constitute an anti-dissipation insulating film. The charge retention sections 18a, 18b in the FIGS. 1A and 1B are each equivalent to the silicon nitride 17 in memory function bodies 11a, 11b (collectively designated by reference numeral 11 as appropriate). Accordingly, the silicon nitride 17 that functions as a charge retention section in FIG. 2 is interposed in between the insulating films 12 and 16 so that retained charges are restrained from dissipating, allowing provision of a semiconductor storage device with a good retention characteristic. Further, employing the structure in which the silicon nitride 17 is interposed in between the insulating films 12 and 16 leads to restraint of the charges injected during reprogramming operation from dissipating to the gate electrode and other nodes, which increases the charge injection efficiency, allowing higher-speed operation. Further, the memory function body 11 and the gate electrode 3 are covered with the coating film 21, which restrains outward diffusion of impurities that would cause depletion of impurities in the gate electrode, thereby boosting yield. Furthermore, the coating film 21 has a plurality of functions described below to reduce a space occupancy of the device concerning a contact, and restrains contact failure. A plurality of these functions are achieved by simply forming the coating film 21, which allows simplification of the manufacturing steps, making it possible to provide a semiconductor storage device with a low manufacturing cost.

It is to be noted that in FIG. 2, the silicon nitride 17 may be replaced by a conductor (floating gate) or a ferroelectric, which brings about the same effects.

Although a silicon oxide is used as a material of the insulating films 12 and 16 any material which is capable of restraining dissipation of charges fulfills the same effects. Such materials include insulating films such as a silicon oxide nitrides, and high dielectric films such as aluminum oxides, titanium oxides and hafnium oxides.

Description is now given of various aspects of the semiconductor storage element.

The semiconductor storage element is mainly composed of a gate insulator 2, a gate electrode 3 formed on the gate insulator 2, memory function bodies 11 (charge retention section 18) formed on the opposite sides of the gate electrode, source/drain diffusion regions 13, at least a part of which is disposed under the memory function body (charge retention section) 11, and a coating film 21 formed so as to cover the gate electrode 3 or the gate electrode 3 and the memory function body 11 and further cover a part of the semiconductor substrate.

The semiconductor storage element functions as a semiconductor storage element for storing four values or more data by storing two values or more data in one memory function body. Moreover, the semiconductor storage element functions as a memory cell having both functions as a select transistor and a memory transistor due to the variable resistance effect gained by the memory function body. However, the semiconductor storage element does not necessarily need to function so as to store four values or more data, but may function to store two values or more data for example.

Further, the semiconductor storage device can function as a memory cell having both functions as a select transistor and a memory transistor due to the variable resistance effect gained by the memory function body.

Moreover, the semiconductor substrate and the gate electrode should preferably be formed from a material made of silicon. In such a case, the semiconductor substrate and the gate insulator are made of silicon that is widely used as a material of semiconductor devices today, and therefore a semiconductor process having an extremely high compatibility with the conventional semiconductor manufacturing process can be developed. This makes it possible to provide a semiconductor storage device with a low manufacturing cost.

It is preferable that the semiconductor storage element constituting the semiconductor device of the present invention is formed on a semiconductor substrate, or in a well region formed in a semiconductor substrate and having the same conductivity type as the channel forming region in the semiconductor substrate.

The semiconductor substrate is not limited to particular ones as far as it is applicable to semiconductor apparatuses, and it is possible to use various substrates such as substrates made from elemental semiconductors including silicon and germanium, substrates made from compound semiconductors including SiGe, GaAs, InGaAs, ZnSe, and GaN, SOI (Silicon on Insulator) substrates and multilayer SOI substrates, and substrates having a semiconductor layer on a glass or plastic substrate. Among these, a silicon substrate or an SOI substrate having a silicon surface layer is preferable. The semiconductor substrate or the semiconductor layer may be either of a single crystal (e.g., single crystal obtained by epitaxial growth), polycrystalline, or amorphous, though a current amount flowing inside will be slightly different among them.

In the semiconductor substrate or the semiconductor layer, it is preferable that device isolation regions are formed, and it is more preferable to combine elements such as transistors, capacitors and resistors, a circuit composed thereof, a semiconductor device, and an inter-layer insulating film or films to form into a single or a multilayer structure. It is noted that the device isolation region may be formed by any of various device isolation films including a LOCOS (local oxidation of silicon) film, a trench oxide film, and an STI (Shallow Trench Isolation) film. The semiconductor substrate may be either of a P type or an N type conductivity type, and it is preferable that at least one first conductivity type (P type or N type) well region is formed in the semiconductor substrate. Acceptable impurity concentrations of the semiconductor substrate and the well region are those within the known range in the art. It is noted that in the case of using an SOI substrate as the semiconductor substrate, a well region may be formed in the surface semiconductor layer, and also a body region may be provided under the channel forming region. Thus, the well region and the body region formed on the semiconductor substrate and the surface semiconductor layer have a conductivity type opposite to the conductivity type of impurities in the source/drain diffusion regions, and have a impurity concentration properly adjusted, respectively. More particularly, current that leaks from one source/drain diffusion region to the other source/drain diffusion region can be reduced by forming the well region and the body region. This also makes it possible to reduce the substrate floating effect which is produced when SOI substrates are used.

Examples of the gate insulating film are not particularly limited and include those for use in typical semiconductor apparatuses, such as insulating films including silicon oxide films and silicon nitride films; and high-dielectric films including aluminum oxide films, titanium oxide films, tantalum oxide films, hafnium oxide films, in the form of single-layer films or multi-layer films. Among these, the silicon oxide film is preferable. An appropriate thickness of the gate insulating film is, for example, approx. 1 to 20 nm in equivalent insulator thickness, preferably 1 to 6 nm. The gate insulating film may be only formed right under the gate electrode, or may be formed to be larger (in width) than the gate electrode. The gate insulating film, depending on the structure and the process, and if large in width, can also function as an insulating film disposed under the memory function body, thereby allowing simplification of the manufacturing steps.

The gate electrode or electrode is formed on the gate insulation film normally in a shape for use in a semiconductor device or a shape that has a concave portion in a lower end portion. Herein, the "single gate electrode" is defined as a gate electrode consisting of a monolayer or multilayer conductive film and formed into a single inseparable piece. The gate electrode may have a side wall insulation film on each side surface. The gate electrode is normally not specifically limited so long as it is used for a semiconductor device, and there can be enumerated conductive films of: polysilicon; metals including copper and aluminum; high-melting metals including tungsten, titanium, and tantalum; and silicides of high-melting metals, in the form of a single-layer or a multi-layer. The gate electrode should properly be formed with a film thickness of, for example, about 50 to 400 nm. It is to be noted that a channel forming region is formed under the gate electrode. The channel formation region should preferably be formed not only under the gate electrode but also under a region including an outside of the gate electrode along its longitudinal direction at the edge of the gate electrode (offset structure). Thus, in the case where a channel formation region not covered with the gate electrode is present, the channel formation region should preferably be covered with the gate insulator or a later-described charge retention section.

The memory function body has at least a film or a region having a function of retaining electric charges, a function of storing and retaining charges, a function of trapping charges or a function of retaining a charge polarized state. Materials implementing these functions include: silicon nitride; silicon; silicate glass including impurities such as phosphorus or boron; silicon carbide; alumina; high-dielectric substances such as hafnium oxide, zirconium oxide, or tantalum oxide; zinc oxide; and metals. The memory function body may be formed into single-layer or multi-layer structure of: for example, an insulating film containing a silicon nitride film; an insulating film incorporating a conductive film or a semiconductor layer inside; and an insulating film containing one or more conductor dots or semiconductor dots. Among these, the silicon nitride is preferable because it can achieve a large hysteresis property by the presence of a number of levels for trapping electric charges, and has good holding characteristics in that the electric-charge holding time is long and that there hardly occurs leakage of electric charges caused by generation of leakage paths, and further because it is a material normally used in LSI process.

Use of an insulating film containing inside an insulating film having a charge holding function such as a silicon nitride film enables increase of reliability relating to memory holding. Since the silicon nitride film is an insulator, electric charges of the entire silicon nitride film will not be immediately lost even if part of the electric charges is leaked. Further, in the case of arraying a plurality of storage devices, even if the distance between the storage devices is shortened and adjacent memory function bodies come into contact with each other, information stored in each memory function body is not lost unlike the case where the memory function body is made from a conductor. Also, it becomes possible to dispose a contact plug closer to the memory function body, or in some cases it becomes possible to dispose the contact plug so as to overlap with the memory function body, which facilitates miniaturization of the storage devices.

For further increase of the reliability relating to the memory holding, the insulator having a function of holding electric charges is not necessarily needed to be in the film shape, and insulators having the function of holding an electric charge are preferably present in an insulating film in a discrete manner. More specifically, it is preferable that an insulator is dispersed like dots over a material having difficulty in holding electric charges, such as silicon oxide.

Also, use of an insulator film containing inside a conductive film or a semiconductor layer as a memory function body enables free control of quantity of electric charges injected into the conductor or the semiconductor, thereby bringing about an effect of facilitating achieving multi level cell.

Further, using an insulator film containing one or more conductor or semiconductor dots as a memory function body facilitates execution of write and erase due to direct tunneling of electric charges, thereby bringing about an effect of reduced power consumption.

Moreover, it is acceptable to use, as a memory function body, a ferroelectric film such as PZT (lead zirconate titanate) and PLZT (lead lanthanum zirconate titanate) whose polarization direction is changed by an electric field. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase is achievable.

It is preferable that the memory function body further contains a region that obstructs escape of electric charges or a film having a function of obstructing escape of electric charges. Materials fulfilling the function of obstructing escape of electric charges include a silicon oxide.

The charge holding portion contained in the memory function body is formed on opposite sides of the gate electrode directly or through an insulating film, and it is disposed on the semiconductor substrate (a well region, a body region, or a source/drain diffusion region or a diffusion layer region) directly or through the gate insulating film or the insulating film. The charge holding portions on opposite sides of the gate electrode are preferably formed so as to cover all or part of side walls of the gate electrode directly or thought the insulating film. In an application where the gate electrode has a recess portion on the lower edge side, the charge holding portion may be formed so as to fill the entire recess portion or part of the recess portion directly or through the insulating film.

Preferably, the gate electrode is formed only on the side wall of the memory function body or formed such that the upper portion of the memory function body is not covered. In such disposition, it becomes possible to dispose a contact plug closer to the gate electrode, which facilitates miniaturization of the semiconductor storage elements. Also, the semiconductor storage elements having such simple disposition are easily manufactured, resulting in an increased yield.

In the case of using a conductive film as the charge holding portion, the charge holding portion is preferably disposed with interposition of an insulating film so that the charge holding film is not brought into direct contact with a semiconductor substrate (a well region, a body region, or a source/drain diffusion region or a diffusion layer region) or the gate electrode. This is implemented by, for example, a multi-layer structure composed of a conductive film and an insulating film, a structure of dispersing a conductive film like dots in an insulating film, and a structure of disposing a conductive film within part of a side-wall insulating film formed on the side wall of the gate.

The source/drain diffusion regions are disposed on the side of the memory function bodies opposed from the gate electrode as diffusion regions having a conductivity type opposite to that of the semiconductor substrate or of the well region. In the portion where the source/drain diffusion region is joined to the semiconductor substrate or the well region, impurity concentration is preferably sharp. This is because the sharp impurity concentration efficiently generate hot electrons and hot holes with low voltages, which enables high-speed operations with lower voltages. The junction depth of the source/drain diffusion region is not particularly limited and so it is adjustable where necessary, according to performance and the like of a memory device to be manufactured. It is noted that if an SOI substrate is used as the semiconductor substrate, the junction depth of the source/drain diffusion region may be smaller than the film thickness of a surface semiconductor layer, though preferably the junction depth is almost equal to the film thickness of the surface semiconductor layer.

The source/drain diffusion region may be disposed so as to be overlapped with the edge of the gate electrode, or to meet the edge of the gate electrode, or to be offset from the edge of the gate electrode. Particularly, it is preferable that the source/drain diffusion region is offset relative to the edge of the gate electrode. This is because in this case, when voltage is applied to the gate electrode, easiness of inversion of the offset region under the charge holding portion is largely changed by an electric charge amount stored in the memory function body, resulting in increased memory effect and reduced short channel effect. It is noted, however, that too much offset extremely reduces drive current between the source and the drain. Therefore, it is preferable that an offset amount, that is a distance from one edge of the gate electrode to the source or drain region closer thereto in the gate length direction, is shorter than the thickness of the charge holding portion in the gate length direction. What is particularly important is that at least part of the charge holding portion in the memory function body overlaps with the source/drain diffusion region serving as a diffusion layer region. This is because the nature of semiconductor storage elements constituting the semiconductor device of the present invention is to rewrite memory with an electric field crossing the memory function body by voltage difference between the gate electrode present only on the side wall portion of the memory function body and the source/drain diffusion region.

Part of the source/drain diffusion region may be extended to the position higher than the surface of the channel forming region, that is, the lower face of the gate insulating film. In this case, it is appropriate that a conductive film is laid on a source/drain diffusion region formed in the semiconductor substrate in an integrated manner with the source/drain diffusion region. Examples of the conductive film include semiconductors such as polysilicon and amorphous silicon, silicide, and the above described metals and high-melting metals. Among these, the polysilicon is preferable. Since the polysilicon is extremely larger in impurity diffusion speed than the semiconductor substrate, it is easy to make the junction depth of the source/drain diffusion region in the semiconductor substrate shallow, and it is easy to control short channel effect. In this case, it is preferable that the source/drain diffusion region is disposed such that at least part of the charge holding film is sandwiched between part of the source/drain diffusion region and the gate electrode.

The coating film is composed of a silicon nitride and works as a stopper in the process of contact etching for forming contact holes in an interlayer insulator. Accordingly, the coating film prevents short-circuit between the source/drain diffusion regions and the semiconductor substrate that would be caused by deep etching of the semiconductor substrate and further restrains the surface of the semiconductor substrate from being roughened. This leads to restraint of contact failure between the source/drain diffusion regions and the upper interconnection lines and further leads to prevention of short-circuit between the contact to the source/drain diffusion regions and the gate electrode. Consequently, it is not necessary to allow for a margin of alignment to prevent short-circuit or the like, which allows significant reduction in space occupancy, making it possible to provide a semiconductor storage device with a low cost.

In the semiconductor storage element, a single gate electrode formed on the gate insulator, one source/drain diffusion region, the other source/drain diffusion region and a semiconductor substrate serve as four terminals, and specified potentials are given to each of these four terminals so that write, erase and read operations are executed. Specific operation principle and examples of operating voltages will be described later. When the semiconductor storage devices of the present invention are disposed in array to constitute a memory cell array, each memory cell can be controlled by a single control gate, which makes it possible to reduce the number of word lines.

Further, the memory function body (charge retention section) of the present invention is formed independently of the gate insulator 2. Therefore, a memory function implemented by the memory function body (charge retention section) and a transistor operation function implemented by the gate insulator 2 are separated. As a consequence, a design policy for forming a thinner gate insulator or the like to optimize the transistor operation and a design policy for materials of the memory function body or the like to optimize the memory function can be independently determined. This makes it possible to easily achieve a good memory function while a good transistor operation characteristic is maintained.

The semiconductor storage element of the present invention can be formed by the ordinary semiconductor process according to a method similar to the method of forming a side wall spacer of a single layer or laminate structure on the side wall of the gate electrode or word line. In concrete, there can be enumerated: a method comprising forming a gate electrode or a word line, thereafter forming a single layer film or multilayer film including a charge retaining portion, such as a charge retaining portion, a charge retaining portion/insulation film, an insulation film/charge retaining portion, and an insulation film/charge retaining portion/insulation film, and leaving the film or films in a side wall spacer shape by etching back under appropriate conditions; a method comprising forming an insulation film or a charge retaining portion, leaving the film in a side wall spacer shape by etching back under appropriate conditions, further forming a charge retaining portion or insulation film and leaving the film in a side wall spacer shape by etching back under appropriate conditions; a method comprising coating or depositing, on a semiconductor wafer including a gate electrode, an insulation film material in which a particulate charge retaining material is distributed, and leaving the insulation film material in a side wall spacer shape by etching back under appropriate conditions; a method comprising forming a gate electrode, thereafter forming the single layer film or the multilayer film and carrying out patterning by using a mask, and so on. Moreover, there can be enumerated a method comprising forming a charge retaining portion, a charge retaining portion/insulation film, an insulation film/charge retaining portion, or an insulation film/charge retaining portion/insulation film before forming a gate electrode or an electrode, forming an opening through the film or films in a region that becomes a channel forming region, forming a gate electrode material film on the entire upper surface of the wafer and patterning this gate electrode material film in a shape, which is larger than the opening in size and encompasses the opening.

When a memory cell array is constructed by arranging the semiconductor storage elements of the present invention, a best mode of the semiconductor storage elements is to satisfy, for example, the following required conditions:

(i) The function of a word line is possessed by the integrated body of the gate electrodes of a plurality of semiconductor storage elements;
(ii) The memory function body is formed on each of opposite sides of the word line;
(iii) A material that retains electric charges in the memory function body is an insulator, and in particular, a silicon nitride film;
(iv) The memory function bodies are constructed of an ONO (Oxide Nitride Oxide) film, and the silicon nitride film has a surface roughly parallel to the surface of the gate insulation film;
(v) The silicon nitride film in each memory function body is separated from the word line and the channel forming region by the silicon oxide film;
(vi) A silicon nitride film in each memory function body overlaps with the corresponding diffusion region;
(vii) The thickness of the insulation film, which separates the silicon nitride film that has a surface roughly parallel to the surface of the gate insulation film from the channel forming region or the semiconductor layer differs from the thickness of the gate insulation film;
(viii) Write and erase operations of one semiconductor storage element are executed by a single word line;
(ix) There is no electrode (word line), on each memory function body, which has a function to assist the write and erase operations; and
(x) A portion put in contact with the diffusion region right under each memory function body has a region where the impurity concentration of the conductivity type opposite to the conductivity type of the diffusion region is high.

The best mode is a mode in which all of these requirements are satisfied, but it is not necessary to satisfy all requirements.

When some of the above requirements are satisfied, there are most preferable combinations of requirements. For example, a most preferable combination resides in that (iii) a material that retains electric charges in the memory function body is an insulator, and in particular, a silicon nitride film; (ix) there is no electrode (word line), on each memory function body, which has a function to assist the write and erase operations; and (vi) an insulator (silicon nitride film) in each memory function body overlaps with the corresponding diffusion region. According to the finding by the inventors, when an insulator retains electric charges in the memory function body and there is no electrode, on each memory function body, which has a function to assist the write and erase operations, write operations are well performed only if the insulator (silicon nitride film) in each memory function body overlaps with the corresponding diffusion region. That is, when requirements (iii) and (ix) are satisfied, it is particularly preferred that requirement (vi) be satisfied. On the other hand, if a conductor retains electric charges in the memory function body or if there is an electrode, on each memory function body, which has a function to assist the write and erase operations, the write operations are effected even if the insulator in each memory function body does not overlap with the corresponding diffusion region. However, if an insulator retains electric charges in the memory function body or if there is no electrode, on each memory function body, which has a function to assist the write and erase operations, the following great advantages are obtained. That is, it is possible to place a contact plug closer to the memory function body. Or, even if the semiconductor storage elements are put close to each other in distance, the plurality of memory function bodies do not interfere with one another, and the storage information can be retained. Therefore, the miniaturization of the semiconductor storage elements is facilitated. Furthermore, since the element structure is simple, the number of fabrication process steps is reduced, and the yield can be improved. Also, combination with the transistors that constitute a logic circuit and an analog circuit can be facilitated. Furthermore, we have ascertained that the write and erase operations can be executed at a low voltage of not higher than 5 V. This is why satisfying requirements (iii), (ix) and (vi) is particularly preferable.

The semiconductor device of the present invention in which semiconductor storage elements are combined with logic elements is applicable to battery-driven portable electronic equipment, in particular mobile information terminals. Examples of the portable electronic equipment are mobile phones and game machines, in addition to mobile information terminals.

In the embodiment shown below, description will be given on the assumption that an N-channel type device should be used as a memory, though a P-channel type device may be used as a memory instead. In such a case, all the conductivities of impurities should be reversed.

Moreover, in the drawings, the same reference numerals are given to the portions where the same material and substances are used and do not necessarily indicate the same shapes.

Moreover, it is to be noted that the drawings are schematic, and the dimensional relations between thickness and plane, ratios of thickness and size between layers and portions and so on are different from those of the actual ones. Therefore, the concrete dimensions of thickness and size should be determined in consideration of the following description. Moreover, there are, of course, included the portions whose mutual dimensional relations and ratios are different between the figures.

Third Embodiment

The semiconductor storage device in the third embodiment of the present invention will be described with reference to FIGS. 3A to 3E.

Figure 3A:
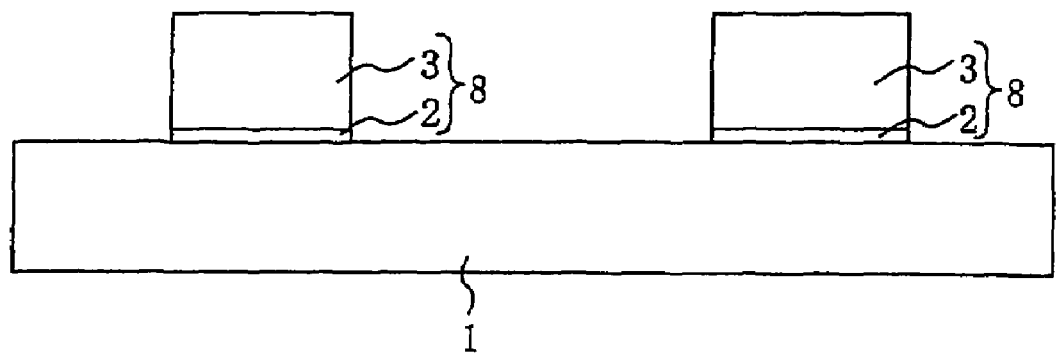
FIGS. 3A to 3E are schematic cross sectional views showing manufacturing steps of a semiconductor storage device in a third embodiment of the present invention.
Figure 3B:
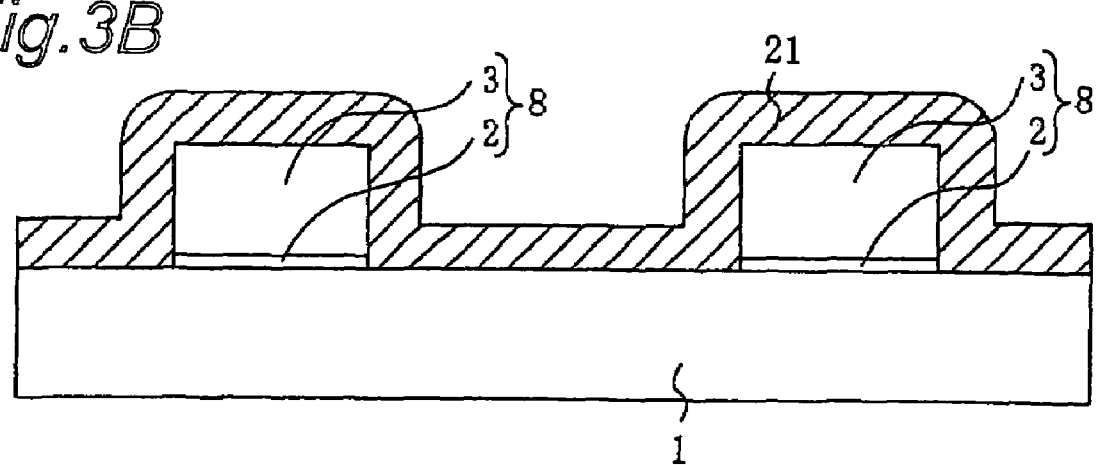
Figure 3C:
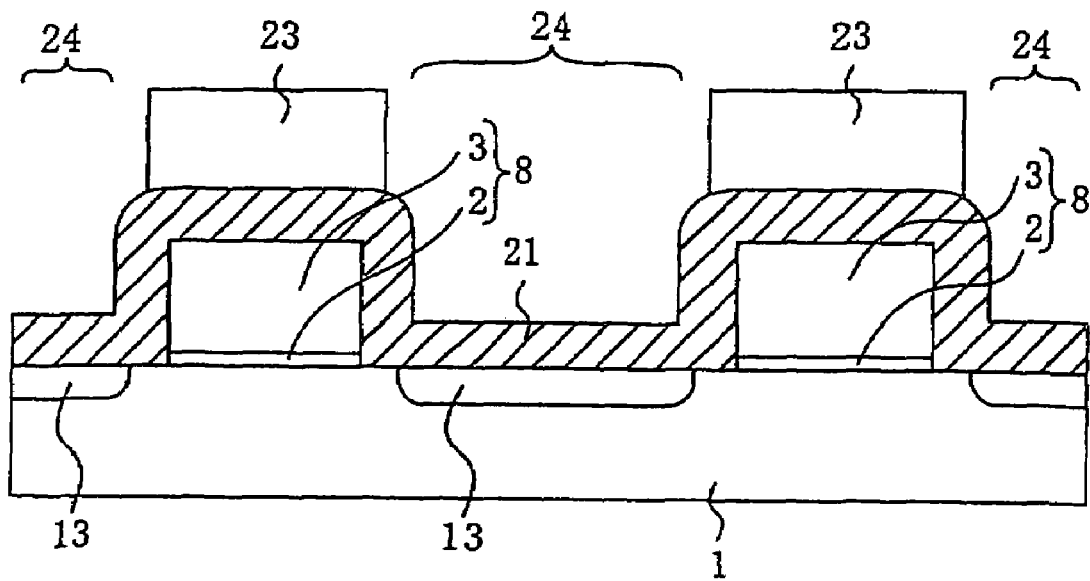
Figure 3D:
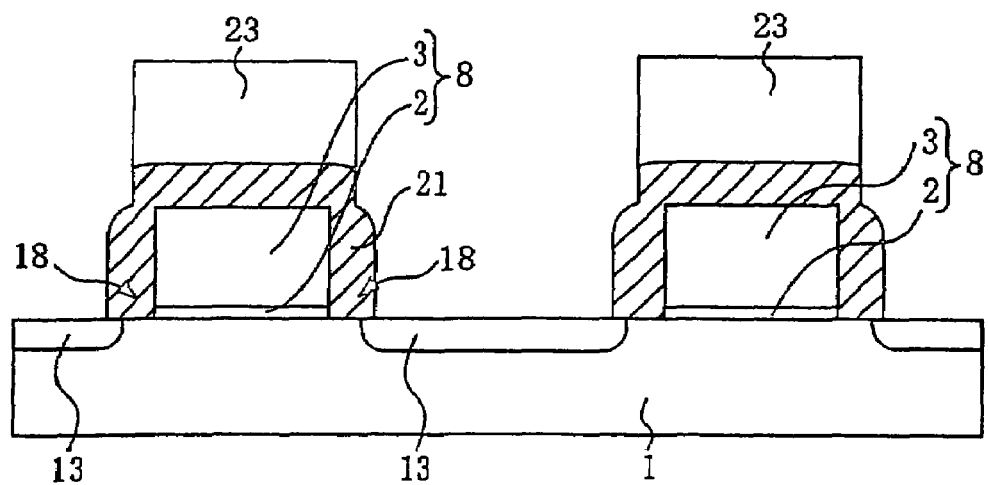
Figure 3E:
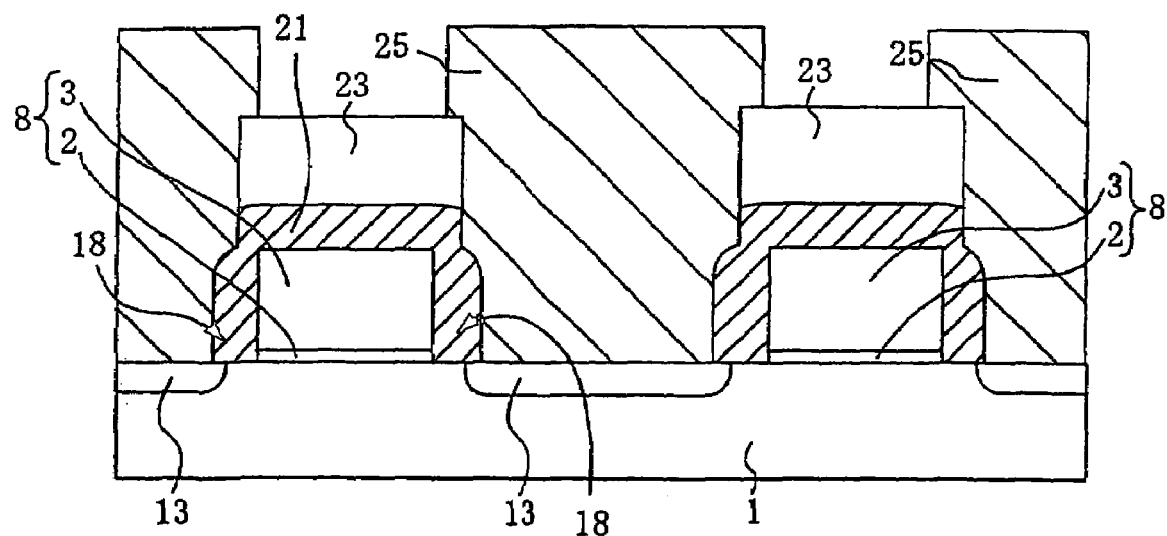

In a semiconductor storage element constituting the semiconductor storage device, as shown in FIG. 3E, a gate electrode 3 is formed on a semiconductor substrate 1 via a gate insulator 2. The semiconductor storage element is composed of a coating film 21 that is made of a silicon nitride and formed on the upper surface and the side surfaces of a gate stack 8 made up of the gate insulator 2 and the gate electrode 3 and on the semiconductor substrate, a charge retention section 18 defined in the vicinity of an offset region 20 in the coating film 21, and a pair of source/drain diffusion regions 13 formed below the charge retention section 18.

In this embodiment, the coating film 21 functions as a memory section of the semiconductor storage element, and also has a function to electrically isolate a contact line to the source/drain diffusion regions 13 and the gate electrode. Further, the coating film 21 restrains contact failure caused by the surface of the source/drain diffusion regions being roughened by etching. Furthermore, when a device isolation region is formed, the coating film 21 has a function to restrain the device isolation region from being etched during etching to form later-described contact holes so that short-circuit between the source/drain diffusion regions and the semiconductor substrate is suppressed. More specifically, in order to fulfill each function, different films were needed to be formed in the past, which required extremely complicated steps and increased the manufacturing cost, and moreover, the films were manufactured by a formation method which increased a space occupancy per element. However, by using the formation method described in the present embodiment, it becomes possible to provide a semiconductor storage device with a low manufacturing cost and a small space occupancy per element. Although a nitride is used as a coating film herein, any material, not limited to the nitride, which may provide a selectivity against the interlayer insulator, insulate the gate and the contact and locally restrain charges, fulfills the same effects. For example, nitride oxides, nitrides containing particulates and low-dielectric insulating films are particularly desirable, while high dielectric materials such as aluminum oxides and hafnium oxides are also desirable.

Hereinbelow, the manufacturing steps are described in due order with reference to drawings shown in FIGS. 3A to 3E.

As shown in FIG. 3A, a gate insulator 2 and a gate electrode 3 having MOS (Metal Oxide Semiconductor) structure formed through MOS formation process, i.e., a gate stack 8, are formed on a semiconductor substrate 1 having a p-type conductivity.

A typical MOS formation process is as follows.

First, as required, a device isolation region is formed by a known method on the semiconductor substrate 1 made of silicon and having a p-type semiconductor region. The device isolation region can prevent a leakage current from flowing through the substrate between mutually adjacent devices. However, even mutually adjacent devices, if associated with the source/drain diffusion region 13 in common, do not need the formation of such a device isolation region. Forming the device isolation region makes it possible to prevent leakage currents from flowing between neighboring devices through the substrate. It is noted that such a device isolation region does not need to be formed for those neighboring devices between which the source/drain diffusion regions are shared. The aforementioned known device-isolation-region formation method has only to be one that allows the objective of isolating devices from each other to be achieved, whichever the method is the known one using LOCOS oxide, or the known one using trench isolation regions, or other known methods. In this embodiment, which is described on a case where the device isolation region is not formed, the device isolation region is not shown in the figures.

Next, although not shown in particular, an impurity diffusion region is formed on and around an exposed surface of the semiconductor substrate. This impurity diffusion region is intended for control of the threshold voltage, and for increase of the impurity concentration of the channel formation region. An appropriate impurity diffusion region may be formed by a known method for obtaining an appropriate threshold voltage.

Next, a dielectric film is formed entirely on the exposed surface of the semiconductor region. This dielectric film, which has only to be able to suppress the leakage, may be formed as an oxide film, a nitride film, a composite film of an oxide film and a nitride film, a high-dielectric film of hafnium oxide, zirconium oxide or the like, or a composite film of a high-dielectric film and an oxide film. Further, since the film forms the gate insulator of a MOSFET, it is desired that a film having good performance as the gate insulator is formed by using a process including $N_2O$ oxidation, NO oxidation, after-oxidation nitriding, and other steps. The film having good performance as the gate insulator means a dielectric film capable of suppressing every disadvantageous factor in advancing scale-down and performance enhancement of MOSFETs, for example, suppressing the MOSFET short-channel effect, suppressing leakage currents that are currents unnecessarily flowing through the gate insulator, and suppressing diffusion of impurities of the gate electrode into the MOSFET channel formation region while suppressing depletion of impurities of the gate electrode. Typically, the film is an oxide film such as thermal oxide film, $N_2O$ oxide film or NO oxide film, its film thickness being appropriately within a range of 1 nm to 6 nm.

Next, a gate electrode material is formed on the dielectric film. As the gate electrode material, any material may be used only if it is capable of exhibiting the performance as MOSFET, such as polysilicon, doped polysilicon or other semiconductors, Al, Ti, W or other metals, compounds of these metals and silicon. When polysilicon film is formed in this case as an example, the polysilicon film thickness is preferably 50 nm to 400 nm.

Next, a desired photoresist pattern is formed on the gate electrode material by photolithography process, and with the resulting photoresist pattern used as a mask, gate etching is performed so that the gate electrode material and the gate insulator are etched so as to form a structure of FIG. 3A. That is, the gate insulator 2 and the gate electrode 3, and the gate stack 8 constituted of those is formed. Although not shown, in this process, it is allowable that the gate insulator is not etched. When the gate insulator, without being etched, is utilized as an implantation protective film in the subsequent-step impurity implantation, the step of forming an implantation protective film can be simplified.

It is noted that materials of the gate insulator 2 and the gate electrode 3 may be ones which are used in logic processes complying with the days' scaling law, and are not limited to the aforementioned ones.

Further, the gate stack 8 may also be formed by the following process. A gate insulator constituted as described above is formed entirely on the exposed surface of the semiconductor substrate 1 having a p-type semiconductor region. Next, a gate electrode material constituted as described above is formed on the gate insulator. Next, a mask dielectric film of oxide, nitride, oxynitride or the like is formed on the gate electrode material. Next, a photoresist pattern constituted as described above is formed on the mask dielectric film, and then the mask dielectric film is etched. Next, the photoresist pattern is removed, and with the mask dielectric film used as an etching mask, the gate electrode material is etched. Next, the mask dielectric film and the exposed portion of the gate insulator are etched, by which the structure of FIG. 3A is formed. In the case where the gate stack is formed in this way, the selection ratio in etching, i.e., the selection ratio of gate electrode material to gate insulator material can be made larger so that the etching of a thin-film gate insulator becomes achievable without etching the substrate. In this case, although not shown, the gate insulator does not need to be etched for the same reason as described above.

Next, as shown in FIG. 3B, a coating film 21 made of a silicon nitride is formed on the exposed surface of the gate stack 8 and the semiconductor substrate 1. The formation method to be used for forming the coating film 21 should be a known CVD (Chemical Vapor Deposition) method having excellent step coverage. Here, the film thickness should be in the range of about 2 nm to 100 nm. Since the film thickness is an important parameter to form the source/drain diffusion regions so as to be displaced from the gate electrode, it should be adjusted within the above-stated range of the film thickness in consideration of an offset amount. Although a nitride is used as a coating film, any material, not limited to the nitride, which may provide a selectivity against the interlayer insulator, insulate the gate and the contact and locally restrain charges, fulfills the same effects. For example, nitride oxides, nitrides containing particulates and high dielectric materials such as aluminum oxides and hafnium oxides are acceptable.

Next, as shown in FIG. 3C, source/drain diffusion regions 13 are formed and an interlayer insulator 23 is formed. After that, contact holes 24 for forming contacts to connect the source/drain diffusion regions and interconnection lines respectively are formed in the interlayer insulator 23. Each steps will be described below.

The source/drain diffusion regions 13 are formed by injecting source/drain impurities with use of the gate electrode 3 and the coating film 21 as a source/drain injection mask and performing a known heat treatment. Herein, the source/drain diffusion regions 13 should be formed so as to be properly displaced from the gate electrode 3 as stated before.

Next, the interlayer insulator 23 is formed, and the contact holes 24 for forming contacts that connect the source/drain diffusion regions 13 and interconnection lines respectively are formed in the interlayer insulator 23. The interlayer insulator 23 should be formed to have a film thickness that allows sufficient planarization through refrowing or the like. The typical film thickness is about 500 nm, which should be decreased by a known technique so as to prevent an aspect ratio to a contact diameter from becoming too high.

Herein, the contact holes 24 are formed through known photoresist and anisotropic selective etching processes. Etching of the interlayer insulator should be performed under an etching condition of high selectivity against a silicon nitride. This makes it possible to suppress contact failure generated by etching of the semiconductor substrate.

Further, a region occupied by the contact hole 24 does not overlap with the gate electrode. However, a part of the coating film 21 covering the lateral side of the gate electrode may position in an extended portion of the contact hole. More specifically, in designing the position of the contact in the prior art, a capacity between the gate electrode and the contact member should be reduced, which necessitates designing the contact hole so as to be formed with a sufficient margin of alignment. However, according to the manufacturing method in the present embodiment, it is acceptable if the position of the contact hole is out of alignment and slightly overlaps with the coating film (i.e., equivalent to a polycrystalline Si film in the prior art). Therefore, unlike the prior art, it is not necessary to allow for a sufficient margin of alignment and form the contact hole away from the gate electrode and the polycrystalline Si film in the consideration of the sufficient margin. Consequently, it becomes possible to form the contact and the polycrystalline Si film substantially with an overlap portion, by which a space occupancy per element can be significantly decreased and a semiconductor storage device with a low manufacturing cost can be provided.

Further, the drawings show the case in which the interlayer insulator remains so as to just cover the outside of the coating film that covers the side surface of the gate electrode. This shown case is the most desirable example, though it is still acceptable if a part of the interlayer insulator positions in an extended portion of the contact hole and is etched in the later step as long as the performance of the charge retention section is in the range comparing favorably with the performance in the case where no etching is performed. Still, the effect in the memory function stands comparison with that in other embodiments.

Further, etching of the interlayer insulator in this step is performed under an etching condition of high selectivity against the coating film 21, and the etching is stopped by the coating film. This makes it possible to restrain contact failure and short-circuit between the source/drain diffusion regions 13 and the semiconductor substrate 1 which are attributed to the semiconductor substrate 1 being etched.

Next, as shown in FIG. 3D, the coating film 21 under the contact holes is removed through anisotropic selective etching.

Thus, etching of the interlayer insulator is once stopped by the coating film 21 and then, etching of the coating film 21 is performed to complete the contact holes. In this way, it becomes possible to prevent short-circuit between the source/drain diffusion regions and the semiconductor substrate that is attributed to deep etching of the semiconductor substrate, easily restrain the surface of the semiconductor substrate from being roughened, and suppress contact failure.

Further, in the case where the device isolation region is formed, the effect fulfilled by the coating film described in a fourth embodiment is also provided. More specifically, a function to prevent short-circuit between the source/drain diffusion regions and the semiconductor substrate that is attributed to the device isolation region being etched during etching to form contact holes is also provided.

It is to be noted that in this etching step, adopted is the etching condition under which a material of the coating film can be etched and a selectivity against the semiconductor substrate.

Next, as shown in FIG. 3E, a contact member is filled in the contact holes to form contacts 25. Further, the contact member is etched with use of photo lithography and etching processes to form an interconnection pattern on the interlayer insulator.

According to the above manufacturing method, not only a binary semiconductor storage element can be formed, but also short-circuit between the source/drain diffusion regions and the substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode as well as the charge retention section. Consequently, it is not necessary to allow for a margin of alignment to prevent short-circuit or the like, which allows significant reduction in space occupancy, making it possible to provide a semiconductor storage device with a low cost.

Further, the formation method for fulfilling the above functional effects can be performed without adding complicated steps, thereby making it possible to provide a semiconductor storage device that achieves the above functional effects with a low cost.

Fourth Embodiment

A semiconductor storage device in the fourth embodiment of the present invention will be described with reference to FIGS. 4A to 4E.

The semiconductor storage device of the present embodiment is almost identical in structure and manufacturing steps to that of the third embodiment except the following point.

That is, the semiconductor storage device of the present embodiment has a device isolation region 28 between devices. According to the present invention, it becomes possible to ensure one of the effects provided by the coating film, i.e., the effect to prevent a failure that the device isolation region is etched during etching to form contact holes and as a result, the contact comes into contact with the semiconductor substrate 1 or a region such as well regions disposed under the source/drain diffusion regions which has a conductivity type opposite to the conductivity type of the source/drain diffusion regions to cause short-circuit.

Further, the characteristics of the present embodiment are applicable to other embodiments. In such a case, the effects included in the applied characteristics can be implemented in addition to the effects that characterize other embodiments.

Hereinbelow, the manufacturing steps will be described in due order with a focus on drawings shown in FIGS. 4A to 4E.

First, as shown in FIG. 4A, a gate insulator 2 and a gate electrode 3 having MOS (Metal Oxide Semiconductor) structure formed through MOS formation process, i.e., a gate stack 8, are formed on a semiconductor substrate 1 having a p-type conductivity and including a device isolation region 28. Except the formation method for the device isolation region, the formation method identical to the method described in the third embodiment should be applied.

The device isolation region is formed by a known method. The device isolation region makes it possible to prevent leakage current from flowing between adjacent devices. However, it is not necessary to form such device isolation region between adjacent devices if the adjacent devices share the source/drain diffusion regions. The known method for forming device isolation regions can be any known method including known methods with use of a LOCOS oxide and known methods with use of a trench isolation region as long as a purpose of device isolation can be achieved thereby. In this embodiment, description is given of the case in which most of the device isolation region is composed of an oxide. It is to be noted that a material constituting most of the device isolation region is not limited to the oxide, and therefore any material which can be etched during contact etching of the interlayer insulator is acceptable and provides the same effects.

Next, as shown in FIG. 4B, a coating film 21 made of a silicon nitride is formed on the exposed surface of the gate stack 8, the semiconductor substrate 1 and the device isolation region 28. The formation method therefor may be identical to the method described in the third embodiment.

Next, source/drain diffusion regions 13 are formed. The formation method therefor may be identical to the method described in the third embodiment. However, unlike the third embodiment, impurities are injected in the semiconductor substrate 1 through the coating film 21 to form the source/drain diffusion regions. Therefore, the impurities should be injected deeper by a film thickness of the coating film by increased injection energy so that the junction is formed similarly to that in the third embodiment.

Next, as shown in FIG. 4C, an interlayer insulator 23 made of an oxide is formed. After that, contact holes 24 for forming contacts to connect the source/drain diffusion regions and interconnection lines respectively are formed in the interlayer insulator 23. Each of these steps may be identical to those described in the third embodiment.

In order to clarify the effects implemented by the present embodiment, the drawings herein show the case in which the contact hole is positioned such that at least a part of the contact hole overlaps with the top of the device isolation region 28. However, the same effects are achieved even if the contact hole is not placed in reality in the position specified in the present embodiment.

More specifically, in designing the memory element disclosed in the prior art, the device should be designed so as to allow for a sufficient margin of alignment between, for example, the device isolation region and the contact hole, which enlarged a space occupancy of the device. In the present embodiment, however, it is not necessary to allow for a sufficient margin of alignment, which reduces a space occupancy of the device, allowing reduction in manufacturing cost per element. More precisely, the effects, which are characteristic effects of the present invention, are generated by provision of each coating film and are generated in the stage of device design, and therefore it is impossible to gauge the validity of the effects from the completed shape of the device.

Herein, if, in the case of the memory element disclosed in the prior art, etching for forming contact holes is executed without allowing for a sufficient margin of alignment and as a result, the position of the contact hole overlaps with the top of the device isolation region 28 as shown in the drawing, then the device isolation region is etched by the contact etching because the coating film 21 made of a nitride is not present and the primary materials of the interlayer insulator and the interlayer insulator are both oxides. The depth of etching in the device isolation region depends on an over-etching amount associated with dispersion of etching. If the device isolation region is etched deeper than the source/drain diffusion regions 13, then a contact is formed in the deeply etched portion in the later contact forming step. Consequently, the source/drain diffusion regions and the substrate are connected via the contact, resulting in occurrence of failures due to short-circuit. If the coating film 21 made of a nitride is formed, then etching for forming contact holes can be stopped by the coating film whose material is different from that of the interlayer insulator. Further in the later step, in etching the coating film made of a nitride to create complete openings of the contact holes, it becomes possible to etch only the coating film without etching most of the device isolation region. This makes it possible to restrain failures that would be caused by the source/drain diffusion regions and the substrate being connected via the contact, thereby allowing provision of a semiconductor storage device with good yield and a low manufacturing cost.

Moreover, a technique to form shallow source/drain diffusion regions for controlling the short-channel effect is being largely utilized these days, which further increases the likelihood of occurrence of short-circuit. Therefore, the etching technique utilizing this coating film is quite effective.

Figure 4D:
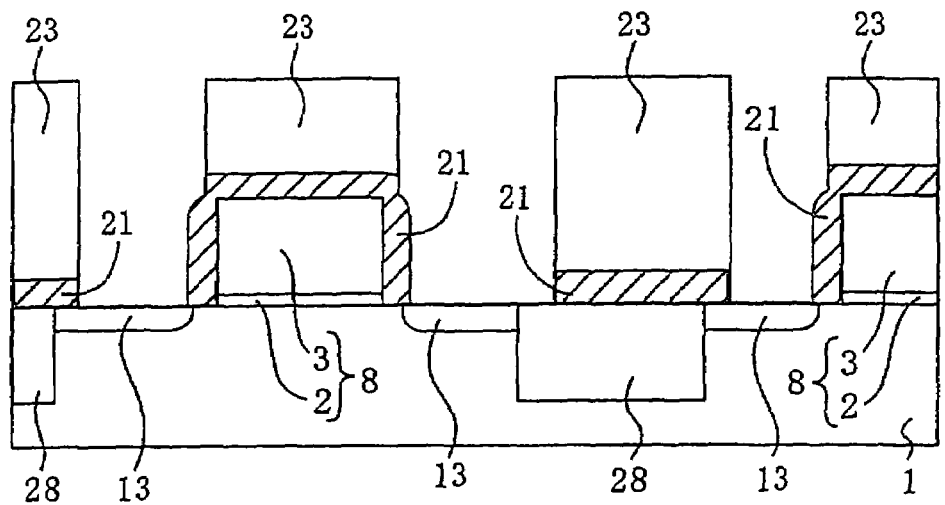

Next, as shown in FIG. 4D, the coating film 21 under the contact holes is removed through anisotropic selective etching. The same etching method as described in the third embodiment may be used. In order to prevent etching of the device isolation region 28 characterizing the present invention, etching should be executed under such condition that the coating film 21 made of a nitride should be etched though the semiconductor substrate 1 and particularly the device isolation insulating film that is mostly made of an oxide should not be etched.

Thus, etching of the interlayer insulator is once stopped by the coating film 21 and then, etching of the coating film 21 is performed to complete the contact holes. In this way, it becomes possible to prevent short-circuit between the source/drain diffusion regions and the semiconductor substrate that is attributed to deep etching of the semiconductor substrate, easily restrain the surface of the semiconductor substrate from being roughened, and suppress contact failure. Further, as described with reference to FIG. 4C, the device isolation region 28 can suppress short-circuit failure between the source/drain diffusion regions and the substrate that would be caused by etching.

Figure 4E:
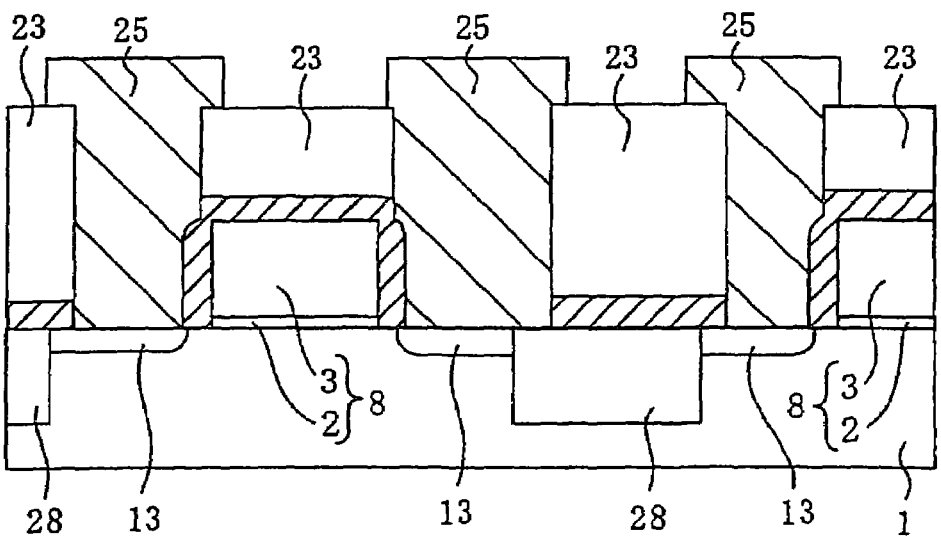

Next, as shown in FIG. 4E, a contact member is filled in the contact holes to form contacts 25. Further, the contact member is etched with use of photo lithography and etching processes to form an interconnection pattern on the inter-layer insulator.

According to the above manufacturing method, not only a binary semiconductor storage element can be formed, but also short-circuit between the source/drain diffusion regions and the substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode. Subsequently, short-circuit between the source/drain diffusion layer and the semiconductor substrate is suppressed. Consequently, it is not necessary to allow for a margin of alignment to prevent short-circuit or the like, which allows significant reduction in space occupancy, making it possible to provide a semiconductor storage device a low cost.

Further, the formation method for fulfilling the above functional effects can be performed without adding complicated steps, thereby making it possible to provide a semiconductor storage device that achieves the above functional effects at a low cost.

Fifth Embodiment

A semiconductor storage device in the fifth embodiment of the present invention will be described with reference to FIGS. 5A to 5G.

The semiconductor storage device of the present embodiment is almost identical in structure and manufacturing steps to that of the fourth embodiment except the following point.

Figure 5A:
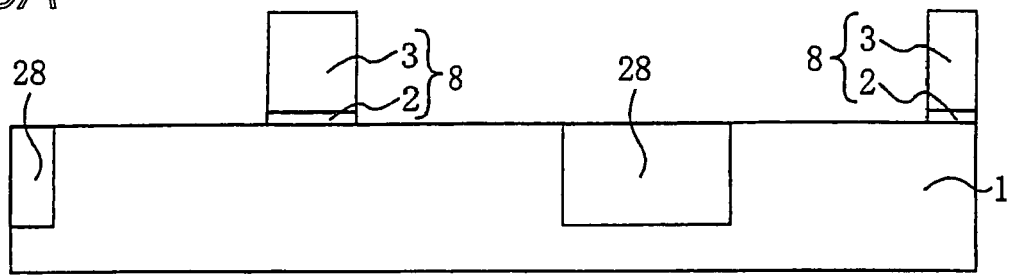
Figure 5B:
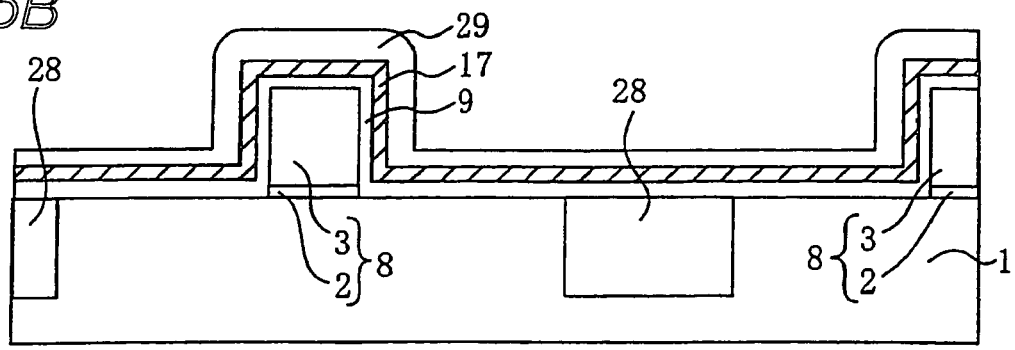
Figure 5C:
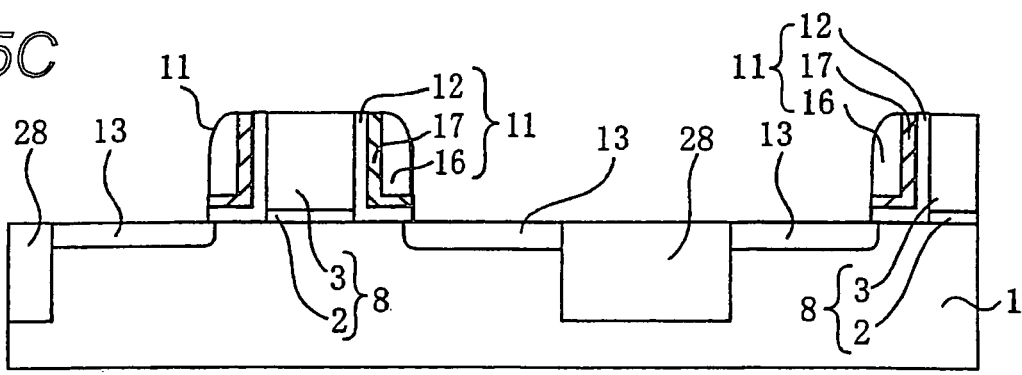

That is, as shown in FIG. 5C, before the coating film 21 is formed, memory function bodies 11 each having a charge storing function are formed, so that as shown in FIG. 5G, a semiconductor storage element identical to the device shown in FIG. 2 is formed.

The memory function body is constituted according to this structure, and a silicon nitride 17 having a charge storing function is interposed in between insulating films 12 and 16 so that retained charges are restrained from dissipating, allowing provision of a semiconductor storage device with a good retention characteristic. Further, employing the structure in which the silicon nitride 17 is interposed in between the insulating films 12 and 16 leads to restraint of the charges injected during reprogramming operation from dissipating to the gate electrode and other nodes, which increases the charge injection efficiency, allowing higher-speed operation. Further, the memory function bodies 11 and a gate electrode 8 are covered with a coating film 21, which restrains outward diffusion of impurities that would cause depletion of impurities in the gate electrode, thereby boosting yield. Furthermore, the coating film 21 has a plurality of functions described below to reduce a space occupancy of the device concerning a contact, and restrains contact failure. A plurality of these functions concerning the coating film are achieved by simply forming the coating film 21, which allows simplification of the manufacturing steps, making it possible to provide a semiconductor storage device with a low manufacturing cost.

Although in the present embodiment, description is given of the case in which the device isolation region is formed, it will be appreciated that the case in which the device isolation region is not formed is also effective. In such a case, the effects disclosed in this embodiment except the effect concerning device isolation are achieved.

Hereinbelow, the manufacturing steps of the semiconductor storage device will be described in due order with reference to FIGS. 5A to 5G.

First, as shown in FIG. 5A, a gate insulator 2 and a gate electrode 3 having MOS (Metal Oxide Semiconductor) structure formed through MOS formation process, i.e., a gate stack 8, are formed on a semiconductor substrate 1 having a p-type conductivity and including a device isolation region 28. The formation methods identical to each of the methods described in the third embodiment should be applied.

Next, as shown in FIG. 5B, a first insulating film 9 made of an oxide is formed almost evenly on the exposed surface of the gate stack 8, the semiconductor substrate 1 and the device isolation region 28. The first insulating film 9, which is made of an oxide in here, functions as an insulating film through which electrons pass, and therefore the first insulating film 9 should preferably be a film high in voltage withstand, small in leakage current and high in reliability. For example, like the material of the gate insulator 2, oxides such as thermally-oxidized films, $N_2O$ oxides and NO oxides are used. The thickness of the oxide should preferably be in the range of about 1 nm to 20 nm. Further, in the case where the insulating film is formed to be as thin as to pass tunneling current, it becomes possible to reduce a voltage required to inject or erase charges and thereby lower power consumption is achieved. The typical film thickness in this case should preferably be in the range of about 1 nm to 5 nm. By forming the first insulating film 9, the nitride 17 having a function to store charges is brought into contact with the semiconductor substrate and the gate electrode via the insulating film, which enables the insulating film to suppress leakage of retained charges. This makes it possible to form a semiconductor storage element having a good charge retention characteristic and high long-term reliability.

Next, the nitride 17 is almost evenly deposited. Although a nitride is used herein, the nitride may be replaced by materials which are capable of retaining and inducing charges, i.e., materials such as oxide nitrides that are capable of retaining substances having charges such as electrons and holes and oxides that have charge traps, materials such as ferroelectrics that are capable of inducing electrons to the surface of the memory function body by a phenomenon such as polarization, and materials which are structured to have substances capable of retaining charges such as floating polysilicon and silicon dots inside the oxide. Such materials achieve the same effects. The thickness of the nitride should be, for example, in the range of about 2 nm to 100 nm.

Further, a second insulating film 29 made of an oxide is almost evenly formed. The second insulating film should be a film having excellent step coverage such as a HTO (High Temperature Oxide) formed by CVD (Chemical Vapor Deposition) method. In the case of using the oxide, the film thickness should be in the range of about 5 nm to 100 nm. Moreover, the second insulating film may be formed by processing the surface of a nitride through heat treatment. In such a case, like the material of the aforementioned gate insulator 2, oxides such as thermally-oxidized films, N$_2$O oxides and NO oxides are used. The thickness of the oxide should preferably be in the range of about 1 nm to 20 nm. Further, in the case where the insulating film is formed to be as thin as to pass tunneling current, it becomes possible to reduce a voltage required to inject or erase charges and thereby lower power consumption is achieved. The typical film thickness in this case should preferably be in the range of about 1 nm to 5 nm.

Next, as shown in FIG. 5C, anisotropic etching of the second insulating film 29 is executed to form a side-wall insulator 16 on the side wall of the gate stack 8 via the first insulating film 9 and the nitride 17. The etching should be conducted under the condition which allows selective etching of the second insulating film 29 and provides a large selectivity against the nitride 17.

Figure 6A:
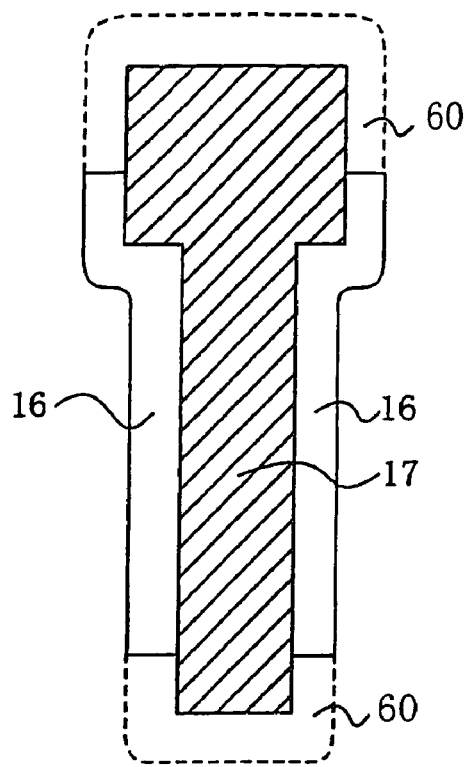
FIGS. 6A to 6D are schematic top views showing an isolated memory function body in the manufacturing steps of the semiconductor storage device.

In the case where the nitride is replaced by a material having electrical conductivity such as conductors and semiconductors, 2-bit operation is disabled if, after formation of the memory function bodies 11, continuity is developed between left and right memory function bodies 11a, 11b (See FIG. 2). Therefore, electrical insulation between the left and right memory function bodies 11a, 11b is necessary. Accordingly, as shown in FIG. 6A, a part of the side-wall insulator 16 (a portion in each removal region 60 shown by a broken line) is removed by etching. The removing method is composed of performing patterning of photoresist through a known photo lithography process so as to cover a portion of the side-wall insulator 16 other than the removal region 60. After that, anisotropic etching should be executed under the condition of a large etching selectivity against the nitride 17. It is to be noted that the removal region 60 should preferably be present on the device isolation region.

Figure 6B:
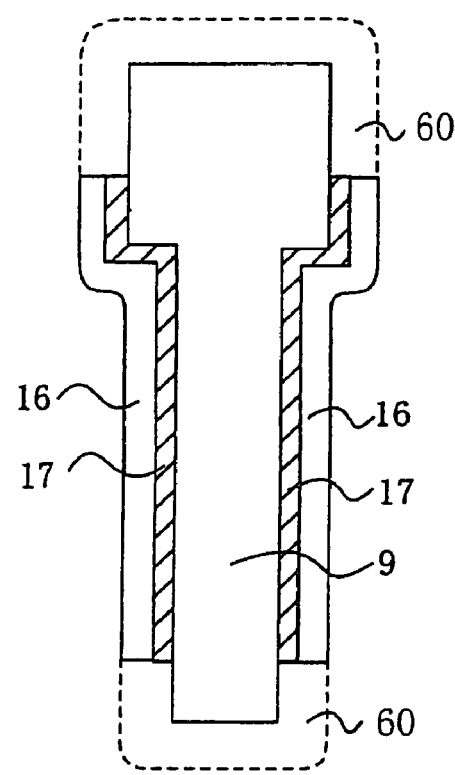

Next, with use of the side-wall insulator 16 as an etching mask, isotropic etching of the nitride 17 is performed to form an L-shaped nitride 17 on the side wall of the gate stack 8 via the first insulating film. In this case, the etching should be conducted under the condition which allows selective etching of the nitride 17 and provides a large selectivity against the first insulating film 9 and the side-wall insulator 16 made of an oxide. It is to be noted that in the case where the nitride 17 is replaced by a material having electrical conductivity such as conductors or semiconductors, a part of the side-wall insulator 16 (a portion in the removal region 60) is removed through etching in the previous step (FIG. 6A), and further since the etching in this step adopts isotropic etching, a part of the material having electrical conductivity (designated by reference numeral 17 in the drawing) is also removed in this step to produce the shape shown in FIG. 6B. This allows electric insulation between the right and left memory function bodies 11.

Next, anisotropic etching of the first insulating film 9 is performed to form an L-shaped insulator 12 composed of a part of the first insulating film 9 on the side wall of the gate stack 8. In this case, the etching should be conducted under the condition which allows selective etching of the first insulating film 9 and provides a large selectivity against the nitride 17, the gate electrode 3 and the semiconductor substrate 1.

Figure 6C:
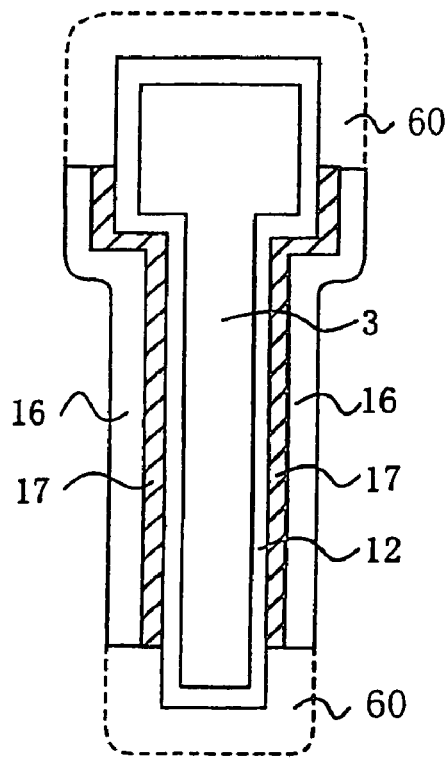
Figure 6D:
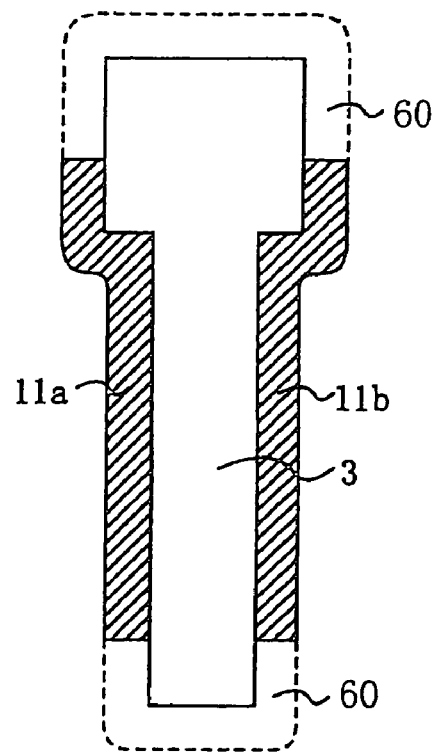

In this case, as shown in FIG. 6C, a part of the side-wall insulator 16 and the nitride 17 (a portion in the removal region 60) is removed in advance by etching. Since anisotropic etching is used in this step, a part of the L-shaped insulator 12 not covered with the nitride 17 is etched away though other parts remain around the gate electrode 3 in the state as shown in FIG. 6C. As a result, a part of the L-shaped insulator 12 remains in the state as shown in FIG. 6D and covers the outer periphery of the gate electrode, so that short-circuit between the source/drain diffusion region contact or the memory function body and the gate electrode contact can be suppressed. This facilitates miniaturization and allows high integrity of the memory.

It is to be noted that in the case where the L-shaped insulator 12 and the side-wall insulator 16 are made from the same material such as oxides, a large etching selectivity cannot be obtained. Accordingly in such a case, it is necessary to consider an etching amount of the side-wall insulator in etching of the first insulating film and appropriately reduce an etching amount for forming the side-wall insulator by the above-stated etching amount.

Further, the structure of FIG. 5B to the structure of FIG. 5C may be achieved in one step. More specifically, by executing anisotropic etching under the condition which allows selective etching of all the first insulating film 9, the second insulating film 29 and the nitride 17 and which provides a large selectivity against the material of the gate electrode 3 and the material of the semiconductor substrate 1, the process typically requiring three steps can be completed in one step. This makes it possible to reduce the number of steps and thereby decrease the manufacturing cost.

In the case where the nitride 17 is replaced by a material having electrical conductivity such as conductors and semiconductors, electrical insulation between the left and right memory function bodies 11a, 11b is necessary. Accordingly, after the memory function body is formed on the entire circumference of the gate stack 8 by the aforementioned method, a part of the side-wall insulator 16 (a portion in the removal region 60) is removed by etching as shown in FIG. 6C. The removing is composed of performing patterning of photoresist through a known photo lithography process so as to cover a portion of the side-wall insulator 16 other than the removal region 60. After that, anisotropic etching is executed to remove the removal region that is an exposed portion of the side-wall insulator 16. The etching should be conducted under the condition which allows selective etching of the side-wall insulator 16 and provides a large etching selectivity against the material having electrical conductivity. Further, a part of the material having electrical conductivity (a portion in the removal region 60) is removed by etching. The removing method is composed of performing anisotropic etching and isotropic etching with use of the previously formed photoresist in the state that a portion of the material having electrical conductivity other than the removal region is covered so as to remove a portion in the removal region that is an exposed portion. The etching should be conducted under the condition which allows selective etching of the material having electrical conductivity and provides a large etching selectivity against the L-shaped insulator 12. In this step, the L-shaped insulator 12 remains so as to cover the outer periphery of the gate electrode, so that short-circuit between the source/drain contacts and the gate electrode can be suppressed. This facilitates miniaturization and allows high integration of the memory. Further, as shown in FIG. 6D, the removal region of the memory function body 11 may be etched away in one etching operation. More specifically, through a known photo lithography process, patterning of photoresist is performed so as to cover a portion of the memory function body other than the removal region. After that, anisotropic etching is executed under the condition which allows selective etching of all the first insulating film 9, the second insulating film 29 and the nitride 17 and which provides a large etching selectivity against the material of the gate electrode 3 and the material of the semiconductor substrate 1, by which the process typically requiring three steps can be completed in one step. This makes it possible to reduce the number of steps and thereby decrease the manufacturing cost.

Next, with use of the gate electrode 3 and the memory function bodies 11 as a mask, source/drain injection is executed, and then known activated heating treatment is performed to form the source/drain diffusion regions 13 in a self-aligning way.

Through the above-stated steps, the memory function bodies 11 are formed. A semiconductor storage device of the present embodiment having this memory function bodies 11 achieve the following effects.

When charges are retained in the memory function body 11, a part of the channel formation region is strongly influenced by the charges, by which a drain current value is changed. Consequently, a semiconductor storage element that identifies the presence and absence of charges is formed.

Moreover, the gate insulator 2 and the memory function body 11 are separately disposed so that different scaling is applied to each of the gate insulator 2 and the memory function body 11, making it possible to suppress the short-channel effect and provide a semiconductor storage device with a good memory effect.

Further, since the nitride 17 in the memory function body is in contact with the semiconductor substrate 1 and the gate electrode 3 via an insulating film, leakage of retained charges can be restrained by the insulating film. Consequently, a semiconductor storage element with a good retention characteristic and high long-term reliability is formed.

Further, in the case of using a conductor or semiconductor as the memory function body, positive potentials, if applied to the gate electrode, are polarized in the memory function body, as a result of which electrons are induced in the vicinity of the side-wall portion of the gate electrode, thereby decreasing electrons in the vicinity of the channel formation region. This makes it possible to promote injection of electrons from the substrate or the source/drain region, allowing formation of a semiconductor storage element with a high write speed and high reliability.

Figure 5D:
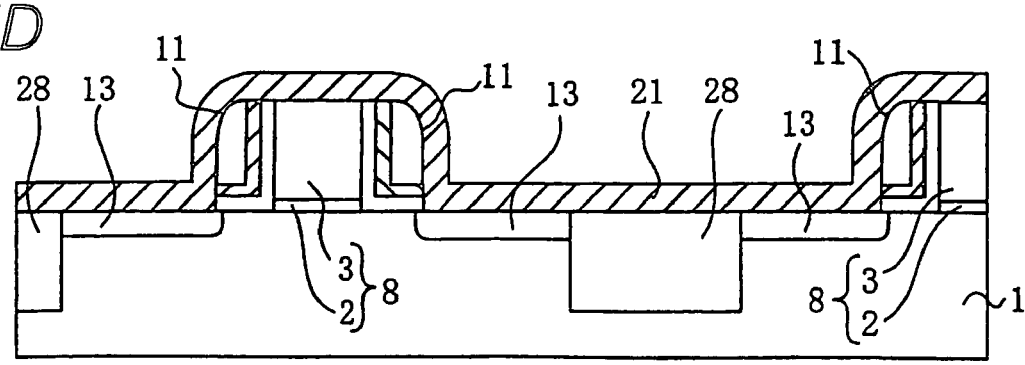

Next, as shown in FIG. 5D, a coating film 21 made of a nitride is formed on the exposed surface of the gate stack 8, the memory function bodies 11, the semiconductor substrate 1 and the device isolation region 28. The formation method thereof may be identical to the method described in the third embodiment.

Next, as shown in FIG. 5E, an interlayer insulator 23 made of an oxide is formed. After that, contact holes 24 for forming contacts to connect the source/drain diffusion regions and interconnection lines respectively are formed in the interlayer insulator 23. Each of these steps may be identical to those described in the fourth embodiment.

In order to clarify the effects implemented by the present embodiment, the drawings herein show the case in which the contact hole is positioned such that at least a part of the contact hole overlaps with the top of the device isolation regions 28. However, the same effects are achieved even if the contact hole is not placed in reality in the position specified in the present embodiment. More specifically, in designing the memory element disclosed in the prior art, the device should be designed so as to allow for a sufficient margin of alignment between, for example, the device isolation region and the contact hole, which enlarged a space occupancy of the device. In the present embodiment, however, it is not necessary to allow for a sufficient margin of alignment, which reduces a space occupancy of the device, allowing reduction in manufacturing cost per element. More precisely, the effects, which are characteristic effects of the present invention, are generated by provision of each coating film and are generated in the stage of device design, and therefore it is impossible to gauge the validity of the effects from the completed shape of the device.

Herein, if, in the case of the memory element disclosed in the prior art, etching for forming contact holes is executed without allowing for a sufficient margin of alignment and as a result, the position of the contact hole overlaps with the top of the device isolation region 28 as shown in the drawing, then the device isolation region is etched by the contact etching because the coating film 21 made of a nitride is not present and the primary materials of the interlayer insulator and the interlayer insulator are both oxides. The depth of etching in the device isolation region depends on an over-etching amount associated with dispersion of etching. If the device isolation region is etched deeper than the source/drain diffusion regions 13, then a contact is formed in the deeply etched portion in the later contact forming step. Consequently, the source/drain diffusion regions and the substrate are connected via the contact, resulting in occurrence of failures due to short-circuit. If the coating film 21 made of a nitride is formed, then etching for forming contact holes can be stopped by the coating film whose material is different from that of the interlayer insulator. Further in the later step, in etching the coating film made of a nitride to create complete openings of the contact holes, it becomes possible to etch only the coating film without etching most of the device isolation region. This makes it possible to restrain failures that would be caused by the source/drain diffusion regions and the substrate being connected via the contact, thereby allowing provision of a semiconductor storage device with good yield and a low manufacturing cost.

Moreover, a technique to form shallow source/drain diffusion regions for controlling the short-channel effect is being frequently utilized these days, which further increases the likelihood of occurrence of short-circuit. Therefore, the etching technique utilizing this coating film is quite effective.

Next, as shown in FIG. 5F, the coating film 21 under the contact holes is removed through anisotropic selective etching. The same etching method as described in the third embodiment may be used.

Thus, etching of the interlayer insulator is once stopped by the coating film 21 and then, etching of the coating film 21 is performed to complete the contact holes. In this way, it becomes possible to prevent short-circuit between the source/drain diffusion regions and the semiconductor substrate that is attributed to deep etching of the semiconductor substrate, easily restrain the surface of the semiconductor substrate from being roughened, and suppress contact failure. Moreover, as described with reference to FIG. 4C, the device isolation region 28 can suppress short-circuit failure between the source/drain diffusion regions and the substrate that would be caused by etching.

Next, as shown in FIG. 5G, a contact member is filled in the contact holes to form contacts 25. Further, the contact member is etched with use of photo lithography and etching processes to form an interconnection pattern on the interlayer insulator.

According to the above manufacturing method, not only a binary semiconductor storage element can be formed, but also short-circuit between the source/drain diffusion regions and the substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode. Subsequently, short-circuit between the source/drain diffusion regions and the semiconductor substrate is suppressed. Consequently, it is not necessary to allow for a margin of alignment to prevent short-circuit or the like, which allows significant reduction in space occupancy, making it possible to provide a semiconductor storage device with a low cost.

Further, the formation method for fulfilling the above functional effects can be performed without adding complicated steps, thereby making it possible to provide a semiconductor storage device that achieves the above functional effects at a low cost.

Further, the structure of the memory function body makes it possible to provide a semiconductor storage device which has a good retention characteristic and which allows higher-speed operation.

Further, charges retained in an insulator, a conductor or a semiconductor which has a function to store the charges can be restrained from dissipating by the insulator having a function to restrain dissipation of charges. Therefore, a semiconductor storage device with a good retention characteristic can be provided. Also, the charges injected during reprogramming operation are also restrained from dissipating to the gate electrode and other nodes, which increases the charge injection efficiency, allowing higher-speed operation. Further, the memory function body and the gate electrode are covered with the coating film, which restrains outward diffusion of impurities that would cause depletion of impurities in the gate electrode, thereby boosting yield. Furthermore, the coating film can restrain retained charges in the memory function body from dissipating, making it possible to provide a semiconductor storage device with a better retention characteristic and high reliability. Further, the source/drain diffusion regions are not disposed below the gate electrode, i.e., the offset region remains below the memory function body. Consequently, an inversion layer is deleted or formed by the presence or absence of excessive electrons in the memory function body, as a result of which large hysteresis (threshold change) can be gained, making it possible to provide a semiconductor storage device with good write/erase characteristics. Furthermore, write/erase operations by hot carriers generated in the offset region are executable, allowing provision of a semiconductor storage device supporting 2-bit operation.

Sixth Embodiment

The outline of a semiconductor storage device in a sixth embodiment of the present invention will be described with reference to FIGS. 7A to 7C and FIG. 8. It is to be noted that in the following description regarding the drawings, component members made from like materials and substances are sometimes designated by like reference numeral, though those component members do not necessarily share the like shapes.

Figure 7A:
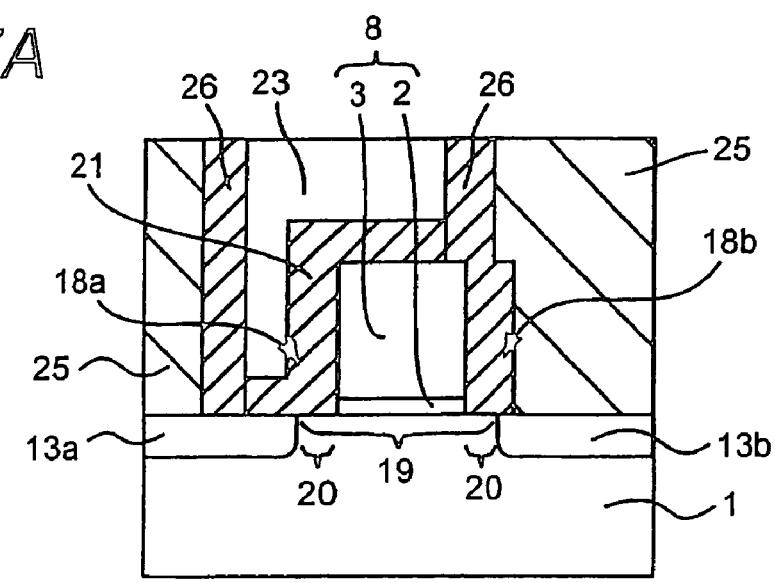
FIGS. 7A to 7C are schematic cross sectional views each showing a structure of a semiconductor storage device in a sixth embodiment of the present invention.

FIG. 7A shows a cross sectional structure of a semiconductor storage element of a seventh embodiment in the present invention. As shown in FIG. 7A, the semiconductor storage device is composed of a gate electrode 3 formed on a semiconductor substrate 1 via a gate insulator 2 (the gate insulator 2 and the gate electrode 3 constitute a gate stack 8), a channel formation region 19 disposed at least in a region under the gate electrode 3 in the semiconductor substrate 1, a pair of source/drain diffusion regions 13a, 13b which are disposed on the opposite sides of the channel formation region 19 of the semiconductor substrate 1 and have a conductivity opposite to that of the channel formation region 19, an interlayer insulator 23 formed at least above the top side of the gate electrode 3, first and second coating films 21, 26 which are formed so as to cover the top side and the lateral side of the gate electrode 3 and formed on the lateral side of the interlayer insulator 23, and contacts 25 made of a contact material filled in contact holes formed on the lateral side of the first and second coating films 21, 26 and the interlayer insulator 23.

The contacts 25 are electrically connected to the source/drain diffusion regions 13a, 13b, respectively. The first and second coating films 21, 26 include charge retention sections 18a, 18b made of an conductor having a function to retain charges and function as etching stopper materials in etching the interlayer insulator 23. As the first and second coating films 21, 26, insulating films should preferably be used so that interconnecting lines and an electrode would be electrically isolate.

Further, as the materials of the first and second coating films 21, 26, it is preferable to use materials which provide the condition of a large etching selectivity against the coating films 21, 26 in anisotropic selective etching of the interlayer insulator 23 so that the coating films 21, 26 could function as etching stoppers in etching to form contact holes in the interlayer insulator 23. To cite one example, a silicon nitride should be used as the materials of the first and second coating films 21, 26 since a silicon oxide is widely used as the material of the interlayer insulator 23.

Further, the materials of the first and second coating films 21, 26 should be those other than the material of the device isolation region or the material of the device isolation region embedding material, which provide the condition of a large etching selectivity against the device isolation region in anisotropic selective etching of the first and second coating films 21, 26 so that the device isolation region is not etched during formation of contacts in the coating films 21, 26. To cite one example, a silicon nitride should be used as the materials of the first and second coating films since a silicon oxide is widely used as the material of the device isolation region or the material of the device isolation region embedding material.

In this case, the first and second coating films 21, 26 are silicon nitrides having trap levels to retain charges. Further, the opposite side-wall portions of the gate stack 8 in the first and second coating films 21, 26 respectively serve as the charge retention sections 18a, 18b for substantially retaining charges. Further, a structure that characterizes the present invention is the structure of the first coating film 21 and the interlayer insulator 23 formed thereon. By etching the first coating film 21 covering the semiconductor substrate 1 and the gate stack 8 with use of the interlayer insulator 23 as a mask, the structure of the coating film 21 is formed as shown in the drawing. It means that the relation between the first coating film 21 and the interlayer insulator 23 corresponds to the relation between an etching film and an etching mask. Further, the above-mentioned etching, which is the etching to form the contacts 25, adopts the step of stopping the etching once by the first coating film 21 and then etching the first coating film 21. This restrains the surface of the source/drain diffusion regions 13a, 13b from being roughened and thereby restrains contact failure. Since the source/drain diffusion regions 13a, 13b are not deeply etched, short-circuit between the source/drain diffusion regions 13a, 13b and the semiconductor substrate 1 is prevented. Further, in the case where a device isolation region is provided, short-circuit between the source/drain diffusion regions 13a, 13b and the semiconductor substrate 1 that would be caused by the device isolation region being etched during contact etching can be also suppressed.

Further, the second coating film 26 is formed on a portion of the first coating film 21, the interlayer insulator 23 and the gate stack 8 which is exposed to the contact hole. Furthermore, on the side-wall portion of the second coating film 26, there is formed a contact 25, which is in contact with the source/drain diffusion regions 13a or 13b and has electric continuity.

Further, the gate stack 8 is covered with the coating films 21, 26, which restrains outward diffusion of impurities that would cause depletion of impurities in the gate electrode, thereby boosting yield.

The source/drain diffusion regions 13a, 13b respectively function as a source region or a drain region. The semiconductor storage device has an offset structure. More specifically, the both source/drain diffusion regions 13a, 13b do not extend to the region under the gate electrode and therefore offset regions 20, 20 are produced.

From the above description, in the semiconductor storage device shown in FIG. 7A, the first coating film 21 and the second coating film 26 have a plurality of functions to reduce a space occupancy of a device concerning a contact, restrain contact failure, and further have a function as a memory function section for retaining charges in the 2-bit memory element. A plurality of these functions are achieved by simply forming the first coating film 21 and the second coating film 26, which allows simplification of the manufacturing steps, making it possible to provide a semiconductor storage device with a low manufacturing cost.

In FIG. 7A, only on one side of the gate electrode 3, the contact 25 is formed near the gate electrode 3, and even if a contact hole is formed on top of the gate electrode 3, the contact 25 and the gate electrode 3 would not be short-circuited in reality because the second coating film 26 is formed. Consequently, it is not necessary to allow for a large margin of alignment between the contact 25 and the gate electrode 3 in design, thereby allowing miniaturization of the element. More specifically, even if the gate electrode 3 and the contact hole are overlapped through actual processing, short circuit will not occur because the coating film can cover the gate electrode 3 if the width of an overlapped portion is identical to or smaller than the film thickness of the coating film. In this structure, however, the other contact hole does not overlap with the gate electrode side-wall portion of the gate electrode 3. According to this structure, only one side of the contact 25 is close to the gate electrode 3, and therefore a space occupancy of the device is increased by the other side of the contact 25.

Figure 7B:
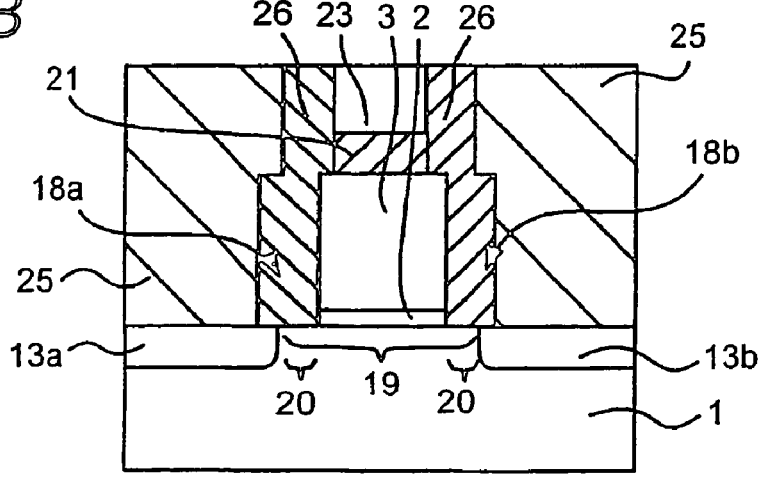

FIG. 7B shows a cross sectional structure of another semiconductor storage device in the sixth embodiment of the present invention. This structure brings about the same effects as those in FIG. 7A and allows further miniaturization of the deice. In this semiconductor storage device, the both of the contacts have the above structure, which miniaturizes the device more than the structure shown in FIG. 7A.

In the following embodiments and reference to the drawings, description will be given based on only one of the structures shown in FIG. 7A and FIG. 7B. If no specific statement is given, either of the structures can be used. If the structure in which both of the contact holes overlap with the side-wall portion of the gate electrode as shown in FIG. 7B is used, it should be understood that this structure is effective for the miniaturization effort, in addition to which almost all the other effects other than the miniaturization effect are also achieved.

Figure 7C:
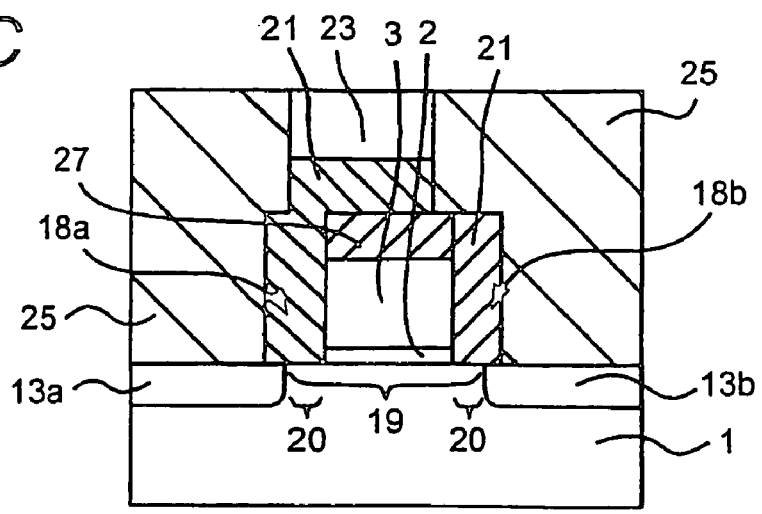

FIG. 7C shows a cross sectional structure of another semiconductor storage element in the sixth embodiment of the present invention. This semiconductor storage element has a structure in which a third coating film 27 is formed on the top portion of the gate electrode 3. Consequently, even if the contact hole overlaps with the gate electrode 3 through processing like FIGS. 7A and 7B, the gate electrode 3 and the contact 25 would not be short-circuited, thereby fulfilling the same miniaturization effect. Further, like the relation between the above described FIG. 7A and FIG. 7B, the opposite sides of the gate electrode 3 may be formed so as to overlap with the contact hole through processing, and if that is the case, the aforementioned same effects are achieved.

Further in FIGS. 7A to 7C, the charge retention sections 18a, 18b may have a structure in which quantum dots of nanometer sizes (nanodot) are found scattered in the insulating film. In this case, the same effects can also be fulfilled. For example, in the semiconductor storage device stated in FIGS. 7A and 7C, though the first coating film 21 and the second coating film 26 cover the side surfaces and the upper surface of the gate stack 8, the charge retention sections 18a, 18b for substantially retaining charges locate at the opposite side-wall portions of the gate electrode 3. This means that a function to retain charges or a material to retain polarization should be disposed on these regions. Therefore, forming nanodots in these regions further improves the retention characteristic.

Figure 8:
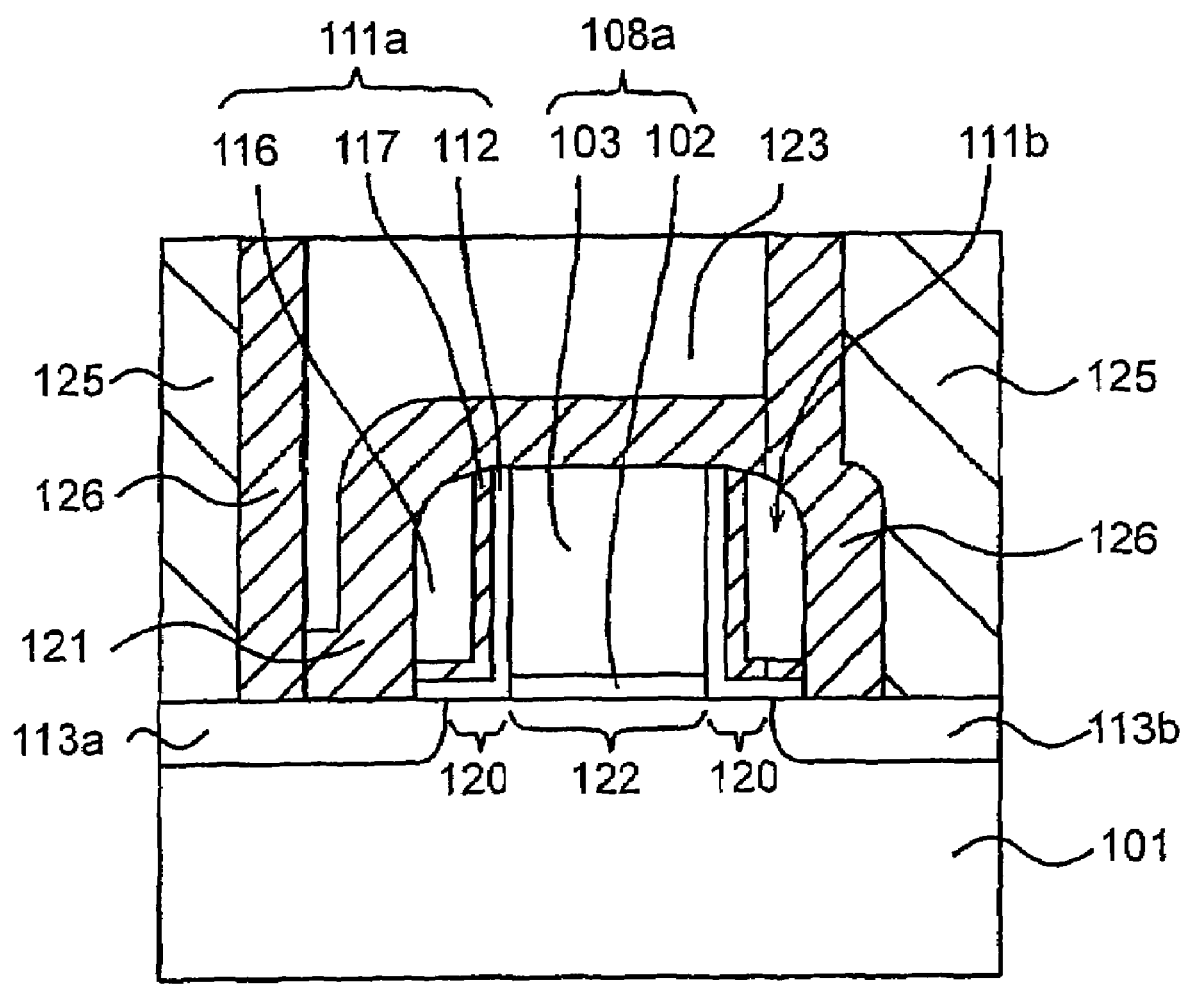
FIG. 8 is a schematic cross sectional view showing another structure of the semiconductor storage device in the sixth embodiment.

FIG. 8 shows another semiconductor storage device in the sixth embodiment of the present invention. In FIG. 8, there are shown a semiconductor substrate 101, a gate insulator 102, a gate electrode 103, a gate stack 108, source/drain diffusion regions 113a, 113b, a silicon nitride 117 exemplifying the charge retention section, a first insulator 112, a side-wall insulator 116, a channel formation region 119, an offset region 120, a first coating film 121, an underneath region 112 of the gate electrode 103, an interlayer insulator 123, contacts 125 and a second coating film 126. This semiconductor storage device is different from the semiconductor storage device shown in FIGS. 7A and 7C in the point that memory function bodies 111a, 111b are formed. The memory function bodies 111a, 111b are composed of a silicon nitride 117 having trap levels that retain charges, and an insulator 112 and a side-wall insulator 116 that are made of a silicon oxide and are disposed so as to sandwich the silicon nitride 117 therebetween. The charge retention sections 18a, 18b in the FIGS. 7A and 7C are each equivalent to the silicon nitride 117 in the memory function bodies 111a, 111b in FIG. 8.

Accordingly, the silicon nitride 117 that functions as a charge retention section in FIG. 8 is interposed in between the first insulator 112 and the side-wall insulator 116 so that retained charges are restrained from dissipating, allowing provision of a semiconductor storage device with a good retention characteristic. Further, employing the structure in which the silicon nitride 117 is interposed in between the first insulator 112 and the side-wall insulator 116 leads to restraint of the charges injected during reprogramming operation from dissipating to the gate electrode and other nodes, which increases the charge injection efficiency, allowing higher-speed operation. Further, the memory function bodies 111a, 111b and the gate stack 108 are covered with the first and second coating films 121, 126, which restrains outward diffusion of impurities that would cause depletion of impurities in the gate electrode 103, thereby boosting yield. Furthermore, the device has a plurality of functions to reduce a space occupancy of the device concerning a contact, and restrains contact failure. A plurality of these functions are achieved by forming the first and second coating films 121, 126, which allows simplification of the manufacturing steps, making it possible to provide a semiconductor storage device with a low manufacturing cost.

It is to be noted that in FIG. 8, the silicon nitride 117 may be replaced by a conductor (floating gate) or a ferroelectric, which brings about the same effects.

Although a silicon oxide is used as a material of the first insulator 112 and the side-wall insulator 116, any material which is capable of restraining dissipation of charges fulfills the same effects. Such materials include insulating films such as a silicon oxide nitrides, high dielectric films such as aluminum oxides, titanium oxides tantalum oxides and hafnium oxides, and low dielectric films.

Description is now given of various aspects of the semiconductor storage device.

The semiconductor storage device is mainly composed of a gate insulator, a gate electrode formed on the gate insulator, a memory function body (or charge retention sections) formed on the opposite sides of the gate electrode, source/drain diffusion regions, at least a part of which is disposed under the memory function body (charge retention section), and a coating film formed so as to cover the gate electrode or the gate electrode and the memory function body (or the charge retention section) and further cover a part of the semiconductor substrate.

The semiconductor storage device functions as a semiconductor storage device for storing four values or more data by storing two values or more data in one memory function body (or the charge retention section). Moreover, the semiconductor storage device functions as a memory cell having both functions as a select transistor and a memory transistor due to the variable resistance effect gained by the memory function body. However, the semiconductor storage device does not necessarily need to function so as to store four values or more data, but may function to store two values or more data for example.

Further, the semiconductor storage device can function as a memory cell having both functions as a select transistor and a memory transistor due to the variable resistance effect gained by the memory function body.

Moreover, the semiconductor substrate and the gate electrode should preferably be formed from a material made of silicon. In such a case, the semiconductor substrate and the gate insulator are made of silicon that is widely used as a material of semiconductor devices today, and therefore a semiconductor process having an extremely high compatibility with the conventional semiconductor manufacturing process can be developed. This makes it possible to provide a semiconductor storage device with a low manufacturing cost.

It is preferable that the semiconductor storage element constituting the semiconductor device of the present invention is formed on a semiconductor substrate, or in a well region formed in a semiconductor substrate and having the same conductivity type as the channel forming region in the semiconductor substrate.

The semiconductor substrate is not limited to particular ones as far as it is applicable to semiconductor apparatuses, and it is possible to use various substrates such as substrates made from elemental semiconductors including silicon and germanium, substrates made from compound semiconductors including SiGe, GaAs, InGaAs, ZnSe, and GaN, SOI (Silicon on Insulator) substrates and multilayer SOI substrates, and substrates having a semiconductor layer on a glass or plastic substrate. Among these, a silicon substrate or an SOI substrate having a silicon surface layer is preferable. The semiconductor substrate or the semiconductor layer may be either of a single crystal (e.g., single crystal obtained by epitaxial growth), polycrystalline, or amorphous, though a current amount flowing inside will be slightly different among them.

In the semiconductor substrate or the semiconductor layer, it is preferable that device isolation regions are formed, and it is more preferable to combine elements such as transistors, capacitors and resistors, a circuit composed thereof, a semiconductor device, and an inter-layer insulating film or films to form into a single or a multilayer structure. It is noted that the device isolation region may be formed by any of various device isolation films including a LOCOS (local oxidation of silicon) film, a trench oxide film, and an STI (Shallow Trench Isolation) film. The semiconductor substrate may be either of a P type or an N type conductivity type, and it is preferable that at least one first conductivity type (P type or N type) well region is formed in the semiconductor substrate. Acceptable impurity concentrations of the semiconductor substrate and the well region are those within the known range in the art. It is noted that in the case of using an SOI substrate as the semiconductor substrate, a well region may be formed in the surface semiconductor layer, and also a body region may be provided under the channel forming region. Thus, the well region and the body region formed on the semiconductor substrate and the surface semiconductor layer have a conductivity type opposite to the conductivity type of impurities in the source/drain diffusion regions, and have a impurity concentration properly adjusted, respectively. More particularly, current that leaks from one source/drain diffusion region to the other source/drain diffusion region can be reduced by forming the well region and the body region. This also makes it possible to reduce the substrate floating effect which is produced when SOI substrates are used.

Examples of the gate insulating film are not particularly limited and include those for use in typical semiconductor apparatuses, such as insulating films including silicon oxide films and silicon nitride films; and high-dielectric films including aluminum oxide films, titanium oxide films, tantalum oxide films, hafnium oxide films, in the form of single-layer films or multi-layer films. Among these, the silicon oxide film is preferable. An appropriate thickness of the gate insulating film is, for example, approx. 1 to 20 nm in equivalent insulator thickness, preferably 1 to 6 nm. The gate insulating film may be only formed right under the gate electrode, or may be formed to be larger (in width) than the gate electrode. The gate electrode depends on the structure and the process, and if large in width, the gate electrode can also function as an insulating film disposed under the memory function body, thereby allowing simplification of the manufacturing steps.

The gate electrode or electrode is formed on the gate insulation film normally in a shape for use in a semiconductor device or a shape that has a concave portion in a lower end portion. Herein, the "single gate electrode" is defined as a gate electrode consisting of a monolayer or multilayer conductive film and formed into a single inseparable piece. The gate electrode may have a side wall insulation film on each side surface. The gate electrode is normally not specifically limited so long as it is used for a semiconductor device, and there can be enumerated conductive films of: polysilicon; metals including copper and aluminum; high-melting metals including tungsten, titanium, and tantalum; and silicides of high-melting metals, in the form of a single-layer or a multi-layer. The gate electrode should properly be formed with a film thickness of, for example, about 50 to 400 nm. It is to be noted that a channel forming region is formed under the gate electrode. The channel formation region should preferably be formed not only under the gate electrode but also under a region including an outside of the gate electrode along its longitudinal direction at the edge of the gate electrode (offset structure). Thus, in the case where a channel formation region not covered with the gate electrode is present, the channel formation region should preferably be covered with the gate insulator or a later-described charge retention section.

The memory function body has at least a film or a region having a function of retaining electric charges, a function of storing and retaining charges, a function of trapping charges or a function of retaining a charge polarized state. Materials implementing these functions include: silicon nitride; silicon; silicate glass including impurities such as phosphorus or boron; silicon carbide; alumina; high-dielectric substances such as hafnium oxide, zirconium oxide, or tantalum oxide; zinc oxide; and metals. The memory function body may be formed into single-layer or multi-layer structure of: for example, an insulating film containing a silicon nitride film; an insulating film incorporating a conductive film or a semiconductor layer inside; and an insulating film containing one or more conductor dots or semiconductor dots. Among these, the silicon nitride is preferable because it can achieve a large hysteresis property by the presence of a number of levels for trapping electric charges, and has good holding characteristics in that the electric-charge holding time is long and that there hardly occurs leakage of electric charges caused by generation of leakage paths, and further because it is a material normally used in LSI process.

Use of an insulating film containing inside an insulating film having a charge holding function such as a silicon nitride film enables increase of reliability relating to memory holding. Since the silicon nitride film is an insulator, electric charges of the entire silicon nitride film will not be immediately lost even if part of the electric charges is leaked. Further, in the case of arraying a plurality of storage devices, even if the distance between the storage devices is shortened and adjacent memory function bodies come into contact with each other, information stored in each memory function body is not lost unlike the case where the memory function body is made from a conductor. Also, it becomes possible to dispose a contact plug closer to the memory function body, or in some cases it becomes possible to dispose the contact plug so as to overlap with the memory function body, which facilitates miniaturization of the storage devices.

For further increase of the reliability relating to the memory holding, the insulator having a function of holding electric charges is not necessarily needed to be in the film shape, and insulators having the function of holding an electric charge are preferably present in an insulating film in a discrete manner. More specifically, it is preferable that an insulator is dispersed like dots over a material having difficulty in holding electric charges, such as silicon oxide.

Also, use of an insulator film containing inside a conductive film or a semiconductor layer as a memory function body enables free control of quantity of electric charges injected into the conductor or the semiconductor, thereby bringing about an effect of facilitating achieving multi level cell.

Further, using an insulator film containing one or more conductor or semiconductor dots as a memory function body facilitates execution of write and erase due to direct tunneling of electric charges, thereby bringing about an effect of reduced power consumption.

Moreover, it is acceptable to use, as a memory function body, a ferroelectric film such as PZT (lead zirconate titanate) and PLZT (lead lanthanum zirconate titanate) whose polarization direction is changed by an electric field. In this case, electric charges are substantially generated by polarization on the surface of the ferroelectric film and retained in the state. Therefore, electric charges are supplied from outside the film that has the memory function, and a hysteresis characteristic similar to that of the film that traps electric charges can be obtained. In addition, since there is no need to inject electric charges from outside the film and the hysteresis characteristic can be obtained only by the polarization of the electric charges in the film, high-speed write and erase is achievable.

It is preferable that the memory function body further contains a region that obstructs escape of electric charges or a film having a function of obstructing escape of electric charges. Materials fulfilling the function of obstructing escape of electric charges include a silicon oxide.

The charge holding portion contained in the memory function body is formed on opposite sides of the gate electrode directly or through an insulating film, and it is disposed on the semiconductor substrate (a well region, a body region, or a source/drain diffusion region or a diffusion layer region) directly or through the gate insulating film or the insulating film. The charge holding portions on opposite sides of the gate electrode are preferably formed so as to cover all or part of side walls of the gate electrode directly or thought the insulating film. According to such disposition arrangement, the contact plug can be disposed so as to be closer to the gate electrode, which facilitates miniaturization of the semiconductor storage element. In an application where the gate electrode has a recess portion on the lower edge side, the charge holding portion may be formed so as to fill the entire recess portion or part of the recess portion directly or through the insulating film.

Preferably, the gate electrode is formed only on the side wall of the memory function body or formed such that the upper portion of the memory function body is not covered. In such disposition, it becomes possible to dispose a contact plug closer to the gate electrode, which facilitates miniaturization of the semiconductor storage elements. Also, the semiconductor storage elements having such simple disposition are easily manufactured, resulting in an increased yield.

In the case of using a conductive film as the charge holding portion, the charge holding portion is preferably disposed with interposition of an insulating film so that the charge holding film is not brought into direct contact with a semiconductor substrate (a well region, a body region, or a source/drain diffusion region or a diffusion layer region) or the gate electrode. This is implemented by, for example, a multi-layer structure composed of a conductive film and an insulating film, a structure of dispersing a conductive film like dots in an insulating film, and a structure of disposing a conductive film within part of a side-wall insulating film formed on the side wall of the gate.

The source/drain diffusion regions are disposed on the side of the memory function bodies opposed from the gate electrode as diffusion regions having a conductivity type opposite to that of the semiconductor substrate or of the well region. In the portion where the source/drain diffusion region is joined to the semiconductor substrate or the well region, impurity concentration is preferably sharp. This is because the sharp impurity concentration efficiently generate hot electrons and hot holes with low voltages, which enables high-speed operations with lower voltages. The junction depth of the source/drain diffusion region is not particularly limited and so it is adjustable where necessary, according to performance and the like of a memory device to be manufactured. It is noted that if an SOI substrate is used as the semiconductor substrate, the junction depth of the source/drain diffusion region may be smaller than the film thickness of a surface semiconductor layer, though preferably the junction depth is almost equal to the film thickness of the surface semiconductor layer.

The source/drain diffusion region may be disposed so as to be overlapped with the edge of the gate electrode, or to meet the edge of the gate electrode, or to be offset from the edge of the gate electrode. Particularly, it is preferable that the source/drain diffusion region is offset relative to the edge of the gate electrode. This is because in this case, when voltage is applied to the gate electrode, easiness of inversion of the offset region under the charge holding portion is largely changed by an electric charge amount stored in the memory function body, resulting in increased memory effect and reduced short channel effect. It is noted, however, that too much offset extremely reduces drive current between the source and the drain. Therefore, it is preferable that an offset amount, that is a distance from one edge of the gate electrode to the source or drain region closer thereto in the gate length direction, is shorter than the thickness of the charge holding portion in the gate length direction. What is particularly important is that at least part of the charge holding portion in the memory function body overlaps with the source/drain diffusion region serving as a diffusion layer region. This is because the nature of semiconductor storage elements constituting the semiconductor device of the present invention is to rewrite memory with an electric field crossing the memory function body by voltage difference between the gate electrode present only on the side wall portion of the memory function body and the source/drain diffusion region.

Further, the source/drain diffusion regions are displaced from the end portions of the gate electrode, which allows effective injection of electrons and holes in the memory function body, making it possible to form a semiconductor storage device with a high write/erase speed.

Part of the source/drain diffusion region may be extended to the position higher than the surface of the channel forming region, that is, the lower face of the gate insulating film. In this case, it is appropriate that a conductive film is laid on a source/drain diffusion region formed in the semiconductor substrate in an integrated manner with the source/drain diffusion region. Examples of the conductive film include semiconductors such as polysilicon and amorphous silicon, silicide, and the above described metals and high-melting metals. Among these, the polysilicon is preferable. Since the polysilicon is extremely larger in impurity diffusion speed than the semiconductor substrate, it is easy to shallow the junction depth of the source/drain diffusion region in the semiconductor substrate, and it is easy to control short channel effect. In this case, it is preferable that the source/drain diffusion region is disposed such that at least part of the charge holding film is sandwiched between part of the source/drain diffusion region and the gate electrode.

Further, the coating film is composed of a silicon nitride and works as a stopper in the process of contact etching for forming contact holes in an interlayer insulator. Accordingly, the coating film prevents short-circuit between the source/drain diffusion regions and the semiconductor substrate that would be caused by deep etching of the semiconductor substrate and further restrains the surface of the semiconductor substrate from being roughened. This leads to restraint of contact failure between the source/drain diffusion regions and the upper interconnection lines and further leads to prevention of short-circuit between the contact to the source/drain diffusion regions and the gate electrode. Consequently, it is not necessary to allow for a margin of alignment to prevent short-circuit or the like, which allows significant reduction in space occupancy, making it possible to provide a semiconductor storage device with a low cost.

In the semiconductor storage element, a single gate electrode formed on the gate insulator, one source/drain diffusion region, the other source/drain diffusion region and a semiconductor substrate serve as four terminals, and specified potentials are given to each of these four terminals so that write, erase and read operations are executed. Specific operation principle and examples of operating voltages will be described later. When the semiconductor storage devices of the present invention are disposed in array to constitute a memory cell array, each memory cell can be controlled by a single control gate, which makes it possible to reduce the number of word lines.

Further, the memory function body (charge retention section) of the present invention is formed independently of the gate insulator. Therefore, a memory function implemented by the memory function body (charge retention section) and a transistor operation function implemented by the gate insulator are separated. As a consequence, a design policy for forming a thinner gate insulator or the like to optimize the transistor operation and a design policy for materials of the memory function body or the like to optimize the memory function can be independently determined. This makes it possible to easily achieve a good memory function while a good transistor operation characteristic is maintained.

The semiconductor storage element of the present invention can be formed by the ordinary semiconductor process according to a method similar to the method of forming a side wall spacer of a single layer or laminate structure on the side wall of the gate electrode or word line. In particular, there can be enumerated: a method comprising forming a gate electrode or a word line, thereafter forming a single layer film or multilayer film including a charge retaining portion, such as a charge retaining portion, a charge retaining portion/insulation film, an insulation film/charge retaining portion, and an insulation film/charge retaining portion/insulation film, and leaving the film or films in a side wall spacer shape by etching back under appropriate conditions; a method comprising forming an insulation film or a charge retaining portion, leaving the film in a side wall spacer shape by etching back under appropriate conditions, further forming a charge retaining portion or insulation film and leaving the film in a side wall spacer shape by etching back under appropriate conditions; a method comprising coating or depositing, on a semiconductor wafer including a gate electrode, an insulation film material in which a particulate charge retaining material is distributed, and leaving the insulation film material in a side wall spacer shape by etching back under appropriate conditions; a method comprising forming a gate electrode, thereafter forming the single layer film or the multilayer film and carrying out patterning by using a mask, and so on. Moreover, there can be enumerated a method comprising forming a charge retaining portion, a charge retaining portion/insulation film, an insulation film/charge retaining portion, or an insulation film/charge retaining portion/insulation film before forming a gate electrode or an electrode, forming an opening through the film or films in a region that becomes a channel forming region, forming a gate electrode material film on the entire upper surface of the wafer and patterning this gate electrode material film in a shape, which is larger than the opening in size and encompasses the opening.

When a memory cell array is constructed by arranging the semiconductor storage elements of the present invention, a best mode of the semiconductor storage elements is to satisfy, for example, the following required conditions:

(i) The function of a word line is possessed by the integrated body of the gate electrodes of a plurality of semiconductor storage elements;

(ii) The memory function body is formed on each of opposite sides of the word line;

(iii) A material that retains electric charges in the memory function body is an insulator, and in particular, a silicon nitride film;

(iv) The memory function bodies are constructed of an ONO (Oxide Nitride Oxide) film, and the silicon nitride film has a surface roughly parallel to the surface of the gate insulation film;

(v) The silicon nitride film in each memory function body is separated from the word line and the channel forming region by the silicon oxide film;

(vi) A silicon nitride film in each memory function body overlaps with the corresponding diffusion region;

(vii) The thickness of the insulation film, which separates the silicon nitride film that has a surface roughly parallel to the surface of the gate insulation film from the channel forming region or the semiconductor layer differs from the thickness of the gate insulation film;

(viii) Write and erase operations of one semiconductor storage element are executed by a single word line;

(ix) There is no electrode (word line), on each memory function body, which has a function to assist the write and erase operations; and (x) A portion put in contact with the diffusion region right under each memory function body has a region where the impurity concentration of the conductivity type opposite to the conductivity type of the diffusion region is high.

The best mode is a mode in which all of these requirements are satisfied, but it is not necessary to satisfy all requirements.

When some of the above requirements are satisfied, there are most preferable combinations of requirements. For example, a most preferable combination includes, (iii) a material that retains electric charges in the memory function body is an insulator, and in particular, a silicon nitride film; (ix) there is no electrode (word line), on each memory function body, which has a function to assist the write and erase operations; and (vi) an insulator (silicon nitride film) in each memory function body overlaps with the corresponding diffusion region. According to the finding by the inventors, when an insulator retains electric charges in the memory function body and there is no electrode, on each memory function body, which has a function to assist the write and erase operations, write operations are well performed only if the insulator (silicon nitride film) in each memory function body overlaps with the corresponding diffusion region. That is, when requirements (iii) and (ix) are satisfied, it is particularly preferred that requirement (vi) be satisfied. On the other hand, if a conductor retains electric charges in the memory function body or if there is an electrode, on each memory function body, which has a function to assist the write and erase operations, the write operations are effected even if the insulator in each memory function body does not overlap with the corresponding diffusion region. However, if an insulator retains electric charges in the memory function body or if there is no electrode, on each memory function body, which has a function to assist the write and erase operations, the following advantages are obtained. That is, it is possible to place a contact plug closer to the memory function body. Or, even if the semiconductor storage elements are put close to each other in distance, the plurality of memory function bodies do not interfere with one another, and the storage information can be retained. Therefore, the miniaturization of the semiconductor storage elements is facilitated. Furthermore, since the element structure is simple, the number of fabrication process steps is reduced, and the yield can be improved. Also, a combination with transistors that constitute a logic circuit and an analog circuit can be facilitated. Furthermore, we have ascertained that the write and erase operations can be executed at a low voltage of not higher than 5 V. This is why satisfying requirements (iii), (ix) and (vi) is particularly preferable.

The semiconductor storage device of the present invention is applicable to IC cards, portable electronic equipment and the like. The portable electronic equipment include personal digital assistants, cell phones and game machines.

The present invention will be described hereinbelow in detail with reference to the drawings. It would be appreciated that the present invention is not limited to the embodiments described below. More precisely, in the embodiment shown below, description will be given on the assumption that an N-channel type device should be used as a memory, though a P-channel type device may be used as a memory instead. In such a case, all the conductivity types of impurities should be reversed.

Further, the following drawings are schematic views, and therefore it should be understood that the relation between thickness and plane size, ratios of the thickness and the size of each layer and each section or the like are different from those of real devices. Therefore, concrete thickness and size should be determined in consideration of the following description. It should be understood that among the drawings, the relation of each size or the ratio may be partially different.

The semiconductor storage device of the present invention is capable of storing 2-bit (4-value) information. Each operation principle of the semiconductor storage devices shown in FIG. 7A to 7C will be described below.

Description is now given of the write operation principle of the semiconductor storage device.

The term "write" herein refers to injecting electrons in the charge retention section if the semiconductor storage device is of an N-channel type. Hereinbelow, description will be given on the assumption that the semiconductor storage device should be of the N-channel type.

In FIGS. 7A to 7C, in order to inject electrons (write) in the second charge retention section 18b, the first source/drain diffusion region 13a (having N-type conductivity) is set to be a source electrode, while the second source/drain diffusion region 13b (having N-type conductivity) is set to be a drain electrode. For example, a voltage of 0V should be applied to the first source/drain diffusion region 13a and the semiconductor substrate 1, a voltage of +5V should be applied to the second source/drain diffusion region 13b, and a voltage of +2V should be applied to the gate electrode 3. In such voltage conditions, an inversion layer extends from the first source/drain diffusion region 13a (source electrode) but stops short of reaching the second source/drain diffusion region 13b (drain electrode), resulting in generation of a pinch-off point. Electrons are accelerated from the pinch-off point to the second source/drain diffusion region 13b (drain electrode) by high electric fields and turn to be so-called hot electrons (high energy conduction electrons). Write operation is effectuated when these hot electrons are injected in the second charge retention section 18b. It is to be noted that in the vicinity of the first charge retention section 18a, hot electrons are not generated so write operation is not executed.

Thus, write operation is executable by injecting electrons in the second charge retention section 18b.

In order to inject electrons (write) in the first charge retention section 18a, the second source/drain diffusion region 13b is set to be a source electrode, while the first source/drain diffusion region 13a is set to be a drain electrode. For example, a voltage of 0V should be applied to the second source/drain diffusion region 13b and the semiconductor substrate 1, a voltage of +5V should be applied to the first source/drain diffusion region 13a, and a voltage of +2V should be applied to the gate electrode 3. Thus, by reversing the source and drain regions employed in the case of injecting electrons in the second charge retention section 18b, electrons are injected in the first charge retention section 18a so that write operation is executable.

Description is now given of the erase operation principle of the semiconductor storage device.

In a first method for erasing information stored in the first charge retention section 18a, a positive voltage (e.g., +6V) should be applied to the first source/drain diffusion region 13a, a voltage of 0V should be applied to the semiconductor substrate 1, a reverse bias should be applied to the pn junction between the first source/drain diffusion region 13a and the semiconductor substrate 1, and further a negative voltage (e.g., −5V) should be applied to the gate electrode 3. In this case, in a portion of the pn junction that is in the vicinity of the gate electrode 3, potential gradient grows steep in particular due to the influence of the gate electrode to which the negative voltage was applied. As a consequence, hot holes (high energy holes) are generated in the pn junction on the side of the semiconductor substrate 1 by interband tunneling. The hot holes are pulled toward the side of the gate electrode 3 that has negative potentials, as a result of which holes are injected in the first charge retention section 18a. Thus, erase operation of the first charge retention section 18a is performed. At this time, a voltage of 0V should be applied to the second source/drain diffusion region 13b.

For erasing information stored in the second charge retention section 18b, the potentials of the first source/drain diffusion region 13a and the second source/drain diffusion region 13b should be switched.

In a second method for erasing information stored in the first charge retention section 18a, a positive voltage (e.g., +5V) should be applied to the first source/drain diffusion region 13a, a voltage of 0V should be applied to the second source/drain diffusion region 13b, a negative voltage (e.g., −4V) should be applied to the gate electrode 3, and a positive voltage (e.g., +0.8V) should be applied to the semiconductor substrate 1. In this case, a forward voltage is applied to between the semiconductor substrate 1 and the second source/drain diffusion region 13b, so that electrons are injected in the semiconductor substrate 1. The injected electrons diffuse to the pn junction between the semiconductor substrate 1 and the first source/drain diffusion region 13a, where the electrons are accelerated by strong electric fields to be hot electrons. The hot electrons generate electron-hole pairs in the pn junction. More specifically, by applying a forward voltage to between the semiconductor substrate 1 and the second source/drain diffusion region 13b, hot holes are generated in the pn junction positioned on the opposite side with the electrons injected in the semiconductor substrate 1 working as triggers. The hot holes generated in the pn junction are pulled toward the side of the gate electrode 3 that has negative potentials, as a result of which holes are injected in the first charge retention section 18a.

According to the second method, even in the case where a voltage applied to the pn junction between a P-type well region and the first source/drain diffusion region 13a is not large enough for generating hot holes through interband tunneling, the electrons injected from the second source/drain diffusion region 13b still work as triggers to generate electron-hole pairs in the pn junction, thereby achieving generation of hot holes. This makes it possible to reduce voltages required for erase operation. Particularly, with the presence of the offset region 20 (120 in FIG. 8), the effect of gaining steep potential gradient in the pn junction by the gate electrode to which the negative voltage was applied is diminished, making it difficult to generate hot holes through interband tunneling. However, the second method remedies this drawback, allowing erase operation to be executed at low voltages.

It is to be noted that in the case of erasing information stored in the first charge retention section 18a, the first method required application of +6V to the first source/drain diffusion region 13a, whereas the second erase method required only +5V. Thus, according to the second method, voltages required for erase operation can be decreased, making it possible to reduce power consumption and restrain the semiconductor storage device from being deteriorated by hot carriers.

Description is now given of the read operation principle of the semiconductor storage device.

In order to read information stored in the first charge retention section 18a, the first source/drain diffusion region 13a is set to be a source electrode, the second source/drain diffusion region 13b is set to be a drain electrode, and the transistor is operated in the saturation region. For example, a voltage of 0V should be applied to the first source/drain diffusion region 13a and the semiconductor substrate 1, a voltage of +2V should be applied to the second source/drain diffusion region 13b, and a voltage of +1V should be applied to the gate electrode 3. In this case, if electrons are not stored in the first charge retention section 18a, drain current tends to flow. If, however, electrons are stored in the first charge retention section 18a, an inversion layer is not easily formed in the vicinity of the first charge retention section 18a so that drain current does not tend to flow. Therefore, by detecting the drain current, the information stored in the first charge retention section 18a can be read out. In this case, the presence or absence of the electrons stored in the second charge retention section 18b would not affect drain current since pinch-off is effected in the vicinity of the drain region.

In order to read information stored in the second charge retention section 18b, the second source/drain diffusion region 13b is set to be a source electrode, the first source/drain diffusion region 13a is set to be a drain electrode, and the transistor is operated in the saturation region. For example, a voltage of 0V should be applied to the second source/drain diffusion region 13b and the semiconductor substrate 1, a voltage of +2V should be applied to the first source/drain diffusion region 13a, and a voltage of +1V should be applied to the gate electrode 3. Thus, by reversing the source and drain regions employed in the case of reading information stored in the first charge retention section 18a, information stored in the second charge retention section 18b can be read out.

It is to be noted that in the case where a channel region (offset region 20) not covered with the gate electrode 3 remains, an inversion layer is deleted or formed by the presence or absence of excessive electrons in the charge retention sections 18b, 18b in the channel region not covered with the gate electrode 3, as a result of which large hysteresis (threshold change) is obtained. However, if the width of the offset region 20 is too large, then drain current significantly drops, resulting in considerable decrease in the read speed. Therefore, the width of the offset region 20 should preferably be determined so as to obtain sufficient hysteresis and read speed.

In the case where the source/drain diffusion regions 13a, 13b reach the end of the gate electrode 3, i.e., the source/drain diffusion regions 13a, 13b overlap with the gate electrode 3, the threshold value of the transistor was hardly changed by write operation, though parasitic resistance at the end portions of the source/drain regions was largely changed and drain current showed drastic reduction (of not less than 1 digit). Therefore, read operation is executable by detecting the drain current, and a function as a memory can be obtained. However, if the larger memory hysteresis effect is necessary, then it is preferable that the source/drain diffusion regions 13a, 13b do not overlap with the gate electrode 3 (i.e., the offset region 20 is present).

The above operation methods allow selective write and erase operations of two bit data per transistor.

Further in the above operation methods, although the source electrode and the drain electrode are switched so that 2-bit data is written or erased per transistor, the source electrode and the drain electrode can be fixed so as to allow operation as a 1-bit memory. In this case, it becomes possible to allot a fixed common voltage to one of the source/drain diffusion regions, thereby making it possible to reduce the number of bit lines connected to the source/drain diffusion regions by half.

It is to be noted that each of the above stated operation principles applies in the similar way to the semiconductor storage element shown in FIG. 8

As is cleared from the above description, according to the semiconductor storage device in the sixth embodiment, the charge retention section is formed independently of the gate insulator, and is formed on the opposite sides of the gate electrode, allowing 2-bit operation. Moreover, each of the charge retention sections is isolated by the gate electrode, and therefore interference during reprogramming can effectively be restrained. Further, a memory function implemented by the charge retention section and a transistor operation function implemented by the gate insulator are separated, which makes it possible to reduce the thickness of the gate insulator and control the short channel effect. This facilitates miniaturization of the semiconductor storage device.

Seventh Embodiment

A semiconductor storage device in a seventh embodiment of the present invention will be described with reference to FIGS. 9A to 9F.

Figure 9A:
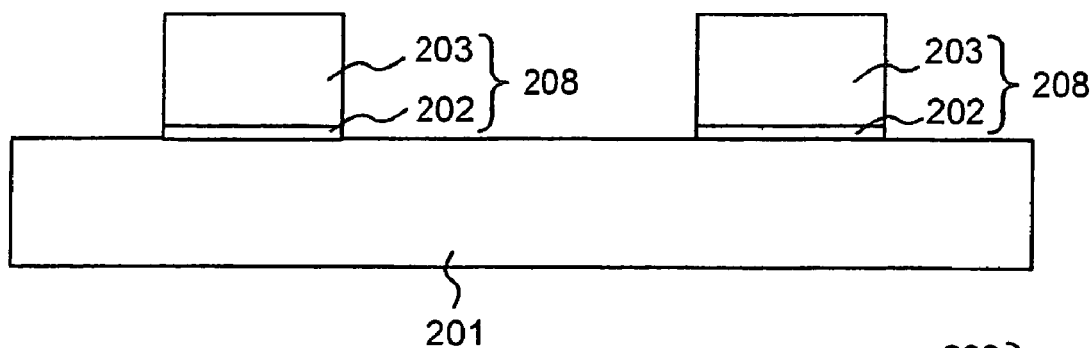
FIGS. 9A to 9F are schematic cross sectional views showing manufacturing steps of semiconductor storage devices with use of a semiconductor storage device in a seventh embodiment of the present invention.
Figure 9B:
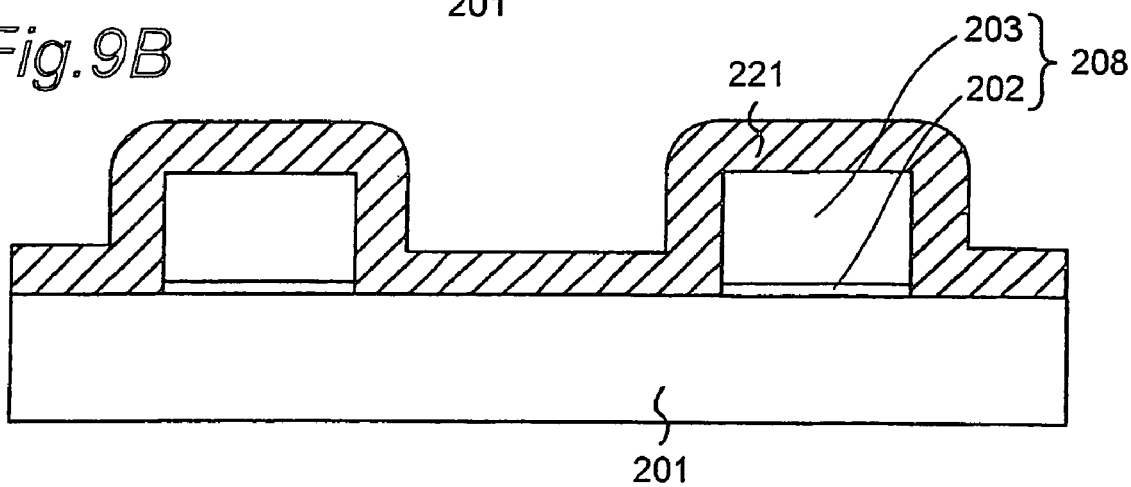
Figure 9C:
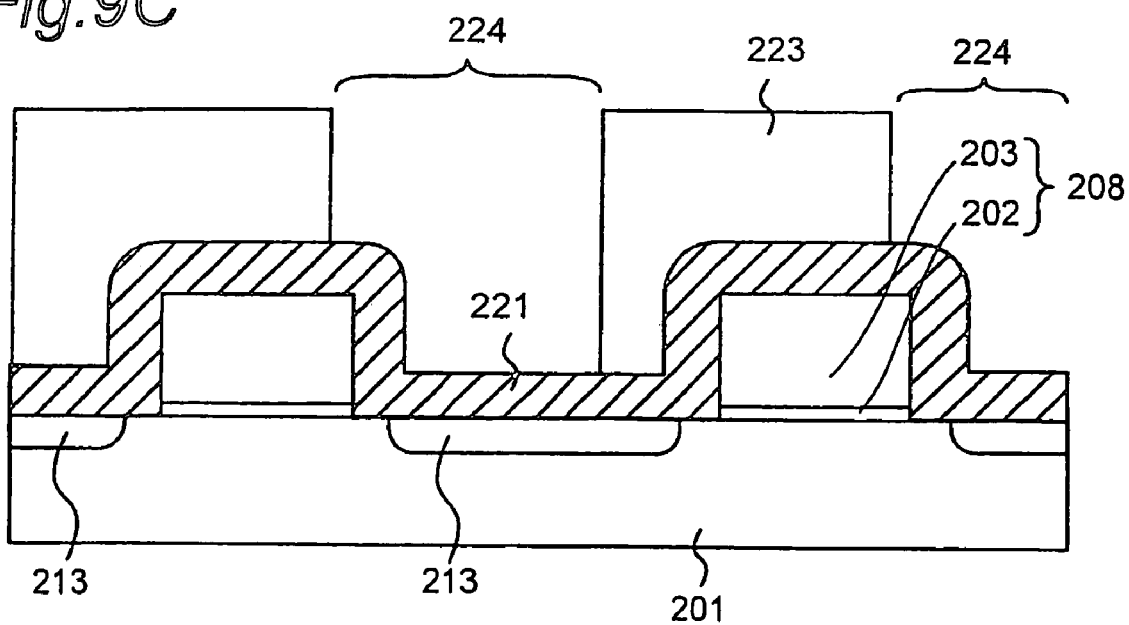
Figure 9D:
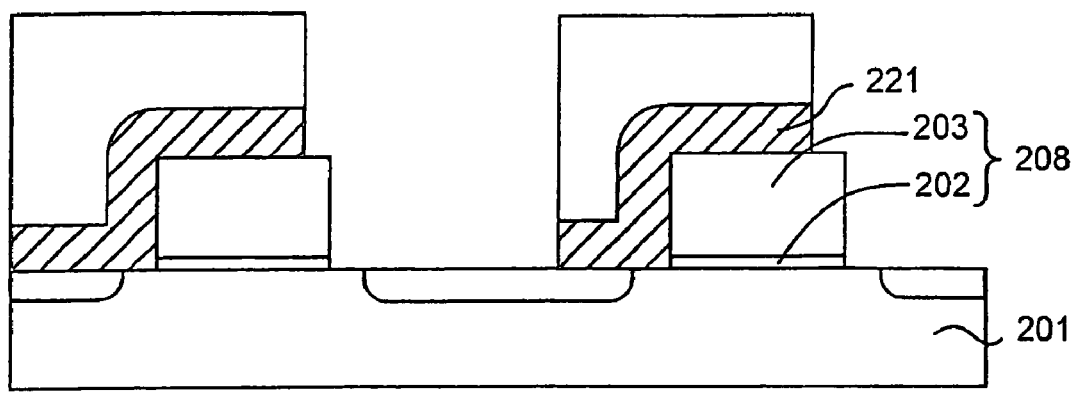
Figure 9E:
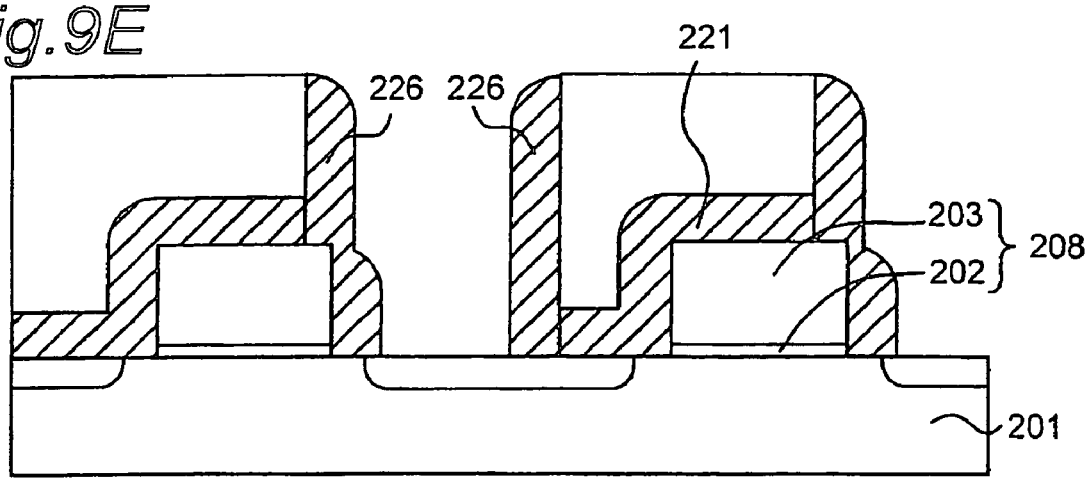
Figure 9F:
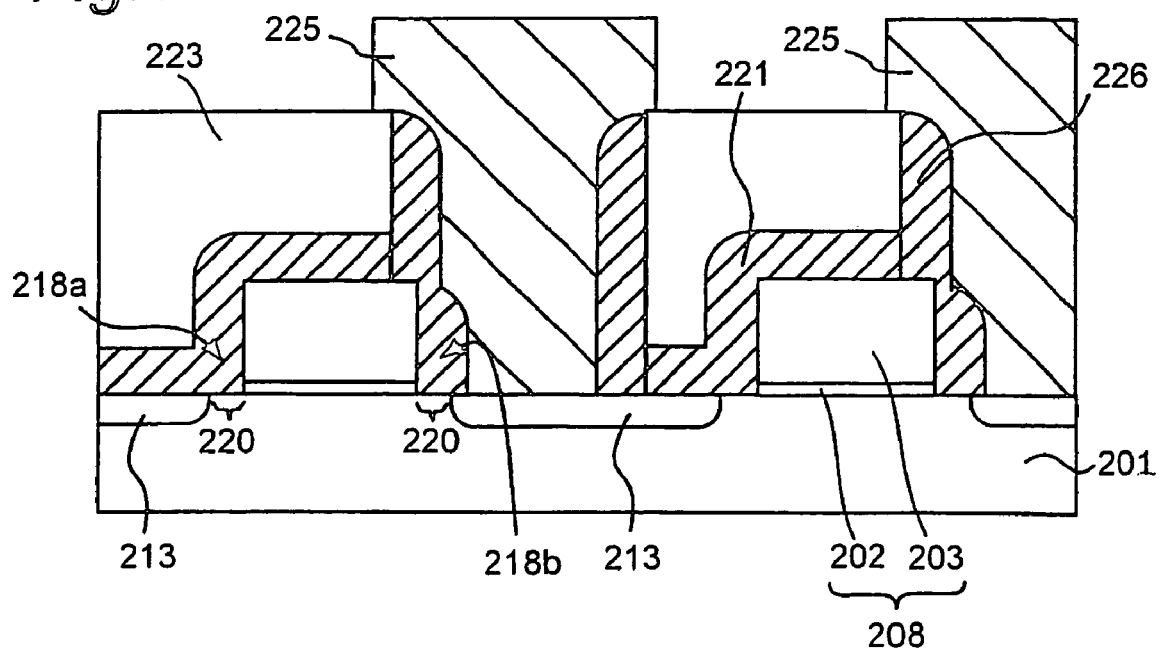

In the semiconductor storage device, as shown in FIG. 9F, a gate electrode 203 is formed on a semiconductor substrate 201 via a gate insulator 202. The semiconductor storage device is composed of a first coating film 221 and a second coating film 226 that are made of silicon nitrides and formed on the upper surface and the side surfaces of a gate stack 208 made up of the gate insulator 202 and the gate electrode 203 and on the semiconductor substrate, charge retention sections 218a, 218b defined in the vicinity of an offset region 220 in these coating films, and a pair of source/drain diffusion regions 213 formed below the charge retention sections 218a, 218b.

In this seventh embodiment, the first coating film 221 and the second coating film 226 function as memory sections of the semiconductor storage device, and also have a function to electrically isolate a contact 225 to the source/drain diffusion regions 213 and the gate electrode 203. Further, the first coating film 221 and the second coating film 226 have a function to prevent short-circuit between the source/drain diffusion regions 213 and the semiconductor substrate 201 and further have a function to prevent the device isolation region from being etched during etching to form a contact. More specifically, in order to fulfill each function, different films were needed to be formed in the past, which required extremely complicated steps and increased the manufacturing cost, and moreover, the films were manufactured by a formation method which increased a space occupancy per element. However, by using the formation method in the seventh embodiment, it becomes possible to provide a semiconductor storage device with a low manufacturing cost and a small space occupancy per element.

Hereinbelow, the manufacturing steps of the semiconductor storage device are described in due order with reference to FIGS. 9A to 9F.

As shown in FIG. 9A, a gate insulator 202 and a gate electrode 203 having MOS (Metal Oxide Semiconductor) structure formed through MOS formation process, i.e., a gate stack 208, are formed on a semiconductor substrate 201 having a p-type conductivity.

A typical MOS formation process in this case is shown below.

First, a device isolation region (unshown) is formed by a known method on the semiconductor substrate 201 made of silicon and having a p-type semiconductor region. The device isolation region makes it possible to prevent leakage current from flowing between adjacent devices via the substrate. However, it is not necessary to form such device isolation region between adjacent devices if the adjacent devices share the source/drain diffusion regions. The known method for forming device isolation regions can be any known method including known methods with use of a LOCOS oxide and known methods with use of a trench isolation region as long as the a purpose of device isolation can be achieved thereby. In this embodiment, description is given for the case in which the device isolation region is not formed, and therefore a graphic representation is not provided.

Next, though not particularly shown in the drawing, an impurity diffusion region is formed in the vicinity of the exposed surface of the semiconductor substrate. The impurity diffusion region serves to adjust threshold voltages and to increase the impurity concentration in the channel formation region. An appropriate impurity diffusion region should be formed by a known method to obtain proper threshold voltages.

Next, an insulating film is formed on the entire exposed surface of the semiconductor region. As the insulating film, there may be used an oxide, a nitride, a composite film of an oxide and a nitride, a high dielectric insulating film such as hafnium oxides and zirconium oxides, and a composite film of a high dielectric insulating film and an oxide to suppress leakage. Further, in order to make a gate insulator for the MOSFET, it is desired to form a film with excellent capabilities as a gate insulator by adopting the steps including $N_2O$ oxidation, NO oxidation and nitration after oxidation and the like. The film with excellent capabilities as a gate insulator is the insulating film which is capable of restraining any inconvenient factors standing in the way of developing the miniaturized and higher-performance MOSFET, i.e., the film should be able to restrain the short-channel effect in the MOSFET, restrain leakage current that flows through the gate insulator in an undesirable manner, and restrain impurities of gate electrode from diffusing to the channel formation region of the MOSFET while suppressing depletion of the gate electrode impurities. The typical film includes an oxide such as thermally-oxidized films, $N_2O$ oxides and NO oxides, and an appropriate film thickness thereof is in the range of 1 nm to 6 nm.

Next, a gate material is formed on the gate insulator. Any material can be used as the material of the gate electrode such as semiconductors including polysilicon and doped polysilicon, metals including Al, Ti and W, and compounds of these metals and silicon, as long as the material have capabilities as a MOSFET. In the case of forming a polysilicon film by way of example, the thickness of the polysilicon film should preferably be in the range of about 50 nm to 400 nm.

Next, on the gate electrode material, a desired photoresist pattern is formed through a photo lithography process, and then gate etching is executed with the photoresist pattern as a mask to etch the gate electrode material and the gate insulator, by which the structure shown in FIG. 9A is formed. More precisely, the gate insulator 202, the gate electrode 203 and the gate stack 208 composed of these are formed. Though not shown in the drawing, etching of the gate insulator is not necessary at this time. If the gate insulator is not etched and utilized as an injection overcoat during impurity injection in the next step, the step of forming the injection overcoat can be simplified.

It is to be noted that the materials of the gate insulator 202 and the gate electrode 203 should be the materials used in the logic process for compliance with the scaling law of the age without being limited to the aforementioned materials.

Further, the gate stack 208 may be formed by the following method. A gate insulator similar to aforementioned one is formed on the entire exposed surface of the semiconductor substrate 201 having a p-type semiconductor region. Next, a material of the gate electrode similar to aforementioned one is formed on the gate insulator. Then, on the gate electrode material, a mask insulating film such as oxides, nitrides, and oxide nitrides is formed. Next, a photoresist pattern similar to aforementioned one is formed on the mask insulating film, and the mask insulating film is etched. Next, the photoresist pattern is removed, and the gate electrode material is etched with the mask insulating film as an etching mask. Next, the mask insulating film and an exposed portion of the gate insulator are etched, by which the structure shown in FIG. 9A is formed. In the case where the gate stack is formed in this way, a selectivity during etching, i.e., a selectivity between the gate electrode material and the gate insulating material can be increased, which allows etching of a thin gate insulator without etching the substrate. Though not shown in the drawing, at this time, etching of the gate insulator is not necessary because of a reason similar to aforementioned one.

Next, as shown in FIG. 9B, the first coating film 221 made of a silicon nitride is formed on the exposed surface of the gate stack 8 and the semiconductor substrate 201. The formation method to be used for forming the first coating film 221 should be a known CVD (Chemical Vapor Deposition) method having excellent step coverage. Here, the film thickness should be in the range of about 2 nm to 100 nm. Since the film thickness is an important parameter to form the source/drain diffusion regions 213 (shown in FIG. 9C) so as to be displaced from the gate electrode, it should be adjusted within the above-stated range of the film thickness in consideration of an offset amount.

Next, as shown in FIG. 9C, source/drain diffusion regions 213 and an interlayer insulator 223 are formed. After that, contact holes 224 for forming contacts to connect the source/drain diffusion regions and interconnection lines respectively are formed in the interlayer insulator 223. Each step will be described below.

The source/drain diffusion regions 213 are formed by injecting source/drain impurities with use of the gate electrode 203 and the first coating film 221 as a source/drain injection mask and performing a known heat treatment. Herein, the source/drain diffusion regions 213 should be formed so as to be properly displaced from the gate electrode 203 as stated before.

Next, the interlayer insulator 223 is formed, and the contact holes 224 for forming contacts that connect the source/drain diffusion regions 213 and interconnection lines respectively are formed in the interlayer insulator 223. The interlayer insulator 223 should be formed to have a film thickness that allows sufficient planarization through reflowing or the like. The typical film thickness is about 500 nm, which should be decreased by a known technique so as to prevent an aspect ratio to a contact diameter from becoming too high.

Herein, the contact holes 224 are formed through known photoresist and anisotropic selective etching processes. Etching of the interlayer insulator should be performed under an etching condition of high selectivity against the first coating film 221 (silicon nitride). This makes it possible to suppress contact failure generated by etching of the semiconductor substrate 20.

Herein, if a conventional manufacturing method was adopted, the contact hole was needed to be formed with a sufficient margin of alignment so as not to be connected to the gate electrode. However, according to the manufacturing method in the present embodiment, it is acceptable if the position of the contact hole is out of alignment and slightly overlaps with the gate electrode (let alone the coating film). Therefore, unlike the prior art, it is not necessary to allow for a sufficient margin of alignment and form the contact hole away from the gate electrode with the sufficient margin. Consequently, it becomes possible to form the contact and the gate electrode (let alone the coating film) substantially with an overlap portion, by which a space occupancy per element can be significantly decreased and a semiconductor storage device with a low manufacturing cost can be provided.

Next, as shown in FIG. 9D, the coating film 221 under the contact holes is removed through isotropic selective etching. Thus, etching of the interlayer insulator is once stopped by the first coating film 221 and then, etching of the first coating film 221 is performed to complete the contact holes. In this way, it becomes possible to prevent short-circuit between the source/drain diffusion regions and the semiconductor substrate that is attributed to deep etching of the semiconductor substrate 201, easily restrain the surface of the semiconductor substrate from being roughened, and suppress contact failure. The isotropic selective etching may use wet etching as well as dry isotropic etching with remote plasma. With respect to prevention of the semiconductor from deep etching and restraint of the surface of the semiconductor substrate from being roughened, the wet etching is preferred.

As shown in the drawing, however, there are not only the case in which the first coating film on one side surface of the gate stack is completely removed and the gate stack is exposed, but also the case in which the first coating film 221 on the opposite side surfaces of the gate stack remains and the gate stack 208 would not be exposed. The drawing shows the case in which alignment with a foundation in the photolithography step for forming a contact widely deviates. However, the seventh embodiment would not fall within this example. Even if no alignment deviation is present, the present embodiment has an efficient effect such that a margin of alignment in design is not necessary.

Next, as shown in FIG. 9E, side walls of the second coating film 226 made of a silicon nitride are formed on the side surface of the contact hole and the exposed surface of the gate stack 201. According to the formation method for the second coating film 226, first, a silicon nitride is deposited on the entire exposed surface by the CVD method having excellent step coverage. Next, by etching back process using anisotropic etching, the silicon nitride is etched so that the semiconductor substrate 201 is exposed while the gate electrode 203 is covered. This makes it possible to prevent short-circuit between the contact of the source/drain diffusion regions and the gate electrode. In the case of a small contact hole, the thickness of a deposited silicon nitride should be decreased so that the semiconductor substrate would be exposed. However, if the thickness is decreased too much, then the gate electrode would be exposed. Therefore, an appropriate film thickness should be determined with these considerations. Thus, the second coating film 226 is formed.

Next, As shown in FIG. 9F, a contact material is filled in the contact holes to form contacts 225. Further, the contact material is etched with use of photo lithography and etching processes to form an interconnection pattern on the interlayer insulator 223.

According to the above manufacturing method, not only a 2-bit (4-value) semiconductor storage device can be formed, but also short-circuit between the source/drain diffusion regions and the substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode. Consequently, it is not necessary to allow for a margin of alignment to prevent short-circuit or the like, which allows significant reduction in space occupancy, making it possible to provide a semiconductor storage device with a low cost.

Further, according to the above disclosure, it becomes possible to provide a semiconductor storage device that achieves the above effects with a low cost without adding specific steps.

Eighth Embodiment

A semiconductor storage device in an eighth embodiment of the present invention will be described with reference to FIGS. 10A to 10C.

In the eighth embodiment, the steps used are almost identical to those used in the semiconductor storage device in the seventh embodiment except the following point. In the seventh embodiment as shown in FIG. 9D, the first coating film 221 exposed to the contact holes is removed through isotropic etching. In the present embodiment, however, a first coating film 321 is not completely removed but left in a side-wall shape through anisotropic etching. Consequently, since the charge retention sections on the left and right sides of the gate electrode are the films formed by the same step, their film quality is equal, which decreases deviation of the memory effect between the left and light charge retention sections, making it possible to provide a semiconductor storage device with high reliability. Further, the material of a second coating film 326 does not have to be a film material such as silicon nitrides that retain charges in the seventh embodiment, but may be an oxide or an oxide nitride as long as the material is an insulator having excellent step coverage.

Hereinbelow, the manufacturing steps of the semiconductor storage device are described in due order with reference to FIGS. 10A to 10C.

First, the same structure as that of the semiconductor storage device in the seventh embodiment shown in FIG. 9C is formed by the manufacturing method for the semiconductor storage device in the seventh embodiment.

Figure 10A:
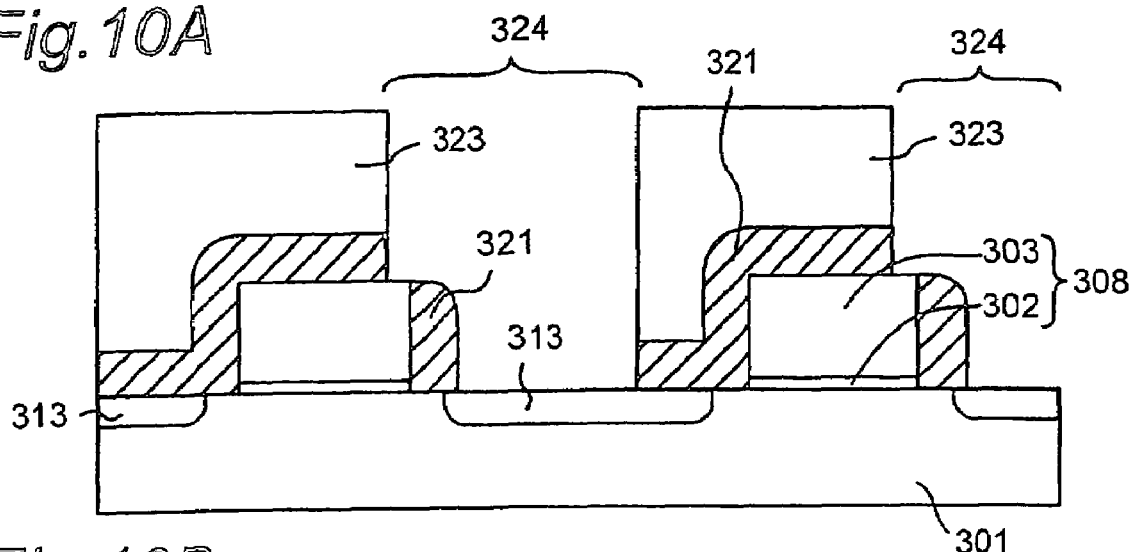
FIGS. 10A to 10C are schematic cross sectional views showing manufacturing steps of semiconductor storage devices with use of a semiconductor storage device in a eighth embodiment of the present invention.

Next, as shown in FIG. 10A, a first coating film 321 made of a silicon nitride disposed under contact holes 324 is etched by etching back process using anisotropic etching so that the first coating film 321 remains in a side-wall shape on the exposed side surface of a gate stack 308. Thus, etching of an interlayer insulator 323 is once stopped by the first coating film 321 and then, etching of the first coating film 321 is performed to complete contact holes 324. In this way, it becomes possible to prevent short-circuit between source/drain diffusion regions 313 and a semiconductor substrate that is attributed to deep etching of the substrate, restrain the surface of the semiconductor substrate from being roughened, and suppress contact failure.

Figure 10B:
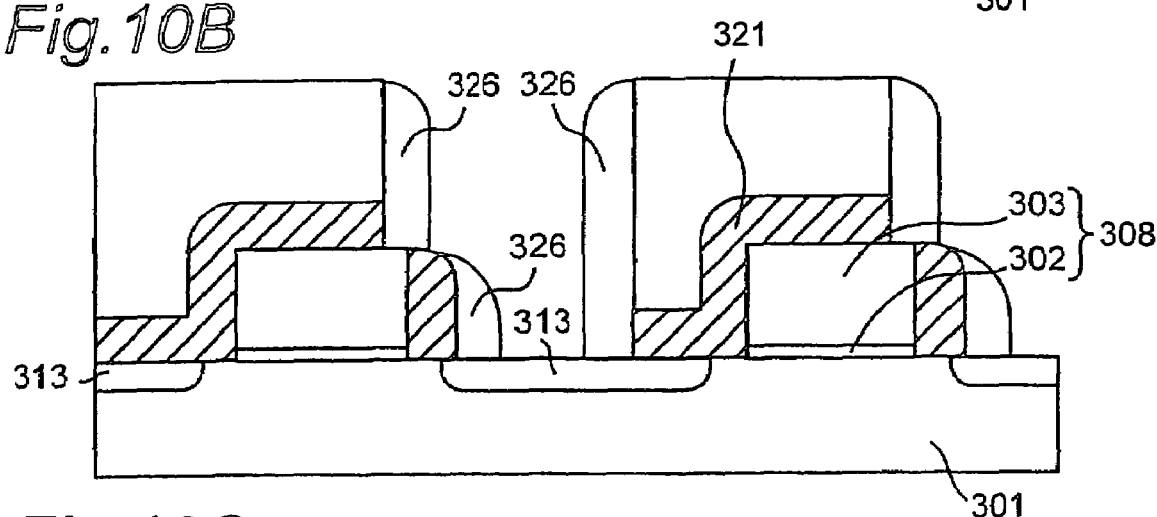

Next, as shown in FIG. 10B, a second coating film 326 is formed on the side surface of the contact hole, the exposed surface of a gate electrode 303 and the exposed surface of the coating film 321 left on the side surface of the gate stack 308.

According to the formation method for the second coating film 326, first, the second coating film 326 is deposited on the entire exposed surface by the CVD method having excellent step coverage. Next, by etching back process using anisotropic etching, the second coating film 326 is etched so that the semiconductor substrate 301 is exposed while the gate electrode 303 is covered. Thus, contact holes can be formed while the gate electrode 303 is covered, which makes it possible to prevent short-circuit between the contact 325 (shown in FIG. 10C) of the source/drain diffusion regions 313 and the gate electrode 303.

In the case of a small contact hole, the thickness of a deposited silicon nitride should be decreased so that the semiconductor substrate would be exposed. However, if the thickness is decreased too much, then the gate electrode would be exposed. Therefore, an appropriate film thickness should be determined with these considerations.

Figure 10C:
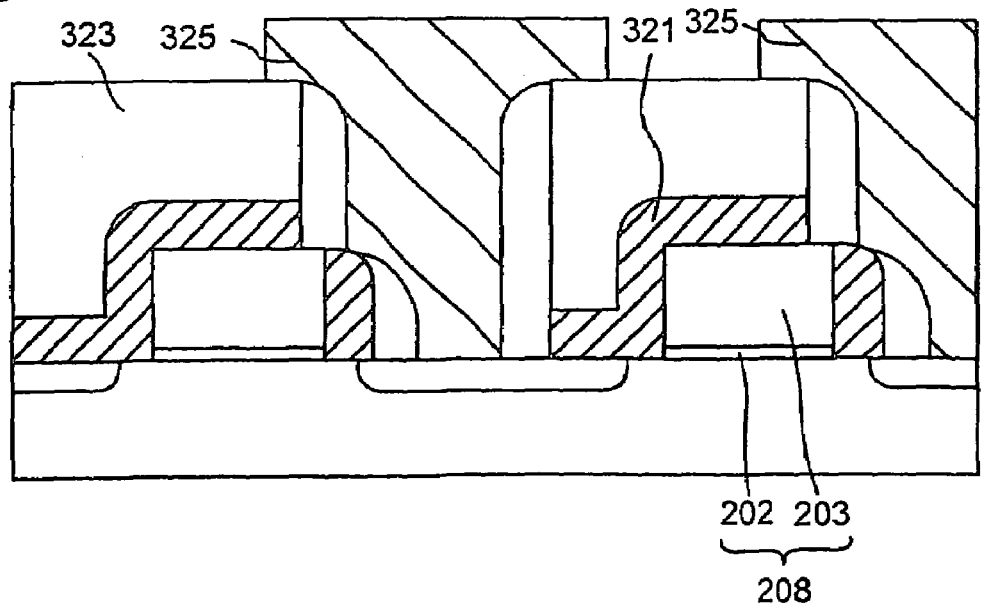

Next, as shown in FIG. 10C, a contact material is filled in the contact holes to form the contacts 325. Further, the contact material is etched with use of photo lithography and etching processes to form an interconnection pattern on the interlayer insulator 323.

According to the above manufacturing method, not only a 2-bit (4-value) semiconductor storage device can be formed, but also short-circuit between the source/drain diffusion regions and the semiconductor substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode. Consequently, it is not necessary to allow for a margin of alignment to prevent short-circuit, which allows significant reduction in space occupancy, making it possible to provide a semiconductor storage device with a low cost.

Further, according to the above disclosure, it becomes possible to provide a semiconductor storage device that achieves the above effects with a low cost without adding specific steps.

Ninth Embodiment

A semiconductor storage device in a ninth embodiment of the present invention will be described with reference to FIGS. 11A to 11E.

In the ninth embodiment, the steps used are almost identical to those used in the semiconductor storage device in the eighth embodiment except the following points. They are the points that a third coating film 427 is provided above the gate stack, and that second coating film is not formed in the contact hole as shown in FIGS. 9D to 9F and FIGS. 10A to 10C. Consequently, compared to the effects of the eighth embodiment, the gate electrode can be formed through etching with a hard mask (third coating film mask), which makes it possible to form a gate stack with a good shape suitable for miniaturization. Further, since formation of the second coating film is not necessary, the steps are considerably simplified, leading to reduction in a manufacturing cost.

Hereinbelow, the manufacturing steps of the semiconductor storage device in the ninth embodiment are described in due order with reference to FIGS. 11A to 11E.

Figure 11A:
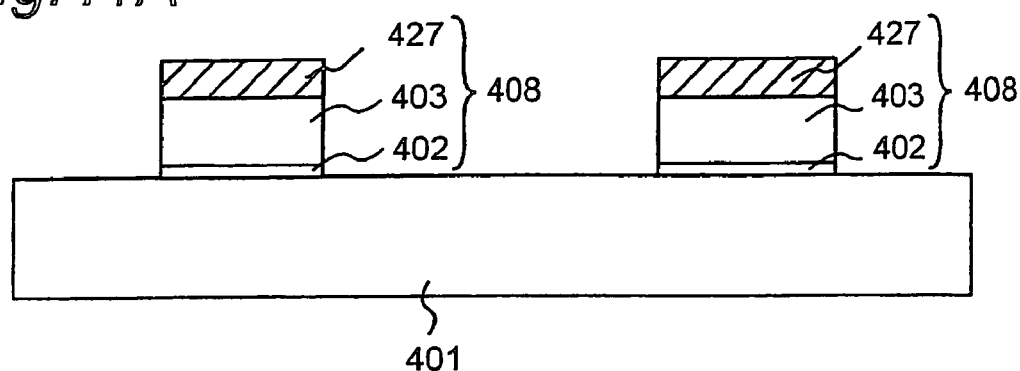
FIGS. 11A to 11E are schematic cross sectional views showing manufacturing steps of semiconductor storage devices with use of a semiconductor storage device in a ninth embodiment of the present invention.

As shown in FIG. 11A, a gate insulator 402, a gate electrode 403 and a third coating film 427 having MOS (Metal Oxide Semiconductor) structure formed through MOS formation process, i.e., a gate stack 408, are formed on a semiconductor substrate 401 having a p-type conductivity.

A typical MOS formation process in this case is shown below.

First, there are formed a device isolation region and a impurity diffusion region in the vicinity of the surface of the semiconductor substrate by the manufacturing method for semiconductor storage devices identical to that in the seventh embodiment.

Further, an insulating film and the material of a gate electrode are formed in sequence on the exposed surface of the semiconductor substrate by the manufacturing method for semiconductor storage devices identical to that in the seventh embodiment.

Next, a third coating film is formed on the entire surface of the gate electrode material. Any material can be used as the material of the third coating film such as insulating films including silicon oxides, silicon nitrides and silicon oxide nitrides, and single-layer or laminated high dielectric films such as aluminum oxides, titanium oxides, tantalum oxides and hafnium oxides. Among these, the silicon oxide is favorable.

Next, on the third coating film, a desired photoresist pattern is formed through a photo lithography process, and then gate etching is executed with the photoresist pattern as a mask to etch the gate electrode material and the gate insulator, by which the structure shown in FIG. 11A is formed.

More precisely, the gate insulator 402, the gate electrode 403, the third coating film 427, and the gate stack 408 composed of these are formed. Though not shown in the drawing, etching of the gate insulator is not necessary at this time. If the gate insulator is not etched and utilized as an injection overcoat during impurity injection in the next step, the step of forming the injection overcoat can be simplified.

It is to be noted that the materials of the gate insulator 402 and the gate electrode 403 should be the materials used in the logic process for compliance with the scaling law of the age without being limited to the aforementioned materials.

Further, in the case where the material of the third coating film 427 is the same as the material of the first coating film, i.e., a nitride, the third coating film 427 should be formed to have a thickness as large as to prevent the upper surface of the gate electrode from being etching and exposed since the third coating film 427 works as an etching stopper in etching the first coating film 421 in the later step. Moreover, in the case where a material difference from that of the first coating film is used, the material should provide a large etching selectivity such as oxides.

Further, the gate stack 408 may be formed by the following method. A gate insulator, a gate electrode material and a third coating film are formed on the exposed surface of the semiconductor substrate in the same way as described above. Next, a photoresist pattern to form a gate stack similar to aforementioned one is formed on the third coating film, and the third coating film is etched to form the third coating film 427 shown in FIG. 11A. Next, the photoresist pattern is removed, and the gate electrode material is etched with the third coating film as an etching mask. Next, an exposed portion of the gate insulator is etched, by which the structure shown in FIG. 9A is formed. In the case where the gate stack is formed in this way, a selectivity during etching, i.e., a selectivity between the gate electrode material and the gate insulating material can be increased, which allows etching of a thin gate insulator without etching the substrate, making it possible to form a gate stack suitable for miniaturization, increase in space occupancy of a device, and reduce in a manufacturing cost per device.

Though not shown in the drawing, at this time, etching of the gate insulator is not necessary because of a reason similar to aforementioned one.

Figure 11B:
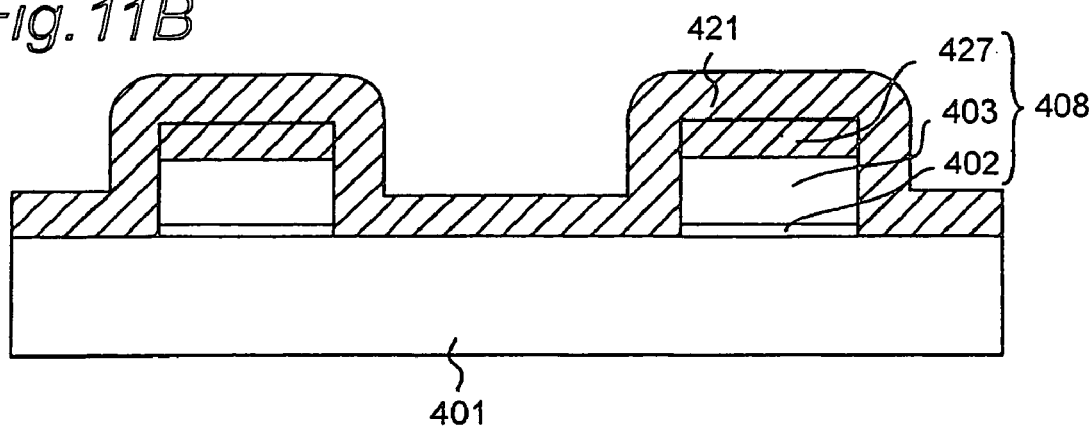

Next, as shown in FIG. 11B, by the manufacturing method identical to the method in the seventh embodiment the first coating film 421 made of a silicon nitride is formed on the exposed surface of the gate stack 408 and the semiconductor substrate 401.

Figure 11C:
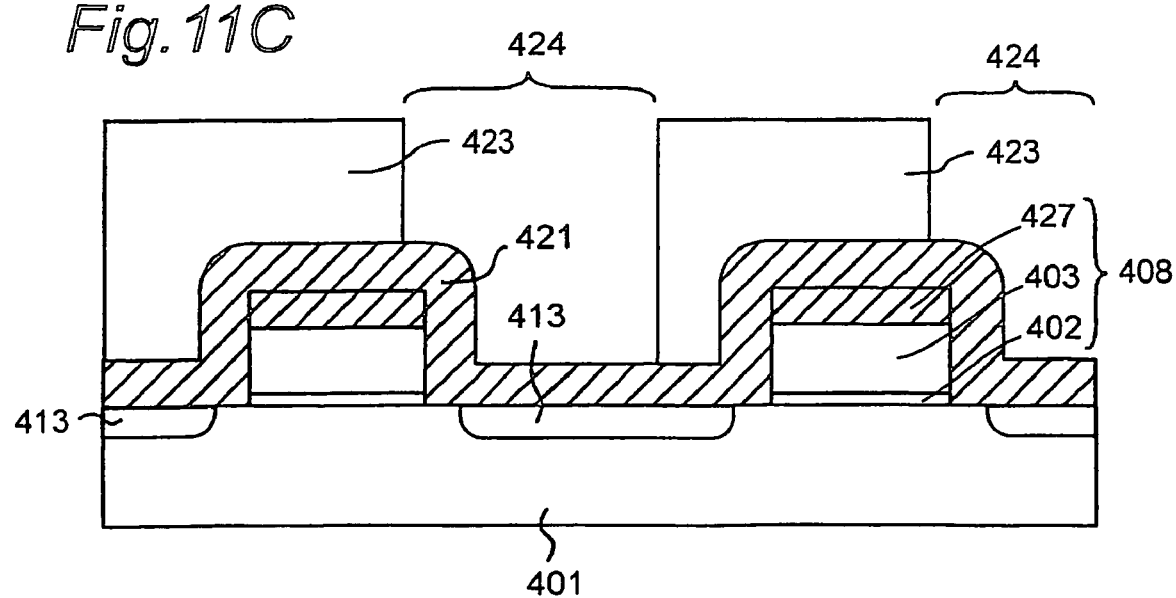

Next, as shown in FIG. 11C, by the manufacturing method for semiconductor storage devices identical to the method in the seventh embodiment, source/drain diffusion regions 413 and an interlayer insulator 423 are formed. After that, contact holes 424 for forming contacts to connect the source/drain diffusion regions and interconnection lines respectively are formed in the interlayer insulator 423.

Herein, if a conventional manufacturing method was adopted, the contact hole was needed to be formed with a sufficient margin of alignment so as not to be connected to the gate electrode. However, according to the manufacturing method in the present embodiment, it is acceptable if the position of the contact hole is out of alignment and slightly overlaps with the gate electrode. Therefore, unlike the prior art, it is not necessary to allow for a sufficient margin of alignment and form the contact hole away from the gate electrode with the sufficient margin. Consequently, it becomes possible to form the contact and the gate electrode substantially with an overlap portion, by which a space occupancy per element can be significantly decreased and a semiconductor storage device with a low manufacturing cost can be provided.

Further, according to this embodiment, unlike other embodiments, even if alignment deviation of the contact is considerably large so that the contact hole is formed so as to overlap with the gate electrode to a large extent, short-circuit between the gate electrode and the contact can still be suppressed without increasing the film thickness of the second coating film as required in other embodiments. Therefore, compared to other embodiments, space occupancy can be reduced, resulting in a semiconductor storage device with a low manufacturing cost.

Figure 11D:
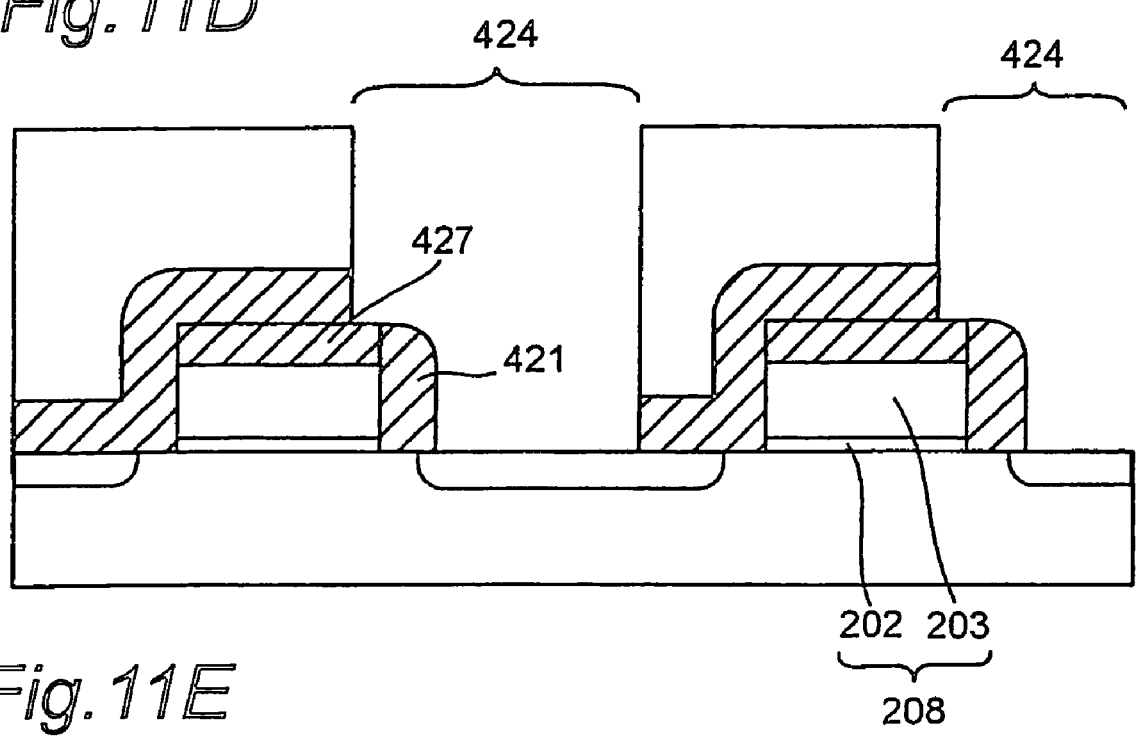

Next, as shown in FIG. 11D, the first coating film 421 under the contact holes 424 is etched by etching back process using anisotropic selective etching by the manufacturing method for semiconductor storage devices identical to the method in the eighth embodiment to leave the first coating film 421 in a side-wall shape on the side wall of the gate stack 408.

Herein, since the third coating film 427 is used as an etching stopper as stated before, the gate electrode 403 would not be exposed.

However, as shown in the drawing, there is the case in which the first insulating film formed in the side-wall shape on the side surface of the gate stack is completely disconnected from the first insulating film on the gate stack, whereas there is the case in which it is not disconnected. The drawing shows the case in which alignment with a foundation in the photolithography step for forming a contact widely deviates. However, the present embodiment would not fall within this example. Even if no alignment deviation is present, the present embodiment has an efficient effect that a margin of alignment in design is not necessary.

Thus, etching of the interlayer insulator 423 is once stopped by the first coating film 421 and then, etching of the first coating film 421 is performed to complete the contact holes 424. In this way, it becomes possible to prevent short-circuit between the source/drain diffusion regions and the semiconductor substrate that is attributed to deep etching of the substrate, restrain the surface of the semiconductor substrate from being roughened, and suppress contact failure.

Figure 11E:
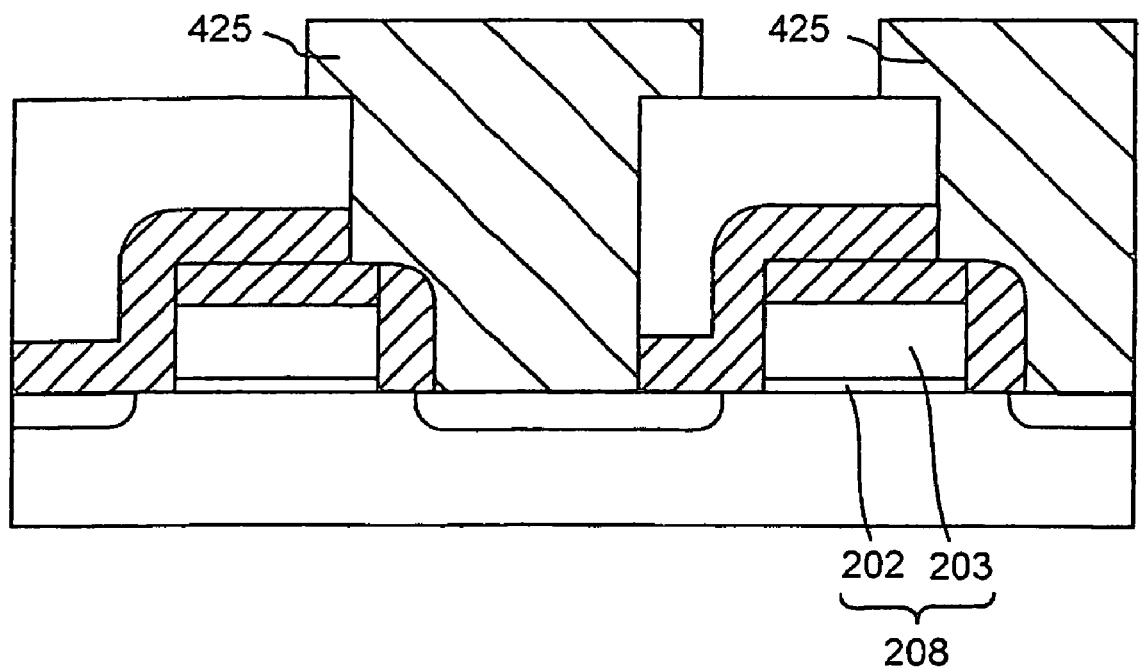

Next, as shown in FIG. 11E, a contact material is filled in the contact holes to form the contacts 425. Further, the contact material is etched with use of photo lithography and etching processes on the interlayer insulator to form an interconnection pattern thereon.

According to the above manufacturing method, not only a 2-bit (4-value) semiconductor storage device can be formed, but also short-circuit between the source/drain diffusion regions and the semiconductor substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode. Consequently, it is not necessary to allow for a margin of alignment to prevent short-circuit, which allows significant reduction in space occupancy, making it possible to provide a semiconductor storage device with a low cost.

Further, according to the above disclosure, it becomes possible to provide a semiconductor storage device that achieves the above effects at a low cost without adding specific steps.

Tenth Embodiment

A semiconductor storage device in a tenth embodiment of the present invention will be described with reference to FIGS. 12A to 12F.

The tenth embodiment is almost identical in manufacturing steps and structure to the seventh embodiment except the following point.

That is, there is provided a device isolation region 528 between devices. According to the present invention, it becomes possible to ensure one of the effects provided by each of the coating films, i.e., the effect to prevent a failure that the device isolation region is etched during etching to form contact holes and as a result, the contact comes into contact with a semiconductor substrate 501 or a region such as well regions disposed under the source/drain diffusion regions which have a conductivity type opposite to the conductivity type of the source/drain diffusion regions to cause short-circuit.

Further, the characteristic of the present embodiment is applicable to other embodiments. In such a case, the effect of the applied characteristic (the device isolation region is provided) can be implemented in addition to the essential effects of other embodiments.

Hereinbelow, the manufacturing steps of the semiconductor storage device in the tenth embodiment will be described in due order with reference to FIGS. 12A to 12F.

Figure 12A:
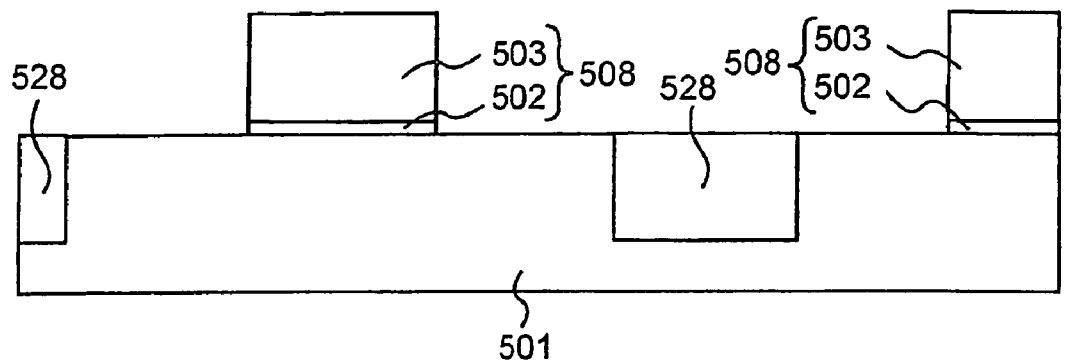
FIGS. 12A to 12F are schematic cross sectional views showing manufacturing steps of semiconductor storage devices with use of a semiconductor storage device in a tenth embodiment of the present invention.

First, as shown in FIG. 12A, a gate insulator 502 and a gate electrode 503 having MOS (Metal Oxide Semiconductor) structure formed through MOS formation process, i.e., a gate stack 508, are formed on a semiconductor substrate 501 having a p-type conductivity and including a device isolation region 528. Except the formation method for the device isolation region, it is preferred that the formation method identical to the method described in the seventh embodiment be applied.

The device isolation region 528 is formed by a known method. The device isolation region makes it possible to prevent leakage current from flowing between adjacent devices. However, it is not necessary to form such device isolation region between adjacent devices if the adjacent devices share the source/drain diffusion regions. The known method for forming device isolation regions can be any known method including known methods with use of a LOCOS oxide and known methods with use of a trench isolation region as long as a purpose of device isolation can be achieved thereby. In this embodiment, description is given for the case in which most of the device isolation region is composed of an oxide. It is to be noted that a material constituting most of the device isolation region is not limited to the oxide, and therefore any material which can be etched during contact etching of the interlayer insulator is acceptable and provides the effects of the present embodiment.

Figure 12B:
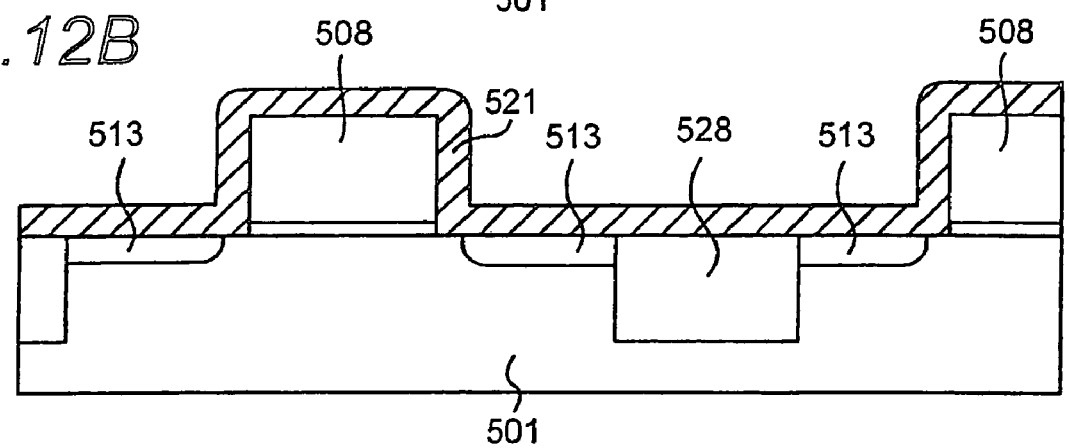

Next, as shown in FIG. 12B, a first coating film 521 made of a silicon nitride is formed on the exposed surface of the gate stack 508, the semiconductor substrate 501 and the device isolation region 528. After that, source/drain diffusion regions 513 are formed. Each formation method may be identical to each of the methods in the manufacturing method for semiconductor storage devices described in the seventh embodiment. Moreover, after formation of the source/drain diffusion regions 513, the first coating film 521 made of a silicon nitride may be formed. In such a case, the nitride would not receive injection damage, so that good film quality is gained. Therefore, it becomes possible to provide a semiconductor storage device having a good memory characteristic.

Figure 12C:
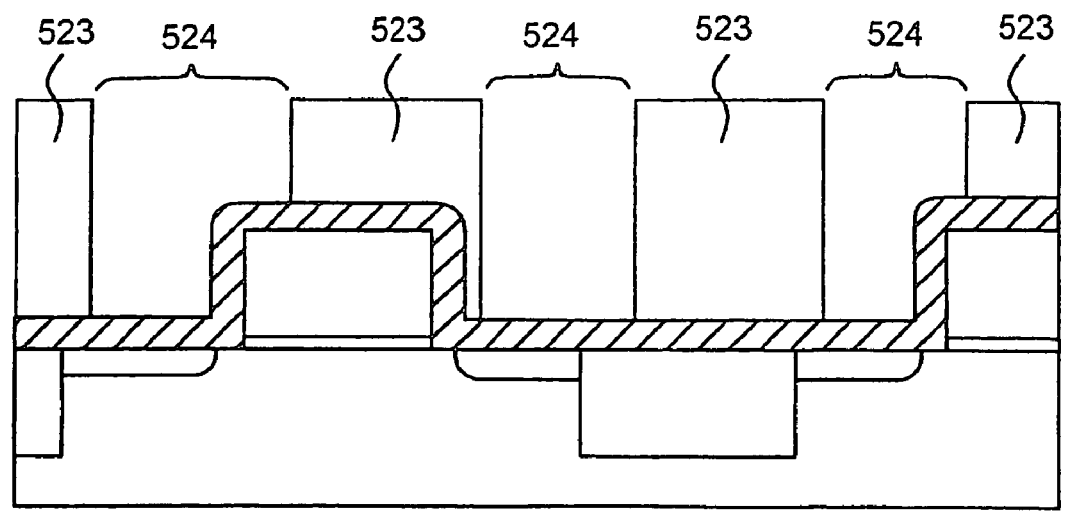

Next, as shown in FIG. 12C, an interlayer insulator 523 made of an oxide is formed. After that, contact holes 524 for forming contacts to connect the source/drain diffusion regions 513 and interconnection lines respectively are formed in the interlayer insulator 523. Each of these steps may be identical to those described in the seventh embodiment.

In order to clarify the effects implemented by the present embodiment, the drawings herein show the case in which the contact hole is positioned such that at least a part of the contact hole overlaps with the top of the device isolation region 528. However, the same effects are achieved even if the contact hole is not placed in reality in the position specified in the present embodiment. More specifically, in designing the memory element disclosed in the prior art, the device has been designed so as to allow for a sufficient margin of alignment between, for example, the device isolation region and the contact hole, which enlarged a space occupancy of the device. In the present embodiment, however, it is not necessary to allow for a sufficient margin of alignment, which reduces a space occupancy of the device, allowing reduction in manufacturing cost per element. More precisely, the effects, which are characteristic effects of the present invention, are generated by provision of each coating film and are generated in the stage of device design, and therefore it is impossible to gauge the validity of the effects from the completed shape of the device.

Herein, if, in the case of the memory element disclosed in the prior art, etching for forming contact holes is executed without allowing for a sufficient margin of alignment and as a result, the position of the contact hole overlaps with the top of the device isolation region 528 as shown in the drawing, then the device isolation region is etched by the contact etching because the coating film 521 made of a nitride is not present and the primary materials of the interlayer insulator and the interlayer insulator are both oxides. The depth of etching in the device isolation region depends on an over-etching amount associated with dispersion of etching. If the device isolation region is etched deeper than the source/drain diffusion regions 513, then a contact is formed in the deeply etched portion in the later contact forming step. Consequently, the source/drain diffusion regions and the substrate are connected via the contact, resulting in occurrence of failures due to short-circuit.

If the coating film 521 made of a nitride is formed, then etching for forming contact holes can be stopped by the first coating film whose material is different from that of the interlayer insulator. Further in the later step, in etching the first coating film made of a nitride to create complete openings of the contact holes, it becomes possible to etch only the first coating film without etching most of the device isolation region. This makes it possible to restrain failures that would be caused by the source/drain diffusion regions and the substrate being connected via the contact, thereby allowing provision of a semiconductor storage device with good yield and a low manufacturing cost.

Moreover, a technique to form shallow source/drain diffusion regions for controlling the short-channel effect is being vigorously utilized in these days, which further increases the likelihood of occurrence of short-circuit. Therefore, the etching technique utilizing this coating film is quite effective.

Figure 12D:
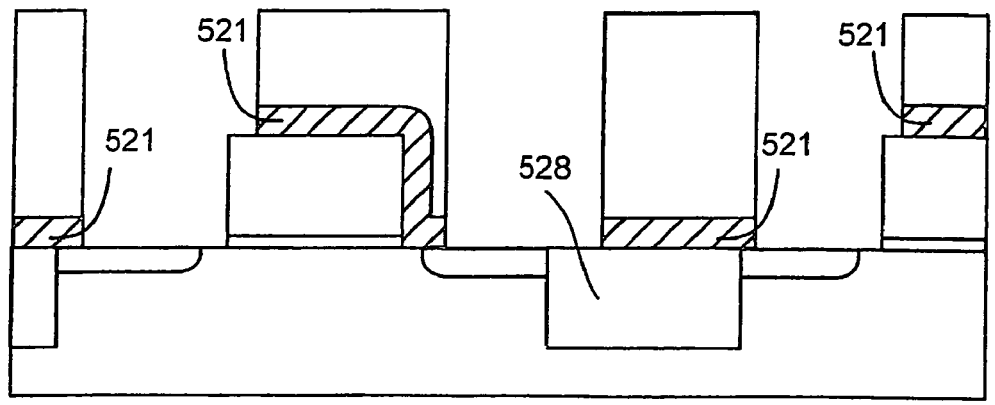

Next, as shown in FIG. 12D, the first coating film 521 under the contact holes is removed through isotropic selective etching or anisotropic selective etching. Thus, etching of the interlayer insulator is once stopped by the first coating film 521 and then, etching of the first coating film 521 is performed to complete the contact holes. In this way, it becomes possible to prevent short-circuit between the source/drain diffusion regions and the semiconductor substrate that is attributed to deep etching of the substrate, easily restrain the surface of the semiconductor substrate from being roughened, and suppress contact failure. The isotropic selective etching may use wet etching as well as dry isotropic etching with remote plasma. Further, as described above, it becomes possible to suppress short-circuit failure between the source/drain diffusion regions and the substrate that would be caused by etching of the device isolation region 528.

As shown in the drawing, however, there not only the case in which the first coating film on one side surface of the gate stack is completely removed and the gate stack is exposed, but also the case as shown in the ninth embodiment in which the first coating film on the opposite side surfaces of the gate stack remains and the gate stack would not be exposed. The drawing shows the case in which alignment with a foundation in the photolithography step for forming a contact widely deviates. However, the tenth embodiment would not fall within this example. Even if no alignment deviation is present, the present embodiment has an efficient effect that a margin of alignment in design is not necessary.

Figure 12E:
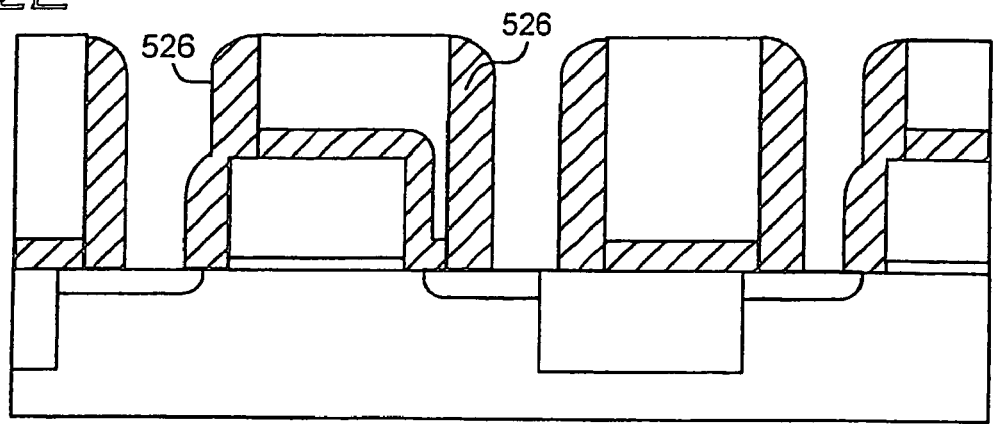

Next, as shown in FIG. 12E, a side wall of a second coating film 526 made of a silicon nitride is formed on the side surface of the contact hole and the exposed surface of the gate stack. The formation method should be identical to the manufacturing method for semiconductor storage devices disclosed in the seventh embodiment.

Figure 12F:
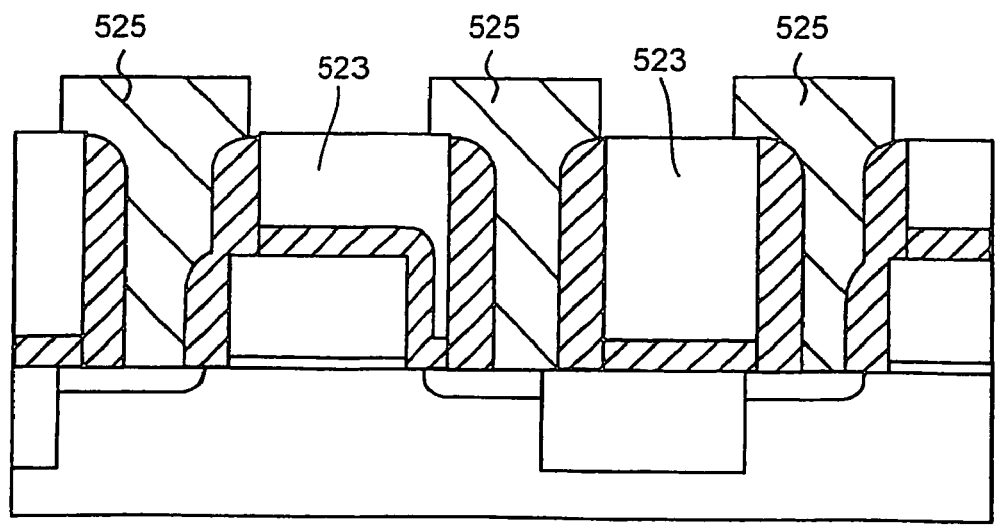

Next, as shown in FIG. 12F, a contact member is filled in the contact holes to form contacts 525. Further, the contact material is etched on the interlayer insulator 523 with use of photo lithography and etching processes to form an interconnection pattern thereon.

According to the above manufacturing method, not only a 2-bit (4-value) semiconductor storage device can be formed, but also short-circuit between the source/drain diffusion regions and the substrate that is attributed to deep etching of the semiconductor substrate can be prevented. Further, restraining the surface of the semiconductor substrate from being roughened leads to suppression of contact failure between the source/drain diffusion regions and the upper interconnection lines and further leads to prevention of short-circuit between the contact to the source/drain diffusion regions and the gate electrode. Consequently, it is not necessary to allow for a margin of alignment to prevent short-circuit or the like, which allows significant reduction in space occupancy, leading to a semiconductor storage device with a low cost.

Further, according to the above disclosure, it becomes possible to provide a semiconductor storage device that achieves the above effects with a low cost without adding specific steps, i.e., without adding a specific mask.

Eleventh Embodiment

A semiconductor storage device in an eleventh embodiment of the present invention will be described with reference to FIGS. 13A to 13G.

The semiconductor storage device of the present embodiment is almost identical in manufacturing steps to that of the tenth embodiment except the following point.

Figure 13A:
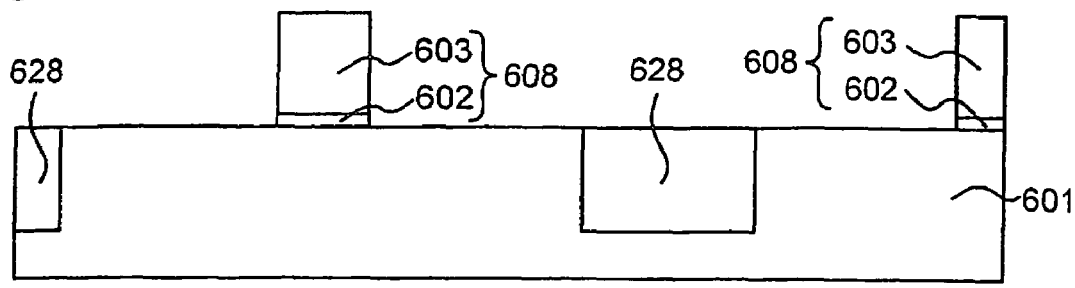
FIGS. 13A to 13G are schematic cross sectional views showing manufacturing steps of semiconductor storage devices with use of a semiconductor storage device in a eleventh embodiment of the present invention.
Figure 13B:
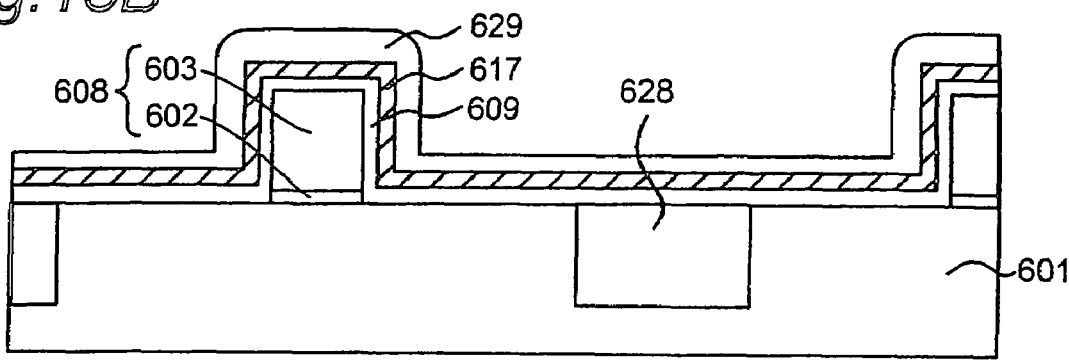
Figure 13C:
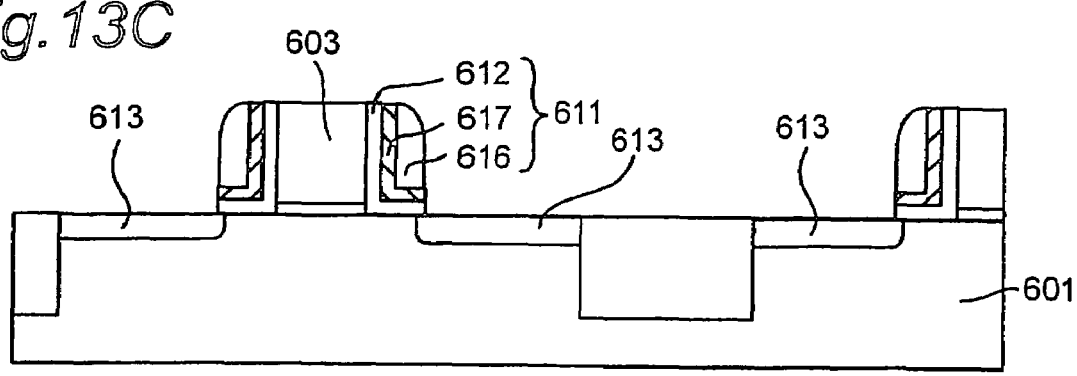
Figure 13D:
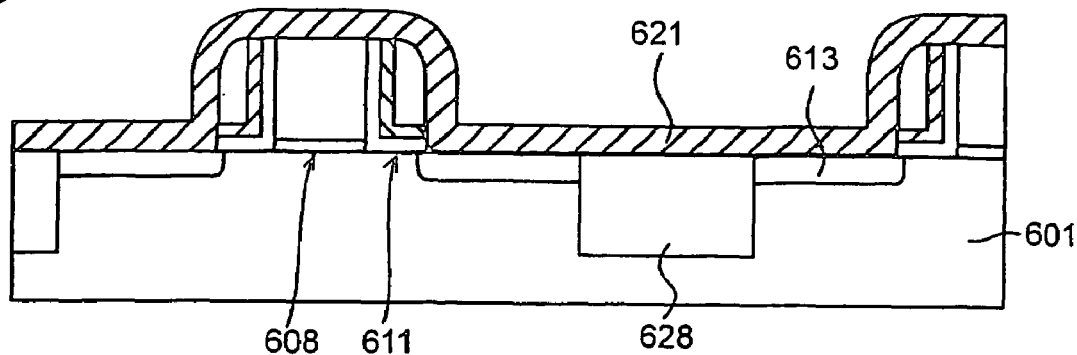
Figure 13E:
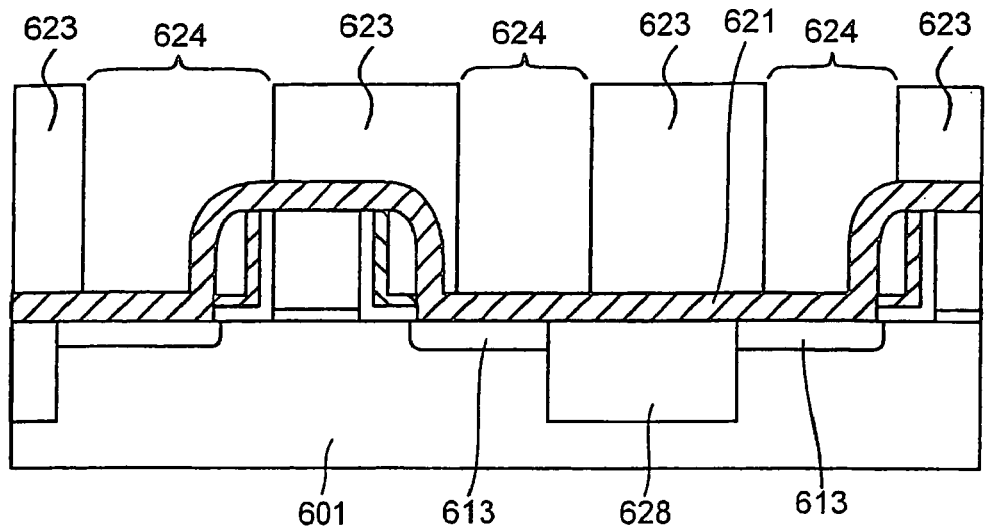
Figure 13F:
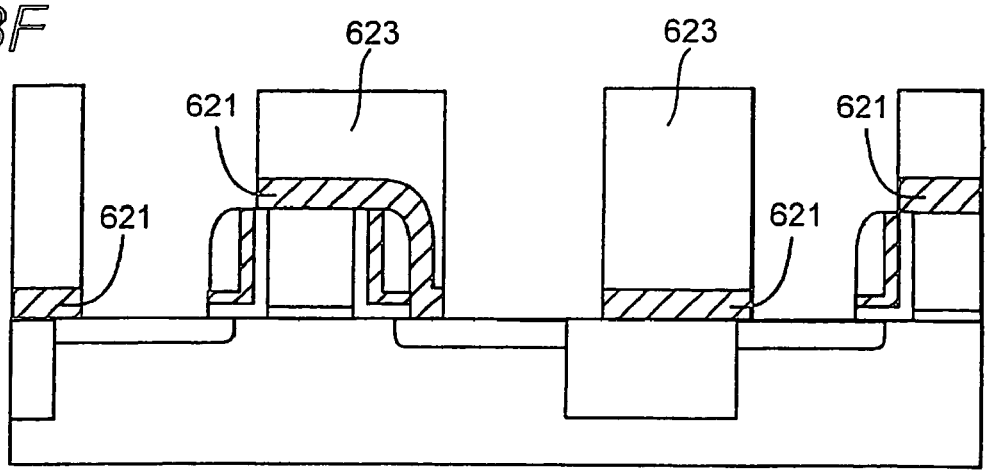
Figure 13G:
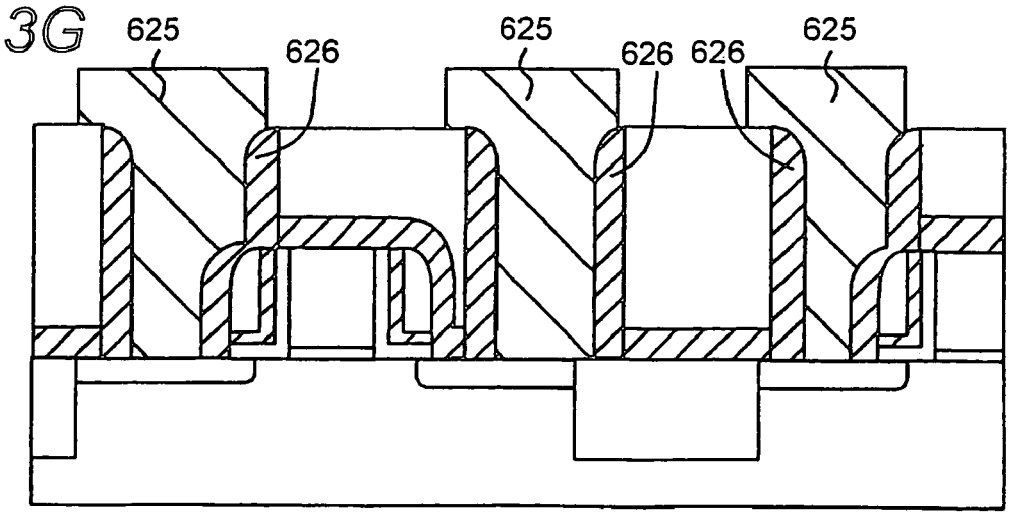

That is, as shown in FIG. 13C, before a first coating film 621 (shown in FIG. 13D) is formed, a memory function bodies 611 having a charge retention function are formed, so that as shown in FIG. 13G, a device identical to the device shown in FIG. 8 except the device isolation region is formed.

The memory function body is constituted according to this structure, and a silicon nitride 617 having a charge retaining function is interposed in between a first insulator 612 and a side-wall insulator 616 so that retained charges are restrained from dissipating, allowing provision of a semiconductor storage device with a good retention characteristic. Further, employing the structure in which the silicon nitride 617 is interposed in between the first insulator 612 and the side-wall insulator 616 leads to restraint of the charges injected during reprogramming operation from dissipating to the gate electrode and other nodes, which increases the charge injection efficiency, allowing higher-speed operation. Further, the memory function bodies 611 and a gate electrode 608 are covered with the first coating film 621 (shown in FIG. 13D), which restrains outward diffusion of impurities that would cause depletion of impurities in the gate electrode, thereby boosting yield. Furthermore, the first coating film 621 has a plurality of functions to reduce a space occupancy of the device concerning a contact, and restrains contact failure. A plurality of these functions concerning the first coating film 621 are achieved by simply forming the coating film, which allows simplification of the manufacturing steps, making it possible to provide a semiconductor storage device with a low manufacturing cost.

Although in the present embodiment, description is given of the case in which the device isolation region is formed, it will be appreciated that the case in which the device isolation region is not formed is also effective. In such a case, the effects disclosed in this embodiment except the effect concerning device isolation are achieved.

Hereinbelow, the manufacturing steps of the semiconductor storage device in the eleventh embodiment will be described in due order with reference to FIGS. 13A to 13G.

First, as shown in FIG. 13A, a gate insulator 602 and a gate electrode 603 having MOS (Metal Oxide Semiconductor) structure formed through MOS formation process, i.e., a gate stack 608, are formed on a semiconductor substrate 601 having a p-type conductivity and including a device isolation region 628. The formation methods identical to each of the methods described in the seventh embodiment should be applied except the formation method for the device isolation region.

The device isolation region 628 is formed by a known method. The device isolation region makes it possible to prevent leakage current from flowing between adjacent devices. However, it is not necessary to form such device isolation region between adjacent devices if the adjacent devices share the source/drain diffusion regions. The known method for forming device isolation regions can be any known method including known methods with use of a LOCOS oxide and known methods with use of a trench isolation region as long as a purpose of device isolation can be achieved thereby. In this embodiment, description is given of the case in which most of the device isolation region is composed of an oxide. It is to be noted that a material constituting most of the device isolation region is not limited to the oxide, and therefore any material which can be etched during contact etching of the interlayer insulator is acceptable and provides the same effects.

Next, as shown in FIG. 13B, a first insulating film 609 made of an oxide is formed almost evenly on the exposed surface of the semiconductor substrate 601 and the device isolation region 628. The first insulating film 609, which is made of an oxide in here, functions as an insulating film through which electrons pass, and therefore the first insulating film 609 should preferably be a film high in voltage withstand, small in leakage current and high in reliability. For example, like the material of the gate insulator 602, oxides such as thermally-oxidized films, $N_2O$ oxides and NO oxides are used. The thickness of the oxide should preferably be in the range of about 1 nm to 20 nm. Further, in the case where the insulating film is formed to be as thin as to pass tunneling current, it becomes possible to reduce a voltage required to inject or erase charges and thereby lower power consumption is achieved. The typical film thickness in this case should preferably be in the range of about 1 nm to 5 nm.

Next, a nitride 617 is almost evenly deposited. Although a nitride is used herein, the nitride may be replaced by materials which are capable of retaining and inducing charges, i.e., materials such as oxide nitrides that are capable of retaining substances having charges such as electrons and holes and oxides that have charge traps, materials such as ferroelectrics that are capable of inducing electrons to the surface of the memory function body by a phenomenon such as polarization, and materials which are structured to have substances capable of retaining charges such as floating polysilicon and silicon dots inside the oxide, and such materials achieve the same effects. The thickness of the nitride should be, for example, in the range of about 2 nm to 100 nm.

Further, a second insulating film 629 made of an oxide is almost evenly formed. The second insulating film should be a film having excellent step coverage such as a HTO (High Temperature Oxide) formed by CVD (Chemical Vapor Deposition) method. In the case of using the oxide, the film thickness should be in the range of about 5 nm to 100 nm. Moreover, the second insulating film may be formed by processing the surface of a nitride through heat treatment. In such a case, like the material of the aforementioned gate insulator 602, oxides such as thermally-oxidized films, $N_2O$ oxides and NO oxides are used. The thickness of the oxide should preferably be in the range of about 1 nm to 20 nm. Further, in the case where the insulating film is formed to be as thin as to pass tunneling current, it becomes possible to reduce a voltage required to inject or erase charges and thereby lower power consumption is achieved. The typical film thickness in this case should preferably be in the range of about 1 nm to 5 nm.

Herein, forming the first insulating film 609 enables the nitride 617 having a function to retain charges to come into contact with the semiconductor substrate and the gate electrode via the insulating film, which makes it possible to suppress leakage of retained charges with this insulating film, allowing formation of a semiconductor storage device with a good charge retention characteristic and high long-term reliability.

Next, as shown in FIG. 13C, there are formed memory function bodies 611 composed of the first insulator 612, the nitride 617 and the side-wall insulator 616 as well as source/drain diffusion regions 613. Herein, the source/drain diffusion regions 613 may be formed before the memory function bodies 611 are formed or after the memory function bodies 611 are formed. In either case, the same effect is achieved. In the case where the source/drain diffusion regions 613 are formed before the memory function bodies 611 are formed, an injection overcoat is not necessary so that simplification of the step can be achieved. Description is herein given of the case in which the source/drain diffusion regions 613 are formed after the memory function bodies 611 are formed.

First, anisotropic etching of the second insulating film 629 is executed to form a side-wall insulator 616 on the side wall of the gate stack 608 via the first insulating film 609 and the nitride 617. The etching should be conducted under the condition which allows selective etching of the second insulating film 629 and provides a large selectivity against the nitride 617.

In the case where the nitride is replaced by a material (e.g., conductor) 614 having electrical conductivity such as conductors and semiconductors, the same effects are implemented. In this case, however, 2-bit operation is disabled if, after formation of the memory function body 611, continuity is developed between left and right memory function bodies 611 (corresponding to 11a, 11b in FIG. 2). Therefore, electrical insulation between the left and right memory function bodies 611 are necessary. Accordingly, in the same way as shown in FIG. 6A, a part of the side-wall insulator 616 (a portion equivalent to the removal region 60 in FIG. 6A) is removed by etching. The removing method is composed of performing patterning of photoresist through a known photo lithography process so as to cover a portion of the side-wall insulator 616 other than the removal region.

After that, anisotropic etching or isotropic etching should be executed to etch the side-wall insulator 616 in the removal region. The etching should be executed under the condition of a large selectivity against the nitride 617. It is to be noted that the removal region should preferably be present on the device isolation region.

Next, with the side-wall insulator 616 used as an etching mask, the nitride 617 is isotropically or anisotropically etched, by which an L-shaped nitride 617 is formed on the side wall of the gate stack 608 via the first insulator 612. In this case, the etching is preferably performed under such conditions that the nitride 617 can be selectively etched and that the etching selection ratio to the first insulating film 609 made of oxide and the side-wall insulator 616 is a large one.

However, in the case where a material (conductor or the like) is used in place of the nitride 617, part of the side-wall insulator 616 (part corresponding to the removal region 60 in FIG. 6A) has been removed by etching in the preceding process. Further, when the etching in this process is performed by using isotropic etching, part of the material (conductor or the like) 614 is also removed together with the side-wall insulator 616 by this process, resulting in a configuration similar to that shown in FIG. 6B.

Therefore, as shown in FIG. 13C, right-and-left memory function bodies 611 can be electrically insulated from each other.

In this way shown above, the memory function body 611 composed of the first insulator 612, the L-shaped nitride 617 and the side-wall insulator 616 is formed on the side walls of the gate stack 608.

Next, the first insulating film 609 is anisotropically etched, by which the first insulator 612 is formed on the side wall of the gate stack 608. In this case, the etching is preferably performed under such conditions that the first insulating film 609 can be selectively etched and that the etching selection ratio of the nitride 617 to the gate electrode 603 and the semiconductor substrate 601 is a large one.

In this way shown above, memory function bodies 611 each composed of the first insulator 612, the L-shaped nitride 617 and the side-wall insulator 616 are formed on the side walls of the gate stack 608. The formation method in this case may be one described in the seventh embodiment. However, unlike the seventh embodiment, the source/drain diffusion regions are formed not by implanting the impurities into the semiconductor substrate 601 through the first coating film 621. Therefore, it is appropriate that with the implantation energy adjusted, the impurities are implanted shallower by an extent corresponding to the absence of the film thickness of the first coating film 621 so that a junction similar to that of the seventh embodiment is formed.

In this case, part of the side-wall insulator 616 and the nitride 617 (corresponding to the part present at the removal region 60 in FIG. 6C) has been removed by etching in the preceding process. However, since anisotropic etching is used in this process, part of the first insulator 612 that is not covered with the nitride 617 is etched, but some other part remains present around the gate electrode 603 in a state similar to that shown in FIG. 6C. In this case, since part of the first insulator 612 covers the outer periphery of the gate electrode 603, short-circuits between the contact to the source/drain diffusion regions or the memory function bodies and the gate electrode or the gate electrode contact can be suppressed. This facilitates miniaturization and allows higher integration of the memory.

It is to be noted that in the case where both the first insulator 612 and the side-wall insulator 616 are made of an identical material like oxide, a large etching selectivity cannot be obtained. Accordingly in such a case, it is necessary to consider an etching amount of the side-wall insulator in etching of the first insulating film and appropriately reduce the etching amount for forming the side-wall insulator by the above-stated etching amount.

Further, the structure of FIG. 13B to the structure of FIG. 13C may be achieved in one step. More specifically, by executing anisotropic etching under the condition which allows selective etching of all the first insulating film 609, the second insulating film 629 and the nitride 617 and which provides a large selectivity against the material of the gate electrode 603 and the material of the semiconductor substrate 1, the process typically requiring three steps can be completed in one step. This makes it possible to reduce the number of steps and thereby decrease the manufacturing cost.

In the case where the nitride 617 is replaced by a material (conductor or the like) 614 having electrical conductivity such as conductors and semiconductors, electrical insulation between the left and right memory function bodies 611 (shown in FIG. 13C) is necessary. Accordingly, after the memory function body is formed over the entire periphery of the gate stack 608 by the aforementioned method, a part of the side-wall insulator 616 (a portion in the removal region 60 in FIG. 6C) is removed by etching as shown in FIG. 6C. In this removing method, photoresist is patterned so as to cover the side-wall insulator 616 other than the removal region 60. After that, anisotropic etching is executed to remove the removal region that is an exposed portion of the side-wall insulator 616. The etching should be conducted under the condition which allows selective etching of the side-wall insulator 616 and provides a large etching selectivity against the material (conductor or the like) 614 having electrical conductivity.

Further, a part (removal region) of the material (conductor or the like) 614 is removed by etching. In this removing method, anisotropic etching or isotropic etching is performed with use of the previously formed photoresist in the state that a portion of the material (conductor or the like) 614 other than the removal region is covered so as to remove the removal region that is an exposed portion. The etching should be conducted under the condition which allows selective etching of the material (conductor or the like) 614 and provides a large etching selectivity against the first insulator 612.

In this step, the first insulator remains so as to cover the outer periphery of the gate electrode, so that short-circuits between the contacts to the source/drain diffusion regions or the memory function bodies and the gate electrode or gate electrode contact can be suppressed. This facilitates further scale-down and allows higher integration of the memory.

Further, as shown in FIG. 6D, the removal regions of the memory function body 611 which is so formed as to surround the gate electrode 603 may be etched away in one etching operation. More specifically, through a known photolithography process, patterning of photoresist is performed so as to cover portions of the memory function bodies other than the removal regions. After that, anisotropic etching is executed under the condition which allows selective etching of all the first insulating film 609, the second insulating film 629 and the nitride 617 and which provides a large etching selectivity against the material of the gate electrode 603 and the material of the semiconductor substrate 601, by which the process typically requiring three steps can be completed in one step. This makes it possible to reduce the number of steps and thereby decrease the manufacturing cost.

Next, with use of the gate electrode 603 and the memory function bodies 611 as a mask, source/drain implantation is executed, and then known heating treatment for activation is performed to form the source/drain diffusion regions 613 in a self-alignment fashion.

Through the above-stated steps, the memory function bodies have been formed. A semiconductor storage device using this memory function body has the following effects.

When electric charge is retained in the memory function body, part of the channel region is strongly influenced by the charge, by which a drain current value is changed. Consequently, a semiconductor storage element that distinguishes between the presence and absence of electric charge is formed.

Moreover, the gate insulator 2 and the memory function body 611 are disposed separate from each other so that different scaling can be applied to each of the gate insulator 2 and the memory function body 611, making it possible to suppress the short-channel effect and provide a semiconductor storage device with a good memory effect.

Further, since the nitride 617 in the memory function body is in contact with the semiconductor substrate 601 and the gate electrode 603 via an insulating film, leakage of retained charge can be suppressed by the insulating film. Consequently, a semiconductor storage device with a good charge retention characteristic and high long-term reliability is formed.

Further, in the case where a conductor or semiconductor is used as the memory function body, a positive voltage, when applied to the gate electrode, causes polarization to occur in the memory function body, by which electrons are induced in the vicinity of the side-wall portion of the gate electrode, with the result that electrons are decreased in the vicinity of the channel region. This makes it possible to promote injection of electrons from the semiconductor substrate or the source/drain diffusion regions, allowing formation of a semiconductor storage device with a high write speed and high reliability.

Next, as shown in FIG. 13D, a first coating film 621 made of silicon nitride is formed on exposed surfaces of the gate stack 608, the memory function body 611, the semiconductor substrate 601 and the device isolation region 628. The formation method therefor may be identical to the manufacturing method for the semiconductor storage device described in the seventh embodiment.

Next, as shown in FIG. 13E, an interlayer insulator 623 made of oxide is formed. After that, contact holes 624 for forming contacts to connect the source/drain diffusion regions and interconnection lines respectively are formed in the interlayer insulator 623. Each of these steps may be identical to those of the manufacturing method for the semiconductor storage device described in the seventh embodiment.

In order to clarify the effects implemented by this embodiment, the drawings herein show a case in which the contact hole is positioned such that at least part of the contact hole overlaps with upper portion of the device isolation region 628. However, the same effects are achieved even if the contact hole is actually not placed in such a position as in this embodiment. More specifically, in designing the memory element of the prior art, the device would need to be designed so as to allow for a sufficient margin of alignment between, for example, the device isolation region and the contact hole, which would enlarge a space occupancy of the device. In this embodiment, however, it is not necessary to allow for a sufficient margin of alignment, which reduces a space occupancy of the device, allowing reduction in manufacturing cost per element. In more detail, the effects, which are characteristic effects of this embodiment, are generated by provision of individual coating films and are generated in the stage of device design, and not functional effects by the completed shape of the device.

Also in this case, with the memory element of the prior art, if etching for forming contact holes is executed without allowing for a sufficient margin of alignment and as a result, the position of the contact hole overlaps with the top of the device isolation region 628 as shown in the drawing, then the device isolation region would be etched by the contact etching because the first coating film 621 made of nitride is not present and the primary materials of the interlayer insulator and the device isolation region are both oxides. The depth of etching in the device isolation region depends on an over-etching amount associated with etching variations. If the device isolation region is etched deeper than the source/drain diffusion regions 613, then a contact is formed in the deeply etched portion in the later contact forming step. Consequently, the source/drain diffusion regions and the semiconductor substrate are connected to each other via the contact, resulting in occurrence of failures due to short-circuit.

If the first coating film 621 made of a nitride is formed, then etching for forming contact holes can be stopped by the first coating film 621 whose material is different from that of the interlayer insulator 623. Further in the later step, in etching the first coating film 621 made of a nitride to create complete openings of the contact holes, it becomes possible to etch only the first coating film 621 without etching most of the device isolation region 628. This makes it possible to suppress failures that would be caused by the source/drain diffusion regions 613 and the semiconductor substrate 601 being connected to each other via the contact, thereby allowing provision of a semiconductor storage device with high yield and a low manufacturing cost.

Moreover, a technique to form shallow source/drain diffusion regions for controlling the short-channel effect is being heavily utilized these days, which further increases the likelihood of occurrence of short-circuits. Therefore, the etching technique utilizing this first coating film 621 is quite effective.

Next, as shown in FIG. 13F, the first coating film 621 under the contact holes is removed by using anisotropic selective etching. The etching method may be the same as the method described in the eighth embodiment.

In this way, the etching of the interlayer insulator 623 is once stopped by the first coating film 621, and then the first coating film 621 is etched to completely open the contact holes. By doing so, it becomes possible to prevent short-circuits between the source/drain diffusion regions and the substrate that are attributed to deep etching of the semiconductor substrate, easily suppress the surface of the semiconductor substrate from being roughened, and suppress contact failures. Further, it also becomes possible to suppress short-circuit failures between the source/drain diffusion regions and the substrate that would be caused by etching of the device isolation region 628.

Next, as shown in FIG. 13G, side walls of the second coating film 626 made of silicon nitride are formed on the exposed surface of the contact hole and the exposed surface of the gate stack. Then, the contact material is buried in the contact holes to form contacts 625. Further, the contact material is etched on the interlayer insulator 623 with use of photolithography and etching processes to form an interconnection pattern thereon.

By the above-described manufacturing method, not only a 2-bit (4-value) semiconductor storage device can be formed, but also short-circuits between the source/drain diffusion regions and the substrate that are attributed to deep etching of the semiconductor substrate can be prevented. Further, restraining the surface of the semiconductor substrate from being roughened leads to suppression of contact failures between the source/drain diffusion regions and the upper interconnection lines and further leads to prevention of short-circuits between the contact to the source/drain diffusion regions and the gate electrode. Subsequently, short-circuits between the source/drain diffusion regions and the semiconductor substrate are suppressed. Consequently, there is no need for allowing for a margin of alignment to prevent short-circuits or the like, which allows significant reduction in space occupancy, making it possible to provide a semiconductor storage device at a low cost.

Further, since the formation method for achieving the above-described functional effects can be carried out without adding any complex steps, a semiconductor storage device that achieves the above effects can be provided with a low cost.

Furthermore, by virtue of the structure of the memory function bodies, it becomes possible to provide a semiconductor storage device which is good at retention characteristics and capable of higher-speed operations.

Twelfth Embodiment

A semiconductor storage device of a twelfth embodiment of the present invention is described with reference to FIGS. 15A to 15J. The semiconductor storage device of this twelfth embodiment shows an embodiment of the construction of the memory function body in the eleventh embodiment. This embodiment has the following working effects in addition to the working effects of the eleventh embodiment.

Also, the first coating film does not necessarily need to be an insulating film unlike the first to eleventh embodiments. As to the reason of this, in FIGS. 15A to 15E, since the contour of a memory function body is completely covered with a dielectric so that dissipation of stored charge is suppressed, the first coating film does not need to be given by a dielectric to prevent short-circuits between the memory function body and the contact, and has only to be one that allows a selectivity against the material of the interlayer insulator or the device isolation region to be obtained, where the same working effects are exhibited.

Now designations of the memory function body and its individual portions are defined as follows.

As shown in FIGS. 15A to 15J, the memory function body is composed of a charge retention part, which is a part capable of retaining electric charge, and an anti-dissipation dielectric, which is a part for preventing the dissipation of electric charge. In this case, it is assumed that the charge retention part is at least either one of silicon dots 710 or polysilicon 715 while the anti-dissipation dielectric is at least either one of a first insulator 712 or a side-wall insulator 716.

Figure 15A:
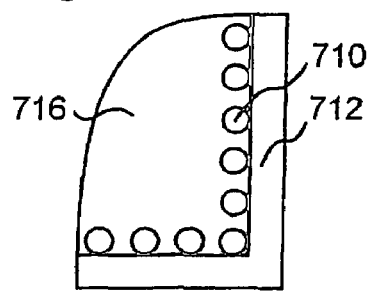
FIGS. 15A to 15J are schematic cross sectional views each showing a structural aspect of a memory function body in a semiconductor storage device in a twelfth embodiment of the present invention, respectively.
Figure 15B:
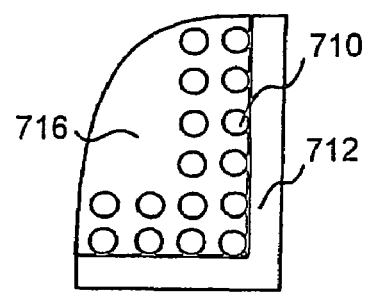
Figure 15C:
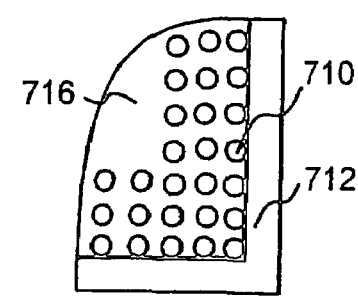
Figure 15D:
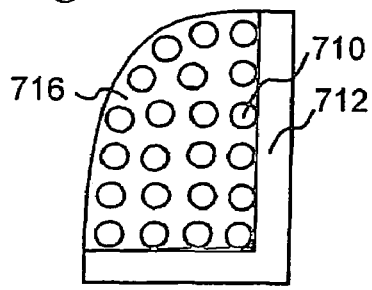
Figure 15E:
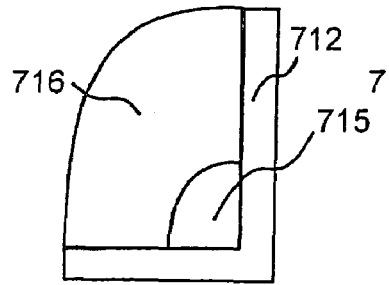
Figure 15F:
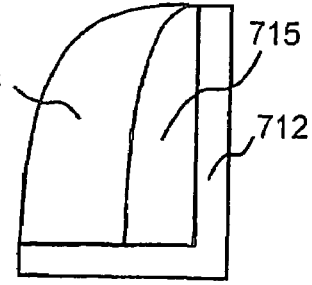
Figure 15G:
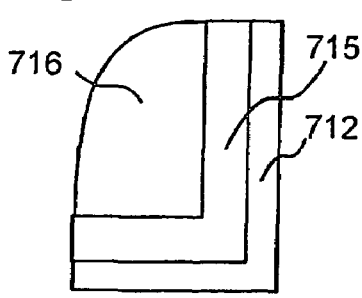
Figure 15H:
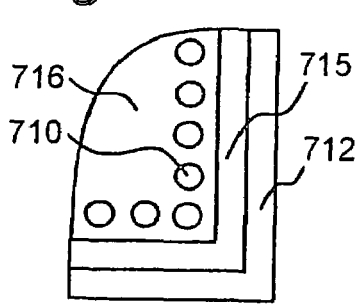
Figure 15I:
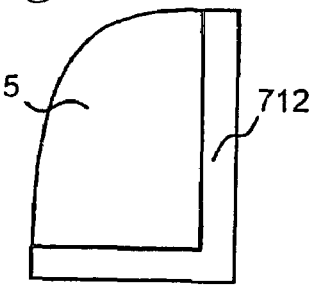
Figure 15J:
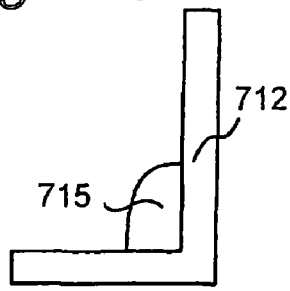

More specifically, there are assumed cases where the charge retention part is silicon dots 710 and the anti-dissipation dielectric is composed of a first insulator 712 and a side-wall insulator 716 as shown in FIGS. 15A to 15D, or where the charge retention part is polysilicon 715 and the anti-dissipation dielectric is composed of the first insulator 712 and the side-wall insulator 716 as shown in FIGS. 15E to 15G, or where the charge retention part is the silicon dots 710 and the polysilicon 715 and the anti-dissipation dielectric is composed of the first insulator 712 and the side-wall insulator 716 as shown in FIG. 15H, or where the charge retention part is the polysilicon 715 and the anti-dissipation dielectric is the polysilicon 715 and the anti-dissipation dielectric is composed only of the first insulator 712 as shown in FIGS. 15I and 15J.

The memory function body shown in 15A is so constructed that a side-wall insulator 716 containing one-layer silicon dots is formed on the side wall of the first insulator 712.

The fabrication method includes the steps of, after forming the first insulator 712, forming silicon dots, and thereafter depositing a deposition insulating film thereon, followed by an etchback process and a residue removal process, to fabricate the structure shown in the figure. Individual steps are shown below in detail.

First, the method of forming the silicon dots is shown. With disilane used as the material gas, the silicon dots 710 are grown for 2 min. at a substrate temperature of 700° C. under a pressure of 1 Torr by CVD process. In this case, the size of silicon dots is about 5 nm. Preferably, the size of silicon dots for this case is about 1 nm to 50 nm. More preferably, the size is desirably about 1 nm to 15 nm, which is such a size that quantum effects such as Coulomb blockade are developed. In this case, controlling such CVD conditions as material gas, pressure, substrate temperature and growth time as required makes it possible to optimize the size, density or the like of silicon dots in their formation.

Also, taking in consideration that the dot diameter is reduced by the subsequent-step oxidation, forming the silicon dots somewhat larger in size as required allows the formation of silicon dots having an optimum configuration.

Further, although not shown, the silicon dots 710, after their formation, are oxidized at their surfaces. This oxidation process may be implemented by using thermal oxidation. In this case, the rate of oxidation slows down as the silicon dots decrease in size, variations in size of the silicon dots can be suppressed. Further, the oxide of the silicon-dot surfaces, which serves as an insulating film through which electrons pass, has only to be formed as a film having a high withstand voltage, less leakage current and high reliability. For example, the oxide may be a film of $N_2O$, NO or the like. Film thickness of the insulating film in its final configuration, which is located between the silicon dots 710 and the semiconductor substrate (not shown) and between the silicon dots 710 and the gate electrode, is preferably within a range of about 1 nm to 20 nm as equivalent-oxide film thickness including the first insulator 712. More preferably, when the silicon dots are each sized about 1 nm to 15 nm, then it is desirably about 1 nm to 10 nm in terms of equivalent oxide film thickness. In the case where the silicon dots are oxidized so as to be decreased in size as shown above, it is of course necessary to form the silicon dots more or less larger, taking into consideration the degree of size decrement in the formation of the silicon dots. Further, in the case where the insulating film is formed at such a thinness as to allow a tunnel current to pass therethrough, where electric charge is retained by the Coulomb blockade effect using a double tunnel junction, the voltage required for injection/erase of charge can be made lower, thus allowing a power consumption saving to be achieved. A typical oxide film thickness in that case is preferably about 1 nm to 3 nm. Further, the silicon dots may also be deposited so as to have depressions and projections without their height being uniformed.

Next, the method of forming the deposition insulating film by using the CVD process is preferably one which employs an HTO (High Temperature Oxide) or a film having a good step coverage with use of LPCVD (Low Pressure Chemical Vapor Deposition). With the use of an HTO film, the film thickness may be about 20 nm to 100 nm. It is noted here that the deposition insulating film is etched back into the side-wall spacer configuration in the succeeding step, serving as an implantation mask in the impurity implantation for forming the source/drain diffusion regions. That is, since the film thickness of the deposition insulating film is an important factor for specifying the configuration of the source/drain diffusion regions, in particular, the offset width against the gate electrode end, adjusting and changing the thickness of the deposition insulating film as required makes it possible to form the source/drain diffusion regions into an optimum configuration and obtain an optimum offset width.

Next, the deposition insulating film and the silicon dots 710 are anisotropically etched, by which a memory function body including the silicon dots 710 of the side-wall spacer configuration is formed on the side wall of the gate stack. For this process, selecting different materials for the first insulator 712 and the deposition insulating film allows the selectivity between these films to be raised so that the process can be carried out with higher efficiency and simplicity. For example, nitride may be used as the material of the first insulator 712 while oxide may be used as the material of the deposition insulating film.

However, in many cases, a silicon substrate is commonly used as the semiconductor substrate. In this case, since silicon is used as the material of the dots, the silicon dots could not be etched, causing etching residues to come out. In such a case, it is recommendable to isotropically etch the remaining insulating film by wet etching with the use of hydrofluoric acid or the like after the anisotropic etching, by which the silicon residues are lifted off. Further, if the residues still remain, oxidation is performed so that the surfaces or entirety of these residues is oxidized, and thereafter wet etching with the use of hydrofluoric acid or the like can be applied to remove the residues.

As shown above, with the use of the structure that electric charge is retained by silicon dots, even if there has occurred a leakage from the insulating film that would cause the memory retention characteristics to deteriorate, not that an entirety of retained electric charge leaks, but that only part of the electric charge retained by silicon dots located in the vicinity of the insulating film leakage portion leaks. Therefore, there can be provided a semiconductor storage device having good retention characteristics.

Further, oxidizing the silicon-dot surface makes it possible to suppress size variations of the silicon dots. Thus, a semiconductor storage device that involves less variations of the electric characteristics can be provided.

Next, the memory function body shown in FIG. 15B is so constructed that a side-wall insulator 716 containing two-layer silicon dots 710 is formed on a side wall portion of the first insulator 712.

As to the fabrication method therefor, preferably, after the formation of the first insulator 712, silicon dots 710 are formed by the foregoing method described in FIG. 15A and the surface of the silicon dots is oxidized. Then, silicon dots are further formed by a similar method, and thereafter a deposition insulating film is deposited, where an etchback step and a residue removal step are carried out, thereby fabricating the structure shown in the figure. The individual steps may be those described in above FIG. 15A.

With this structure, silicon dots constitute two- or more multiplexed dots longitudinally, so that the memory retention performance is greatly improved, compared with one-layer dots. Further, since the number of silicon dots in the memory function film increases in comparison to one-layer dots, the amount of retained charge increases. Thus, the difference in threshold voltage or difference in drive current between write and erase operations increases, and therefore a semiconductor storage device having a large voltage margin and improved in reliability can be formed.

Next, the memory function body shown in FIG. 15C is so constructed that a side-wall insulator 716 containing three-layer silicon dots 710 is formed on the side wall portion of the first insulator 712.

As to the fabrication method therefor, after the formation of the first insulator 712, silicon dots 710 are formed by the foregoing method described in FIG. 15A and the surface of the silicon dots is oxidized. Further, silicon dots 710 are formed by a similar method, and the surface of the silicon dots is oxidized. Then, silicon dots are further formed and thereafter a deposition insulating film is deposited, where an etchback step and a residue removal step are carried out, thereby fabricating the structure shown in the figure. The individual steps may be those described in above FIG. 15A.

With this structure, silicon dots constitute three- or more multiplexed dots longitudinally, so that the memory retention performance is greatly improved, compared with one- and two-layer dots. Further, since the number of silicon dots in the memory function film increases in comparison to one- and two-layer dots, the amount of retained charge increases. Thus, the difference in threshold voltage or difference in drive current between write and erase operations increases, and therefore a semiconductor storage device having a large voltage margin and improved in reliability can be formed.

In a structure shown in FIG. 15D, a side-wall insulator 716 composed of stacked silicon dots 710 is formed on the side wall portion of the first insulator 712 to such a film thickness as to sufficiently fill the interior of the side-wall insulator 716.

As to the fabrication method therefor, the foregoing steps of forming and oxidizing silicon dots may be repeated further to a plurality of times as required with respect to FIGS. 15A and 15C. The memory retention performance is greatly improved, compared with one-, two-and three-layer dots. Further, since the number of silicon dots in the memory function film increases in comparison to one-, two- and three-layer dots, the amount of retained charge increases. Thus, the difference in threshold voltage or difference in drive current between write and erase operations increases, and therefore a nonvolatile memory having a large voltage margin and improved in reliability can be formed.

In a structure shown in FIG. 15E, a side-wall insulator 716 in which side-wall shaped minute polysilicon 715 is contained near the charge injection portion is formed on the side wall portion of the first insulator 712.

As to the fabrication method therefor, after the formation of the first insulator 712, polysilicon is deposited by a process of good step coverage such as LPCVD process, and etched back so as to be formed in limitations to portions of the corner portions of the memory function body at which electric charge is injected as shown in the figure. Thereafter, a deposition insulating film is deposited and an etchback process is performed, thereby fabricating the structure shown in the figure.

With this structure, since the electrons to be injected by write operation are limited to the vicinities of the channel, it becomes easier to remove the electrons by erase operation, so that mis-erases can be prevented. Further, the amount of electric charge per unit volume can be increased by decreasing the volume of the memory function body that retains electric charge without the amount of injected electric charge maintained unchanged. Therefore, electron write/erase operation can be performed efficiently, so that a semiconductor storage device of high write/erase speeds can be provided. Further, since the side-wall insulator 716 covers the polysilicon 715, short-circuits between the polysilicon 715 and the contact can be prevented in the process for the gate electrode or the contacts to the source/drain diffusion regions. It is of importance that the interlayer insulator and the side-wall insulator are made of different materials, respectively, e.g. oxide and nitride. Therefore, scale-down can be achieved by virtue of a small, good design contact margin. Thus, a semiconductor storage device of reduced cost is provided.

In a structure shown in FIG. 15F, a side-wall insulator 716 in which side-wall shaped narrow-in-width polysilicon 715 is contained near the charge injection portion is formed on the side wall portion of the first insulator 712.

The formation method therefor may be similar to the method described in FIG. 15E, where the structure can be formed by controlling the deposition film thickness and etching amount of polysilicon. Its working effects are also similar to those of FIG. 15E.

Shown in FIG. 15G is a memory function body in which polysilicon 715 is formed on the side wall portion of the first insulator 712 and in which a side-wall insulator 716 is formed on its side wall portion.

As to the formation method therefor, after the formation of the first insulator 712, polysilicon is deposited by a process of good step coverage such as LPCVD process, and subsequently a deposition insulating film is deposited. Thereafter, the polysilicon and the deposition insulating film are etched, thereby forming the structure shown in the figure. With this structure, working effects similar to those of FIG. 15E can be produced.

Shown in FIG. 15H is a memory function body in which polysilicon 715 is formed on the side wall portion of the first insulator 712 and in which a side-wall insulator 716 containing a plurality of silicon dots 710 is formed on its side wall portion.

As to the formation method therefor, after the formation of the first insulator 712, polysilicon is deposited by a process of good step coverage such as LPCVD process, followed by oxidation of its surface and the formation of silicon dots, and subsequently a deposition insulating film is deposited. This structure is preferably formed by using the steps of FIG. 15A and FIG. 15G. With this structure, by the formation that provides the presence of a semiconductor or conductor film between the semiconductor substrate and the plurality of fine particles, it becomes possible to suppress any influences of variations in position and size of the fine particles on the threshold voltage of the field effect transistors. Thus, a semiconductor storage device in which misreads are suppressed can be provided. Also, the formation process for the silicon dots may be given by using the silicon dots of the structures described in FIGS. 15B to 15D, i.e. silicon dots of multilayer structure, in place of FIG. 15A, in which case also memory function bodies having their individual working effects added can be formed.

Furthermore, the following steps can also be employed.

After the formation of the first insulator 712, polysilicon is deposited by a process of good step coverage such as LPCVD process, and its surface is oxidized. Thereafter, a process under the same conditions as those of the deposition of polysilicon is performed. In this process, silicon dots are formed depending on the difference in the roughness of base oxide between the first-time deposition of polysilicon and this-time process. In the case of such silicon-dot formation, too small silicon dots would cause too large a Coulomb blockade effect, making it hard to inject electric charge, and moreover, too large silicon dots would result in a film shape. Therefore, the differential film thickness is about 1 nm to 20 nm. As a typical example, 5 nm polysilicon film and silicon dots can be formed by LPCVD process in a $SiH_4$ atmosphere of 620° C. as in the case of polysilicon film.

Shown in FIG. 15I is a memory function body in which polysilicon 715 is formed on the side wall portion of the first insulator 712. As to the formation method therefor, after the formation of the first insulator 712, polysilicon is deposited by a process of good step coverage such as LPCVD process, and anisotropically etched, by which a memory function body of the side-wall spacer configuration is formed. In this structure, the polysilicon region is so large as to allow a large amount of electric charge to be retained, making it possible to easily implement multi-valued processing. Further, by virtue of the simplicity of the structure, device manufacturing becomes easier and the manufactured cost can be reduced.

Shown in FIG. 15J is a memory function body which has, on the side wall portion of the first insulator 712, a structure that polysilicon is scaled down near the charge injunction portion, compared with FIG. 15I. As to the formation method therefor, after the formation of the first insulator 712, polysilicon is deposited by a process of good step coverage such as LPCVD process, and anisotropically etched. Thereafter, wet etching or other isotropic selective etching is performed, by which the formation is achieved. With this structure, since the electrons to be injected by write operation are limited to the vicinities of the channel, it becomes easier to remove the electrons by erase operation, so that mis-erases can be prevented. Further, the amount of electric charge per unit volume can be increased by decrease of the volume of the memory function body that retains electric charge without the amount of injected electric charge maintained unchanged. Therefore, electron write/erase operation can be performed efficiently, so that a semiconductor storage device of high write/erase speeds can be provided.

According to the structures of FIGS. 15E to 15J, dissipation of electric charge stored in the polysilicon can be suppressed by the first insulator 712. Thus, a semiconductor storage device good at retention characteristics and high in reliability can be provided.

The memory function bodies described in the FIGS. 15E to 15J need the removal of coverage portion around the gate electrode, similar to that shown in FIGS. 6A to 6D, for the prevention of short-circuits between right-and-left memory function bodies.

Also, as to the polysilicon of the memory function bodies of FIGS. 15E to 15J, materials other than polysilicon, only if having the function of being capable of retaining electric charge, can also produce the same effects as described above. For example, silicon nitride, electrical conductor or ferroelectric substances such as PZT or PLZT may also be used.

However, use of polysilicon makes it possible to control the amount of electric charge injection, thereby enabling multi-valued processing, which allows the manufacturing cost per bit to be reduced. Further, polysilicon is a material which is quite normally used for LSI processes, thus allowing the manufacturing cost to be reduced.

Also, in the case where silicon nitride is used in place of polysilicon, since energy levels of about $1\times10^{12}$ cm$^{-2}$ for trapping electric charge of the charge retention part can be contained, a large hysteresis characteristic can be obtained. Further, since the charge retention time is so long that the problem of charge leakage due to occurrence of leak paths does not occur, there can be obtained good retention characteristics. Moreover, since silicon nitride is a material which is quite normally used for LSI processes, the manufacturing cost becomes lower.

(Thirteenth Embodiment)

A semiconductor storage device of a thirteenth embodiment of the present invention is explained with reference to FIGS. 14A to 14C. In this thirteenth embodiment, a semiconductor storage device similar in structure to the semiconductor storage device in which various types of memory function bodies shown in the foregoing eleventh embodiment are formed on the side walls is formed and the semiconductor storage device is applied to the seventh to ninth embodiments. That is, the eleventh embodiment, which is a modification of the semiconductor storage device of the tenth embodiment, differs therefrom only in the addition of a step for forming the memory function bodies by the formation method described in the eleventh embodiment, where the manufacturing method of the semiconductor storage device shown in the tenth embodiment may be applied to the rest of the manufacturing method of this semiconductor storage device. Similarly, with the seventh to ninth embodiments as well, the structure of this embodiment can be formed only by adding the step of forming the memory function bodies, where working effects additionally including the effects described in the second to ninth embodiments, respectively, can be produced.

Figure 14A:
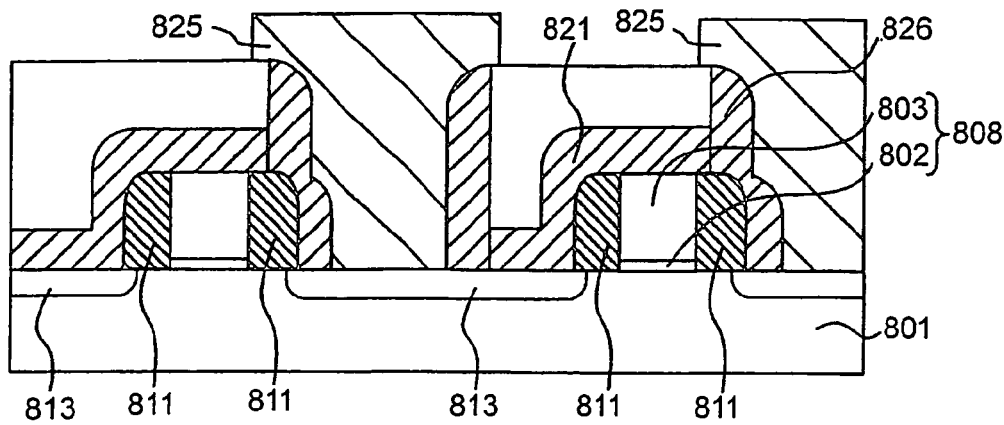
FIGS. 14A to 14C are schematic cross sectional views each showing a semiconductor storage device in a thirteenth embodiment of the present invention, respectively.
Figure 14B:
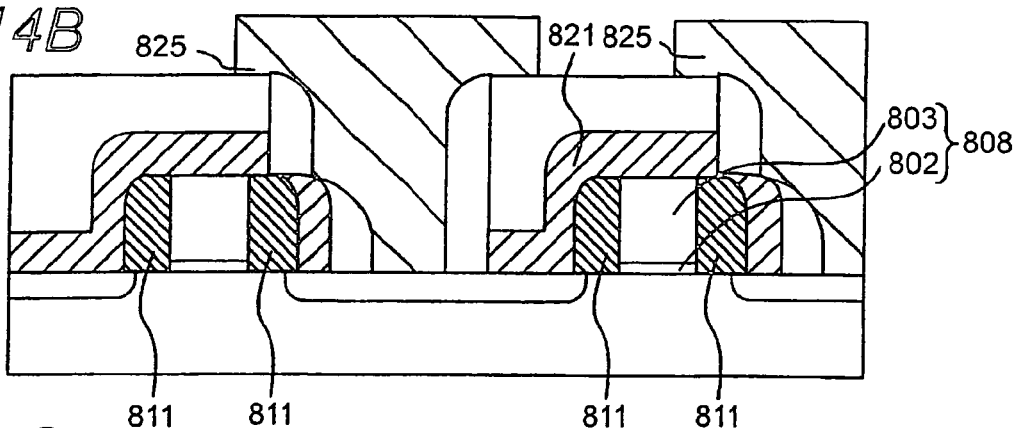
Figure 14C:
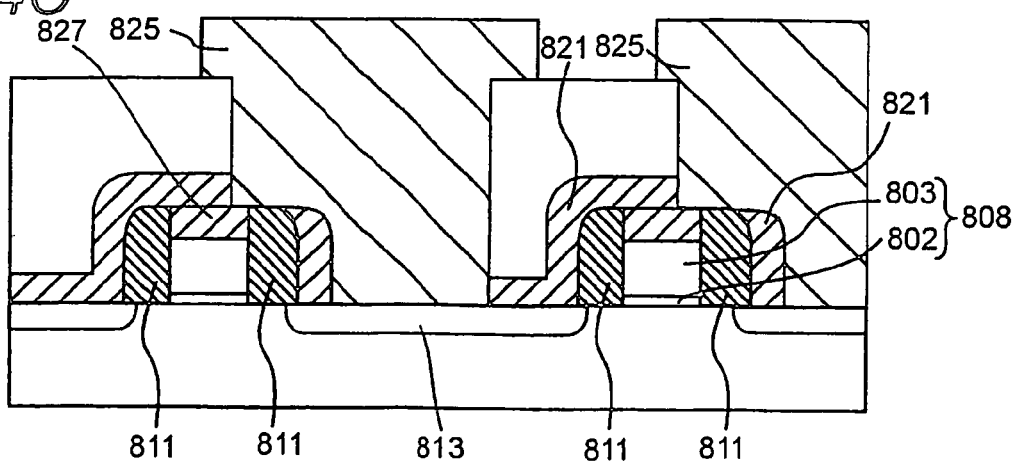

FIGS. 14A to 14C are explained in detail, respectively. It is noted that in FIGS. 14A to 14C, reference numeral 801 denotes a semiconductor substrate, 802 denotes gate oxide, 803 denotes a gate electrode, 808 denotes a gate stack, 811 denotes a memory function body, 813 denotes a source/drain diffusion region, 821 denotes a first coating film, 825 denotes a contact, and 826 denotes a second coating film.

The structure of FIG. 14A is generally similar to that of the steps described in the seventh embodiment, and differs therefrom particularly in the following point.

That is, the difference point is that before the formation of the first coating film 821 shown in FIG. 9B of the seventh embodiment, the memory function body 811 having a charge retention function is formed, by which a device similar in configuration to the semiconductor storage device described in the eleventh embodiment is formed. In this case, the memory function body 811 may be given by using the memory function body of the structure and formation method described in the eleventh and twelfth embodiments.

With this structure, the semiconductor storage device not only has the working effects described in the eighth embodiment, but also can be made to have the working effects related to the memory function body described in the sixth or twelfth embodiment.

The manufacturing method of this semiconductor storage device is as follows.

First, by using the methods described in the eleventh and twelfth embodiments, a structure shown in FIG. 13C is formed. In this case, the memory function body 811 is not limited to that shown in FIG. 13C but may be one memory function body described in FIGS. 15A to 15J, by which the working effects described in the twelfth embodiment can be fulfilled.

Thereafter, the semiconductor storage device described in FIG. 14A can be formed by using the steps similar to those described in FIG. 9B and followings of the seventh embodiment. It is noted here that in this thirteenth embodiment, unlike the seventh embodiment, the memory function body is formed so that the design margin can be reduced. That is, in the memory function bodies described in FIGS. 15A to 15F, the silicon dots 710 and the polysilicon 715, which are the portions for retaining electric charge, are covered with the side-wall insulator 716, so that short-circuits do not occur even if the contact and the memory function body have come into contact therebetween. Therefore, for the memory function bodies described in FIGS. 15A to 15F, it is the only requirement to provide such a margin that the contact is kept from short-circuiting with the gate electrode, thus facilitating scale-down.

Next, also for the structure of FIG. 14B, as in the foregoing case, before the formation of the first coating film 821, the memory function body 811 having the charge retention function is formed, by which a device similar in configuration to the semiconductor storage device described in the eleventh embodiment is formed. However, this manufacturing method differs from FIG. 14A in that the steps including and after the formation of the first coating film are those described in the eighth embodiment.

The manufacturing method of this semiconductor storage device is as follows.

First, with the method described in the eleventh and twelfth embodiments, the structure shown in FIG. 13C of the eleventh embodiment is formed. In this case, the memory function body 811 is not limited to that described in FIG. 13C, and but may be one memory function body described in FIGS. 15A to 15J, by which the working effects described in the twelfth embodiment can be fulfilled.

Thereafter, the semiconductor storage device described in FIG. 14B can be formed by using the steps similar to those described in FIGS. 10A and followings of the eighth embodiment. It is noted here that in this embodiment, unlike the eighth embodiment, the memory function body is formed so that the design margin can be reduced. That is, in the memory function bodies described in FIGS. 15A to 15F, the silicon dots 710 and the polysilicon 715, which are the portions for retaining electric charge, are covered with the side-wall insulator 716, so that short-circuits do not occur even if the contact and the memory function body have come into contact therebetween. Further, in the case where the portion of the memory function body for retaining electric charge is made of a substance, such as nitride, that retains the electric charge into a trap within the substance, even if the contact and the nitride or the like are short-circuited, the stored electric charge is not dissipated entirely, so that short-circuits do not occur even if the contact and the memory function body have come into contact therebetween.

Therefore, for the memory function bodies described in FIGS. 15A to 15F as well as the memory function bodies in which the charge retention part is made of nitride or the like, the only requirement is to provide a margin such that the contact is kept from short-circuiting with the gate electrode, thus facilitating scale-down.

Next, explanation is given on FIG. 14C in each part thereof.

The structure of FIG. 14C is different from FIGS. 14A and 14B in that a third coating film 827 is formed in advance on top of the gate electrode 803. As working effects by this feature, in the structure of FIG. 14C, even if the contact stretches onto the gate electrode 803, there occurs no short-circuits with the gate electrode 803, where the design margin may be a minimum and the scale-down can be achieved most simply. In terms of this point, this structure has the same working effects as those of the structure shown in the ninth embodiment.

More specifically, as far as the problem of short-circuits among contacts is eliminated, the contact 825 may be allowed to be shifted within a range over which electrical connection with the source/drain diffusion region 813 can be maintained, as shown in FIG. 14C. However, this is limited to the cases of the memory function bodies shown in FIGS. 15A to 15J, in which the memory function body may be in contact with the contact, and cases where the portion of the memory function body for retaining electric charge is made of a substance, such as nitride, that retains the electric charge into a trap within the substance.

Therefore, in the cases of the memory function bodies shown in FIGS. 15A to 15F and the memory function body 811 in which the charge retention part is made of nitride or the like, the only requirement is that electrical connection of the contact 825 with the source/drain diffusion region 813 be ensured. As a consequence of this, scale-down is facilitated.

Fourteenth Embodiment

A semiconductor storage device of a fourteenth embodiment of the present invention is explained with reference to FIG. 16.

This fourteenth embodiment shows an aspect of the construction of a semiconductor storage device which is so structured that memory function bodies are provided beside the gate electrode in FIG. 8 of the sixth embodiment or in FIGS. 13A to 13G of the eleventh embodiment. That is, here is shown an embodiment of the semiconductor storage device composed of a gate stack, memory function bodies located on opposite sides of the gate stack, a semiconductor substrate, and the like, which is the portion covered with the coating film in FIG. 8 of the sixth embodiment and in the eighth embodiment.

This fourteenth embodiment through a later-described twentieth embodiment are described in detail about the construction of the memory function bodies or the like, while the structure and effects of the coating film and the like are neither explained nor shown in the figures. However, it should be construed that structure components, such as the coating film, that are not particularly referred to in these embodiments are those complying with the above-mentioned embodiments.

The semiconductor storage device of this fourteenth embodiment has the following working effects in addition to the effects of the semiconductor storage device shown in FIG. 8 of the sixth embodiment or in FIGS. 13A to 13G of the eleventh embodiment.

Figure 16:
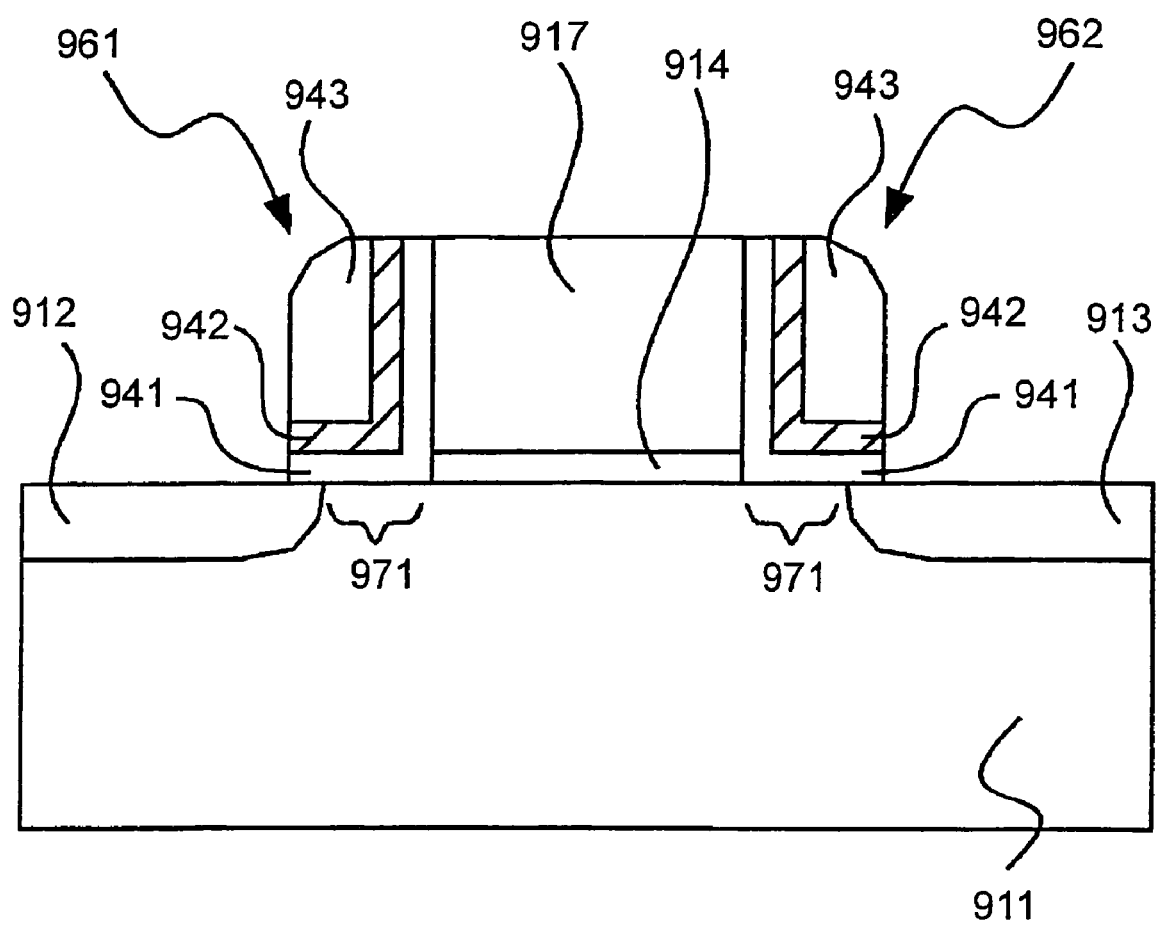
FIG. 16 is a schematic cross sectional view showing a structure of a semiconductor storage device in a fourteenth embodiment of the present invention.

The semiconductor storage device of this fourteenth embodiment is so constructed that, as shown in FIG. 16, each of memory function bodies 961, 962 is made up of a region where electric charge is retained (a region for storing electric charge, which may be a film having the function of retaining electric charge), and a region that makes electric charge unlikely to dissipate (which may be a film having the function of making electric charge less unlikely to dissipate). An example of the structure in this embodiment is an ONO structure, as shown in FIGS. 13A to 13D. That is, silicon nitride 942 as an example of the charge retention part is sandwiched between silicon oxide 941 as an example of the first insulator, and silicon oxide 943 as an example of the side-wall insulator, thus constituting the memory function bodies 961, 962. In this case, the silicon nitride fills the role as a charge retention part having the function of retaining electric charge. Also, the silicon oxide 941, 943 fills the role as the anti-dissipation dielectric having the function of making it unlikely that electric charge stored in the silicon nitride may dissipate.

Further, the regions for storing electric charge (silicon nitride 942) in the memory function bodies 961, 962 overlap with the source/drain diffusion regions 912, 913, respectively. It is noted here that the term "overlap" means that at least part of the region for retaining electric charge (silicon nitride 942) is present on at least partial regions of the diffusion regions 912, 913. In addition, reference numeral 911 denotes a semiconductor substrate, 914 denotes a gate insulator, 917 denotes a gate electrode, and 971 denotes offset region (between gate electrode and diffusion regions). Although not shown, a topmost portion of the semiconductor substrate 911 under the gate insulator 914 becomes a channel region.

Working effects by the overlapping between the silicon nitride 942, which is the region for retaining electric charge in the memory function bodies 961, 962, and the source/drain diffusion regions 912, 913 are explained below.

Figure 17:
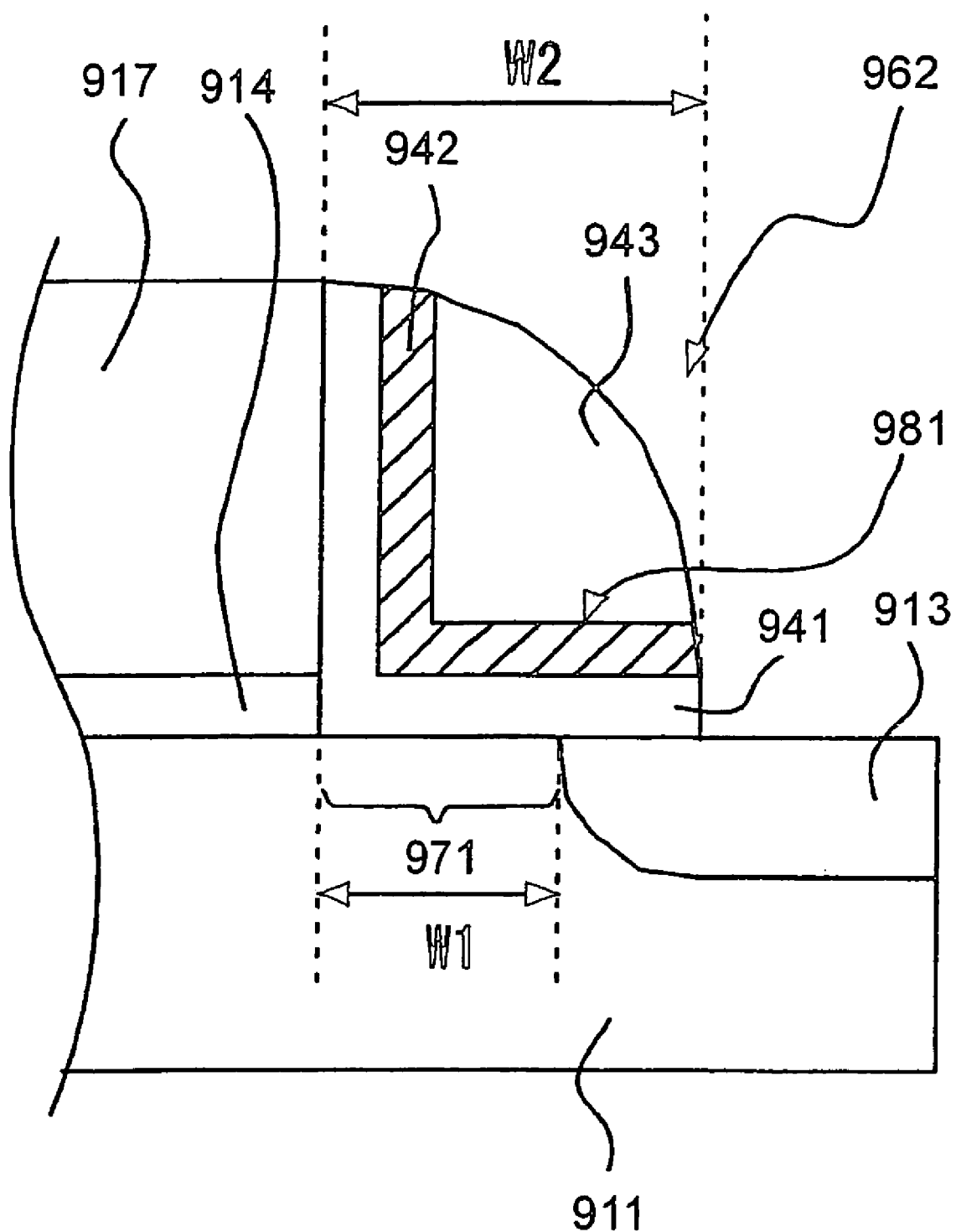
FIG. 17 is an enlarged view showing the peripheral portion of a right-side memory function body of FIG. 16.

FIG. 17 is an enlarged view showing the peripheral portion of the right-side memory function body 962 of FIG. 16. Reference character W1 indicates an offset amount of an offset region 971 between the gate electrode 917 and the diffusion region 913. Also, reference character W2 indicates a width of the memory function body 962 in a cross section of the gate electrode 917 along the gate length direction, where the width of the memory function body 962 is defined as W2 because one end of the silicon nitride 942 farther from the gate electrode 917 out of the memory function body 962 is coincident with one end of the memory function body 962 farther from the gate electrode 917. Reference character W2−W1 shows an overlap amount between the memory function body 962 and the diffusion region 913. The overlap amount between the memory function body 962 and the diffusion region 913 is represented by W2−W1. It is of particular importance that, with respect to the memory function body 962, a part of the memory function body 962 formed of the silicon nitride 942 overlaps with the diffusion region 913, i.e., that a relationship of W2>W1 is satisfied.

Figure 18:
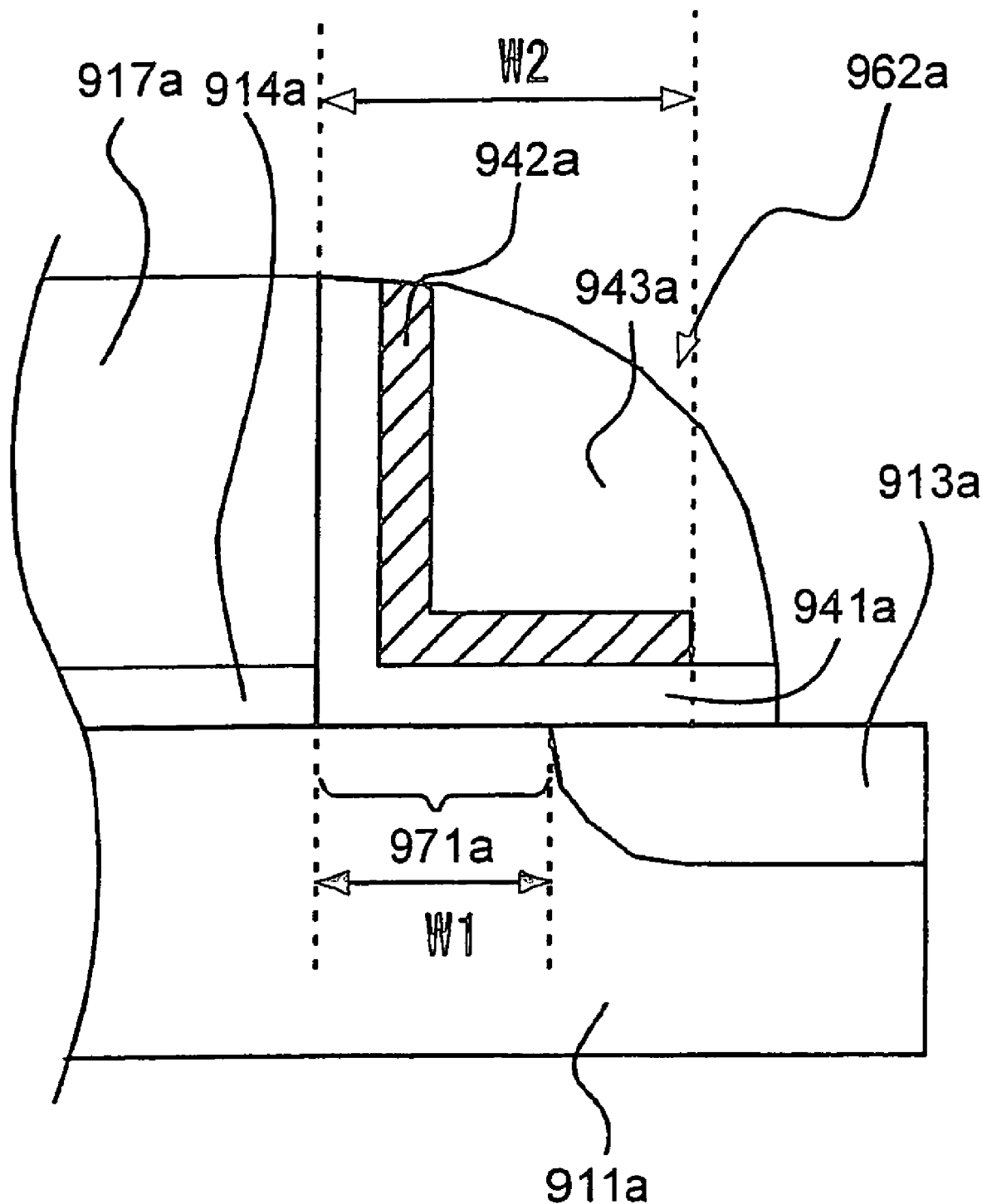
FIG. 18 is an enlarged view showing the peripheral portion of the memory function body in the semiconductor storage device in the case where an end portion of a silicon nitride on the side away from a gate electrode is not aligned with an end portion of the memory function body on the side away from the gate electrode.

In addition, in the case where one end of a silicon nitride 942a farther from the gate electrode 917 out of the memory function body 962a is not coincident with one end of the memory function body 962a farther from the gate electrode 917 as shown in FIG. 18, W2 may appropriately be defined as ranging from one end of the gate electrode 917 to the end of the silicon nitride 942a farther from the gate electrode. In addition, in FIG. 18, reference numeral 911a denotes a semiconductor substrate, 913a denotes a source/drain diffusion region, 914a denotes a gate insulator, 943a denotes silicon oxide, and 971a denotes an offset region.

Figure 19:
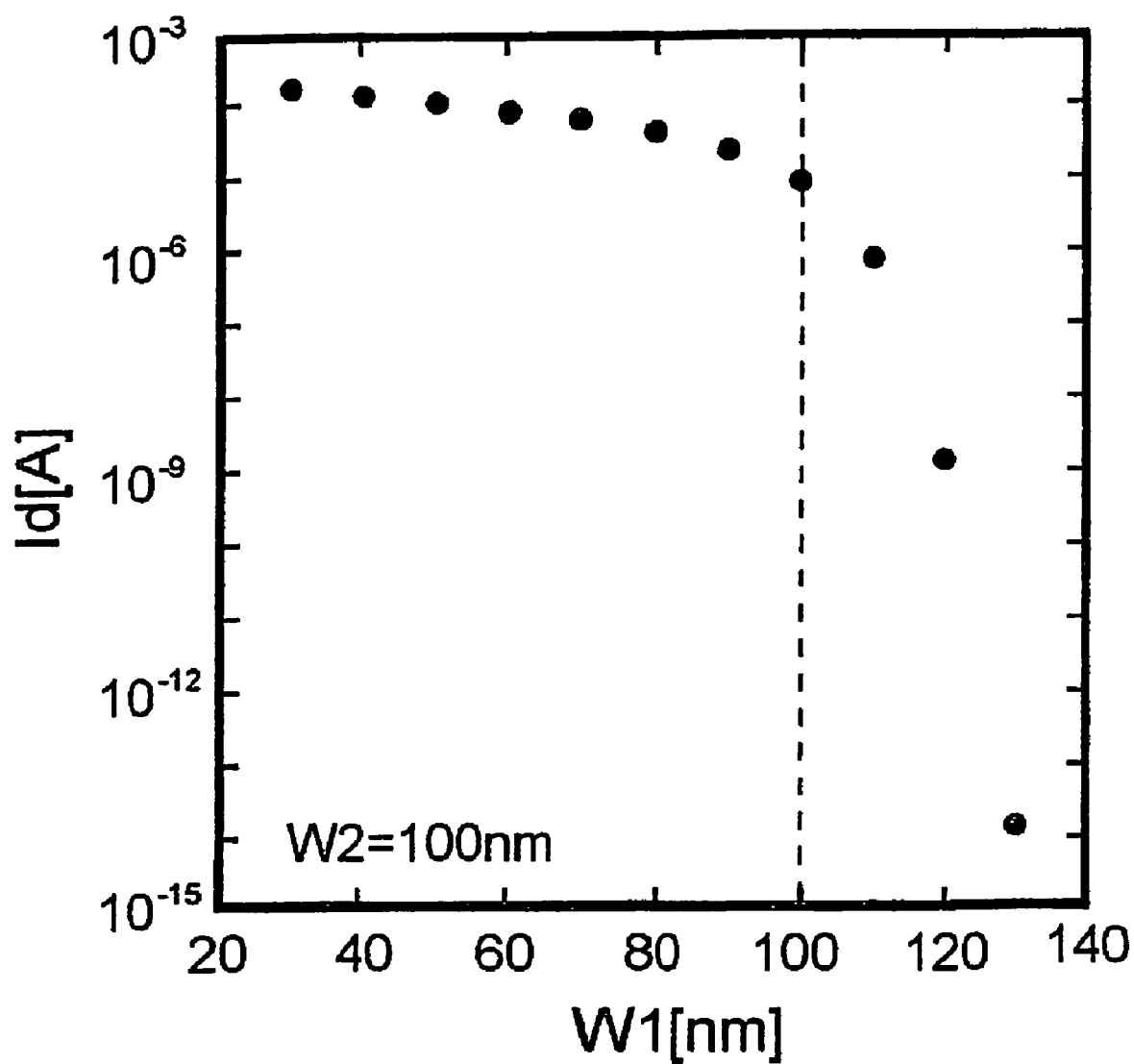
FIG. 19 is a view showing drain current values when an offset amount is changed with a width of a memory function body in the semiconductor storage device being fixed.

FIG. 19 shows drain current Id resulting when the offset amount W1 is changed with the width W2 of the memory function body 962 fixed at 100 nm in the semiconductor storage device of FIG. 17. In this case, the drain current was determined by device simulation on the assumption that the memory function body 962 was in an erase state (with holes stored) and that the diffusion regions 912, 913 were taken as a source electrode and a drain electrode, respectively.

As apparent from FIG. 19, the drain current abruptly decreases with W1 above 100 nm (i.e., the silicon nitride 942 and the diffusion region 913 do not overlap each other). Since the drain current value is generally proportional to the read operation speed, the memory performance abruptly deteriorates with W1 above 100 nm. On the other hand, the drain current gently decreases in the range over which the silicon nitride 942 and the diffusion region 913 overlapping each other. Accordingly, in consideration of variations in mass production, it would be virtually hard to obtain the memory function if at least part of the silicon nitride 942, which is a film having the function of retaining electric charge, and the source/drain diffusion region do not overlap each other.

On the basis of the results of the above-described device simulation, a memory cell array was fabricated with W2 fixed at 100 nm and with W1 set at 60 nm and 100 nm as design values. the silicon nitride 942 and the diffusion regions 912, 913 overlap each other by 40 nm as a design value with W1 at 60 nm, and do not overlap in design value with W1 at 100 nm. As a result of measuring the read time of these memory cell arrays, in comparison of worst cases with variations taken into consideration, the case where W1 was 60 nm as a design value was 100 times faster in read access time. Whereas the read access time is preferably not more than 100 nanoseconds per bit for practical use, it was found that this condition cannot be achieved with W1=W2. It was also found preferable that W2−W1>10 nm, with manufacture variations as well take into consideration.

In the semiconductor storage device shown in FIG. 17, for read of information stored in the memory function body 961 (region 981), it is preferable that, with the diffusion region 912 assigned to a source electrode and the diffusion region to the drain region, a pinchoff point is formed on one side within the channel region closer to the drain region. That is, when the information stored in one of two memory function bodies, the pinchoff point is preferably formed at a region within the channel region and closer to the other memory function body. As a result of this, storage information of the memory function body 961 can be detected with high sensitivity regardless of the storage state of the memory function body 962, which provides a factor that enables 2-bit operation.

On the other hand, when information is stored only in one of the two memory function bodies or when the two memory function bodies are used so as to be brought into the same storage state, it is not necessarily required to form a pinchoff point for read operation.

Although not shown in FIG. 16, it is preferable to form a well region (p-type well for N-channel device elements) on the surface of the semiconductor substrate 911. Forming the well region makes it more easily achievable to maintain the impurity concentration of the channel region optimized for memory operations (rewrite operation and read operation) and control the other electrical characteristics (withstand voltage, junction capacity, short-channel effect).

Also, the memory function body preferably contains a charge retention film serving as the charge retention part having the function of retaining electric charge, as well as an insulating film from the viewpoint of improving the memory retention characteristics. In this fourteenth embodiment, silicon nitride 942 having an energy level for trapping electric charge is used as the charge retention film, and silicon oxide 941, 943 serving for prevention of dissipation of electric charge retained in the charge retention film is used as the insulating film. By the memory function bodies containing the charge retention film and the insulating film, dissipation of electric charge can be prevented and the retention characteristics can be improved. Further, the volume of the charge retention film can be reduced to a moderate extent, compared with the case where the memory function body is composed only of a charge retention film. By moderately reducing the volume of the charge retention film, move of electric charge within the charge retention film can be restricted, so that occurrence of characteristic changes due to charge move during the storage retention can be suppressed.

Further, the memory function body preferably contains a charge retention film placed generally parallel to the surface of the gate insulator. In other words, the upper surface of the charge retention film in the memory function body is preferably placed so as to be positioned equidistant from the upper surface of the gate insulator.

Figure 20:
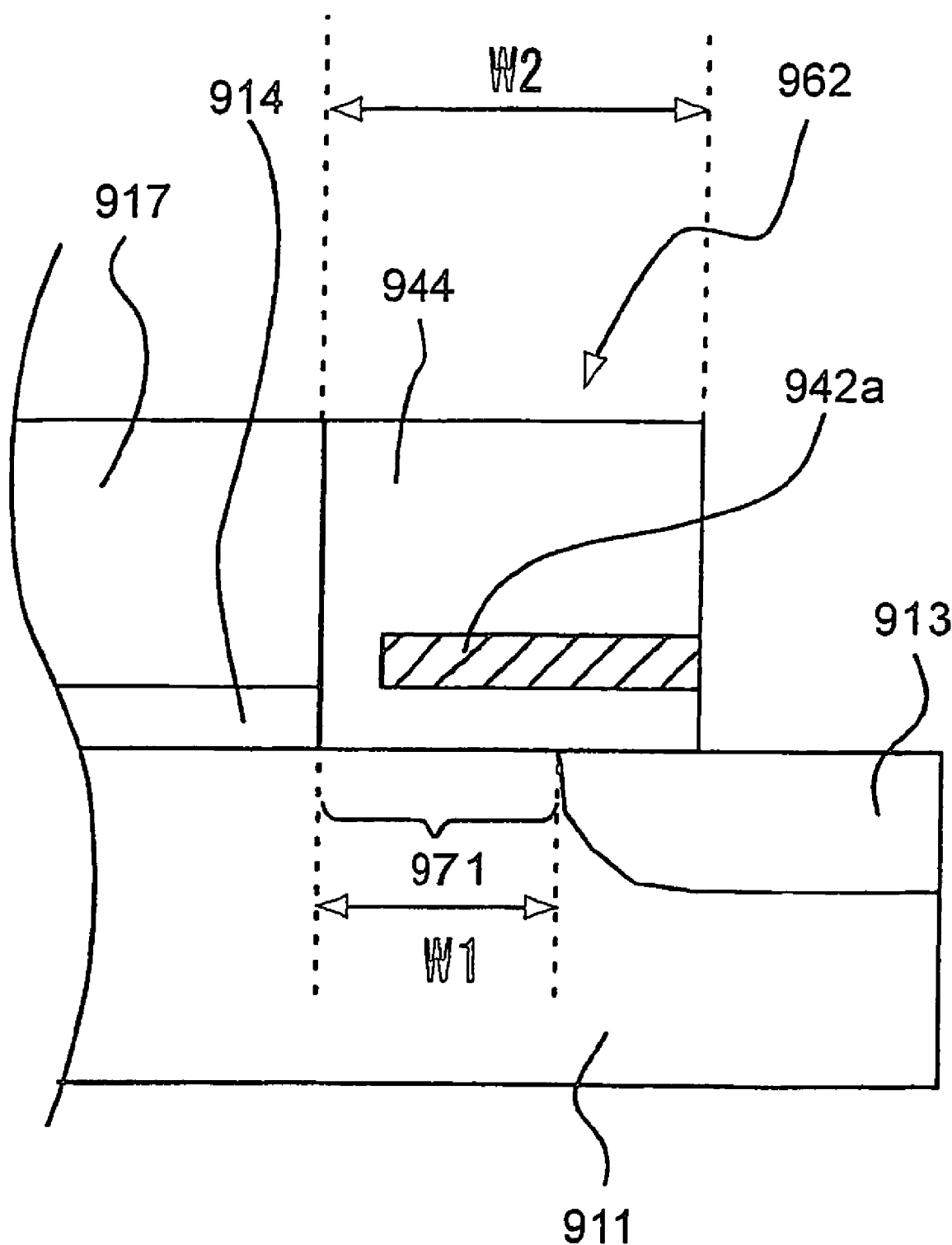
FIG. 20 is an enlarged view showing the peripheral portion of the memory function body in the semiconductor storage device in which the memory function body is disposed so that the upper surface of a charge retention film is positioned in equal distance from the upper surface of a gate insulator.

More concretely, as shown in FIG. 20, the silicon nitride 942a as a charge retention part of the memory function body 962 formed beside the gate electrode 917 has a surface generally parallel to the surface of the gate insulator 914. In other words, the silicon nitride 942a is preferably formed at a uniform height from a height corresponding to the surface of the gate insulator 914. By virtue of the arrangement that the silicon nitride 942a generally parallel to the surface of the gate insulator 914 is provided within the memory function body 962, the likelihood that an inversion layer is formed at the offset region 971 can be effectively controlled depending on the amount of electric charge retained in the silicon nitride 942a, and therefore the memory effect can be increased. Further, by virtue of the arrangement that the silicon nitride 942a is set generally parallel to the surface of the gate insulator 914, changes in the memory effect can be maintained relatively small even with the offset amount (W1) varied, so that variations in the memory effect can be suppressed. Still, move of electric charge upward of the silicon nitride 942a is suppressed, so that occurrence of characteristic changes due to the charge move during the storage retention can be suppressed.

Furthermore, the memory function body 962 preferably contains an insulating film (e.g., a portion of silicon oxide 944 (W2)) located on the offset region 971) that isolates the silicon nitride 942*a*, which is generally parallel to the surface of the gate insulator 914, and the channel region (or well region) from each other. By this insulating film, dissipation of electric charge retained in the charge retention film is suppressed, and a semiconductor storage device of even better retention characteristics can be obtained.

By controlling the film thickness of the silicon nitride 942*a* and moreover controlling the film thickness of the insulating film under the silicon nitride 942*a* (a portion of the silicon oxide 944 located on the offset region 971) to a constant film thickness, it becomes possible that the distance from the surface of the semiconductor substrate 911 to the electric charge stored in the charge retention film is maintained generally constant. That is, the distance from the surface of the semiconductor substrate 911 to the electric charge stored in the charge retention film can be controlled to within a range from a minimum film thickness value of the insulating film under the silicon nitride 942*a* to a sum of a maximum film thickness value of the insulating film under the silicon nitride 942*a* and a maximum film thickness value of the silicon nitride 942*a*. As a result of this, it becomes possible to generally control the density of lines of electric force generated by electric charge stored in the silicon nitride 942*a*, so that variations in the memory effect level of the semiconductor storage device can be reduced to very small ones.

Fifteenth Embodiment

Figure 21:
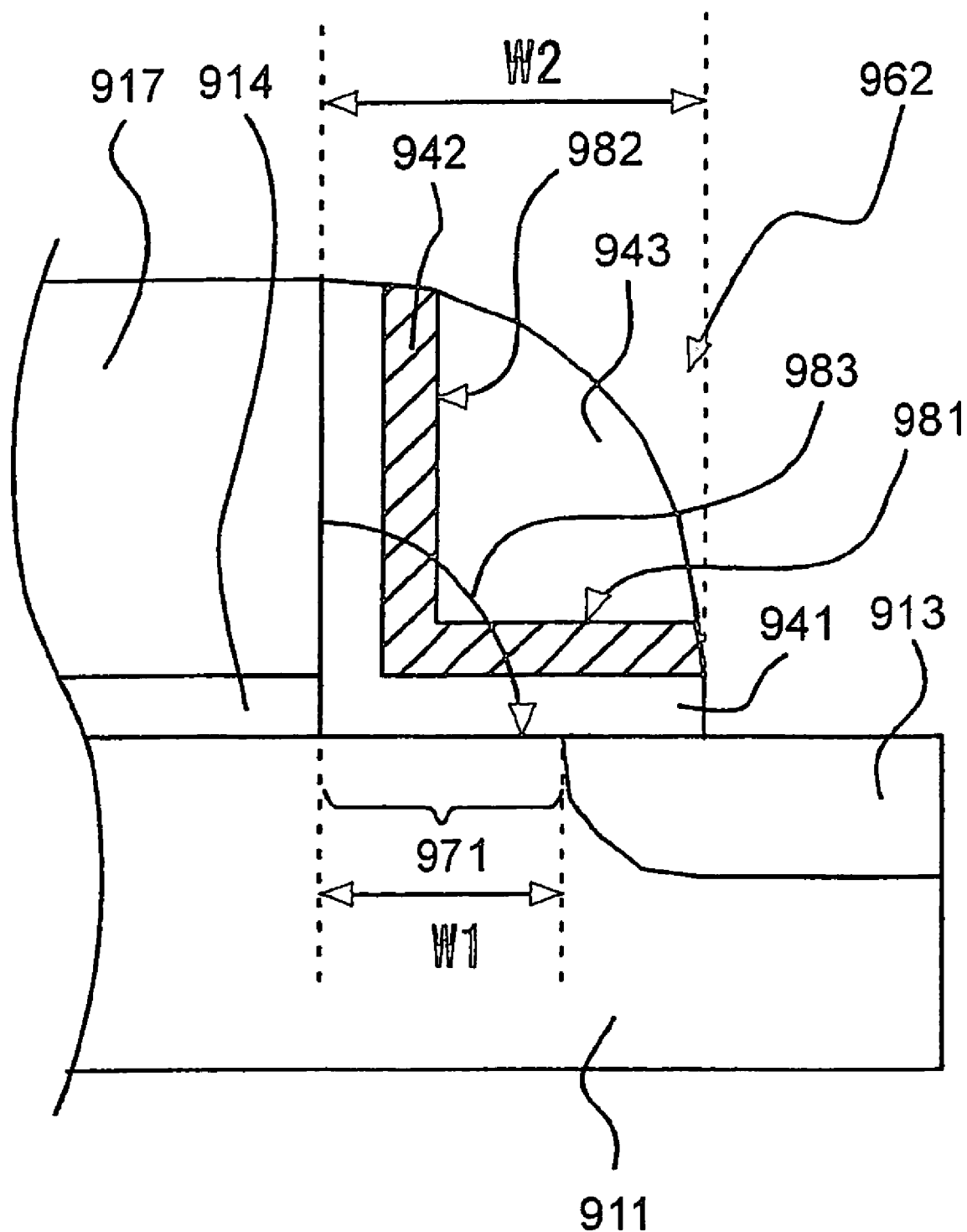
FIG. 21 is an enlarged view showing the peripheral portion of a memory-function body in a semiconductor storage device in a fifteenth embodiment of the present invention.

FIG. 21 is an enlarged view of the peripheral portion of a memory function body in a semiconductor storage device of a fifteenth embodiment of the present invention, where the same constituent members as those of FIG. 17 of the fifteenth embodiment are designated by the same reference numerals. In the semiconductor storage device of this fifteenth embodiment of the invention, as shown in FIG. 21, the silicon nitride 942 of the memory function body 962 is generally uniform in film thickness, disposed generally parallel to the surface of the gate insulator 914 (arrow 981), and further disposed generally parallel to the side surface of the gate electrode 917 (arrow 982).

When a positive voltage is applied to the gate electrode 917, lines of electric force in the memory function body 962 as indicated by arrow 983 pass through the silicon nitride 942 twice (portions indicated by arrows 982 and 981). It is noted that the direction of lines of electric force are reversed when a negative voltage is applied to the gate electrode 917. In this case, the relative dielectric constant of the silicon nitride 942 is about 6, and the relative dielectric constant of the silicon oxide 941, 943 is about 4. Accordingly, compared with the case where only the charge retention film indicated by arrow 981 is present, the effective relative dielectric constant of the memory function body 962 in the direction of the lines of electric force (arrow 983) is increased, so that potential differences across both ends of the lines of electric force can be reduced. That is, most part of the voltage applied to the gate electrode 917 is used to intensify the electric field in the offset region 971.

The reason that electric charge is injected into the silicon nitride 942 in rewrite operation is that generated electric charge is pulled in by the electric field in the offset region 971. Therefore, by the provision of the charge retention film indicated by arrow 982, electric charge to be injected into the memory function body 962 in rewrite operation is increased, so that the rewrite speed is increased.

In the case where the silicon oxide 943 part is replaced by silicon nitride, i.e., where the charge retention film is non-uniform with respect to the height corresponding to the surface of the gate insulator 914, move of electric charge upward of the silicon nitride becomes noticeable, causing the retention characteristics to be deteriorated.

The charge retention film is, more preferably, formed from a high dielectric such as hafnium oxide, which has a very large relative dielectric constant, in place of silicon nitride.

Further, the memory function body 962 preferably further includes an insulating film (a portion of the silicon oxide 941 located on the offset region 971) that isolates the charge retention film, which is generally parallel to the surface of the gate insulator 914, and the channel region (or well region) from each other. By this insulating film, dissipation of electric charge retained in the charge retention film is suppressed, and the retention characteristics can be further improved.

Also, preferably, the memory function body 962 further includes an insulating film (a portion of the silicon oxide 941 in contact with the gate electrode 917) that isolates the gate electrode 917 and the charge retention film extending generally parallel to the side surface of the gate electrode 917 from each other. By this insulating film, changes in electrical characteristics due to injection of electric charge from the gate electrode 917 into the charge retention film can be prevented, so that the reliability of the semiconductor storage device can be improved.

Furthermore, preferably, the film thickness of the insulating film under the silicon nitride 942 (a portion of the silicon oxide 941 located on the offset region 971) is controlled so as to be constant, and moreover the film thickness of the insulating film to be located on the side surface of the gate electrode 917 (a portion of the silicon oxide 941 in contact with the gate electrode 917) is controlled so as to be constant. As a result of this, it becomes possible to generally control the density of lines of electric force generated by electric charge stored in the silicon nitride 942, and moreover leakage of electric charge can be prevented.

Sixteenth Embodiment

Figure 22:
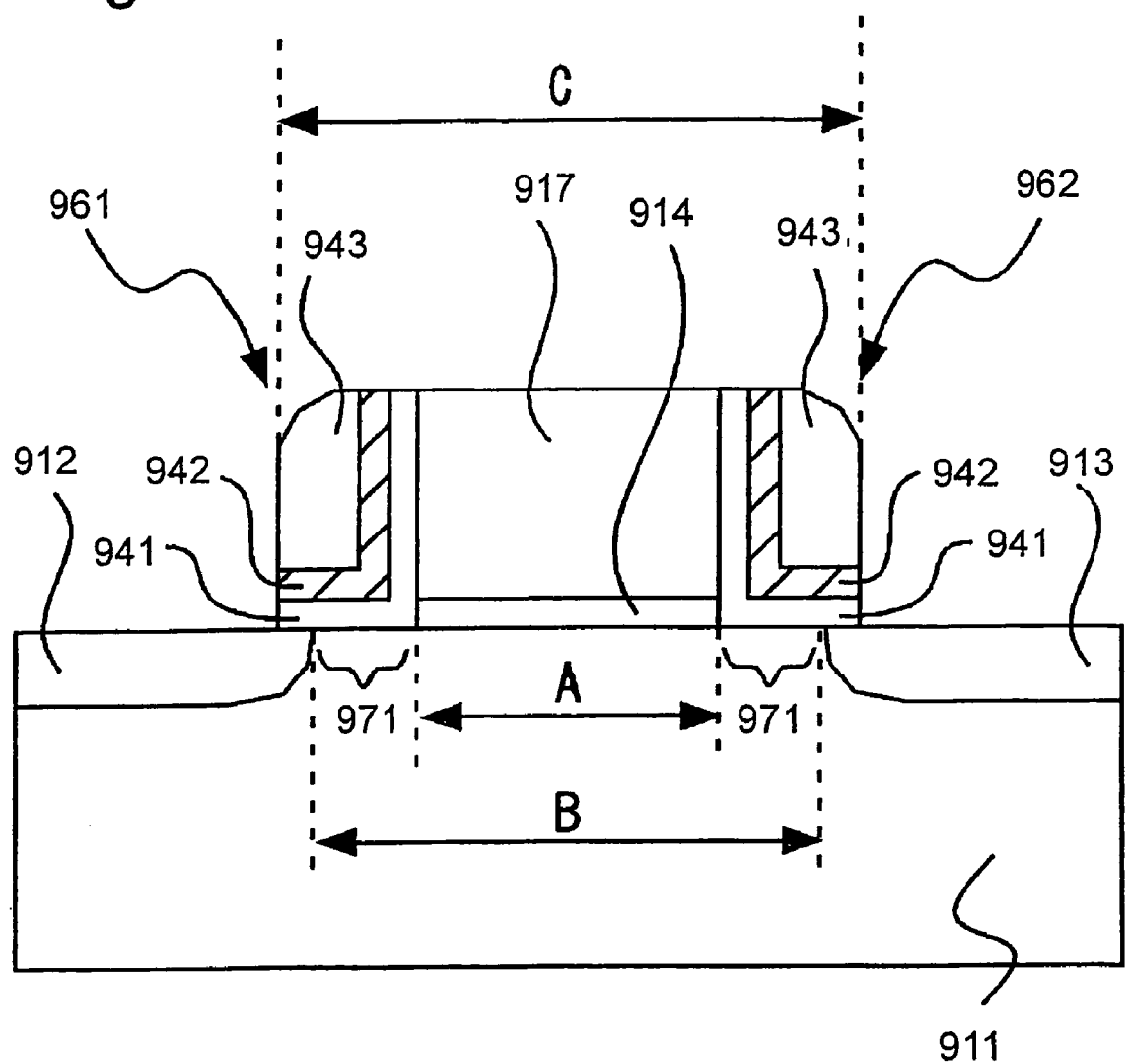
FIG. 22 is a schematic cross sectional view showing a structure of a semiconductor storage device in a sixteenth embodiment of the present invention.

FIG. 22 is a schematic cross sectional view outlining the structure of a semiconductor storage device of a sixteenth embodiment of the present invention, where the same constituent members as those of FIG. 16 of the fourteenth embodiment are designated by the same reference numerals. The semiconductor storage device of this sixteenth embodiment of the invention relates to optimization of distances among a gate electrode, memory function bodies and source/drain diffusion regions.

As shown in FIG. 22, reference character A denotes a gate electrode length in a cross section along the gate length direction, B denotes a distance between the source/drain diffusion regions (channel length), and C denotes a distance from an end of one memory function body to an end of the other memory function body, i.e., a distance from an end (farther from the gate electrode) of a film having the function of retaining electric charge in one memory function body to an end (farther from the gate electrode) of a film having the function of retaining electric charge in the other memory function body in the cross section.

First, preferably, it holds that B<C. Offset regions 971 are present between a portion of the channel region under the gate electrode 917 and the source/drain diffusion regions 912, 913. Because of the relationship of B<C, easiness of inversion is effectively varied over the entire offset regions 971 by the electric charge stored in the memory function bodies 961, 962 (silicon nitride 942). Accordingly, the memory effect is increased and, in particular, higher speed of read operation can be achieved.

Further, when the gate electrode 917 and the source/drain diffusion regions 912, 913 are offset from each other, i.e., when it holds that A<B, the easiness of inversion of the offset region upon application of a voltage to the gate electrode 917 changes depending on the amount of electric charge retained in the memory function bodies 961, 962, so that the memory effect is increased and the short-channel effect can be reduced. However, as far as the memory effect is developed, the offset regions 971 are not necessarily required to be present. Even without the offset regions 971, if the source/drain diffusion regions 912, 913 are sufficiently lightly doped, the memory effect can be developed in the memory function bodies 961, 962 (silicon nitride 942).

Accordingly, it is most preferable that A<B<C.

Seventeenth Embodiment

Figure 23:
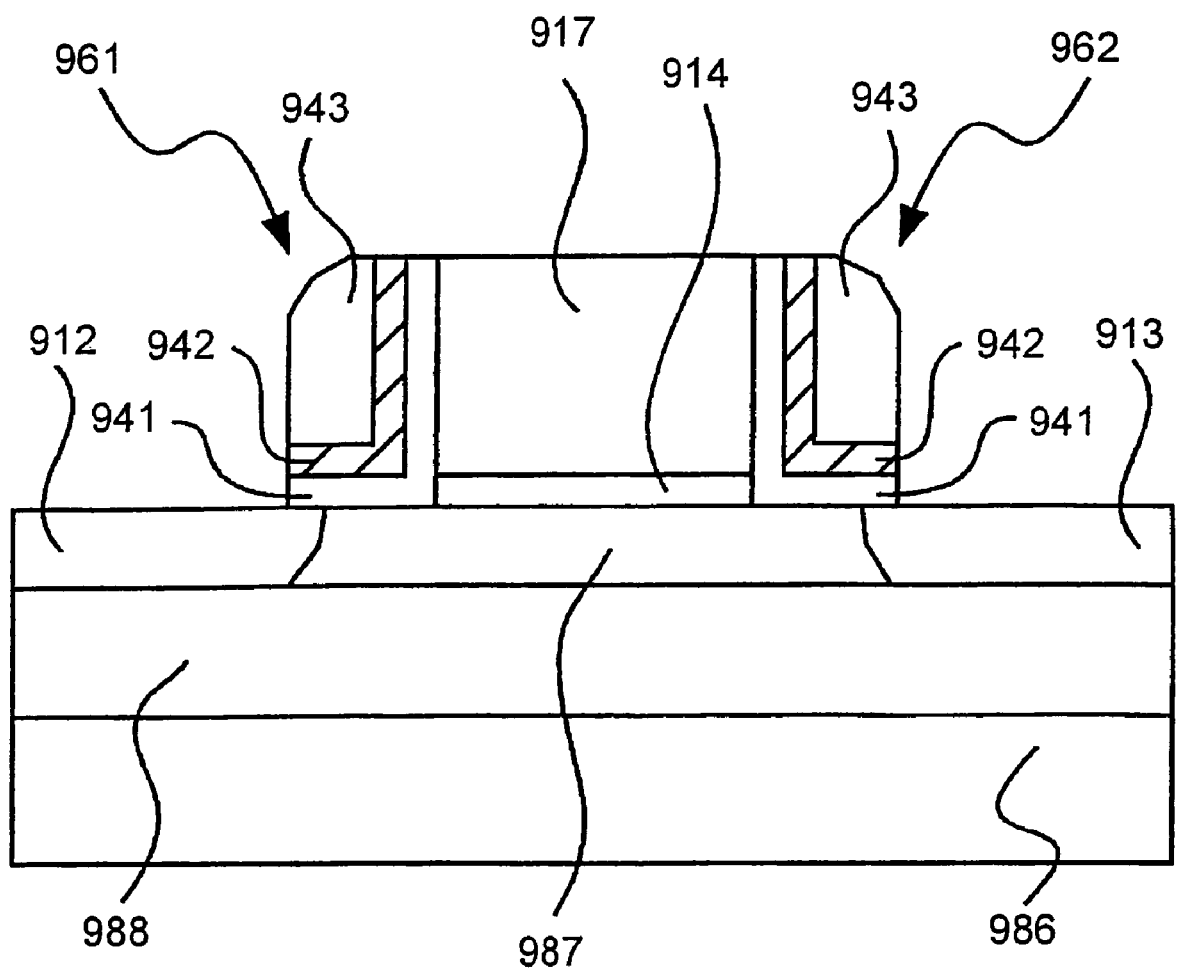
FIG. 23 is a schematic cross sectional view showing a semiconductor storage device in a seventeenth embodiment of the present invention.

A semiconductor storage device of a seventeenth embodiment of the present invention, as shown in FIG. 23, has a construction substantially similar to that of the fourteenth embodiment, except that the semiconductor substrate of the fourteenth embodiment is replaced by an SOI substrate, where the same constituent members are designated by the same reference numerals.

In this semiconductor storage device, buried oxide 988 is formed on the semiconductor substrate 986, and an SOI layer is formed further thereon. Diffusion regions 912, 913 are formed within the SOI layer, and the other region is a body region 987.

With this semiconductor storage device also, the same working effects as those of the semiconductor storage device of the fourteenth embodiment are produced. Further, the junction capacity between the diffusion regions 912, 913 and the body region 987 can be reduced to a large extent, making it possible to achieve higher speeds of device elements and power consumption saving.

Eighteenth Embodiment

Figure 24:
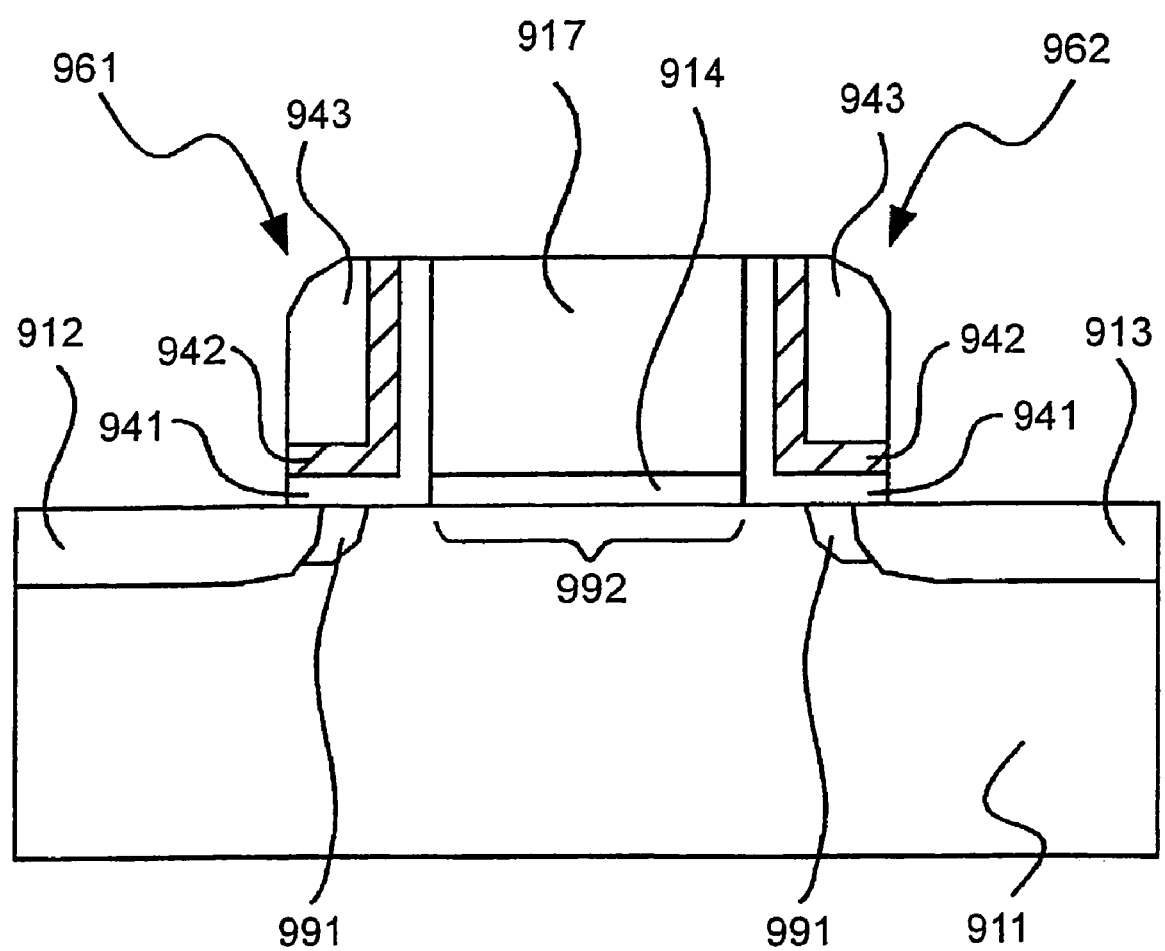
FIG. 24 is a schematic cross sectional view showing a semiconductor storage device in a eighteenth embodiment of the present invention.

A semiconductor storage device of an eighteenth embodiment of the present invention, as shown in FIG. 24, has a construction substantially similar to that of the fourteenth embodiment, except that a p-type heavily doped region 991 is additionally provided in adjacency to the channel side of the n-type source/drain regions 912, 913, where the same constituent members are designated by the same reference numerals.

More specifically, the concentration of an impurity (e.g., boron) that gives the p type in the p-type heavily doped region 991 is higher than the concentration of an impurity that gives the p type in a region 992. The impurity concentration of the p type in the p-type heavily doped region 991 is appropriately about $5 \times 10^{17}$ cm$^{-3}$ to $1 \times 10^{19}$ cm$^{-3}$ as an example. Also, the impurity concentration of the p type of the region 992 may be $5 \times 10^{16}$ cm$^{-3}$ to $1 \times 10^{18}$ cm$^{-3}$.

As shown above, by the provision of the p-type heavily doped region 991, the junctions between the diffusion regions 912, 913 and the semiconductor substrate 911 become abrupt just under the memory function bodies 961, 962. Therefore, hot carriers are more likely to occur in write and erase operations, making it achievable to lower the voltages for write operation and erase operation or to speed up write operation and erase operation. Further, since the impurity concentration of the region 992 is relatively low, the threshold voltage with the memory in an erase state is a low one so that the drain current becomes larger. Therefore, the read speed is enhanced. Thus, a semiconductor storage device having a lower rewrite voltage or higher rewrite speed and a higher read speed can be obtained.

Referring to FIG. 24, when p-type heavily doped regions 991 are provided near the source/drain diffusion regions 912, 913 and below (not just under) the memory function bodies 961, 962, the threshold value as the whole transistor is considerably increased. The degree of this increase is considerably larger than that in the case where the p-type heavily doped regions 991 are located just under the gate electrode 917. This difference becomes even larger when write charge (electrons for N-channel type transistors) is accumulated in the memory function bodies 961, 962. On the other hand, when sufficient erase charge (holes for N-channel type transistors) is accumulated in the memory function bodies 961, 962, the threshold value as the whole transistor decreases to a threshold value that depends on the impurity concentration of the channel region (region 992) below the gate electrode 917. That is, the threshold value in erase operation does not depend on the impurity concentration of the p-type heavily doped regions 991, while the threshold value in write operation is quite largely affected. Therefore, by disposing the p-type heavily doped regions 991 below the memory function bodies 961, 962 and near the source/drain diffusion regions 912, 913, only the threshold value in write operation varies to quite large extents, thus making it possible to remarkably increase the memory effect (difference in threshold value between write and erase operations).

Nineteenth Embodiment

Figure 25:
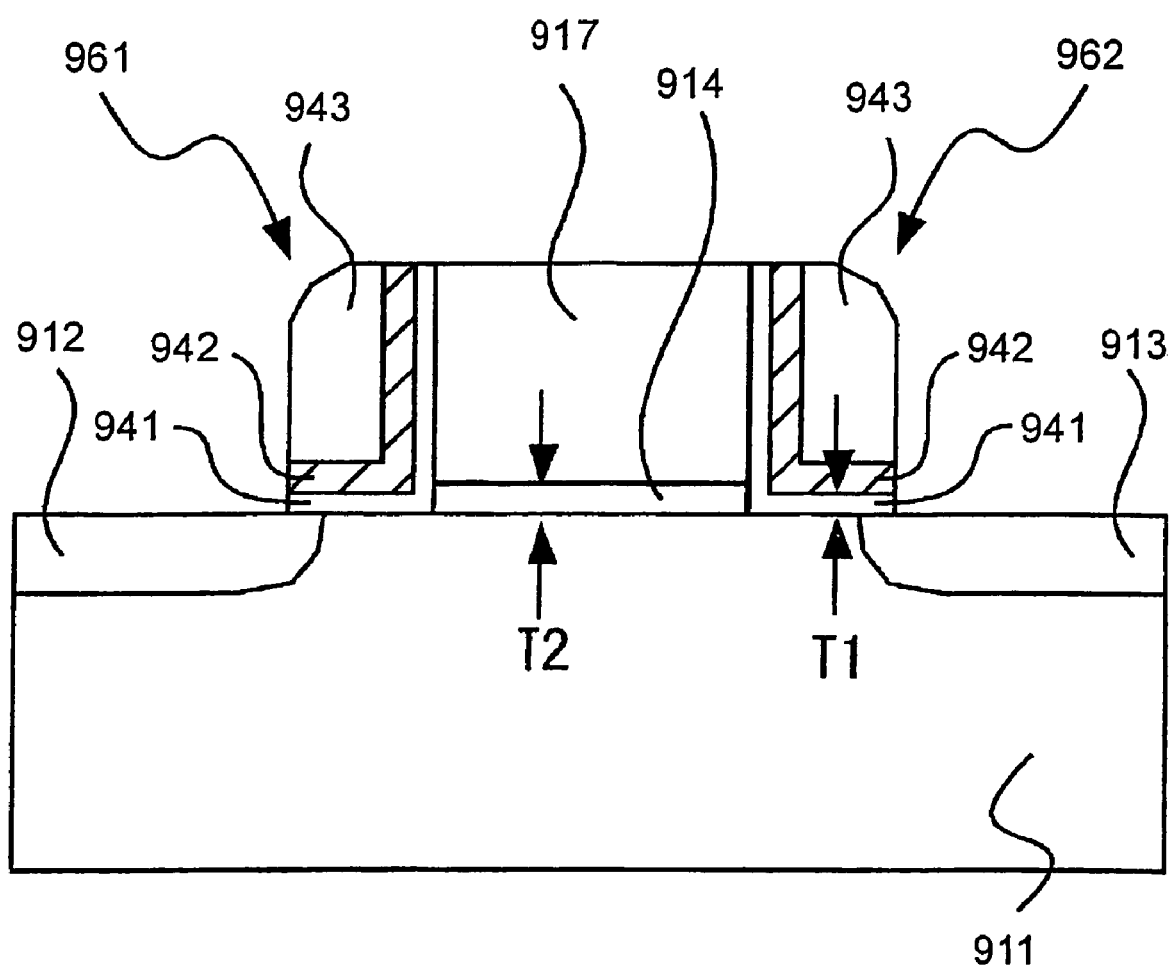
FIG. 25 is a schematic cross sectional view showing a semiconductor storage device in a nineteenth embodiment of the present invention.

A semiconductor storage device of a nineteenth embodiment of the present invention, as shown in FIG. 25, has a construction substantially similar to that of the fourteenth embodiment, except that the thickness (T1) of an insulating film which isolates the charge retention film (silicon nitride 942) and the channel region or well region from each other is thinner than the thickness (T2) of the gate insulator, where the same constituent members are designated by the same reference numerals.

The gate insulator 914 has a lower-limit value of its thickness T2 from the demand for withstand voltage in memory rewrite operation. However, the thickness T1 of the silicon oxide 941 can be made thinner than T2 regardless of the demand for withstand voltage.

In the semiconductor storage device of this nineteenth embodiment, it can be attributed to the following reasons that the degree of freedom of design for T1 is high as described above. In the semiconductor storage device of this embodiment, the insulating film that isolates the charge retention film and the channel region or well region from each other is not sandwiched between the gate electrode 917 and the channel region or well region. Therefore, a high electric field which acts between the gate electrode 917 and the channel region or well region does not act directly on the insulating film that isolates the charge retention film and the channel region or well region from each other, but a relatively weak electric field that expands laterally from the gate electrode 917 acts thereon. Thus, it becomes possible to make T1 thinner than T2 regardless of the demand of withstand voltage for the gate insulator 914. Meanwhile, for example, in EEPROMs typified by flash memory, since the insulating film that isolates the floating gate and the channel region or well region from each other is sandwiched between the gate electrode 917 (control gate) and the channel region or well region, a high electric field derived from the gate electrode 917 acts directly on the insulating film. Therefore, in EEPROMs, the thickness of the insulating film that isolates the floating gate and the channel region or well region from each other is restricted, by which optimization of the functions of the semiconductor storage device is obstructed.

As apparent from the above description, in the semiconductor storage device of this nineteenth embodiment, it is the essential reason for increasing the degree of freedom for T1 that the insulating film that isolates the charge retention film (silicon nitride 942) and the channel region or well region from each other is not sandwiched between the gate electrode 917 and the channel region or well region.

Thinned T1 facilitates the injection of electric charge into the memory function bodies 961, 962, making it possible to lower the voltages for write operation and erase operation or to speed up the write operation and the erase operation. Moreover, since the amount of electric charge induced to the channel region or well region upon storage of electric charge in the silicon nitride 942 is increased, the memory effect can be increased.

The lines of electric force in the memory function bodies 961, 962 include those which are so short as not to pass through the silicon nitride 942 as indicated by arrow 983 of FIG. 21. Such short lines of electric force, on which the electric field intensity is relatively large, fulfill a significant role in rewrite operation. Thinned T1 causes the silicon nitride 942 to be moved downward in the figure, so that the lines of electric force indicated by arrow 983 come to pass through the silicon nitride 942. Therefore, the effective relative dielectric constant in the memory function bodies 961, 962 along the lines of electric force (indicated by arrow 983) becomes large, so that the potential differences across both ends of the lines of electric force can be reduced. Thus, most part of the voltage applied to the gate electrode 917 is used to intensify the electric field in the offset region, making the write operation and the erase operation higher in speed.

As apparent from the above description, by setting the relationship of T1<T2, the voltages for write operation and erase operation can be lowered or the speeds of write operation and erase operation can be increased without lowering the withstand voltage performance of the memory, making it feasible to further increase the memory effect.

In addition, preferably, the thickness T1 of the silicon oxide 941 is not less than 0.8 nm, which allows uniformity or film quality by manufacturing process to be maintained at or above a certain level, and which is a limit for keeping the retention characteristics from extreme deteriorations.

Twentieth Embodiment

A semiconductor storage device of a twentieth embodiment of the present invention, as shown in FIG. 26, has a construction substantially similar to that of the fourteenth embodiment, except that the thickness (T1) of the insulating film that isolates the charge retention part (silicon nitride 942) and the channel region or well region from each other is thicker than the thickness (T2) of the gate insulator 914 in the fourteenth embodiment.

The gate insulator 914 has an upper-limit value of its thickness T2 from the demand for short-channel effect prevention of device elements. However, the thickness T1 of the insulating film can be made thicker than T2 regardless of the demand for short-channel effect prevention.

In the semiconductor storage device of this twentieth embodiment, the reason of the above-described high degree of freedom of design for T1 is that, as already described, the insulating film that isolates the charge retention film and the channel region or well region from each other is not sandwiched between the gate electrode 917 and the channel region or well region. Therefore, it becomes feasible to make T1 thicker than T2 regardless of the demand for short-channel effect prevention for the gate insulator 914.

Thickened T1 prevents electric charge retained in the memory function bodies 961, 962 from being dissipated, making it possible to improve the retention characteristics of the memory.

Consequently, by setting the relationship of T1>T2, it becomes possible to improve the retention characteristics without deteriorating the short-channel effect of the memory.

In addition, preferably, the thickness T1 of the silicon oxide 941 as the first insulator is not less than 20 nm in consideration of decay of the rewrite speed.

Twenty-First Embodiment

A semiconductor device of a twenty-first embodiment of the present invention is composed of a memory section equipped with the semiconductor storage device of the present invention, a peripheral circuit section of nonvolatile memory constituted of common MOSFETs (MOS Field Effect Transistors) of normal structure, a logic circuit section of an MPU (micro processing unit) or the like, an SRAM (static RAM) section, and the like (these constitute members will be referred to as logic circuit section and the like).

Figure 27A:
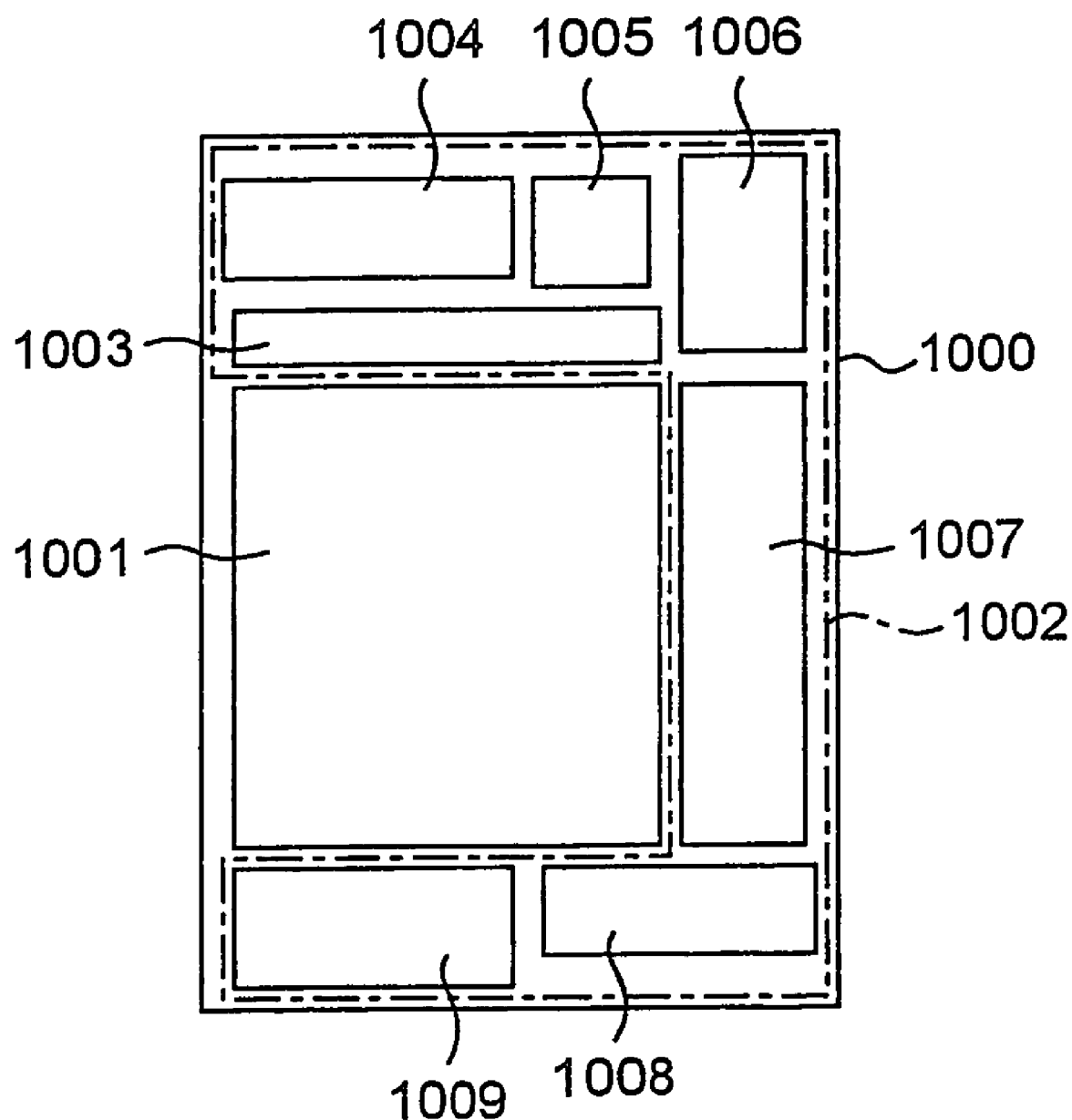
FIGS. 27A and 27B are block diagrams each showing a semiconductor device in a twenty first embodiment of the present invention, respectively.

More specifically, as shown in FIG. 27A, in order that the semiconductor storage device of the present invention is made to function as a memory unit of a RAM (Random Access Memory) or the like, there is a need for disposing a peripheral circuit 1002, which is a logic circuit area, around a memory cell array 1001, which is a memory area in which semiconductor storage devices are arranged in an array on the semiconductor substrate 1000. As the peripheral circuit 1002, logic circuits made up of ordinary MOSFETs such as a decoder 1007, a write/erase circuit 1009, a read circuit 1008, an analog circuit 1006, a control circuit 1005, various types of I/O circuits 1004, and the like constitute a semiconductor device.

Figure 27B:
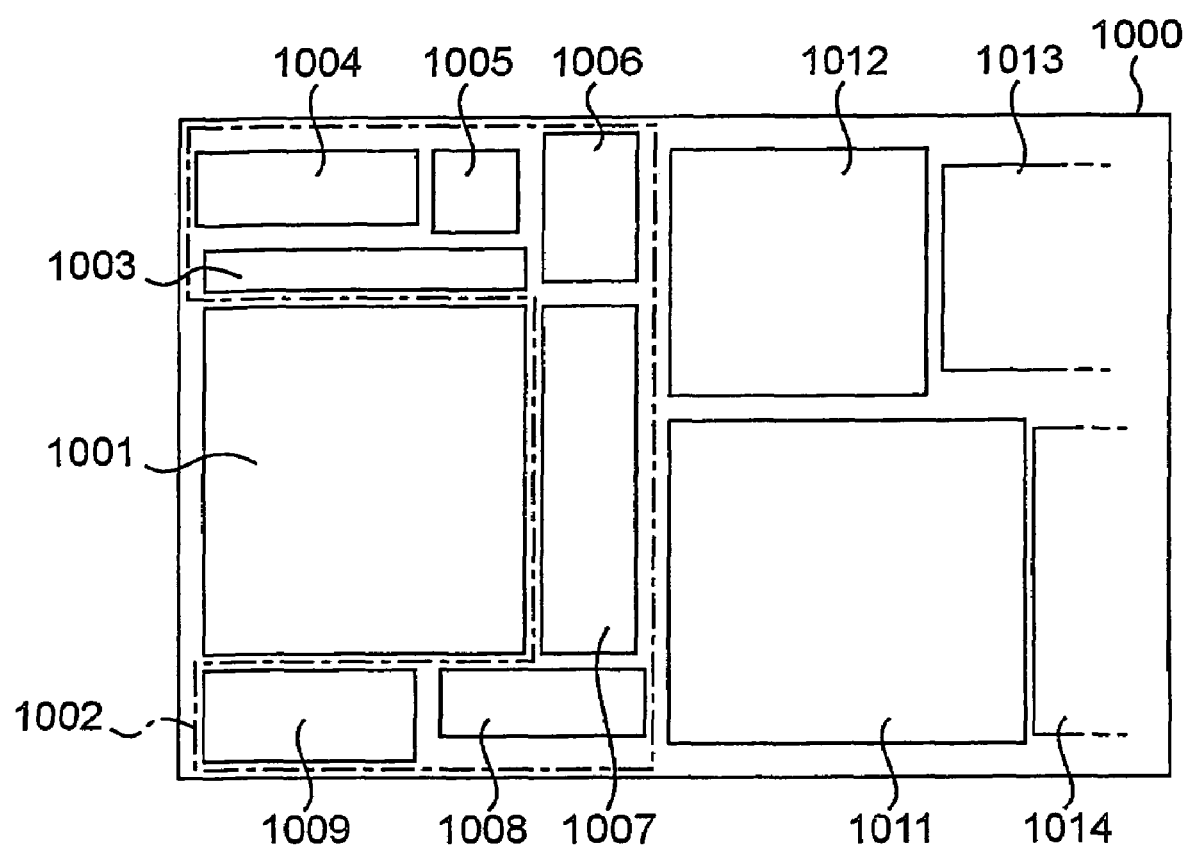

Further, in order that a RAM or other memory unit is made to function as a storage device of an information processing system of personal computers, portable telephones or the like, there is a need for, in addition to the memory unit of the above constitution, including logic circuits made up of common MOSFETs such as an MPU (Micro Processing Unit) 1011, a cache SRAM (static RAM) 1012, a logic circuit 1013, an analog circuit 1014, and the like as shown in FIG. 27B.

The logic circuit section and the like in this embodiment means circuits and units that can be constructed by using logic circuits made up of the aforementioned ordinary, common MOSFETs.

As can be understood from the procedures described in the foregoing first to twentieth embodiments, the procedure for forming this semiconductor storage device is quite compatible with a known, general MOSFET formation process. As apparent from FIGS. 1A to 1C and FIGS. 7A to 7C, the structure of the memory element is close to that of known, general MOSFETs. Such general MOSFETs can be changed into the above-mentioned memory elements only by, for example, in a general MOSFET, forming a coating film after the formation of the gate electrode or forming a coating film having a charge retention part after the formation of a memory function body as the side wall spacer. However, since the offset region is formed, the formation of an LDD region after the formation of the gate stack is not executed.

In this case, even if the side wall spacer of the general MOSFETs constituting the logic circuit section and the like has a function as the memory function body or if a coating film has been formed, the transistor performance is never impaired as far as the coating film or the coating film and side wall spacer have appropriate widths and are operated within such a voltage range that rewrite operation does not occur.

Accordingly, a common coating film or common coating film and side wall spacer can be used for general MOSFETs and the semiconductor storage devices.

Further, composite disposition of general MOSFETs, which constitute the logic circuit section and the like, and the semiconductor storage devices is enabled by forming the LDD structure only for the logic circuit section and the like. For the formation of the LDD structure, impurity implantation for the formation of the LDD region may be done after the gate electrode has been formed and before the material for forming the memory function body is deposited. Therefore, in the process of impurity implantation for the LDD formation, the semiconductor storage devices and the normal-structure MOSFETs constituting the logic circuit section and the like can easily be compositely integrated only by masking the memory area alone with the photoresist. Further, when the SRAM is composed of the semiconductor storage devices and the normal-structure MOSFETs that constitute the logic circuit section and the like, it becomes easily achievable to integrate the semiconductor storage devices, the logic circuits and the SRAM.

In the case where a higher voltage needs to be applied for the semiconductor storage devices than is permitted in the logic circuit section, the SRAM section and the like, only a high-withstand-voltage well-formation mask as well as a high-withstand-voltage gate-insulator formation mask need to be added to the standard MOSFET formation mask. Conventionally, the process of compositely integrating EEPROM (Electrically Erasable Programmable ROM) and logic circuit section on one chip, largely differing from the standard MOSFET process, would involve considerably increased numbers of necessary masks and process man-hours. Therefore, it becomes possible to dramatically reduce the numbers of masks and the process man-hours, as compared with the conventional case where the EEPROM and the circuits of the logic circuit section and the like are compositely integrated. Thus, the cost of the chip on which the common MOSFETs of the logic circuit section and the like and the semiconductor storage devices of the present invention are compositely integrated is reduced. Further, since a high power supply voltage can be fed to the semiconductor storage device, the write/erase speed can be greatly improved. Furthermore, since a low power supply voltage can be fed to the logic circuit section, the SRAM section and the like, deteriorations of transistor characteristics due to breakdown of the gate insulator or the like can be suppressed, allowing the power consumption to be further reduced. Thus, it becomes possible to implement a semiconductor device having a logic circuit section of high reliability and semiconductor storage devices of remarkably fast write/erase speeds both of which are easily compositely integrated on the same substrate.

The manufacturing process for the semiconductor device of this embodiment is explained.

First, with reference to FIGS. 28A to 28F, it is shown that individual devices of the general MOSFETs of the peripheral circuits or the like and the semiconductor storage devices can be simply formed both on an identical substrate at the same time without requiring any complex process. More specifically, it is shown that the general MOSFETs and the semiconductor storage elements can be fabricated simultaneously on one substrate by adding a photolithography step to the semiconductor storage device formation steps described in the third embodiment to thereby provide regions where the LDD diffusion region is formed and other regions where not.

The manufacturing process is explained below in order according to FIGS. 28A-28F. It is noted that in FIGS. 28A-28F, the left side corresponds to a general MOSFET in the peripheral circuit area 4 while the right side corresponds to a semiconductor storage element in a memory area 5.

Figure 28A:
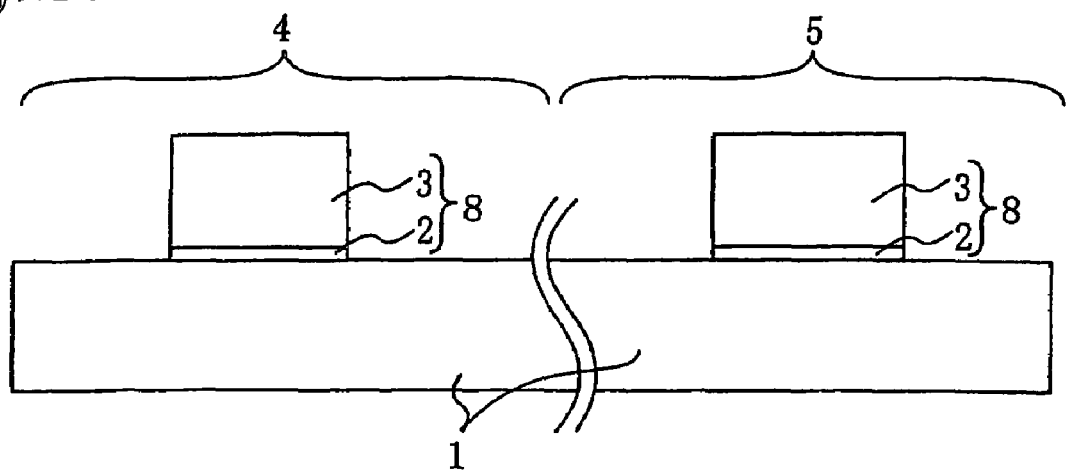
FIGS. 28A to 28F are schematic cross sectional views showing manufacturing steps of the semiconductor device in the fourteenth embodiment of the present invention.

For up to the LDD region formation step, steps similar to those of the third embodiment may be used. That is, as shown in FIG. 28A, the structure described in FIG. 3A in the third embodiment is formed for both the peripheral circuit area 4 and the memory area 5.

Figure 28B:
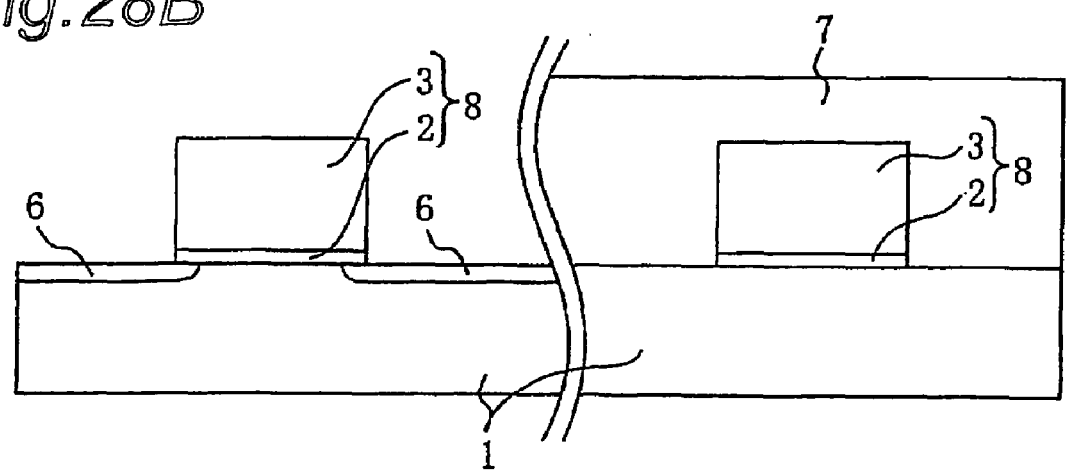

Next, as shown in FIG. 28B, while the memory area 5 is kept covered with photoresist 7 serving as an implantation mask, impurities are ion-implanted, by which an LDD region 6 is formed only in the peripheral circuit area 4. In this process, the LDD region 6 is not formed in the memory area 5. In this case, the LDD region has been formed in the peripheral circuit area 4 where general normal-structure transistors are to be formed. While the LDD region is not formed in the memory area 5. The photoresist is intended to block the implantation, and has only to be one which can be selectively removed and which may be a dielectric film such as silicon nitride. This step only is a special step that differs from the third embodiment, and the following steps afterwards may be the same steps as those of the third embodiment.

Figure 28C:
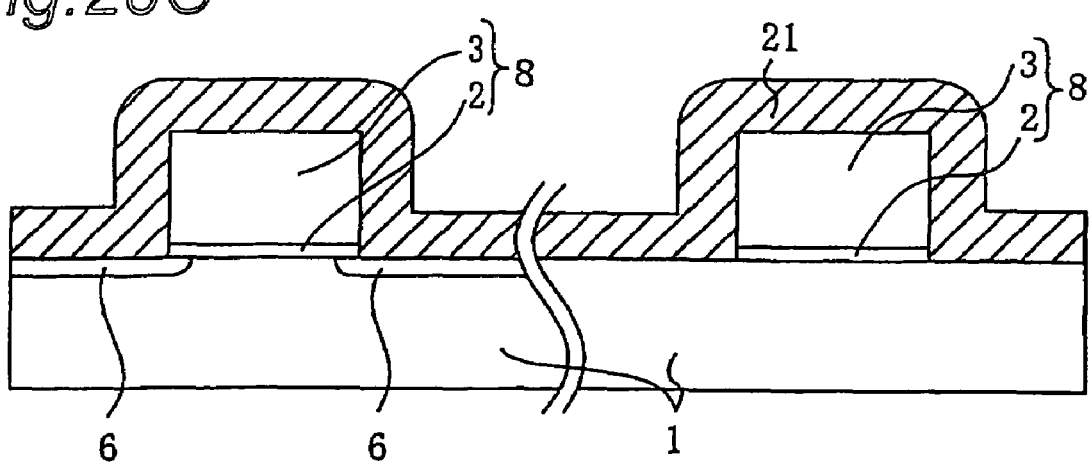

Next, as shown in FIG. 28C, a coating film 21 is formed by using the same step as in FIG. 3B of the third embodiment.

Figure 28D:
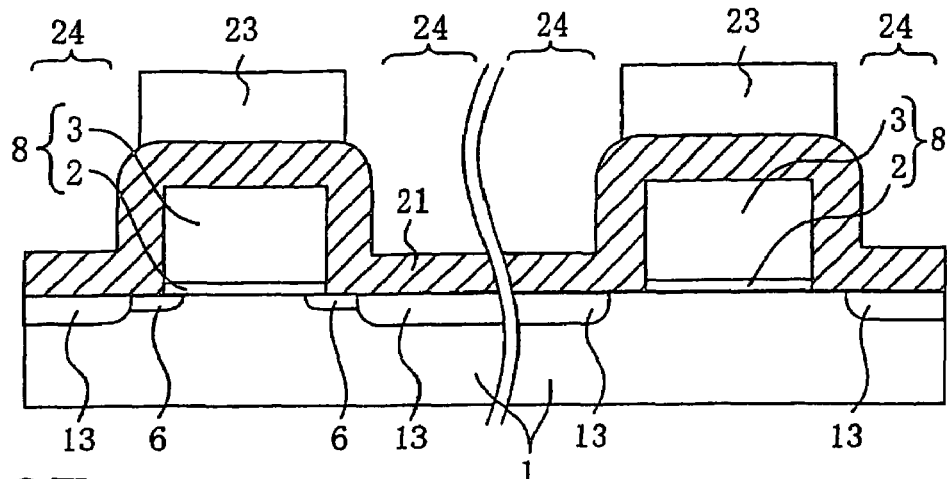

Further, as shown in FIG. 28D, source/drain diffusion regions 13 are formed and an interlayer insulator 23 is formed by using the same step as in FIG. 3C of the third embodiment. After that, a contact hole 24 for forming a contact to connect the source/drain diffusion regions and interconnection lines is formed on the interlayer insulator 23.

Figure 28E:
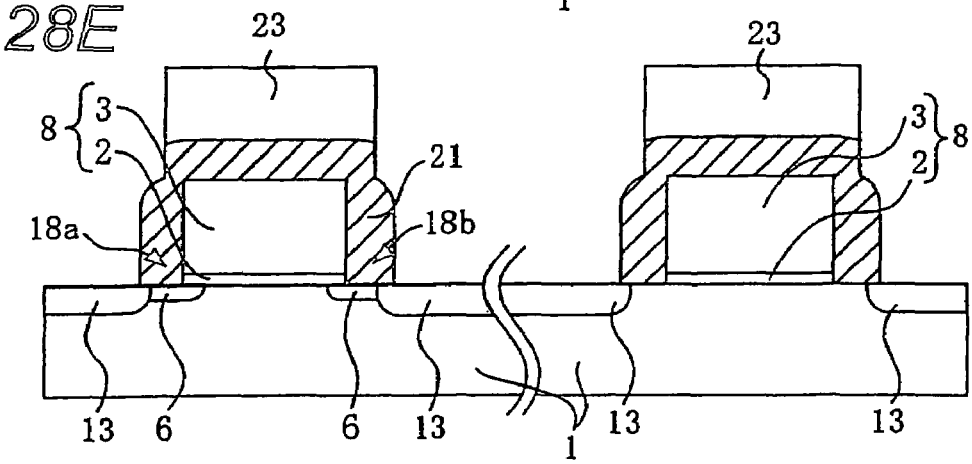

Further, as shown in FIG. 28E, the coating film 21 under the contact hole is removed through anisotropic selective etching by using the same step as in FIG. 3D of the third embodiment.

Figure 28F:
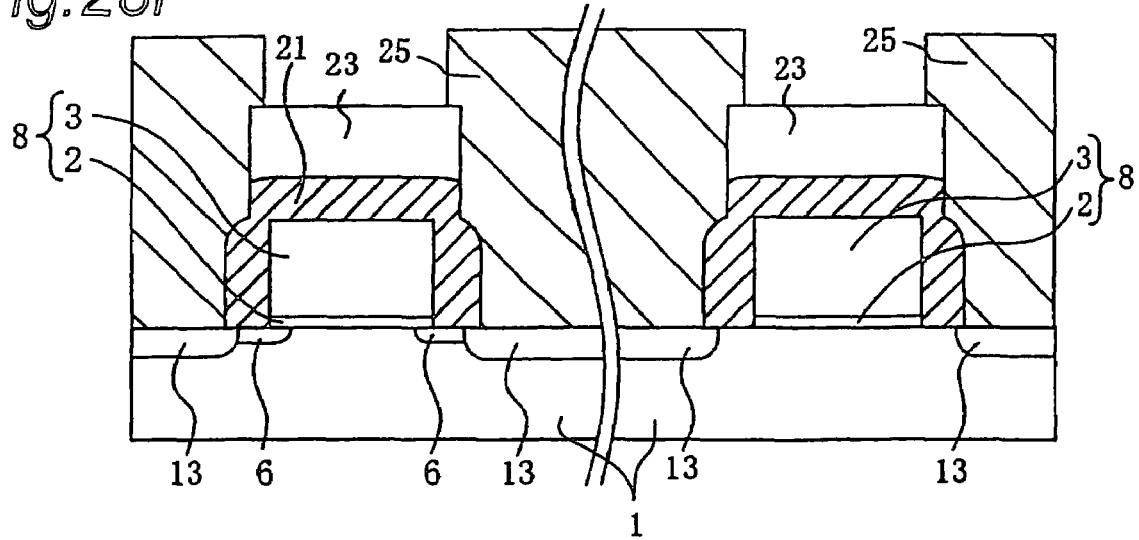

Further, as shown in FIG. 28F, a contact member is filled in the contact hole to form a contact 25 by using the same step as in FIG. 3E of the third embodiment. Further, the contact member is etched with use of photolithography and etching processes to form an interconnection patter on the interlayer insulator.

As a result of the above steps, the general MOSFET and the semiconductor storage elements have been fabricated simultaneously on an identical substrate with simplicity and without requiring any complex process by adding a photolithography step to the semiconductor storage device formation steps described in the third embodiment to thereby provide regions where the LDD diffusion region is formed and other regions where not.

Next, with reference to FIGS. 29A to 29G, it is shown that individual devices of the general MOSFETs in the logic circuit section and the like as well as the semiconductor storage elements can be fabricated simultaneously on an identical substrate with simplicity and without requiring any complex process. More particularly, it is shown that the general MOSFETs and the semiconductor storage devices can be fabricated automatically on an identical substrate by adding a photolithography step to the semiconductor storage device formation steps described in the seventh embodiment to thereby provide regions where the LDD diffusion region is formed and other regions where not.

The manufacturing process is explained below in order according to the drawings.

FIGS. 29A to 29G show different devices between right and left sides, where the left side shows a general MOSFET in the logic circuit area 1104 and the right side shows a semiconductor storage device in the memory area 1105.

Figure 29A:
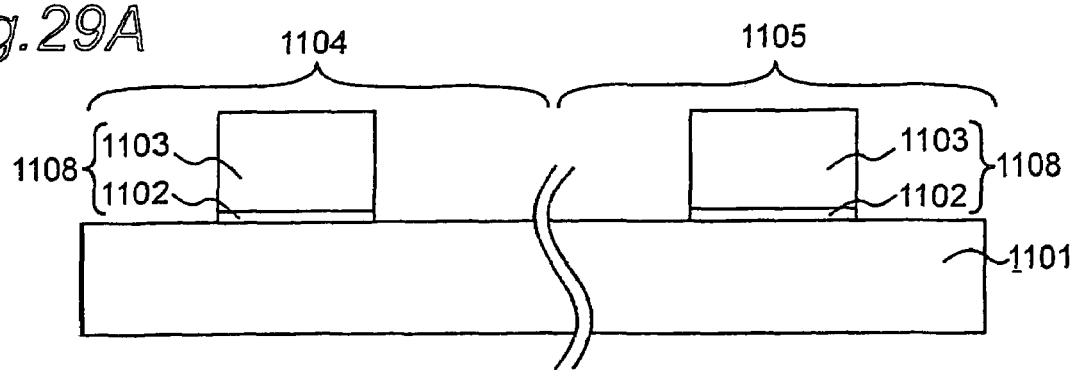
FIGS. 29A to 29G are schematic cross sectional views showing manufacturing steps of the semiconductor device.

For up to the LDD region formation step, steps similar to those of the seventh embodiment may be used. That is, as shown in FIG. 29A, the structure of FIG. 9A in the seventh embodiment is formed for both the logic circuit area 1104 and the memory area 1105 of the semiconductor substrate 1101. It is noted that in FIG. 29A, reference numeral 1102 denotes a gate insulator, 1103 denotes a gate electrode and 1108 denotes a gate stack.

Figure 29B:
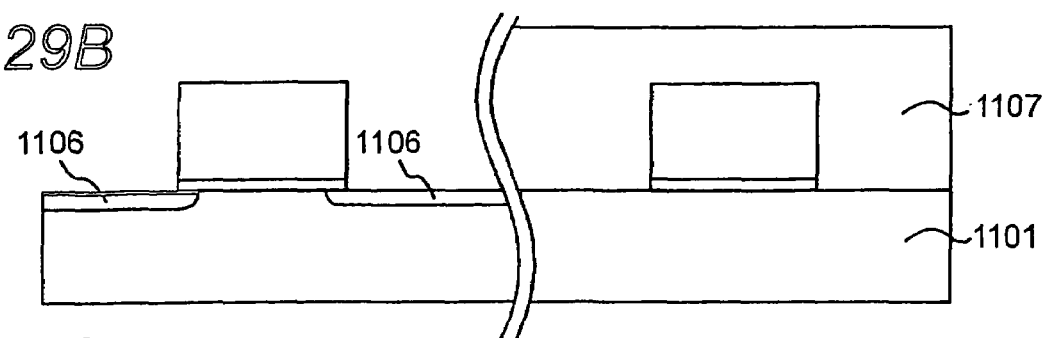

Next, as shown in FIG. 29B, the LDD region 1106 is formed only in the logic circuit area 1104. In this case, in the memory area 1105, photoresist 1107 has been formed and the LDD region 1106 is not formed. In this process, whereas the LDD region 1106 is not formed in the memory area 1105, the LDD region has been able to be formed in the logic circuit area 1104 where general normal-structure transistors are to be formed. The photoresist is intended to block the implantation, and has only to be one which can be selectively removed and which may be a dielectric film such as silicon nitride. This step only is a special step that differs from the seventh embodiment, and the following steps afterwards may be the same steps as those of the seventh embodiment.

Figure 29C:
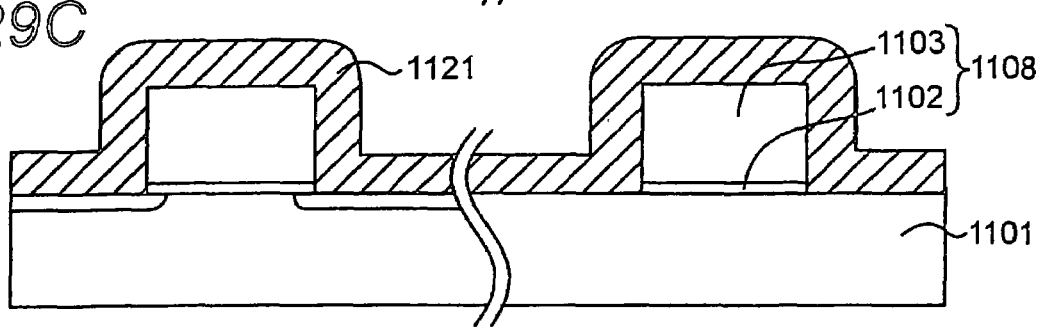

Next, as shown in FIG. 29C, a first coating film 1121 is formed by using the same step as in FIG. 9B of the seventh embodiment.

Figure 29D:
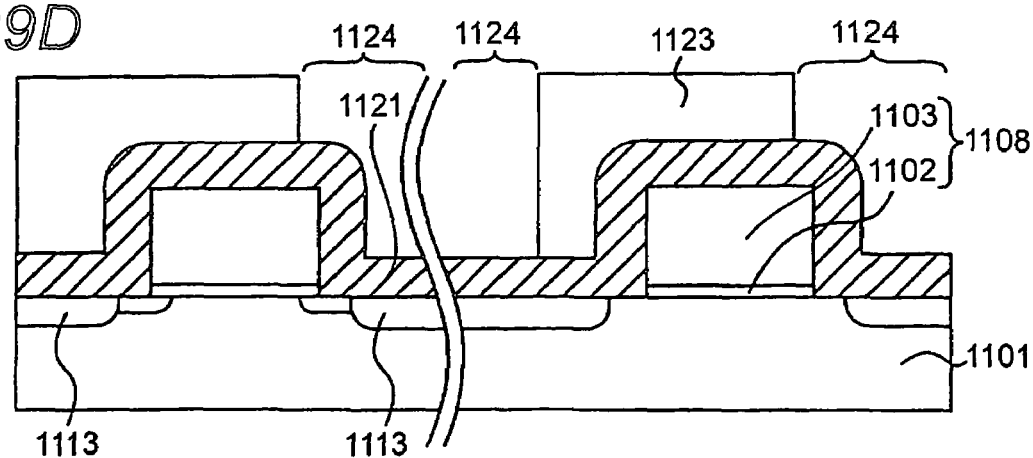

Further, as shown in FIG. 29D, source/drain diffusion regions 1113 are formed and an interlayer insulator 1123 is formed by using the same step as in FIG. 9C of the seventh embodiment. After that, a contact hole 1124 for forming a contact to connect the source/drain diffusion regions and interconnection lines is formed on the interlayer insulator 1123.

Figure 29E:
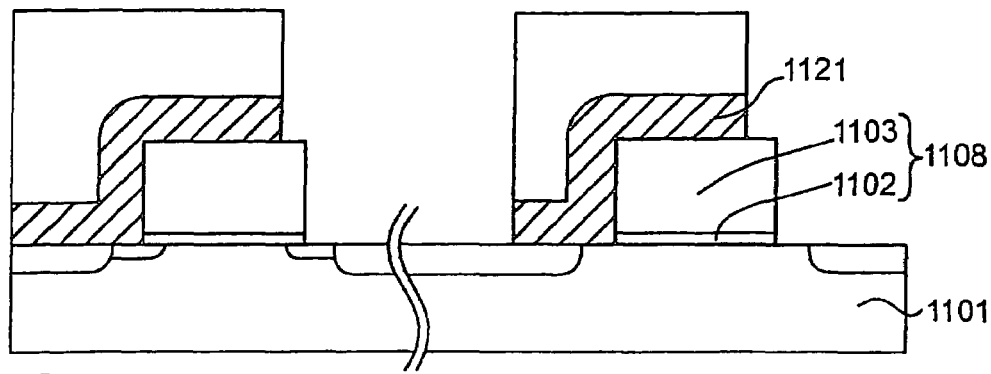

Further, as shown in FIG. 29E, the coating film 1121 under the contact hole is removed through anisotropic selective etching by using the same step as in FIG. 9D of the seventh embodiment.

Figure 29F:
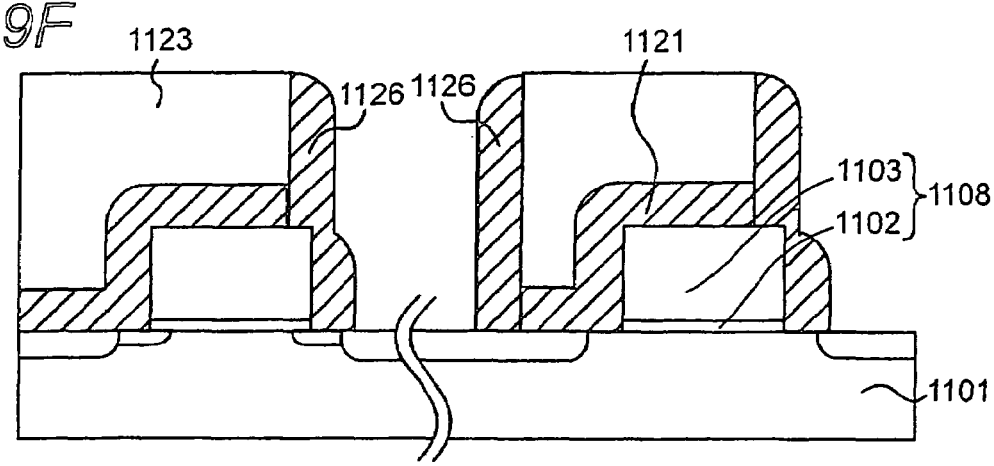

Further, as shown in FIG. 29F, a second coating film 1126 is formed on the side wall at portions of the interlayer insulator 1123 and the gate stack 1108 exposed to the contact hole by using the same step as in FIG. 9E of the seventh embodiment.

Figure 29G:
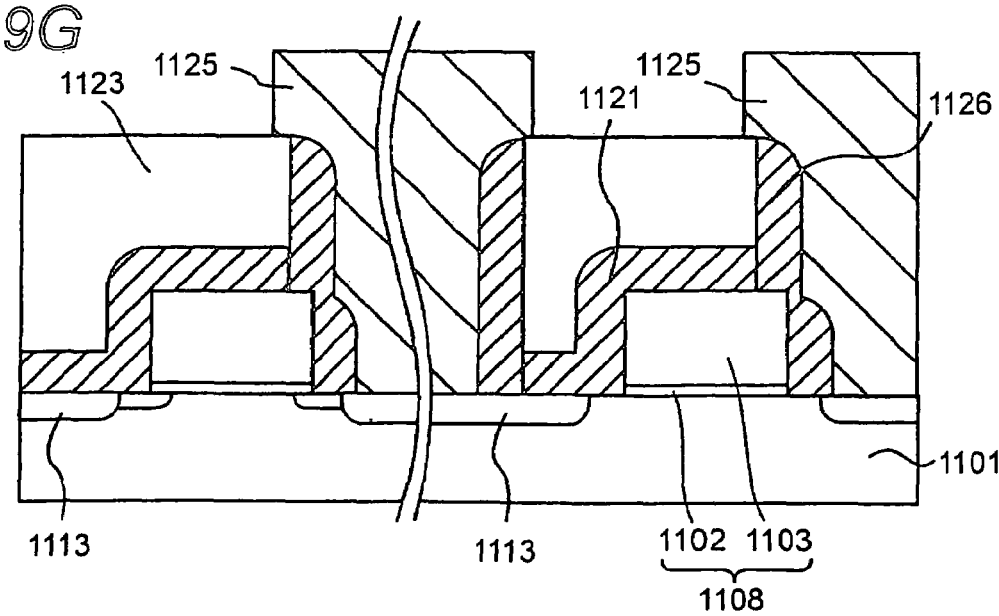

Further, as shown in FIG. 29G, a contact member is filled in the contact hole to form a contact 1125 by using the same step as in FIG. 9F of the seventh embodiment. Further, the contact member is etched with use of photolithography and etching processes to form an interconnection patter on the interlayer insulator 1123.

As a result of the above steps, the general MOSFET and the semiconductor storage device of the present invention have been fabricated automatically on an identical substrate with simplicity and without requiring any complex process by adding a photolithography step to the semiconductor storage device formation steps described in the seventh embodiment to thereby provide regions where the LDD diffusion region is formed and other regions where not.

Twenty-Second Embodiment

An IC card of a twenty-second embodiment of the present invention is explained with reference to FIGS. 30A and 30B.

Figure 30A:
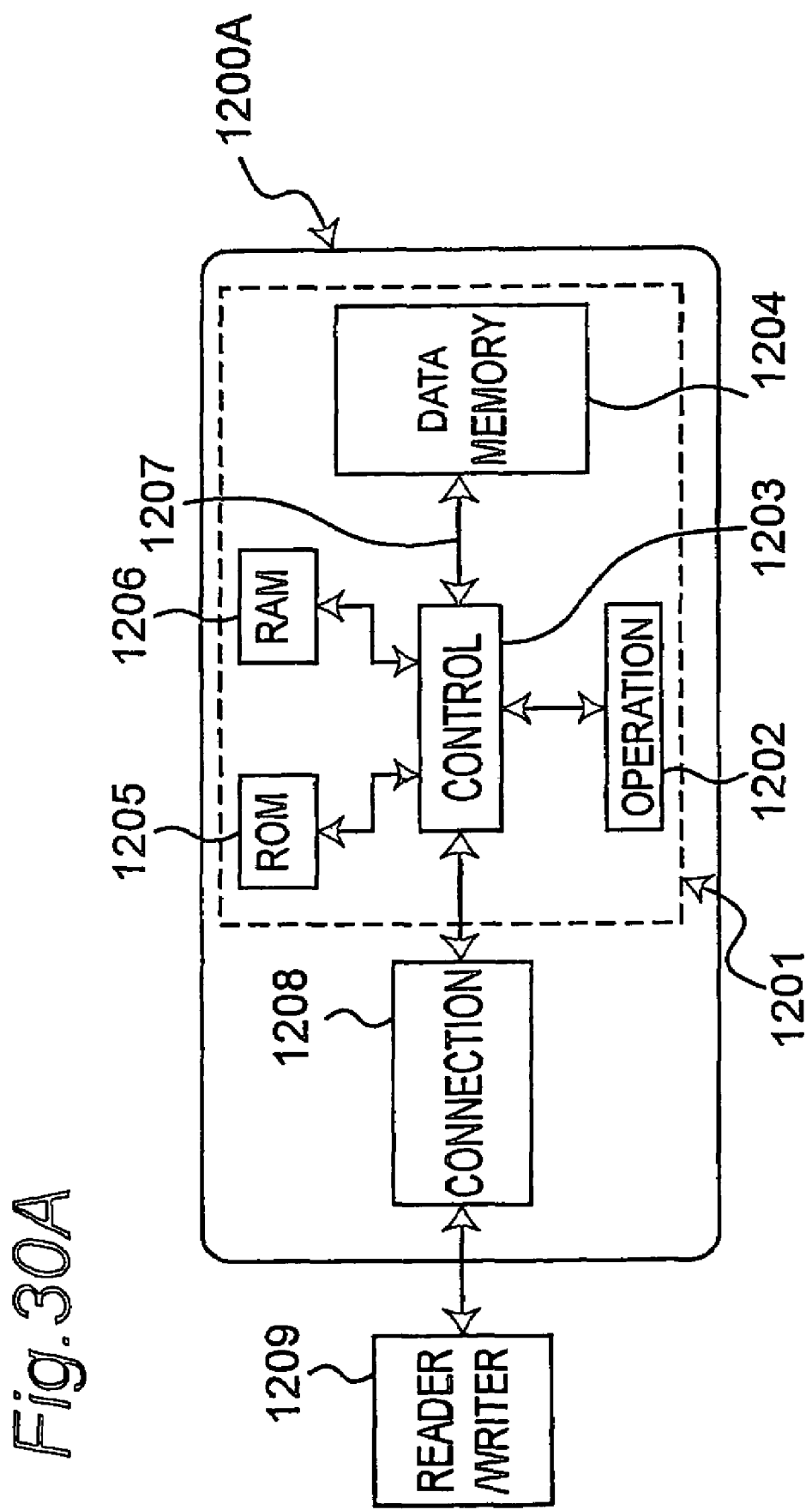

FIGS. 30A and 30B are views showing the construction of the IC card.

The IC card 1200A shown in FIG. 30A has a built-in MPU (Micro Processing Unit) 1201 and a built-in connection section 1208. The MPU 1201 has a data memory section 1204, an operation section 1202, a control section 1203, a ROM (Read Only Memory) 1205, and a RAM (Random Access Memory) 1206, all of these being formed in one chip. Programs for operating the MPU 1201 are stored in the ROM 1205. The RAM 1206 is used as a work area and temporarily stores operation data. The MPU 1201 has the semiconductor device according to the present invention. The constituent parts or sections 1202, 1203, 1204, 1205, 1206, and 1208 are connected with one another via lines (including a data bus and a power source line) 1207. When the IC card 1200A is placed in position in the reader/writer 1209, the connection section 1208 and the reader/writer 1209 are connected to each other, so that the IC card 1200A is energized and data exchange is performed.

The IC card 1200A is characterized in that the MPU 1201 incorporates the data memory section 1204 and that the semiconductor switching elements and the semiconductor storage elements are placed together in one semiconductor chip.

The aforementioned semiconductor storage elements that enable the reduction of production costs are used in the data memory section 1204.

These storage elements are easy to miniaturize and allow two-bit operations. This facilitates reduction of the area of a memory cell array having such storage elements arrayed, and the memory cell array can be fabricated at reduced cost. Use of such a memory cell array in the data memory section 1204 of the IC card 1200A would reduce the cost of the IC card 1200A.

Further, because the MPU 1201, which incorporates the data memory section 1204, is formed in one chip, the production cost of the IC card 1200A can be largely reduced.

Further, because the MPU 1201 has the semiconductor device according to the present invention, more specifically, the data memory section 1204 uses the semiconductor storage elements and other circuits use the semiconductor switching elements, the fabrication process of the IC card 1200A is considerably simplified, as compared with a case in which the data memory section 1204 uses flash memories. The reason for that is that the fabrication process for the semiconductor storage elements in the data memory section 1204 is very similar to the fabrication process for the semiconductor switching elements in the logic circuits (i.e., operation section 1202 and control section 1203), so that it is very easy to place those storage elements and switching elements on one chip in a composite manner. Thus, incorporation of the data memory section 1204 in the MPU 1201 on one chip leads to a considerable cost reduction.

The ROM 1205 may be constructed of the above-described semiconductor storage elements. This makes it possible to externally rewrite the ROM 1205, which brings about remarkable increase of the functions of the IC card 1200A. Because the above semiconductor storage elements are easy to miniaturize and allow two-bit operations, substituting these semiconductor storage elements for the memory cells of the masked ROM would hardly cause increase of a chip area. Also, the process for forming the semiconductor storage elements is almost the same as the general CMOS forming process, which facilitates mixed-placing of the semiconductor storage elements with the logic circuit.

Referring next to FIG. 30B, the IC card 1200B incorporates an MPU section 1201, an RF interface section 1210, and an antenna section 1211. The MPU section 1201 contains a data memory section 1204, an operation section 1202, a control section 1203, a ROM 1205, and a RAM 1206, all of these being formed in one chip. The sections 1202, 1203, 1204, 1205, 1206, 1210, and 1211 are connected to one another via lines (including a data bus and a power source line) 1207.

The IC card 1200B of FIG. 30B is different from the IC card 1200A of FIG. 30A in that the IC card 1200B is of non-contact type. Consequently, the control section 1203 is connected not to the connection section but to the antenna section 1211 via the RF interface section 1210. The RF interface section 1210 has a function of communicating with external equipment and a power collection function. The RF interface section 1210 has a function of commutating high-frequency signals transmitted from the antenna section 1211 and feeding power, and a function of modulating and demodulating signals. It is noted that the RF interface section 1210 and the antenna section 1211 may be placed together with the MPU 1201 in one chip.

Since the IC card 1200B is of non-contact type, it becomes possible to prevent electrostatic destruction which would occur through the connection section. Also, the IC card 1200B does not necessarily need to have a close contact with an external apparatus, which makes freedom of applications large. In addition, the semiconductor storage elements constituting the data memory section 1204 each operate at low supply voltage (approx. 9V), compared with conventional flash memory cells (supply voltage of approx. 12V), which enables down sizing of the circuit of the RF interface section 1210 and enables cost reduction.

Twenty-Third Embodiment

Portable electronic equipment of a twenty-third embodiment of the present invention is explained with reference to FIG. 31.

The semiconductor storage device or semiconductor device of the first through twenty-first embodiments can be used for battery-driven portable electronic equipment. The portable electronic equipment can be exemplified, in particular, by personal digital assistants, portable telephones, game equipment and the like.

Figure 31:
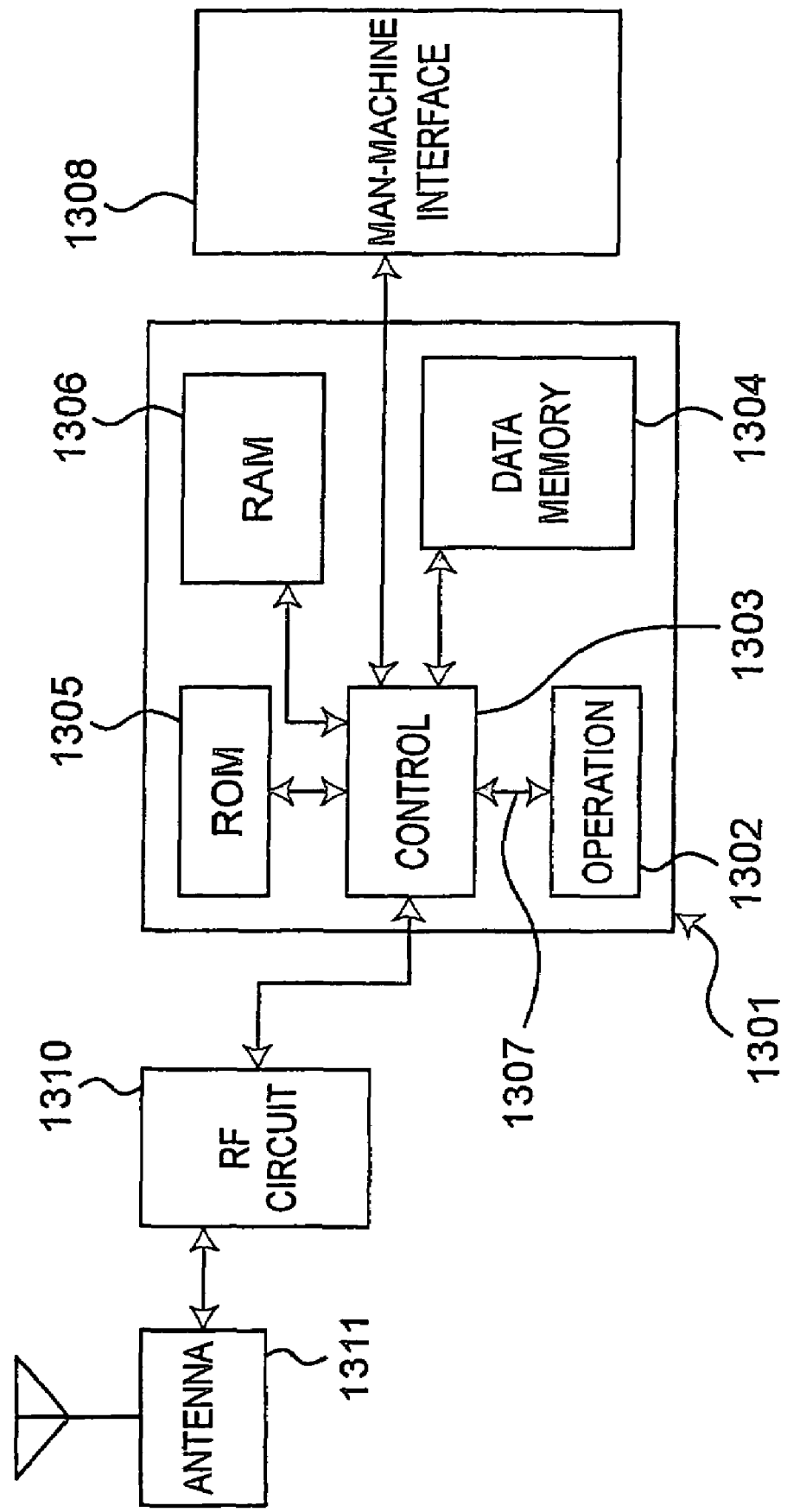
FIG. 31 is a schematic block diagram showing portable electronic equipment in a twenty third embodiment of the present invention.

FIG. 31 shows a portable telephone as an example of the portable electronic equipment. A semiconductor device of the present invention is incorporated into an MPU section 1301.

With the semiconductor device of the invention used for portable electronic equipment, the manufacturing cost of its control circuit is reduced, so that the cost of the portable electronic equipment itself can be reduced. Otherwise, a nonvolatile memory contained in the control circuit can be made larger in capacity, so that the functions of the portable electronic equipment can be enhanced.

As shown in FIG. 31, the mobile phone incorporates an MPU section 1301, a man-machine interface section 1308, an RF circuit section 1310, and an antenna section 1311. The MPU section 1301 has a data memory section 1304, an operation section 1302, a control section 1303, a ROM 1305, and a RAM 1306, all of these being formed in one chip. Programs for operating the MPU 1301 are stored in the ROM 1305. The RAM 1306 is used as a work area and temporarily stores operation data. The semiconductor device according to the present invention is incorporated in the MPU 1301. The constituent parts or sections 1302, 1303, 1304, 1305, 1306, 1308, 1310 and 1311 are connected with one another via lines (including a data bus and a power source line) 1307.

The mobile phone is characterized in that the MPU 1301 incorporates the data memory section 1304 and that the semiconductor switching elements and the semiconductor storage elements are placed together in one semiconductor chip.

The aforementioned semiconductor storage elements that enable the reduction of production costs are used in the data memory section 1304. These storage elements are easy to miniaturize and allow two-bit operations. This facilitates reduction of the area of a memory cell array having such storage elements arrayed, and the memory cell array can be fabricated at reduced cost. Use of such a memory cell array in the data memory section 1304 of the mobile phone would reduce the cost of the mobile phone.

Further, because the MPU 1301, which incorporates the data memory section 1304, is formed in one chip, the production cost of the mobile phone can be largely reduced.

Further, because the MPU 1301 has the semiconductor device according to the present invention, more specifically, the data memory section 1304 uses the semiconductor storage elements and other circuits use the semiconductor switching elements, the fabrication process is considerably simplified, as compared with a case in which the data memory section 1304 uses flash memories. The reason for that is that the fabrication process for the semiconductor storage elements in the data memory section 1304 is very similar to the fabrication process for the semiconductor switching elements in the logic circuits (i.e., operation section 1302 and control section 1303), so that it is very easy to place those storage elements and switching elements on one chip in a composite manner. Thus, incorporation of the data memory section 1304 in the MPU 1301 and placement thereof on one chip leads to a considerable cost reduction.

The ROM 1305 may be constructed of the above-described semiconductor storage elements. This makes it possible to externally rewrite the ROM 1305, which brings about remarkable increase of the functions of the mobile phone. Because the above semiconductor storage elements are easy to miniaturize and allow two-bit operations, substituting these semiconductor storage elements for the memory cells of the masked ROM would hardly cause increase of a chip area. Also, the process for forming the semiconductor storage elements is almost the same as the general CMOS forming process, which facilitates mixed-placement of the semiconductor storage elements and the logic circuit in one chip.

Twenty-Fourth Embodiment

A twenty-fourth embodiment of the present invention shows an example of a memory cell array in which the above-described semiconductor storage devices are arrayed.

Figure 32A:
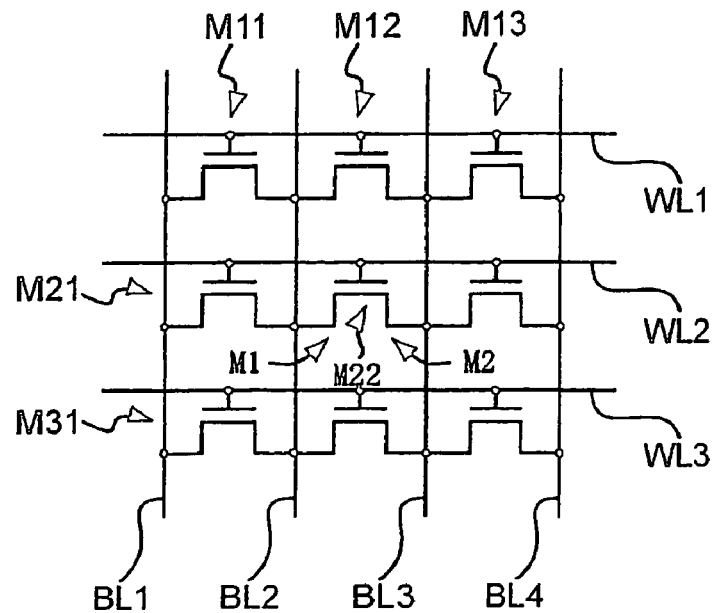
Figure 32B:
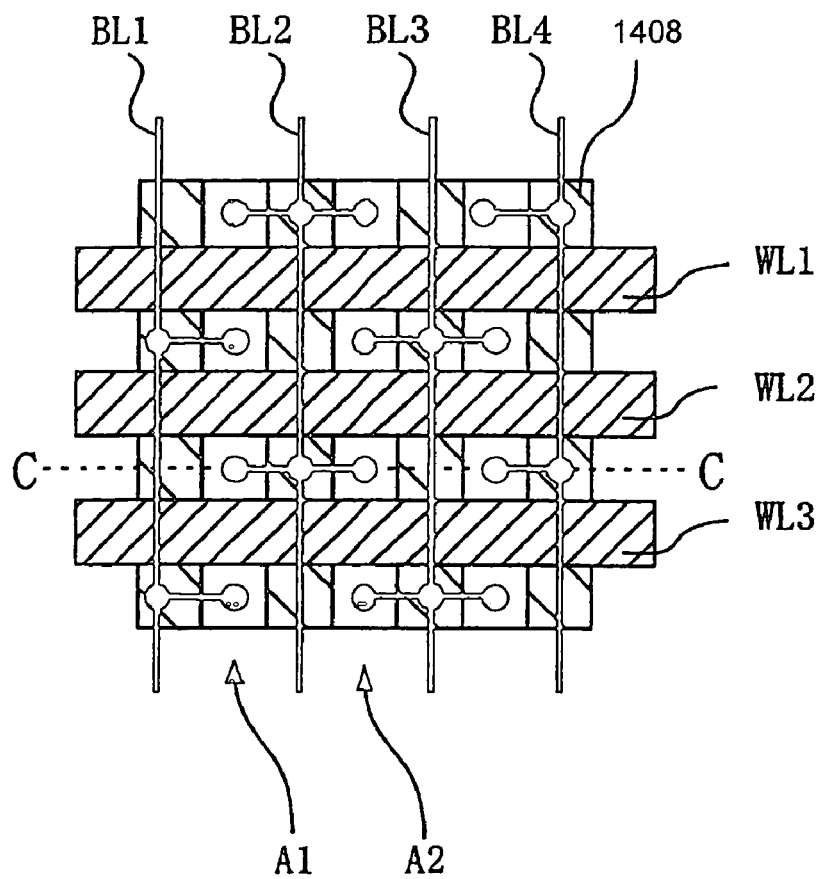
FIG. 32B is a schematic plane view showing the memory cell array.
Figure 33A:
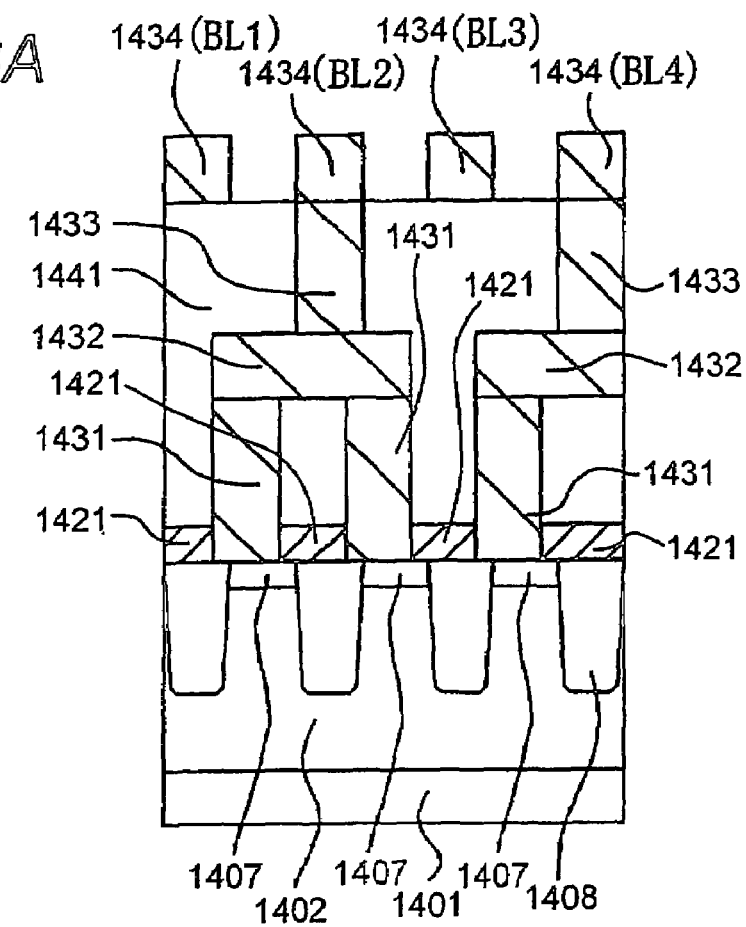
Figure 33B:
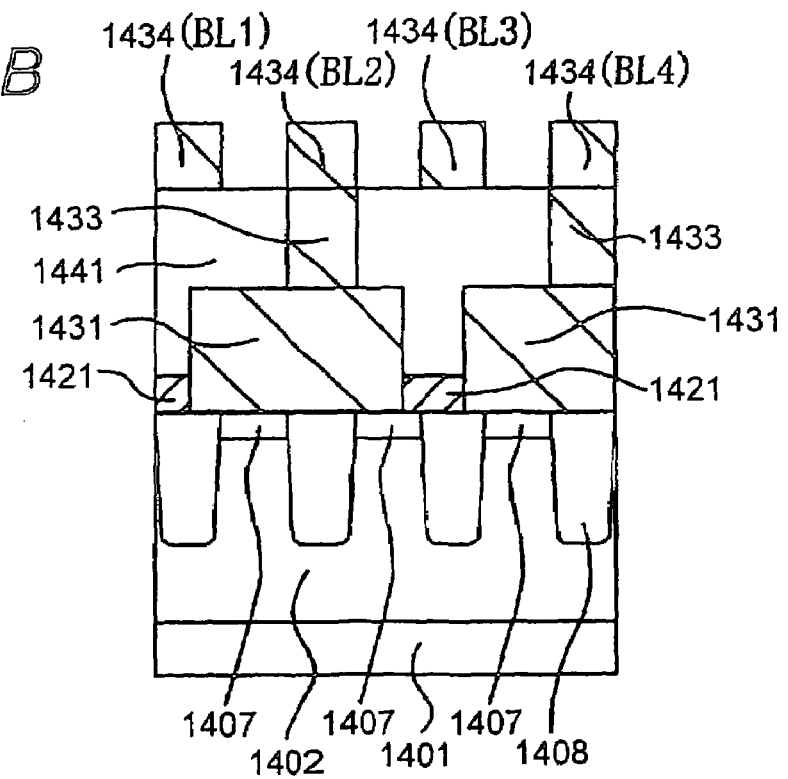
FIG. 33B is a schematic cross sectional view showing the second memory cell array taken along the cross sectional line C-C of FIG. 32B.
Figure 34:
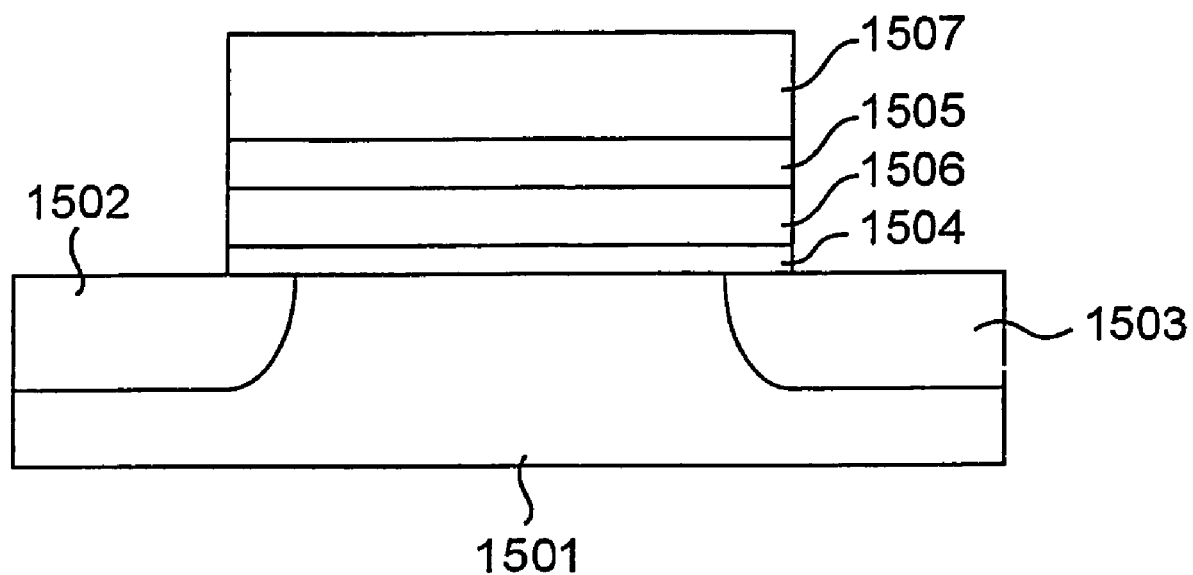
FIG. 34 is a structural cross sectional view showing a flash memory device as a conventional semiconductor storage device.

Two types of memory cell arrays of this twenty-fourth embodiment are explained with reference to FIGS. 32A, 32B, 33A and 33B. FIG. 32A is a circuit diagram of these two types of memory cell arrays, and FIG. 32B is a schematic plan view of the memory cell arrays, where the circuit diagram and the plan view are in common to the two types. Also, FIG. 33A is a schematic cross sectional view showing a first memory cell array taken along the cross sectional line C-C of FIG. 32B, and FIG. 33B is a schematic cross sectional view showing a second memory cell array of different construction taken along the cross sectional line C-C of FIG. 32B. It is noted that in FIG. 32B, the upper interconnection structure (bit lines and contact) is represented as a connection diagram for simplicity's sake. Also, in FIGS. 32A and 32B and FIGS. 33A and 33B, a 3 rows by 3 columns memory cell array is shown, but the of rows and columns are not limited to this arrangement.

As shown in each of FIGS. 33A and 33B, a p-type well region 1402 is formed on a semiconductor substrate 1401. On the surface of the p-type well region 1402 is formed a device isolation region 1408. Regions of the semiconductor substrate 1401 surface where the device isolation region 1408 is not formed are active regions. On the semiconductor substrate 1401, active regions are arrayed. Also, in FIG. 32A, word lines WL1, WL2, WL3 extending laterally on the drawing sheet are arrayed in up-and-down directions in the drawing. The word lines WL1, WL2, WL3 run through on the individual active regions via the gate insulator, and source/drain diffusion regions (shown in FIGS. 33A and 33B) are formed on opposite sides of each word line (over regions which are active regions and which are not covered with the word lines). A word line (gate electrode) and two source/drain diffusion regions (source region or drain region) formed on opposite sides of the word line constitute one field effect transistor. In this case, the field effect transistor is one in which memory function bodies similar to those shown in FIGS. 15A to 15J of the twelfth embodiment are formed in a semiconductor storage device having a memory function shown in FIGS. 7 and 8 of the sixth embodiment. The manufacturing method of this semiconductor storage device may be given by using any suitable one of sixth to twentieth embodiments.

Next, the schematic plan view of the memory cell array shown in FIG. 32B is explained. With neighboring three bit lines selected, those bit lines are assumed as, in order of array, bit line BL1, bit line BL2 and bit line BL3. In this case, an active region present between the bit line BL1 and the bit line BL2 is assumed as an active region A1. Similarly, an active region present between the bit line BL2 and the bit line BL3 is assumed as an active region A2. Then, the bit line BL2 is connected one of source/drain diffusion regions belonging to the active region A1 and the active region A2. Also, the bit line BL3 is connected to the other of the source/drain diffusion regions belonging to the active region A2. Also, the bit line BL1 is connected to the other of the source/drain diffusion regions belonging to the active region A1. Further, with neighboring two of the word lines (e.g., WL1 and WL2) selected, a source/drain diffusion region belonging to the active region A1 and surrounded by the two word lines, and a source/drain diffusion region belonging to the active region A2 and surrounded by the two word lines, are both connected to the bit line BL2 or connected to the bit line BL1 and the bit line BL3, respectively. That is, when an appropriate voltage that becomes a source or drain voltage is applied to an active region connected to the bit line BL2 and the bit line BL3 in the active region A2 so that a word line (e.g., WL1) is selected, the active regions A2 that sandwich the word line WL1 from above and below become a source or drain, by which the corresponding semiconductor storage device is selected.

In FIGS. 33A and 33B, reference numeral 1431 denotes a contact hole (a hole for connecting an active layer or word line and a first-layer metal line to each other), and 1433 denotes a via hole (a hole for connecting the first-layer metal line and a second-layer metal line to each other). Although the first bit line is implemented by a first-layer metal line 1432 and the second bit line is implemented by a second-layer metal line 1434 in this twenty-fourth embodiment, the way of interconnections is not limited to this only.

Working effects by this embodiment are the same effects as those produced in the case where a contact hole is formed on the device isolation region in the seventh embodiment. That is, as shown in FIG. 33A, also when the contact hole 1431 is formed on the device isolation region 1408, good contact characteristics can be obtained without etching the device isolation region 1408. Therefore, it becomes possible to reduce the occupancy area as in the seventh embodiment, so that a semiconductor storage device of low cost can be provided.

Further, when contact materials buried in neighboring contact holes 1431 are connected to each other by the first-layer metal line 1432, which is a characteristic aspect of this embodiment, even more excellent effects can be produced.

More specifically, as shown in FIGS. 33A and 33B, in the case where neighboring source/drain diffusion regions 1407 are connected to each other via the device isolation region 1408, the design margin with shifts of mis-alignment take into consideration can be reduced and the area of the memory cell array can be dramatically reduced when the neighboring source/drain diffusion regions 1407 are connected to each other by the contact hole 1431 as in the second memory cell array shown in FIG. 33B, as compared to the case where a proper contact hole is formed for each of the source/drain diffusion regions 1407 and the neighboring source/drain diffusion regions 1407 are connected to each other by the first-layer metal line 1432 as in the memory cell array shown in FIG. 33A. That is, in the case of FIG. 33B, since neighboring contact holes are connected to each other to make one large contact hole, there is no need for doing alignment with the contact holes in the device isolation regions located under the connection portions. Therefore, the margin of mis-alignment between contact hole and device isolation region 1408 is decreased to one half. Thus, the area of the memory cell array can be reduced dramatically.

The reason why such a large contact hole 1431 as to stretch over the device isolation region 1408 can be formed as in the second memory cell array shown in FIG. 33B is that the process includes a step for forming a coating film 1421, which employs a material having a large etching ratio to the device isolation region 1408 and an interlayer insulator 1441, on the semiconductor substrate 1401 over the device isolation region 1408. By this coating film 1421, the etching is stopped once at this coating film during contact etching. As a result of this, excessive etching of the device isolation region 1408 can be prevented. Further, in the etching of the coating film 1421 exposed to the contact hole, the etching can be carried out under an etching condition of high selectivity against the device isolation region 1408, so that excessive etching of the device isolation region 1408 can be prevented and good contact characteristics can be obtained.

Next, the operation of this memory cell array is explained.

In the circuit diagram of the memory cell array shown in FIG. 32A, storage elements are represented by a common symbol that expresses a field effect transistor for simplicity's sake.

First, the read method is described. It is assumed here that storage information of a bit-line BL2 side memory storage part (charge retention part) M1 of the memory cell M22 is to be read. First of all, the bit lines BL1 and BL2 are precharged to a logical level L, and the bit lines BL3 and BL4 are precharged to a logical level H. After the completion of the precharge, the word line WL2 is set to the logical level H. At the moment when the word line WL2 has come to the logical level H, the memory cell M22 goes on-state. When this occurs, a high voltage (logical level H - logical level L) is applied to between source and drain of the memory cell M22, causing a current to flow therethrough, where the current amount varies depending on the state of the memory storage part M1. Accordingly, by detecting the amount of a current that flows through the bit line BL2 or BL3, or by monitoring a voltage change of the bit line BL2 or BL3, the state of the memory storage part M1 of the memory cell M22 can be known.

In this operation, if the bit line BL1 has not been precharged to the logical level L, then the memory cell M21 would go on-state instantaneously when the word line WL2 has come to the logical level H, causing a current to flow from the bit line BL1 to the bit line BL2. Such a current hinders the detection of a current flowing through the selected memory cell M22. Accordingly, the bit line BL1 is preferably precharged to the same logical level L as the bit line BL2. Similarly, the bit line BL4 is preferably precharged to the same logical level H as the bit line BL3.

In addition, to read storage information of the bit-line BL3 side memory storage part (M2) of the memory cell M22, the bit lines BL1 and BL2 are precharged to the logical level H, and the bit lines BL3 and BL4 are precharged to the logical level L. After the completion of the precharge, the word line WL2 may appropriately be set to the logical level H.

An example of voltages in write, read and erase operations of the memory cell array of this twenty-fourth embodiment is shown in Table 1. Reference characters Lbw, Hbw, Lww and Hww denote low-level voltage of bit lines, high-level voltage of bit lines, low-level voltage of word lines and high-level voltage of word lines, respectively, in write operation. Also, reference characters Lbr, Hbr, Lwr and Hwr denote low-level voltage of bit lines, high-level voltage of bit lines, low-level voltage of word lines and high-level voltage of word lines, respectively, in read operation. Reference characters Lbe1, Lbe2, Hbe, Lwe and Hwe denote low-level voltage 1 of bit lines, low-level voltage 2 of bit lines, high-level voltage of bit lines, low-level voltage of word lines and high-level voltage of word lines, respectively, in erase operation. For each symbol, a concrete example of voltage is shown in parentheses.

It is noted that the erase method shown in Table 1 is the above-described second erase method. Therefore, a voltage of Lbe2 (+0.8 V in Table 1) is preparatorily applied to the p-type well region for erase operation. For erase of the memory storage part M1 of the memory cell M22, an erase is performed with a trigger implemented by electrons injected by a forward voltage applied to the p-type well region and the bit line BL3. Also, Lbe2 is given to the bit line BL1, which is intended to prevent any mis-erase of the memory cell M21.

TABLE 1

| Operation | BL1 | BL2 | BL3 | BL4 | WL1 | WL2 | WL3 |
|---|---|---|---|---|---|---|---|
| Write (M1) | Hbw (6 V) or open | Hbw (6 V) | Lbw (0 V) | Lbw (0 V) or open | Lww (0 V) | Hww (2 V) | Lww (0 V) |
| Write (M2) | Lbw (0 V) or open | Lbw (0 V) | Hbw (6 V) | Hbw (6 V) or open | Lww (0 V) | Hww (2 V) | Lww (0 V) |
| Read (M1) | Lbr (0 V) | Lbr (0 V) | Hbr (2 V) | Hbr (2 V) | Lwr (0 V) | Hwr (1 V) | Lwr (0 V) |
| Read (M2) | Hbr (2 V) | Hbr (2 V) | Lbr (0 V) | Lbr (0 V) | Lwr (0 V) | Hwr (1 V) | Lwr (0 V) |
| Erase (M1) | Lbe2 (0.8 V) | Hbe (5 V) | Lbe1 (0 V) | Lbe1 (0 V) or open | Lwe (0 V) | LWe (−4 V) | Hwe (0 V) |
| Erase (M2) | Lbe1 (0 V) or open | Lbe1 (0 V) | Hbe (5 V) | Lbe2 (0.8 V) | Lwe (0 V) | LWe (−4 V) | Hwe (0 V) |

As apparent from this Table 1, the memory cell array of this embodiment is enabled to perform random access (1-bit basis read and rewrite operations). Therefore, the access efficiency can be increased, compared with devices that require batch erasing. Also, such a sequence of memory state as temporary storage, batch erase and write is no longer necessary, thus producing an effect that the control circuit is simplified.

According to the above read operation, when 2-bit storage of one memory cell is to be read in succession (e.g., memory storage parts M1, M2 of the memory cell M22 are read in succession), all the voltages of bit lines in their neighborhoods have to be inverted (in the above example, the voltages of bit lines BL1-BL4), thus resulting in a poor efficiency. Therefore, it is preferable to avoid the state of alternately reading in succession by taking measures such as separating addresses for access to right-and-left memory storage parts (charge retention parts) with a devised arrangement of an address decoder circuit or the like, as described later.

In each of memory cells Mij (i=1, 2, 3; j=1, 2, 3), the gate electrode is connected to word lines WLi (i=1, 2, 3), one of the source/drain diffusion regions is connected to first bit lines BL1j (j=1, 2, 3), and the other of the source/drain diffusion regions is connected to second bit lines BL2j (j=1, 2, 3).

For operation of the memory cell array, a voltage necessary for the operation method of the above-described semiconductor storage device may be given to desired memory cells via particular word lines and the first and second bit lines. For instance, in writing one of memory storage parts (charge retention parts) of the memory cell M11, it is appropriate to give +2 V to the word line WL1, +6 V to the first bit line BL11, and 0 V to the second BL21, as an example. Also, in writing the other of the memory storage parts (charge retention parts) of the memory cell M11, it is appropriate to give +2 V to the word line WL1, 0 V to the first bit line BL1*l*, and +6 V to the second BL2*l*, as an example. In these cases, 0 V as an example may appropriately be given to other non-selected word lines and non-selected bit lines.

As apparent from the above description, the memory cell array of the twenty-fourth embodiment is made up by arraying the above-described semiconductor storage devices. The semiconductor storage device, as described above, is capable of 2-bit storage by one element and allows the gate insulator to be provided as a thin film, thus allowing to be easily scaled down. Therefore, the memory cell array of this embodiment, in which the semiconductor storage devices are arrayed, also becomes easier to scale down, allowing the manufacturing cost to be reduced.

Further, as described above, the process for forming the semiconductor storage device is very close to the common CMOS process, making it quite simpler to manufacture the semiconductor storage device, as compared with conventional nonvolatile memories having a floating gate such as EEPROMs. Accordingly, the memory cell array of this embodiment is also easy to manufacture, thus making it simpler to achieve composite integration with logic circuits.

The invention being thus described may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage device comprising:
a field effect transistor which has a gate electrode formed on a semiconductor substrate via a gate insulator and a pair of source/drain diffusion regions formed on portions of a semiconductor substrate surface corresponding to opposite sides of the gate electrode;
a coating film which is made of a dielectric having a function of storing electric charge and formed on the semiconductor substrate in such a manner as to cover an upper surface and side surfaces of the gate electrode;
an interlayer insulator formed on and in contact with the coating film; and
contact members which extend vertically through the interlayer insulator and coating film on the source/drain diffusion regions and which are electrically connected to the source/drain diffusion regions, respectively, wherein
the coating film and the interlayer insulator are made of materials which are selectively etchable to each other.

2. The semiconductor storage device as claimed in claim 1, wherein
spaces are provided between the gate electrode and the source/drain diffusion regions with respect to a channel direction, and the spaces are covered with portions of the coating film that extend along the side surfaces of the gate electrode.

3. The semiconductor storage device as claimed in claim 1, wherein
a material of the semiconductor substrate and a material of the gate electrode principally contain silicon,
a material of the gate insulator and a material of the interlayer insulator principally contain silicon oxide, and
a material of the coating film principally contain silicon nitride.

4. The semiconductor storage device as claimed in claim 1, wherein
a plurality of the field effect transistors are arranged on the semiconductor substrate, and
the semiconductor storage device has a device isolation region for electrically isolating the source/drain diffusion regions of mutually neighboring ones of the field effect transistors from each other;
a material of the device isolation region principally contains silicon oxide.

5. The semiconductor storage device as claimed in claim 1, wherein
a plurality of the field effect transistors are arranged on the semiconductor substrate,
the semiconductor storage device has a device isolation region for electrically isolating the source/drain diffusion regions of mutually neighboring ones of the field effect transistors from each other,
the contact members stretch to the source/drain diffusion regions located on opposite sides of the device isolation region, and
the coating film and the device isolation region are made of materials which are selectively etchable to each other.

6. A semiconductor device comprising:
a memory area having semiconductor storage elements and a logic circuit area having semiconductor switching elements, both the memory area and the logic circuit area being arranged on a semiconductor substrate, wherein
each of the semiconductor storage element and the semiconductor switching element comprises a field effect transistor which has a gate electrode formed on the semiconductor substrate via a gate insulator and which has a pair of source/drain diffusion regions formed on portions of a semiconductor substrate surface corresponding to opposite sides of the gate electrode,
a coating film which is made of a dielectric having a function of storing electric charge and formed on the semiconductor substrate in such a manner as to cover an upper surface and side surfaces of the gate electrode;
an interlayer insulator formed on and in contact with the coating film; and
contact members which extend vertically through the interlayer insulator and the coating film on the source/drain diffusion regions so as to be electrically connected to the source/drain diffusion regions, respectively, wherein
the coating film and the interlayer insulator are made of materials which are selectively etchable to each other,
in the semiconductor storage element, spaces are provided between the gate electrode and the source/drain diffusion regions with respect to a channel direction, and the spaces are covered with portions of the coating film that extend along the side surfaces of the gate electrode, and
in the semiconductor switching element, the source/drain diffusion regions extend under an end portion of the gate electrode with respect to the channel direction so as to overlap therewith.

7. An IC card which is equipped with the semiconductor storage device as claimed in claim 1.

8. An IC card which is equipped with the semiconductor device as claimed in claim 6.

9. Portable electronic equipment which is equipped with the semiconductor storage device as claimed in claim 1.

10. Portable electronic equipment which is equipped with the semiconductor device as claimed in claim 6.

11. A semiconductor storage device comprising:
a gate electrode formed on a semiconductor substrate via a gate insulator;
a channel formation region placed at least in a region under the gate electrode on the semiconductor substrate;
a pair of source/drain diffusion regions which are arranged on opposite sides of the channel formation region of the semiconductor substrate and which have a conductive type opposite to that of the channel formation region, an interlayer insulator formed at least above the gate electrode;

a coating film which is formed so as to cover an upper surface and side surfaces of the gate electrode and which is made of a dielectric having a function of retaining electric charge formed beside the interlayer insulator; and contact members which are formed beside the gate electrode via the coating film and which are electrically connected to the source/drain diffusion regions respectively, wherein the coating film is made of a material having such a selection ratio to the interlayer insulator that the material functions as an etching stopper material in etching of the interlayer insulator.

12. A semiconductor storage device comprising:

a gate electrode formed on a semiconductor substrate via a gate insulator;

a channel formation region placed at least in a region under the gate electrode on the semiconductor substrate;

a pair of source/drain diffusion regions which are arranged on opposite sides of the channel formation region of the semiconductor substrate and which have a conductive type opposite to that of the channel formation region, a third coating film made of a dielectric formed on an upper portion of the gate electrode;

a first coating film which is formed at least beside the gate electrode and beside the third coating film and which is made of a dielectric having a function of retaining electric charge;

an interlayer insulator formed at least above the third coating film; and contact members which are formed beside the gate electrode via the first coating film and which are electrically connected to the source/drain diffusion regions respectively, wherein the first coating film is made of a material having such a selection ratio to the interlayer insulator that the material functions as an etching stopper material in etching of the interlayer insulator.

13. The semiconductor storage device as claimed in claim 11, wherein the source/drain diffusion regions are so disposed as to be spaced from the gate electrode with respect to a channel direction.

14. The semiconductor storage device as claimed in claim 12, wherein the source/drain diffusion regions are so disposed as to be spaced from the gate electrode with respect to a channel direction.

15. The semiconductor storage device as claimed in claim 11, wherein the semiconductor substrate and the gate electrode is made of silicon, the gate insulator, the coating film and the interlayer insulator are made of silicon compound, and the silicon compound of the coating film is silicon nitride.

16. The semiconductor storage device as claimed in claim 12, wherein the semiconductor substrate and the gate electrode is made of silicon, the gate insulator, the coating film and the interlayer insulator are made of silicon compound, and the silicon compound of the coating film is silicon nitride.

17. The semiconductor storage device as claimed in claim 11, further comprising a device isolation region which is so placed as to electrically isolate source/drain diffusion regions of mutually neighboring semiconductor storage elements from each other.

18. The semiconductor storage device as claimed in claim 12, further comprising a device isolation region which is so placed as to electrically isolate source/drain diffusion regions of mutually neighboring semiconductor storage elements from each other.

19. A semiconductor device in which a memory area having the semiconductor storage device and a logic circuit area having the semiconductor switching element as described in claim 11 are disposed on a semiconductor substrate, wherein each of the semiconductor storage device and the semiconductor switching element is a field effect transistor having a gate electrode, and a pair of source/drain diffusion regions formed on portions of a semiconductor substrate surface corresponding to opposite sides of the gate electrode; and the semiconductor switching element not only has the structure of the semiconductor storage device but also extends so that at least part of the source/drain diffusion regions is placed under the gate electrode on the semiconductor substrate surface.

20. A semiconductor device in which a memory area having the semiconductor storage device and a logic circuit area having the semiconductor switching element as descended in claim 12 are disposed on a semiconductor substrate, wherein each of the semiconductor storage device and the semiconductor switching element is a field effect transistor having a gate electrode, and a pair of source/drain diffusion regions formed on portions of a semiconductor substrate surface corresponding to opposite sides of the gate electrode; and the semiconductor switching element not only has the structure of the semiconductor storage device but also extends so that at least part of the source/drain diffusion regions is placed under the gate electrode on the semiconductor substrate surface.

21. An IC card which is equipped with the semiconductor storage device as claimed in claim 11.

22. An IC card which is equipped with the semiconductor storage device as claimed in claim 12.

23. An IC card which is equipped with the semiconductor device as claimed in claim 19.

24. An IC card which is equipped with the semiconductor device as claimed in claim 20.

25. Portable electronic equipment which is equipped with the semiconductor storage device as claimed in claim 11.

26. Portable electronic equipment which is equipped with the semiconductor storage device as claimed in claim 12.

27. Portable electronic equipment which is equipped with the semiconductor device as claimed in claim 19.

28. Portable electronic equipment which is equipped with the semiconductor device as claimed in claim 20.

* * * * *